(12) United States Patent
Iizuka et al.

(10) Patent No.: US 8,846,293 B2
(45) Date of Patent: Sep. 30, 2014

(54) ACTINIC RAY-SENSITIVE OR RADIATION-SENSITIVE RESIN COMPOSITION, AND ACTINIC RAY-SENSITIVE OR RADIATION-SENSITIVE FILM AND PATTERN FORMING METHOD USING THE SAME COMPOSITION

(75) Inventors: Yusuke Iizuka, Haibara-gun (JP);
 Akinori Shibuya, Haibara-gun (JP);
 Naohiro Tango, Haibara-gun (JP);
 Shohei Kataoka, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/431,736

(22) Filed: Mar. 27, 2012

(65) Prior Publication Data
 US 2012/0251948 A1  Oct. 4, 2012

(30) Foreign Application Priority Data

Mar. 28, 2011 (JP) .................................. 2011-070594
Aug. 25, 2011 (JP) .................................. 2011-183800

(51) Int. Cl.
 *G03F 7/004* (2006.01)
 *G03F 7/38* (2006.01)
 *G03F 7/039* (2006.01)
 *G03F 7/075* (2006.01)
 *G03F 7/20* (2006.01)

(52) U.S. Cl.
 CPC ............ *G03F 7/0046* (2013.01); *G03F 7/0045* (2013.01); *G03F 7/0397* (2013.01); *G03F 7/0758* (2013.01); *G03F 7/2041* (2013.01); *Y10S 430/111* (2013.01); *Y10S 430/122* (2013.01); *Y10S 430/123* (2013.01)
 USPC ........ 430/270.1; 430/326; 430/330; 430/910; 430/921; 430/922

(58) Field of Classification Search
 CPC .... G03F 7/0397; G03F 7/0045; G03F 7/2041
 USPC .............. 430/270.1, 910, 921, 922, 326, 330
 See application file for complete search history.

(56) References Cited

U.S. PATENT DOCUMENTS

| 8,257,904 B2 * | 9/2012 | Motoike et al. ............ 430/270.1 |
| 2009/0035700 A1 | 2/2009 | Nakayama et al. |
| 2010/0221659 A1 * | 9/2010 | Ebata et al. ................. 430/270.1 |

FOREIGN PATENT DOCUMENTS

| JP | 2004240387 A | 8/2004 |
| JP | 2004341062 A | 12/2004 |
| JP | 2010-102033 A | 5/2010 |
| JP | 2011221471 A | 11/2011 |
| WO | 2007/094473 A1 | 8/2007 |

OTHER PUBLICATIONS

Notice of Reasons for Rejection, mailed Aug. 20, 2013, issued in corresponding JP Application No. 2012-075045, 10 pages in English and Japanese.

* cited by examiner

*Primary Examiner* — John Chu
(74) *Attorney, Agent, or Firm* — Sughrue Mion, PLLC

(57) ABSTRACT

The actinic ray-sensitive or radiation-sensitive resin composition of the present invention contains (A) a resin capable of increasing the solubility in an alkaline developer by the action of an acid, and (C) at least one compound selected from the group of compounds represented by the following formula (ZI-3), (ZI-4) or (ZI-5) and capable of generating an acid upon irradiation of actinic rays or radiation, wherein the resin (A) contains at least one repeating unit having a group capable of decomposing by the action of an acid to leave a leaving group having a ring structure, and the leaving group having a ring structure has at least one of a polar group as a substituent and a polar atom as a part of the ring structure, and a compound derived from the leaving group having a ring structure has a logP value of not less than 0 and less than 2.8.

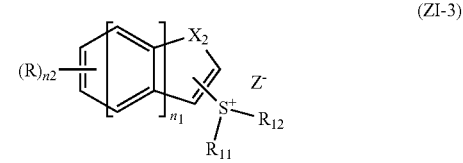

(ZI-3)

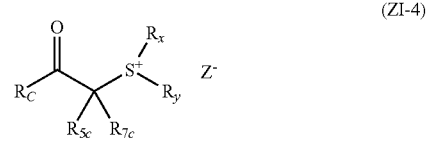

(ZI-4)

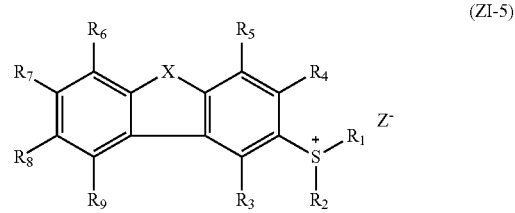

(ZI-5)

13 Claims, No Drawings

ACTINIC RAY-SENSITIVE OR RADIATION-SENSITIVE RESIN COMPOSITION, AND ACTINIC RAY-SENSITIVE OR RADIATION-SENSITIVE FILM AND PATTERN FORMING METHOD USING THE SAME COMPOSITION

BACKGROUND OF THE INVENTION

1. Field of the Invention

The present invention relates to an actinic ray-sensitive or radiation-sensitive resin composition, and an actinic ray-sensitive or radiation-sensitive film and a pattern forming method each using the same. More specifically, the present invention relates to an actinic ray-sensitive or radiation-sensitive resin composition suitably used for the ultramicrolithography process applicable to the production process of VLSI and a high-capacity microchip, the preparation process of a nanoimprint mold, the production process of a high-density information recording medium, and the like, and for other photofabrication processes, and an actinic ray-sensitive or radiation-sensitive film and a pattern forming method each using the same. In particular, the invention relates to an actinic ray-sensitive or radiation-sensitive resin composition suitable for exposure by an immersion projection exposure apparatus with far ultraviolet rays of the wavelength of 300 nm or less as a light source, and an actinic ray-sensitive or radiation-sensitive film and a pattern forming method each using the same.

As used herein, the term "actinic ray" or "radiation" refers to, for example, a bright line spectrum of a mercury lamp, far ultraviolet rays typified by an excimer laser, extreme-ultraviolet (EUV) rays, X-rays or an electron beam (EB). Also, the term "light" as used herein means actinic rays or radiation.

Unless otherwise specifically indicated, the term "exposure" as used herein includes not only irradiation of light by a mercury lamp, far ultraviolet rays, X-rays, EUV light or the like but also lithography with a particle beam such as electron beam or ion beam.

2. Description of the Related Art

A chemical amplification type resist composition is a pattern formation material which is capable of forming a pattern on a substrate by generating an acid in the exposed area upon irradiation of radiation, for example, far ultraviolet rays, and making a difference in the solubility in a developer between the unirradiated area and the irradiated area, through a reaction using the generated acid as a catalyst.

When a KrF excimer laser is used as a light source for exposure, the chemical amplification type resist composition is mainly composed of a resist resin having as a basic skeleton, poly(hydroxystyrene) that has a weak absorption in a wavelength region of 248 nm. Therefore, such a composition is a favorable system capable of forming a good-quality pattern with high sensitivity and high resolution, as compared to the conventional naphthoquinone-diazide/novolak resin system.

On the other hand, when a light source having a shorter wavelength, for example, an ArF excimer laser (193 nm) is used for exposure, the chemical amplification type resist composition mentioned above is not satisfactory since an aromatic group-containing compound used in the composition intrinsically shows strong absorption at a wavelength region of 193 nm.

In order to address such a problem, through replacement with a resin having poly(hydroxystyrene) as a basic skeleton, a resist composition for use with an ArF excimer laser, containing a resin having an alicyclic hydrocarbon structure as a main component, has been developed. For example, there is a resist composition using an acid-decomposable resin formed by copolymerization of hydrophilic units containing an ether bond as an acid-decomposable group (for example, WO2007/094473A and JP2010-102033A).

However, it is extremely difficult to find an appropriate combination of a resin, an acid generator, an additive, a solvent and the like to be employed, from the viewpoint of overall performance of the resist, and these resist compositions have problems to be solved in terms of improving a roughness property and inhibiting pattern collapse.

SUMMARY OF THE INVENTION

It is an object of the present invention to provide an actinic ray-sensitive or radiation-sensitive resin composition which is capable of achieving improvement in terms of a roughness property and pattern collapse, and an actinic ray-sensitive or radiation-sensitive film and a pattern forming method each using the same.

That is, the actinic ray-sensitive or radiation-sensitive resin composition of the present invention which is capable of solving the above-mentioned problems contains (A) a resin capable of increasing the solubility in an alkaline developer by the action of an acid, and (C) at least one selected from the group of compounds represented by the following formula (ZI-3), (ZI-4) or (ZI-5) and capable of generating an acid upon irradiation of actinic rays or radiation, wherein the resin (A) contains at least one repeating unit (a) having a group capable of decomposing by the action of an acid to leave a leaving group having a ring structure, and the leaving group having a ring structure has at least one of a polar group as a substituent and a polar atom as a part of the ring structure, and a compound derived from the leaving group having a ring structure has a logP value of not less than 0 and less than 2.8.

Here, P represents the octanol/water partition coefficient.

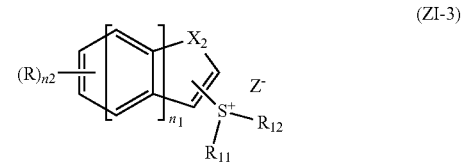

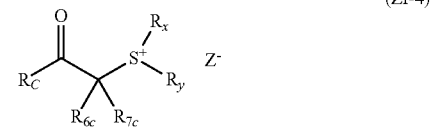

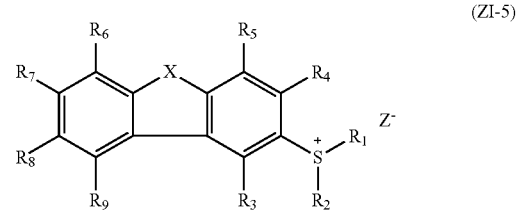

In formula (ZI-3), $X_2$ represents $-CR_{21}=CR_{22}-$, $-NR_{23}-$, $-S-$ or $-O-$. $R_{21}$ to $R_{23}$ each independently represent a hydrogen atom, an alkyl group, a cycloalkyl group, an alkoxy group, or an aryl group.

$R_{11}$ and $R_{12}$ each independently represent an organic group. $R_{11}$ and $R_{12}$ may combine with each other to form a ring.

R represents a substituent.

$n_1$ represents an integer of 0 to 3, and $n_2$ represents an integer of 0 or more. In a case where $R_{11}$ and $R_{12}$ represent a phenyl group, $n_1$ represents an integer of 1 or more.

$Z^-$ represents a non-nucleophilic anion.

In formula (ZI-4), $R_c$ represents an aryl group.

$R_{6c}$ and $R_{7c}$ each independently represent a hydrogen atom, an alkyl group, a cycloalkyl group, a halogen atom, a cyano group or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group or a vinyl group.

$R_{6c}$ and $R_{7c}$, and $R_x$ and $R_y$ each may combine with each other to form a ring structure, and the ring structure may contain an oxygen atom, a sulfur atom, an ester bond, or an amide bond.

$Z^-$ represents a non-nucleophilic anion.

In formula (ZI-5),

X represents an oxygen atom, a sulfur atom or —N(Rx)-. Rx represents a hydrogen atom, an alkyl group, a cycloalkyl group, an acyl group, an alkenyl group, an alkoxycarbonyl group, an aryl group, an arylcarbonyl group or an aryloxycarbonyl group.

$R_1$ and $R_2$ each independently represent an alkyl group, a cycloalkyl group or an aryl group.

$R_3$ to $R_9$ each independently represent a hydrogen atom, an alkyl group, a cycloalkyl group, an alkoxy group, an alkoxycarbonyl group, an acyl group, an alkylcarbonyloxy group, an aryl group, an aryloxy group, an aryloxycarbonyl group or an arylcarbonyloxy group.

$R_1$ and $R_2$ may combine with each other to form a ring. Two or more members out of $R_6$ to $R_9$, $R_3$ and $R_9$, $R_4$ and $R_5$, $R_5$ and Rx, and $R_6$ and Rx each may combine with each other to form a ring.

$Z^-$ represents a non-nucleophilic anion.

In the present invention, preferred embodiments are an embodiment in which the polar atom is at least one of an oxygen atom and a sulfur atom, and the polar group is a group containing at least one of an oxygen atom and a sulfur atom, an embodiment in which the polar atom is at least one of an oxygen atom and a sulfur atom, and the ring structure contains at least one of an ether bond and a thioether bond, and an embodiment in which the polar atom is an oxygen atom and the ring structure contains an ether bond.

Further, in the present invention, preferred embodiments are also an embodiment in which the polar atom is at least one of an oxygen atom and a sulfur atom, and the ring structure contains at least one of a carbonyl group and a thiocarbonyl group, and an embodiment in which the polar atom is an oxygen atom and the ring structure contains a carbonyl group.

Further, in the present invention, a preferred embodiment is also an embodiment in which the repeating unit (a) is represented by the following formula (I).

$$\text{(I)}$$

In formula (I), $R_1$ represents an atom or group selected from a hydrogen atom, an alkyl group, a halogen atom, a cyano group and an alkyloxycarbonyl group.

$R_2$ represents an alkyl group or a cycloalkyl group.

$R_3$ represents a monovalent substituent.

W represents an alkylene group or a cycloalkylene group.

X represents an oxygen atom or a sulfur atom, and the X-containing ring represents a ring structure containing an ether bond or a thioether bond.

l and n each independently represent an integer of 0 or more. In a case where n is 2 or more, each of a plurality of $R_3$'s is independent from every other $R_3$ and may combine with each other to form a ring.

Further, in the present invention, a preferred embodiment is an embodiment in which the repeating unit (a) represented by formula (I) is represented by the following formula (I').

$$\text{(I')}$$

In formula (I'), $R_1$ represents an atom or group selected from a hydrogen atom, an alkyl group, a halogen atom, a cyano group and an alkyloxycarbonyl group.

$R_2$ represents an alkyl group or a cycloalkyl group.

$R_3$ represents a monovalent substituent.

W represents an alkylene group or a cycloalkylene group.

X represents an oxygen atom or a sulfur atom, and the X-containing ring represents a ring structure containing an ether bond or a thioether bond.

l and n each independently represent an integer of 0 or more. When n is 2 or more, each of a plurality of $R_3$'s is independent from every other $R_3$ and may combine with each other to form a ring.

Further, in the present invention, a preferred embodiment is also an embodiment in which X in formula (I) represents an oxygen atom or an embodiment in which the repeating unit (a) is represented by at least one of the following formulae (II) and (III).

$$\text{(II)}$$

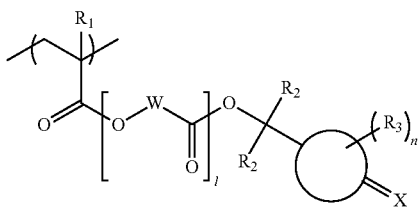

(III)

In formulae (II) and (III),

R₁ represents an atom or group selected from a hydrogen atom, an alkyl group, a halogen atom, a cyano group and an alkyloxycarbonyl group.

R₂ represents an alkyl group or a cycloalkyl group. In a case where two R₂'s are present, each R₂ independently represents an alkyl group or a cycloalkyl group. R₃ represents a monovalent substituent.

W represents an alkylene group or a cycloalkylene group.

X represents an oxygen atom or a sulfur atom, and the X-containing ring represents a ring structure containing a carbonyl group or a thiocarbonyl group.

l and n each independently represent an integer of 0 or more. In a case where n is 2 or more, each of a plurality of R₃'s is independent from every other R₃ and may combine with each other to form a ring.

In the present invention, a preferred embodiment is also an embodiment in which X in at least one of formulae (II) and (III) represents an oxygen atom.

Preferred embodiments are also an embodiment in which the composition of the present invention further contains (B) a resin containing a repeating unit having at least one of a fluorine atom and a silicon atom, and different from the resin (A), an embodiment in which the resin (A) further contains a repeating unit having a lactone structure, and an embodiment in which the resin (A) further contains a repeating unit having a group capable of decomposing by the action of an acid other than the repeating unit (a) having a group capable of decomposing by the action of an acid.

The present invention also includes an actinic ray-sensitive or radiation-sensitive film formed using the foregoing composition.

Further, the present invention also includes a pattern forming method which includes forming a film using the foregoing composition, exposing the formed film and developing the exposed film.

In the present invention, the exposure is preferably carried out using an immersion liquid.

The present invention is capable of providing an actinic ray-sensitive or radiation-sensitive resin composition which is capable of achieving improvement in terms of line edge roughness and pattern collapse, and an actinic ray-sensitive or radiation-sensitive film and a pattern forming method each using the same.

DESCRIPTION OF THE PREFERRED EMBODIMENTS

Hereinafter, embodiments of the present invention will be described.

In the description of the present invention, when a group and an atomic group are denoted without specifying whether substituted or unsubstituted, the group or atomic group includes both a group or atomic group having no substituent and a group or atomic group having a substituent. For example, "an alkyl group" without specifying whether substituted or unsubstituted includes not only an alkyl group having no substituent (unsubstituted alkyl group) but also an alkyl group having a substituent (substituted alkyl group).

<Resin Capable of Increasing Solubility in an Alkaline Developer by the Action of an Acid>

A resin capable of increasing the solubility in an alkaline developer by the action of an acid (hereinafter, also referred to as "resin (A)"), which is contained in the actinic ray-sensitive or radiation-sensitive resin composition in accordance with the present invention, contains a repeating unit having a group capable of decomposing by the action of an acid (specifically, a group capable of decomposing by the action of an acid to leave a leaving group having a ring structure; hereinafter, also referred to as "acid-decomposable group"). The resin (A) at least contains a repeating unit (a) to be described below as a repeating unit having such an acid-decomposable group.

That is, the acid-decomposable group contained in the repeating unit (a) has a moiety capable of decomposing and leaving by the action of an acid (specifically, a leaving group having a ring structure therein; hereinafter, also referred to as "acid-leaving group"). The ring structure in the acid-leaving group contains a polar group as a substituent and/or a polar atom as a part of the ring structure. Further, a compound produced from decomposition of an acid-decomposable group to leave the acid-leaving group (specifically, a compound derived from a leaving group having a ring structure therein; hereinafter, also referred to as "acid decomposition-leaving product") has a logP value of 0 or more and less than 2.8.

Hereinafter, the acid-decomposable repeating unit (a) of the present invention will be described in more detail.

The acid-decomposable group is a group capable of decomposing by the action of an acid generated upon irradiation of actinic rays or radiation to a composition and therefore capable of producing an alkali-soluble group in a repeating unit.

Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkyl sulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

The alkali-soluble group is preferably a carboxyl group, a fluorinated alcohol group (preferably a hexafluoroisopropanol) or a sulfonic acid group. Among them, a carboxyl group is preferred.

The acid-decomposable group is preferably a group formed by substituting an acid-leaving group for a hydrogen atom of the alkali-soluble group above.

The acid-leaving group, as described above, contains a ring structure having a polar atom or a polar group, and the acid decomposition-leaving product detached and produced from an acid-decomposable group has a logP value of 0 or more and less than 2.8. The polar atom or polar group may be contained in a ring structure or may be added as a substituent to the ring structure.

The ring structure may be a monocyclic structure or a polycyclic structure and examples thereof include a tetrahydrofuran structure, a tetrahydropyran structure, an oxepane structure, an octahydrobenzopyran structure, a tetrahydrothiophene structure, a tetrahydrothiopyran structure, a cyclohexanone structure, and a cyclopentanone structure.

Examples of the polar atom include an oxygen atom and a sulfur atom, and examples of the polar group include a hydroxyl group, a cyano group, a ketone group, a nitro group, a mercapto group, and an alkylthio group. The polar atom is preferably an oxygen atom or a sulfur atom. As for the ring structure having a polar atom and/or a polar group, for example, preferred is a structure which contains an ether bond and/or thioether bond in a ring structure and more preferred is a structure which contains an ether bond in a ring structure. In another embodiment, preferred is a structure which contains a carbonyl group and/or a thiocarbonyl group in a ring structure and more preferred is a structure which contains a carbonyl group in a ring structure. However, a lactone structure is not included in the ether bond-containing ring structure and the carbonyl group-containing ring structure. In other words, an —O— structure and a —C(=O)— structure that an ester bond in a cyclic ester has are not regarded as an ether bond and a carbonyl bond in the present invention.

As described hereinbefore, the acid-decomposable group decomposes by the action of an acid to produce an alkali-soluble group in a repeating unit and simultaneously an acid-leaving group leaves to form an acid decomposition-leaving product. Here, a structural example of the acid decomposition-leaving product is shown as follows, by means of formula (I) given below. Individual symbols have the same meanings as the corresponding groups in formula (I) illustrated later, respectively.

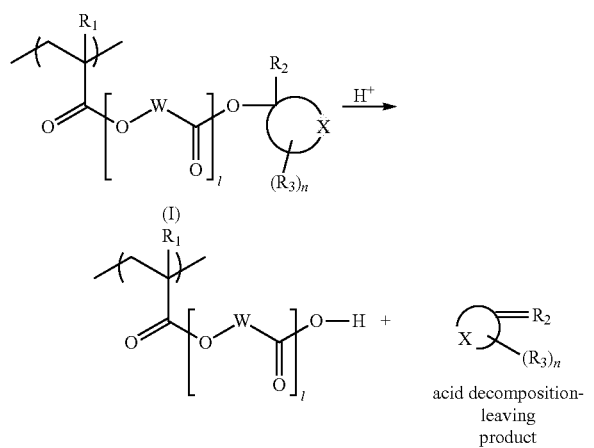

(I)

acid decomposition-leaving product

In the present invention, the acid decomposition-leaving product has a logP value of 0 or more and less than 2.8, preferably 0.2 or more and less than 2.5, and more preferably 0.3 or more and less than 2.3. By virtue of setting the logP value to be 0 or more and less than 2.8, a pattern improved in terms of the line edge roughness and having excellent pattern collapse performance may be obtained. The reason therefor is not clearly known, but it is presumed that due to having a logP value in the above-specified range, and the leaving region having a polar part, affinity of a resist film for a developer is increased and development proceeds more uniformly and smoothly to inhibit swelling. When a logP value is less than 0, since affinity of a resist film for a developer is too high, excessive dissolution of the unexposed area in a developer takes place, which may lead to lowering of a difference in the dissolution rate in a developer between the exposed area and the unexposed area. When a logP value is 2.8 or more, since affinity of a resist film for a developer is decreased, the unexposed area may be susceptible to swelling during a development process. Accordingly, the above-specified range of a logP value is believed to be an optimal range.

Here, the logP value is a logarithm of octanol/water partition coefficient and is known as an important parameter indicative of the hydrophilicity/hydrophobicity of a molecule. The methods for determining the logP value of a compound are roughly classified into methods of actually measuring the value by experiment and methods of determining the value by computation.

The calculation method of the logP value is described below. In the case of actually measuring the logP value, the value can be actually measured and determined by the method described in the publication below. Also, in the case of calculating the logP value by computation, the logP value calculated by computation (referred to as CLogP value) can be determined by computation using the fragment method described in the publication below or using the following commercially available software package 1 or 2. In the context of the present invention, this CLogP value is used whenever the logP value is discussed, and the numerical value of logP value described in the specification is a numerical value of "CLogP value" computed using the following software package 2.

Publication: C. Hansch and A. Leo, Substituent Constants for Correlation Analysis in Chemistry and Biology (John Wiley & Sons, New York (1969)

Software package 1: MedChem Software (Release 3.54, August 1991, Medicinal Chemistry Project, Pomona College, Claremont, Calif.)

Software package 2: Chem Draw Ultra ver. 12.0 (CambridgeSoft Corporation, USA)

Preferred examples of the acid decomposition-leaving product having a logP value of 0 or more and less than 2.8 are given below, but the present invention is not limited thereto.

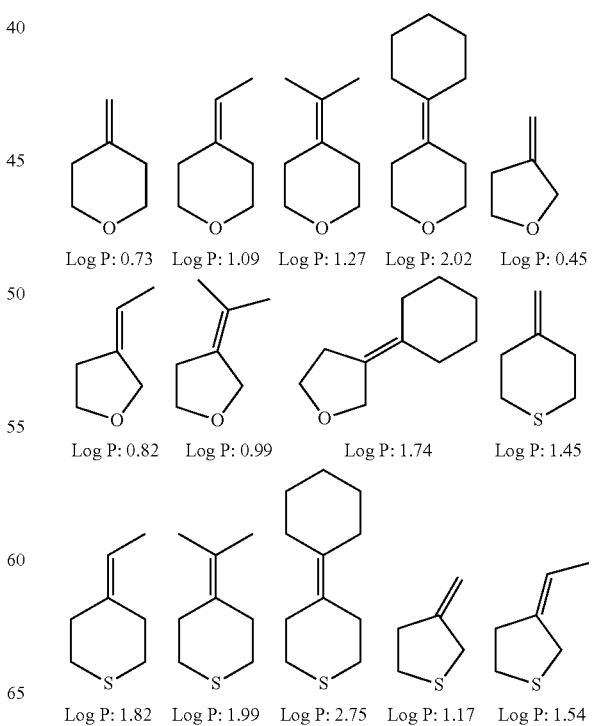

-continued

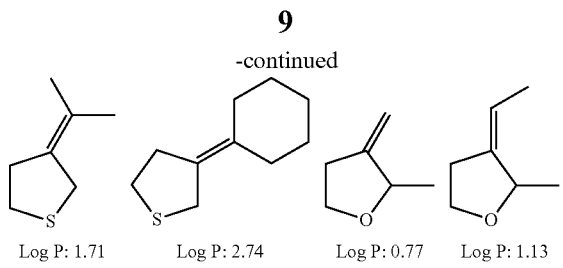

Log P: 1.71    Log P: 2.74    Log P: 0.77    Log P: 1.13

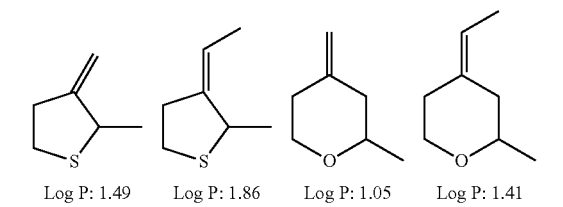

Log P: 1.49    Log P: 1.86    Log P: 1.05    Log P: 1.41

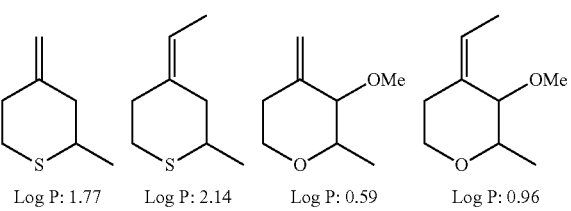

Log P: 1.77    Log P: 2.14    Log P: 0.59    Log P: 0.96

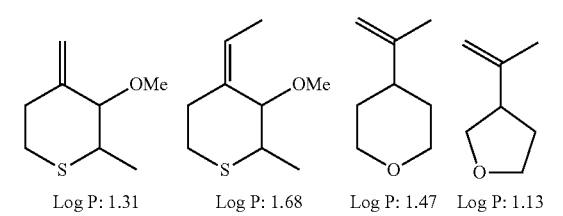

Log P: 1.31    Log P: 1.68    Log P: 1.47    Log P: 1.13

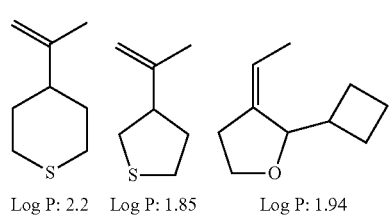

Log P: 2.2    Log P: 1.85    Log P: 1.94

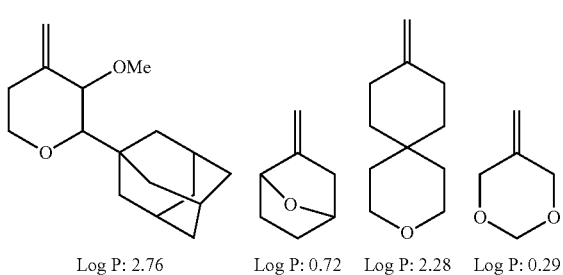

Log P: 2.76    Log P: 0.72    Log P: 2.28    Log P: 0.29

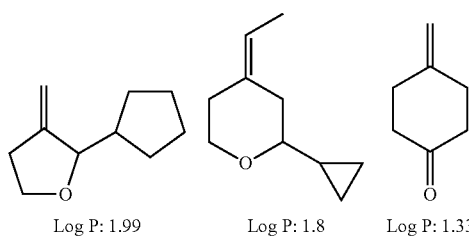

Log P: 1.99    Log P: 1.8    Log P: 1.33

-continued

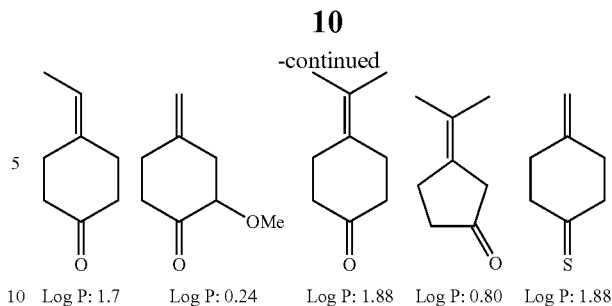

Log P: 1.7    Log P: 0.24    Log P: 1.88    Log P: 0.80    Log P: 1.88

In a preferred embodiment of the present invention, the repeating unit (a) is represented by the following formula (I).

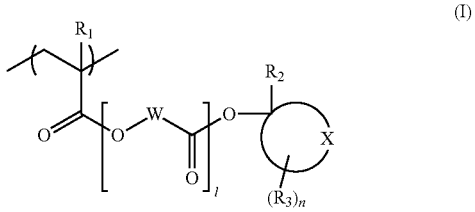

(I)

In formula (I),
$R_1$ represents an atom or group selected from a hydrogen atom, an alkyl group, a halogen atom, a cyano group and an alkyloxycarbonyl group.
$R_2$ represents an alkyl group or a cycloalkyl group.
$R_3$ represents a monovalent substituent.
W represents an alkylene group or a cycloalkylene group.
X represents an oxygen atom or a sulfur atom, and the X-containing ring represents a ring structure containing an ether bond or a thioether bond.
l and n each independently represent an integer of 0 or more. When n is 2 or more, each of a plurality of $R_3$'s is independent from every other $R_3$ and may combine with each other to form a ring.

The repeating unit represented by formula (I) decomposes by the action of an acid to form an acid decomposition-leaving product having a logP value of 0 or more and less than 2.8 as given below.

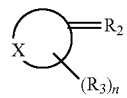

The use of resin (A) having the repeating unit represented by formula (I) is capable of rendering line edge roughness favorable and improving pattern collapse.

Formula (I) will be described in more detail.

Examples of the alkyl group in $R_1$ include a methyl group, an ethyl group, a propyl group, an isopropyl group, an n-butyl group, an isobutyl group, a t-butyl group, a pentyl group, a cyclopentyl group, a hexyl group, a cyclohexyl group, an octyl group, and a dodecyl group. A linear or branched alkyl group having 1 to 20 carbon atoms is preferred. These groups may have a substituent, and preferred examples of the substituent include an alkoxy group, a hydroxyl group, a halogen atom, a nitro group, an acyl group, an acyloxy group, an acylamino group, a sulfonylamino group, an alkylthio group, and a heterocyclic residue such as an arylthio group, an aralkylthio group, a thiophenecarbonyloxy group, a thiophenemethylcarbonyloxy group, or a pyrrolidone residue. The alkyl group having a substituent is preferably a $CF_3$ group, an alkyloxycarbonylmethyl group, an alkylcarbonyloxymethyl group, a hydroxymethyl group, an alkoxymethyl group, or the like.

Examples of the halogen atom in $R_1$ include a fluorine atom, a chlorine atom, a bromine atom and an iodine atom. A fluorine atom is preferred.

Examples of alkyl contained in the alkyloxycarbonyl group in $R_1$ are the same as examples of the alkyl group in $R_1$.

The alkylene group in W may be linear or branched and examples thereof include a linear alkylene group having 1 to 10 carbon atoms and a branched alkylene group having 3 to 10 carbon atoms.

Specific examples of the linear alkylene group having 1 to 10 carbon atoms include a methylene group, an ethylene group [—$(CH_2)_2$—], a trimethylene group [—$(CH_2)_3$—], a tetramethylene group [—$(CH_2)_4$—], and a pentamethylene group [—$(CH_2)_5$—].

Specific examples of the branched alkylene group having 3 to 10 carbon atoms of W include alkylalkylene groups, including an alkylmethylene group such as —$C(CH_3)_2$—, —$CH(CH_2CH_3)$—, —$C(CH_3)(CH_2CH_3)$—, —$C(CH_3)(CH_2CH_2CH_3)$— or —$C(CH_2CH_3)_2$—; an alkyl ethylene group such as —$CH(CH_3)CH_2$—, —$CH(CH_3)CH(CH_3)$—, —$C(CH_3)_2CH_2$—, —$CH(CH_2CH_3)CH_2$— or —$CH_2CH(CH_2CH_3)$—; an alkyltrimethylene group such as —$CH(CH_3)CH_2CH_2$—, —$CH_2CH(CH_3)CH_2$— or —$CH_2CH_2CH(CH_3)$—; and an alkyltetramethylene group such as —$CH(CH_3)CH_2CH_2CH_2$—, —$CH_2CH(CH_3)CH_2CH_2$—, —$CH_2CH_2CH(CH_3)CH_2$— or —$CH_2CH_2CH_2CH(CH_3)$—.

The cycloalkylene group in W may be, for example, a cyclic alkylene group having 3 to 10 carbon atoms. Specific examples thereof include a group formed by removing two or more hydrogen atoms from a monocycloalkane; and a group formed by removing two or more hydrogen atoms from a polycycloalkane such as a bicycloalkane, a tricycloalkane or a tetracycloalkane. More specific examples thereof include a group formed by removing two or more hydrogen atoms from a monocycloalkane such as cyclopentane or cyclohexane; and a group formed by removing two or more hydrogen atoms from a polycycloalkane such as adamantane, norbornane, isobornane or tricyclodecane.

The alkyl group in $R_2$ may be linear or branched and examples thereof include a linear alkyl group having 1 to 6 carbon atoms, and a branched alkyl group having 3 to 6 carbon atoms.

Specific examples of the linear alkyl group having 1 to 6 carbon atoms include a methyl group, an ethyl group, a propyl group, an n-butyl group, an n-pentyl group, and an n-hexyl group. Among these, a methyl group or an ethyl group is preferred, and a methyl group is more preferred.

Specific examples of the branched alkyl group having 3 to 6 carbon atoms of $R_2$ include an alkylmethyl group such as —$CH(CH_3)_2$, —$C(CH_3)_3$, —$CH(CH_3)(CH_2CH_3)$, —$CH(CH_3)(CH_2CH_2CH_3)$ or —$CH(CH_2CH_3)_2$; and an alkylethyl group such as —$CH_2CH(CH_3)_2$, —$CH_2CH(CH_3)(CH_2CH_3)$, —$CH_2CH(CH_3)(CH_2CH_2CH_3)$ or —$CH_2CH(CH_2CH_3)_2$.

The cycloalkyl group in $R_2$ may be, for example, a cyclic alkyl group having 3 to 6 carbon atoms, and specific examples thereof include a group formed by removing one or more hydrogen atoms from a monocycloalkane such as cyclobutane, cyclopentane or cyclohexane.

The X-containing ring represents a ring structure containing an ether bond or a thioether bond, and the ring may be monocyclic or polycyclic and examples thereof include a tetrahydrofuran structure, a tetrahydropyran structure, an oxepane structure, an octahydrobenzopyran structure, a tetrahydrothiophene structure, and a tetrahydrothiopyran structure. The X-containing ring is preferably a 4- to 10-membered ring, more preferably a 4- to 8-membered ring, and most preferably 5- or 6-membered ring.

X is more preferably an oxygen atom.

Incidentally, as mentioned hereinbefore, the ether bond-containing ring structure as the X-containing ring does not encompass a lactone structure. That is, an —O— structure that an ester bond in a cyclic ester has is not regarded as an ether bond in the present invention.

The repeating unit represented by formula (I) is acid-decomposable, and for the sake of being acid-decomposable, when $R_3$ is present, the substituent represented by $R_3$ is preferably other than an F atom. More preferred is an electron-donating substituent. Herein, the electron-donating group means a substituent of which the Hammett constant (Hammett substituent constant σ) is 0 or less. In the present invention, from the viewpoint of enhancement of sensitivity, the Hammett constant of the substituent is preferably −0.1 or less. In addition, the Hammett constant does not have an upper limit from the viewpoint of enhancement of sensitivity. However, from the viewpoint of reactivity and stability, the Hammett constant is more preferably in the range of from −0.5 to −0.1 and even more preferably from −0.3 to −0.1.

The Hammett constant in the present invention represents numerical values (here, values at the p-position) determined based on the equation (2.6) described in page 20 of Chemistry Seminar 10 Hammett Rule-Structure and Reactivity, edited by Naoki Inamoto (published by Maruzen Co., Ltd., 1983). However, the Hammett constants of a methyl group and a methoxy group specified with respect to specific examples described later are values described, in an appendix at the end of the above book, with statistical correction being made to the values.

Examples of the monovalent substituent represented by $R_3$ include an alkyl group, a cycloalkyl group, an alkoxy group, an acyl group, and an ester group.

The alkyl group may be linear or branched and examples thereof include a linear alkyl group having 1 to 6 carbon atoms and a branched alkyl group having 3 to 6 carbon atoms. Examples of the cycloalkyl group include a cyclic alkyl group having 3 to 6 carbon atoms. The linear alkyl group having 1 to 6 carbon atoms, the branched alkyl group having 3 to 6 carbon atoms, or the cyclic alkyl group having 3 to 6 carbon atoms are the same as those described for $R_2$.

Examples of alkyl contained in an alkoxy group are the same as examples of the alkyl group in $R_1$.

Examples of the acyl group include aliphatic acyl groups having 1 to 6 carbon atoms such as a formyl group, an acetyl group, a propionyl group, a butyryl group, an isobutyryl group, a valeryl group, and a pivaloyl group.

Examples of the ester group include ester groups having 1 to 4 carbon atoms.

Use of the groups represented by $R_3$ is capable of improving sensitivity.

l is a repetition number and represents an integer of 0 or more. l is preferably from 0 to 5, more preferably from 0 to 3, and most preferably 0.

n is a repetition number and represents an integer of 0 or more. n is preferably from 0 to 5, particularly preferably from 0 to 3, and most preferably from 0 or 1.

When n is 2 or more, each of a plurality of $R_3$'s is independent from every other $R_3$ and may combine with each other to form a ring.

The repeating unit represented by formula (I) preferably does not have a fluorine atom, from the viewpoint of compatibility with alkaline developer and uneven distribution of a hydrophobic resin (B) described later.

The repeating unit represented by formula (I) is preferably represented by the following formula (I').

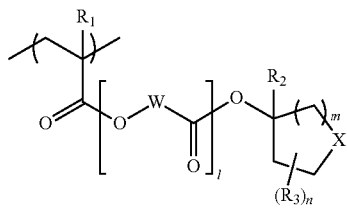

(I')

In formula (I'), m is a repetition number and represents an integer of 1 or more. m is preferably from 1 to 9, more preferably from 1 to 7, and most preferably from 1 or 2.

$R_1$, $R_2$, $R_3$, W, X, l and n have the same meanings as those in formula (I), respectively.

In preferred another embodiment of the present invention, the repeating unit (a) is represented by the following formula (II) and/or (III).

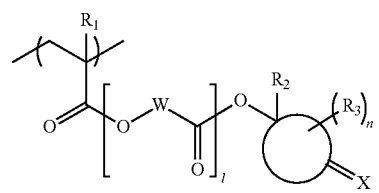

(II)

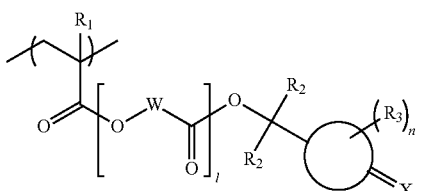

(III)

In formulae (II) and (III), $R_1$ represents an atom or group selected from a hydrogen atom, an alkyl group, a halogen atom, a cyano group and an alkyloxycarbonyl group.

$R_2$ represents an alkyl group or a cycloalkyl group. When two $R_2$'s are present, each $R_2$ independently represents an alkyl group or a cycloalkyl group.

$R_3$ represents a monovalent substituent.

W represents an alkylene group or a cycloalkylene group.

X represents an oxygen atom or a sulfur atom, and the X-containing ring represents a ring structure containing a carbonyl group or a thiocarbonyl group.

l and n each independently represent an integer of 0 or more. When n is 2 or more, each of a plurality of $R_3$'s is independent from every other $R_3$ and may combine with each other to form a ring.

The repeating units represented by formulae (II) and (III) decompose by the action of an acid to form an acid decomposition-leaving product having a logP value of 0 or more and less than 2.8 as given below.

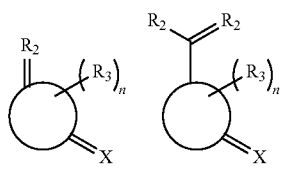

The use of resin (A) having at least one of the repeating units represented by formula (II) and/or (III) is capable of rendering line edge roughness favorable and improving pattern collapse.

The X-containing ring represents a ring structure containing a carbonyl group or a thiocarbonyl group, and the ring may be monocyclic or polycyclic and examples thereof include a cyclohexanone structure and an adamantanone structure. The X-containing ring is preferably a 4 to 12-membered ring, more preferably a 5 to 8-membered ring, and most preferably a 5 to 6-membered ring.

X is more preferably an oxygen atom.

Incidentally, as mentioned hereinbefore, the carbonyl group-containing ring structure as the X-containing ring does not encompass a lactone structure.

Specific examples of the groups represented by $R_1$, $R_2$, $R_3$ and W in formulae (II) and (III) are the same as specific examples of the corresponding groups in formula (I). In addition, preferred ranges of l and n in formulae (II) and (III) are also the same as preferred ranges of l and n in formula (I).

Hereinafter, specific examples of the repeating unit (a) are shown, but the present invention is not limited thereto. In the following formula, $R_1$ has the same meanings as $R_1$ in formulae (I), (II) and (III).

In the following specific examples, all of the acid decomposition-leaving products detached and produced from an acid-decomposable group have a logP value of 0 or more and less than 2.8. Hammett constants of a methyl group and a methoxy group in the present invention are respectively −0.17 and −0.27, and all of a cyclopropyl group, a cyclobutyl group, a cyclopentyl group, a cyclohexyl group, and an adamantyl group have a Hammett constant of 0 or less.

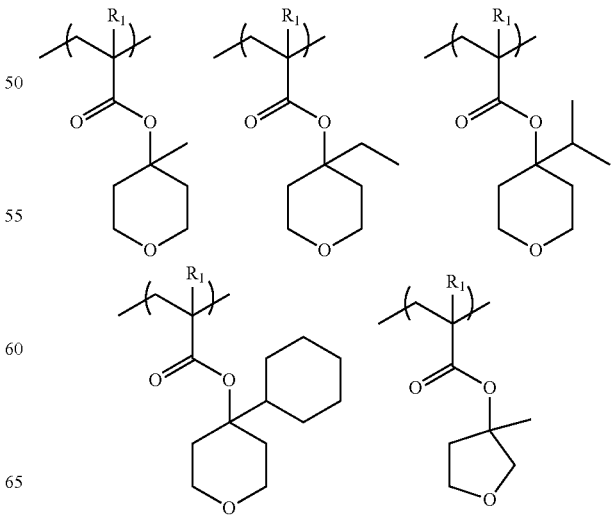

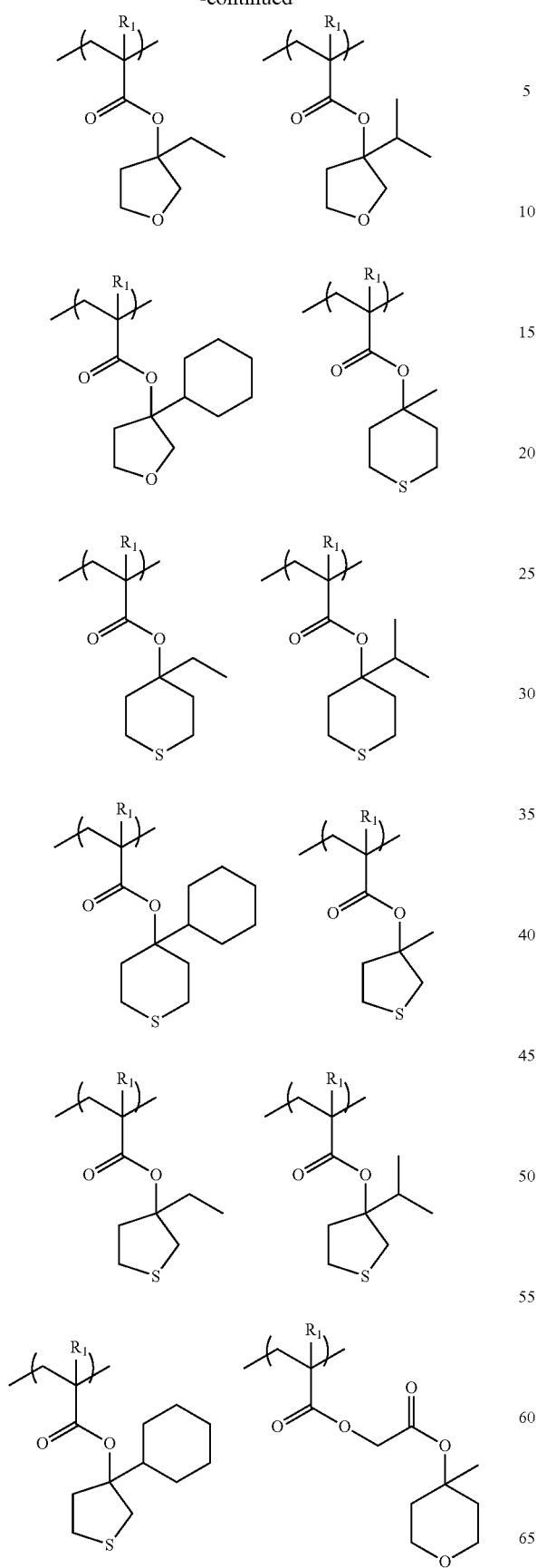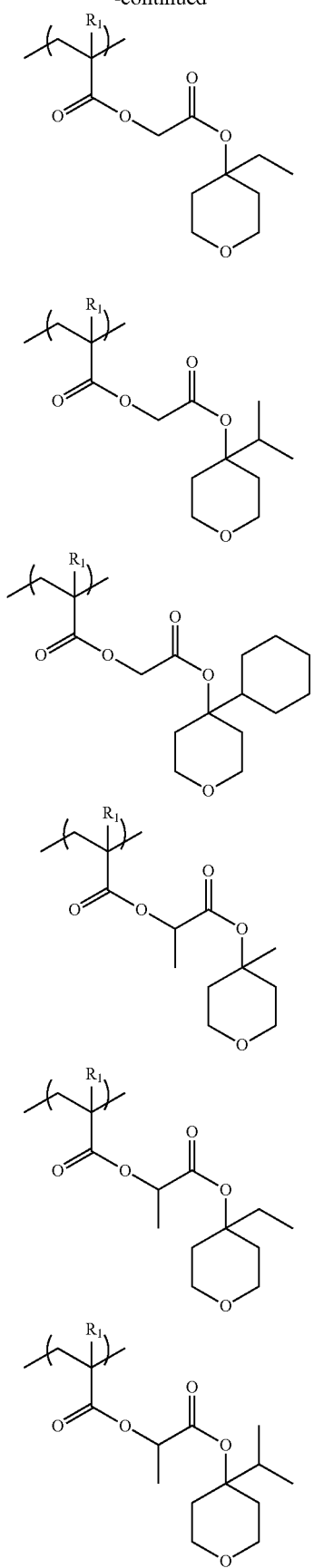

-continued
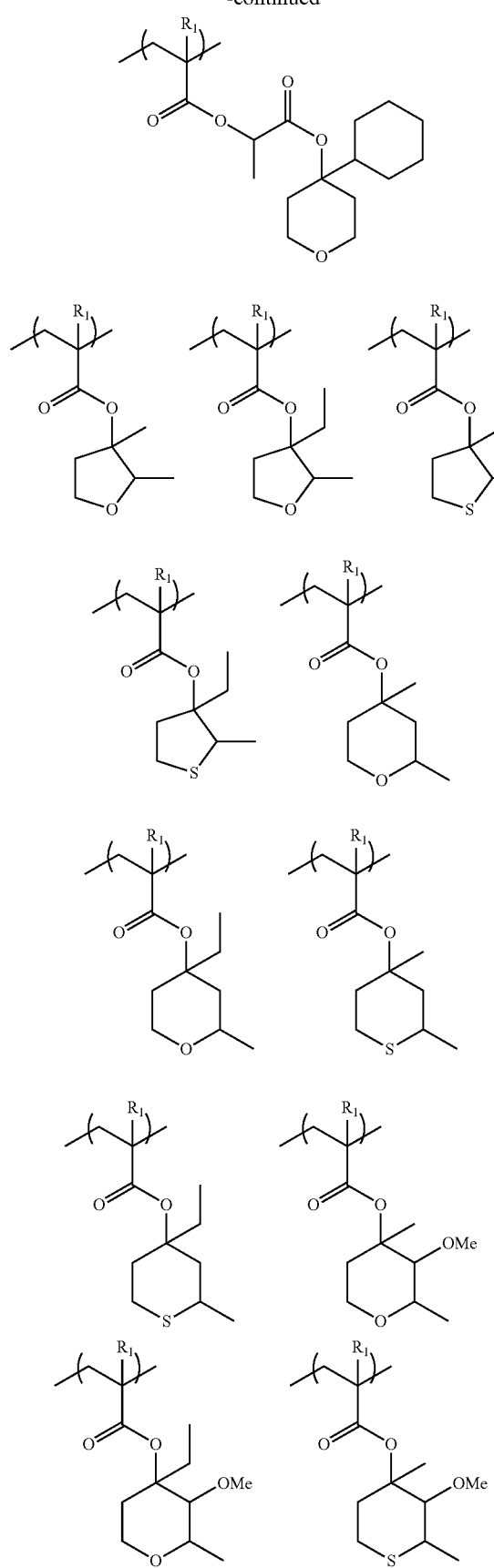
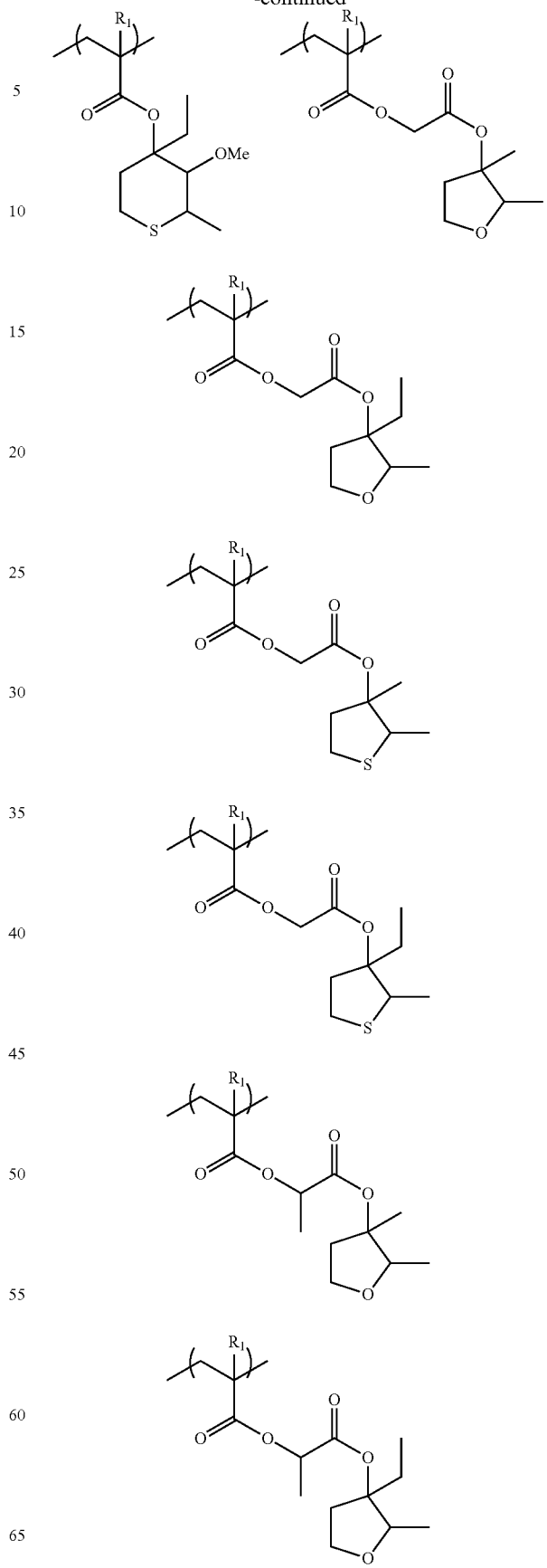

-continued
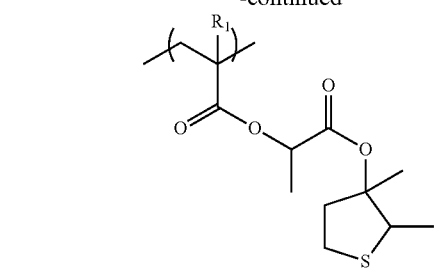 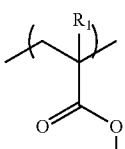
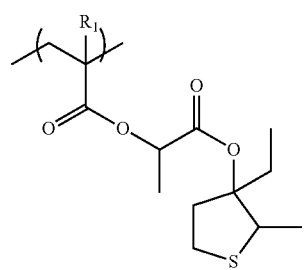 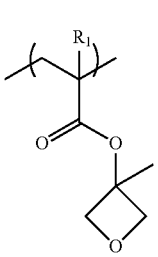
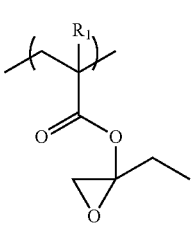 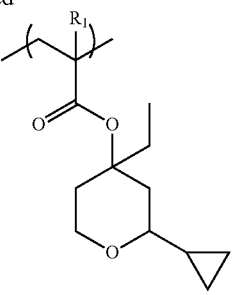
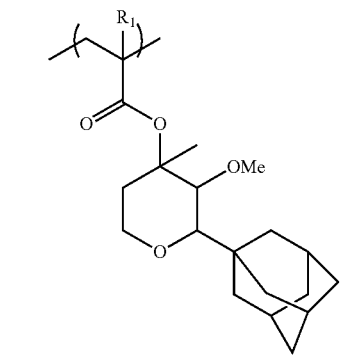
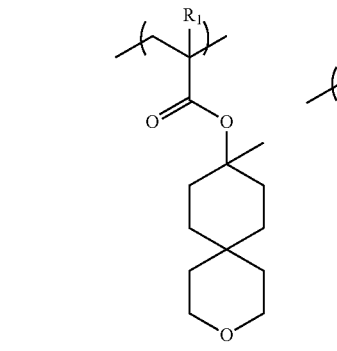
-continued
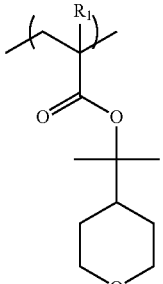 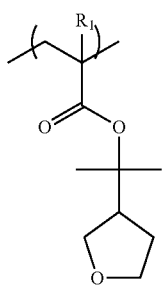 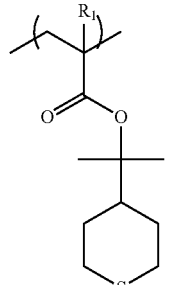
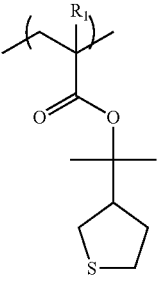 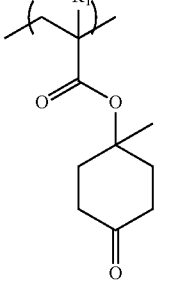 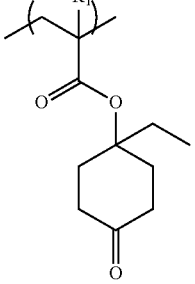
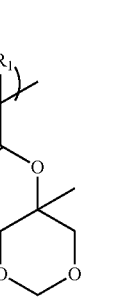 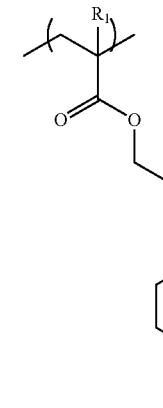 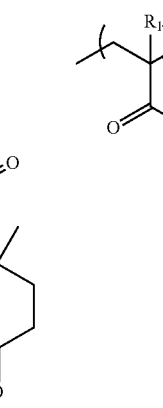 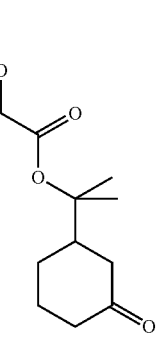

-continued

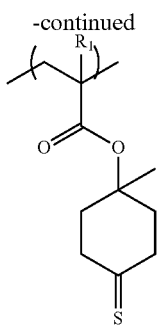

The content of the acid-decomposable repeating unit represented by formula (I) is preferably from 5 to 50 mol %, and more preferably from 10 to 40 mol %, based on all repeating units in the resin (A). Further, the resin (A) may contain two or more kinds of acid-decomposable repeating units (a).

The resin (A) may further have a group capable of decomposing by the action of an acid to produce an alkali-soluble group ("acid-decomposable group"), on either one or both of the main chain and the side chain of the resin, in addition to the acid-decomposable repeating unit (a).

The resin (A) is preferably insoluble or sparingly soluble in an alkaline developer.

The acid-decomposable group preferably has a structure where an alkali-soluble group is protected by a group capable of decomposing and leaving by the action of an acid. Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

The alkali-soluble group is preferably a carboxyl group, a fluorinated alcohol group (preferably a hexafluoroisopropanol) or a sulfonic acid group.

The acid-decomposable group is preferably a group formed by substituting a group capable of leaving by the action of an acid for a hydrogen atom of the alkali-soluble group above.

Examples of the group capable of leaving by the action of an acid include $-C(R_{36})(R_{37})(R_{38})$, $-C(R_{36})(R_{37})(OR_{39})$ and $-C(R_{01})(R_{02})(OR_{39})$.

In the formulae, $R_{36}$ to $R_{39}$ each independently represent an alkyl group, a cycloalkyl group, an aryl group, an aralkyl group or an alkenyl group. $R_{36}$ and $R_{37}$ may combine with each other to form a ring.

$R_{01}$ and $R_{02}$ each independently represent a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, and more preferably a tertiary alkyl ester group.

As a repeating unit other than the acid-decomposable group-containing acid-decomposable repeating unit (a) that the resin (A) may contain, a repeating unit having a group capable of decomposing by the action of an acid is preferred and a repeating unit represented by the following formula (AI) is more preferred.

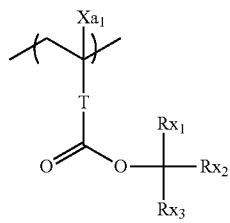

In formula (AI), $Xa_1$ represents a hydrogen atom, a methyl group which may have a substituent, or a group represented by $-CH_2-R_9$. $R_9$ represents a hydroxyl group or a monovalent organic group. Examples of the monovalent organic group include an alkyl group having 5 or less carbon atoms and an acyl group. Of these, an alkyl group having 3 or less carbon atoms is preferred, and a methyl group is more preferred. $Xa_1$ is preferably a hydrogen atom, a methyl group, a trifluoromethyl group or a hydroxymethyl group.

T represents a single bond or a divalent linking group.

$Rx_1$ to $Rx_3$ each independently represent an alkyl group (linear or branched) or a cycloalkyl group (monocyclic or polycyclic).

At least two members out of $Rx_1$ to $Rx_3$ may combine to form a cycloalkyl group (monocyclic or polycyclic).

Examples of the divalent linking group of T include an alkylene group, a $-COO-Rt-$ group, and a $-O-Rt-$ group. In the formulae, Rt represents an alkylene group or a cycloalkylene group.

T is preferably a single bond or a $-COO-Rt-$ group. Rt is preferably an alkylene group having 1 to 5 carbon atoms, and more preferably a $-CH_2-$ group or a $-(CH_2)_3-$ group. The alkyl group of $Rx_1$ to $Rx_3$ is preferably an alkyl group having 1 to 4 carbon atoms, such as a methyl group, an ethyl group, an n-propyl group, an isopropyl group, an n-butyl group, an isobutyl group or a tert-butyl group.

The cycloalkyl group of $Rx_1$ to $Rx_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group or an adamantyl group.

The cycloalkyl group formed by combining at least two members out of $Rx_1$ to $Rx_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group or an adamantyl group. Above all, a monocyclic cycloalkyl group having 5 to 6 carbon atoms is particularly preferred.

An embodiment where $Rx_1$ is a methyl group or an ethyl group and $Rx_2$ and $Rx_3$ are combined to form the above-described cycloalkyl group is preferred.

Each of the groups above may have a substituent, and examples of the substituent include an alkyl group (having 1 to 4 carbon atoms), a halogen atom, a hydroxyl group, an alkoxy group (having 1 to 4 carbon atoms), a carboxyl group and an alkoxycarbonyl group (having 2 to 6 carbon atoms). The carbon number is preferably 8 or less.

The total content of the acid-decomposable group-containing repeating unit containing a repeating unit other than the acid-decomposable repeating unit (a) is preferably from 20 to 70 mol %, and more preferably from 30 to 50 mol %, based on all repeating units in the resin (A).

Specific preferred examples of the repeating unit having an acid-decomposable group are illustrated below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having 1 to 4 carbon atoms. Z represents a substituent containing a polar group, and when a plurality of Z's are present, each Z is independent from every other Z. p represents 0 or a positive integer.

1
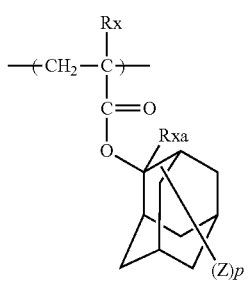

2
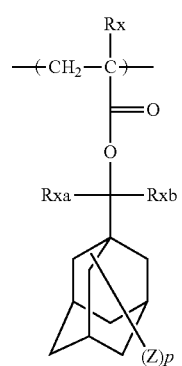

3
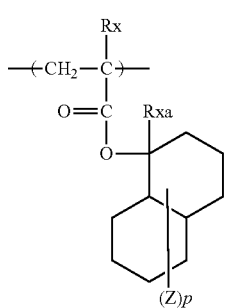

4
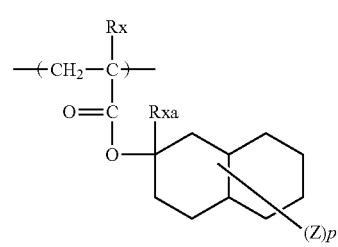

5
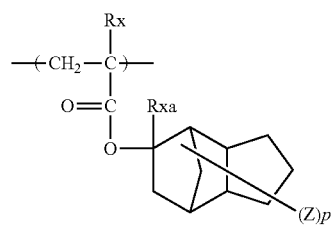

6
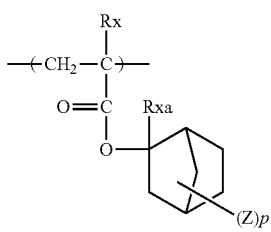

7
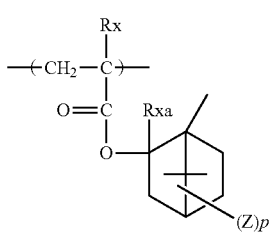

8
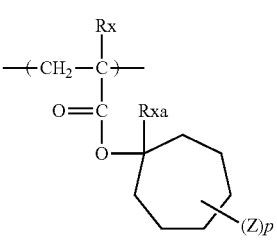

9
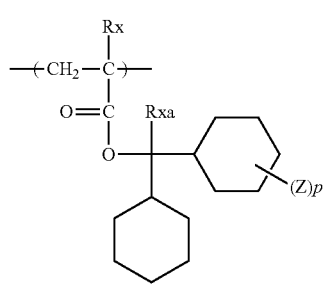

10
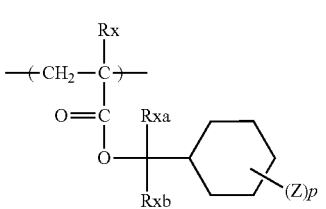

11
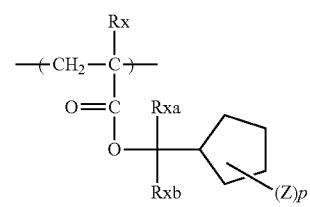

12
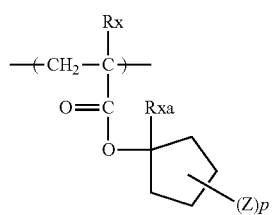
13
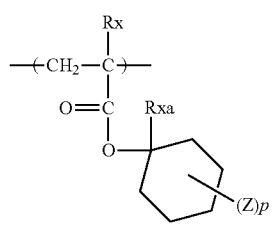
14
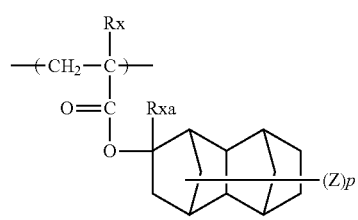
15
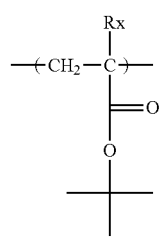
16
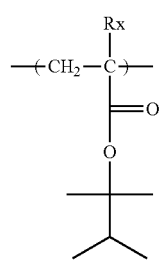
17
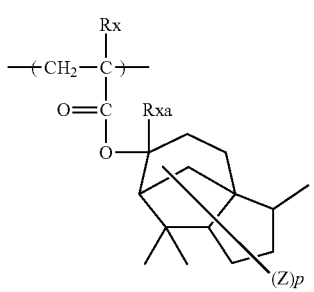
18
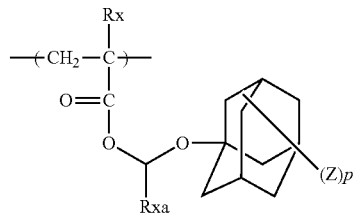
19
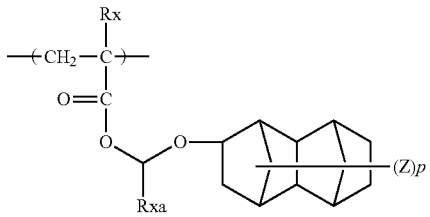
20
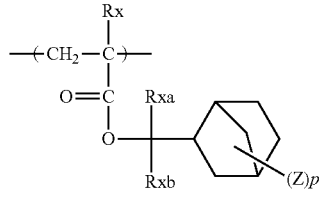
21
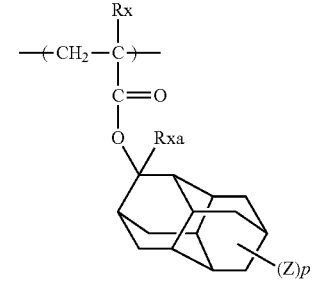
22
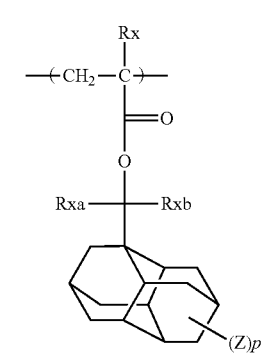
23
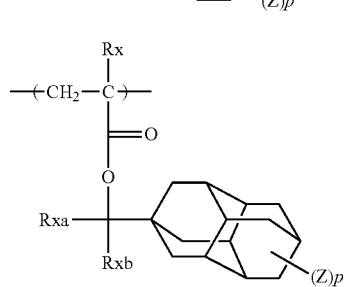

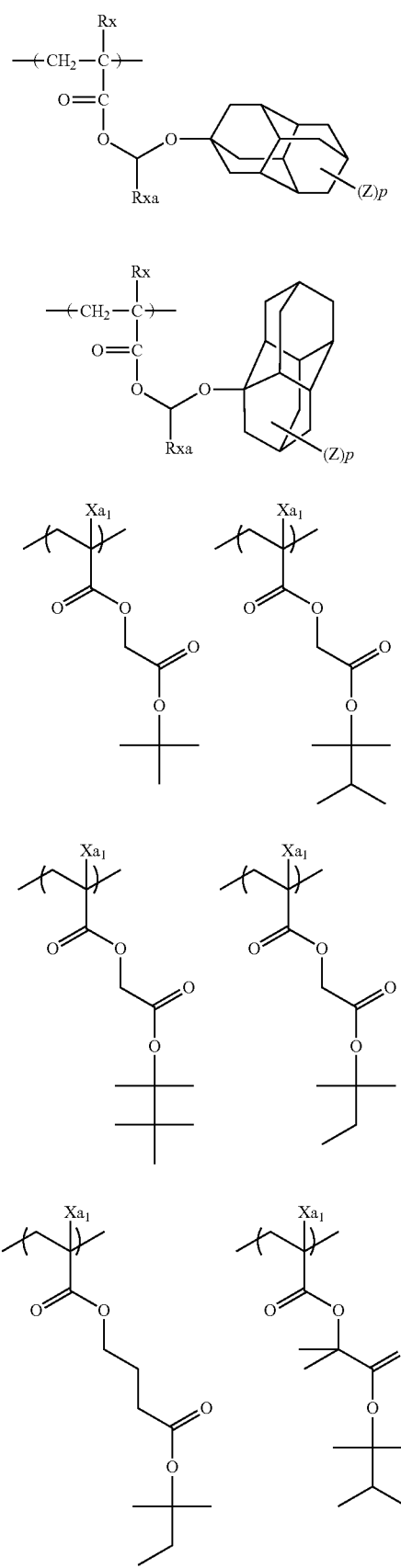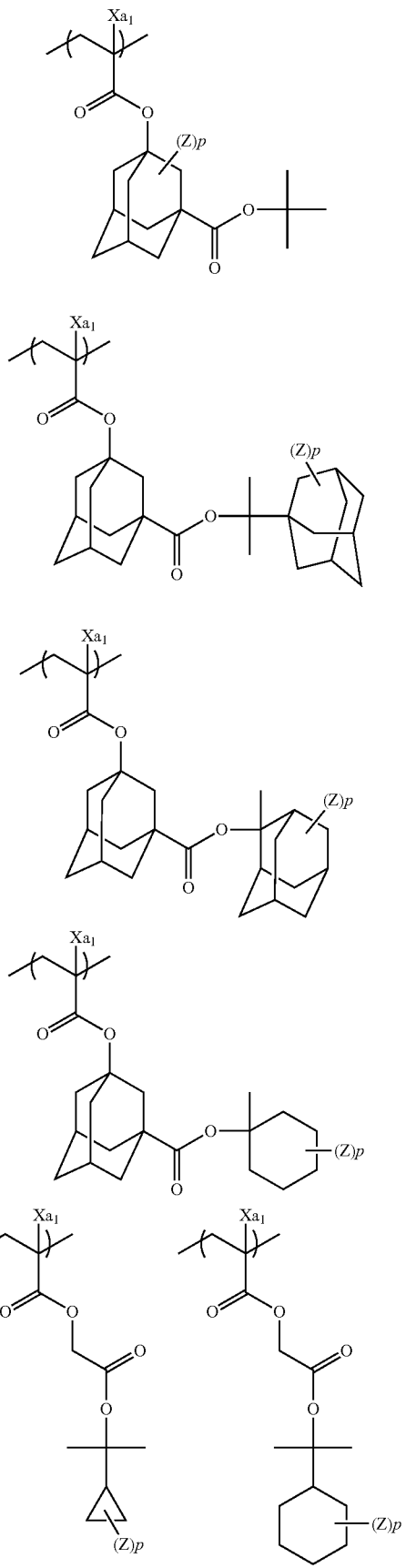

-continued
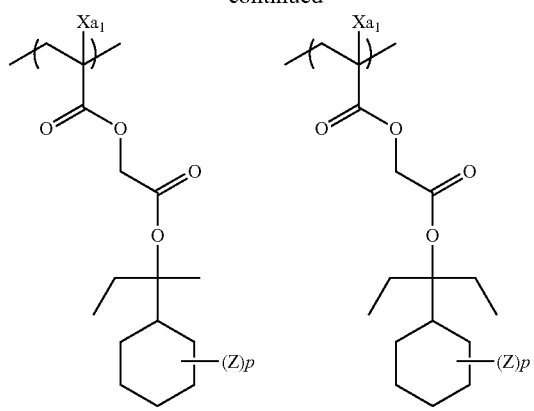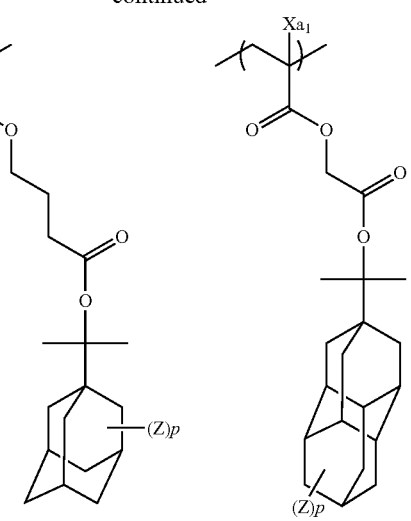
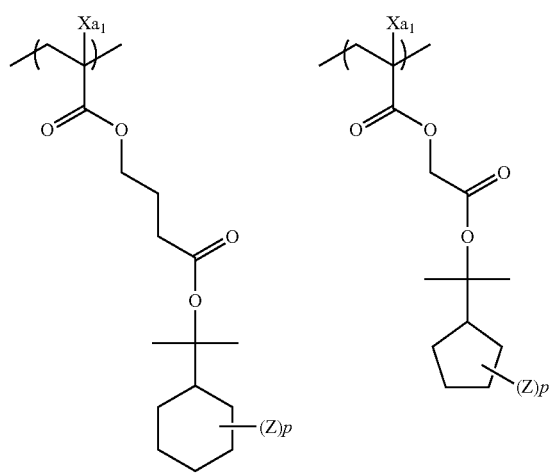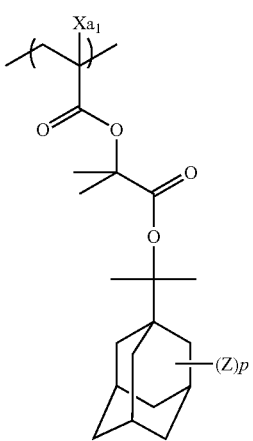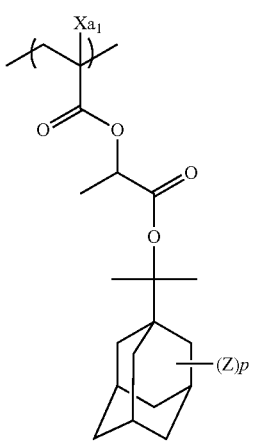
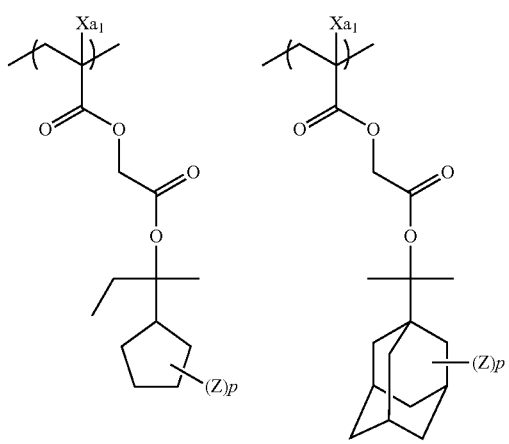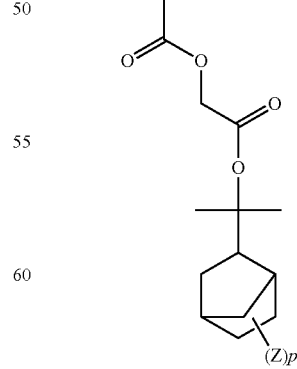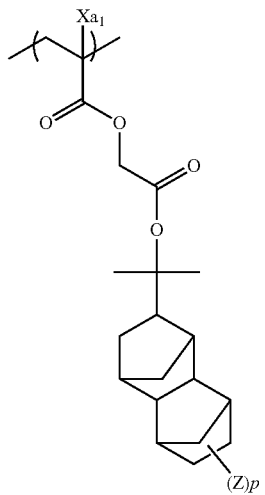

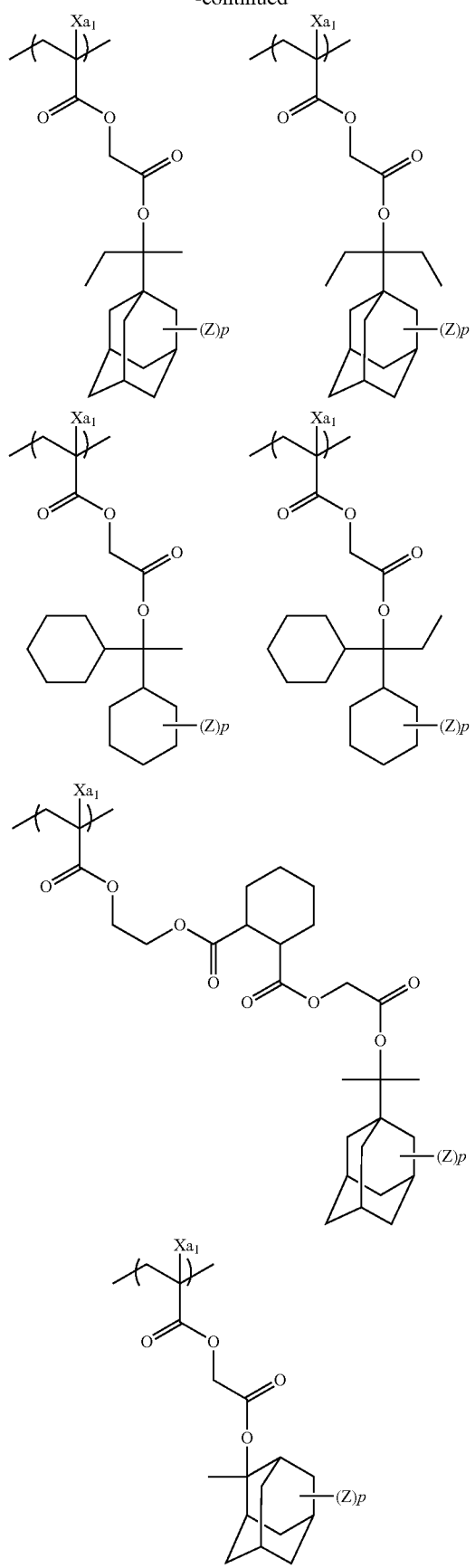
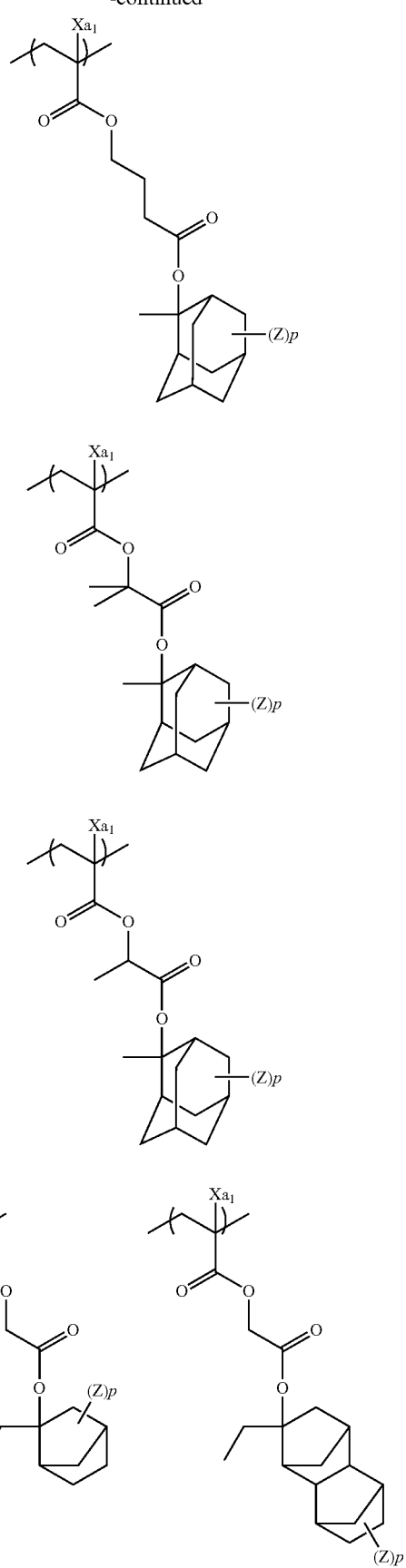

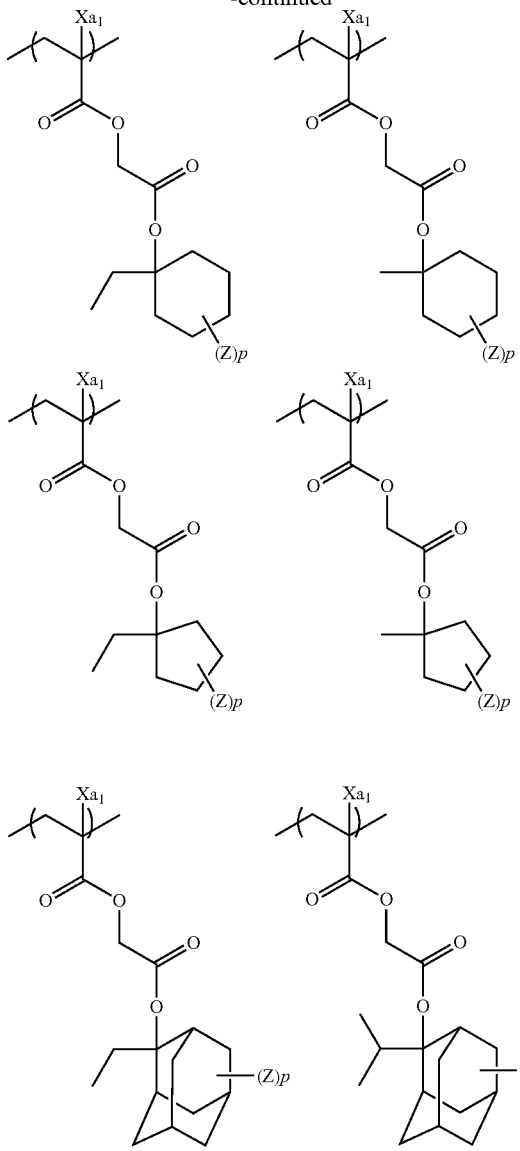

The resin (A) is more preferably a resin containing, as the repeating unit represented by formula (AI), at least either of a repeating unit represented by formula (AI-1) or a repeating unit represented by formula (AI-2).

(AI-1)

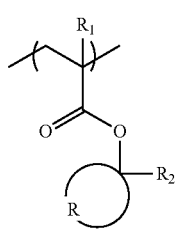

(AI-2)

In formulae (AI-1) and (AI-2), $R_1$ and $R_3$ each independently represent a hydrogen atom, a methyl group which may have a substituent, or a group represented by —$CH_2$—$R_9$. $R_9$ represents a monovalent organic group.

$R_2$, $R_4$, $R_5$ and $R_6$ each independently represent an alkyl group or a cycloalkyl group.

R represents an atomic group necessary for forming an alicyclic structure together with the carbon atom.

$R_1$ is preferably a hydrogen atom, a methyl group, a trifluoromethyl group or a hydroxymethyl group.

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having 1 to 10 carbon atoms, still more preferably an alkyl group having 1 to 5 carbon atoms, and examples thereof include a methyl group and an ethyl group.

R represents an atomic group necessary for forming an alicyclic structure together with the carbon atom. The alicyclic structure formed by R is preferably a monocyclic alicyclic structure, and the carbon number thereof is preferably from 3 to 7, more preferably 5 or 6.

$R_3$ is preferably a hydrogen atom, and more preferably a methyl group.

The alkyl group in $R_4$, $R_5$ and $R_6$ may be linear or branched and may have a substituent. The alkyl group is preferably an alkyl group having 1 to 4 carbon atoms, such as a methyl group, an ethyl group, an n-propyl group, an isopropyl group, an n-butyl group, an isobutyl group and a tert-butyl group.

The cycloalkyl group in $R_4$, $R_5$ and $R_6$ may be monocyclic or polycyclic and may have a substituent. The cycloalkyl group is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group or an adamantyl group.

The repeating unit represented by formula (AI-1) includes, for example, a repeating unit represented by the following formula (1-a):

(1-a)

In the formula, $R_1$ and $R_2$ have the same meanings as those in formula (AI-1).

The repeating unit represented by formula (AI-1) is preferably a repeating unit represented by the following formula (II-1):

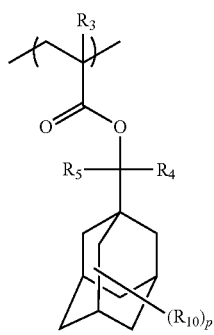

(II-1)

In formula (II-1), $R_3$ to $R_5$ have the same meanings as those in formula (AI-2).

$R_{10}$ represents a polar group-containing substituent. In the case where a plurality of $R_{10}$'s are present, these may be the same or different. Examples of the polar group-containing substituent include a linear or branched alkyl group or cycloalkyl group having a hydroxyl group, a cyano group, an amino group, an alkylamide group, or a sulfonamide group. An alkyl group having a hydroxyl group is preferred. The branched alkyl group is particularly preferably an isopropyl group.

p represents an integer of 0 to 15. p is preferably an integer of 0 to 2, and more preferably 0 or 1.

The acid decomposable resin may contain two or more kinds of the repeating units represented by formula (AI).

The resin (A) preferably further contains a repeating unit having a lactone group. As for the lactone structure, a 5- to 7-membered ring lactone structure is preferred, and a structure where another ring structure is fused to a 5- to 7-membered ring lactone structure in the form of forming a bicyclo or spiro structure is more preferred. The resin more preferably contains a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-13), (LC1-14) and (LC1-17). By using a specific lactone structure, LWR and development defects are improved.

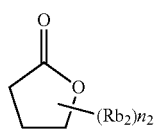

LC1-1

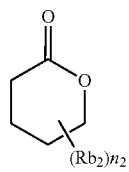

LC1-2

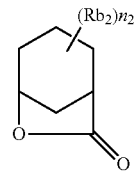

LC1-3

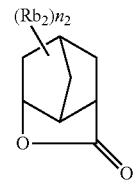

LC1-4

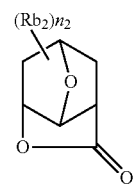

LC1-5

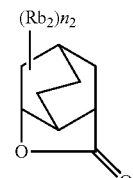

LC1-6

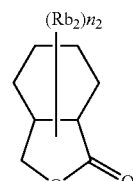

LC1-7

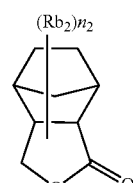

LC1-8

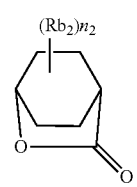

LC1-9

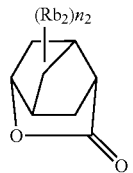

LC1-10

LC1-11
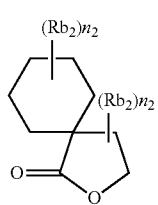

LC1-12
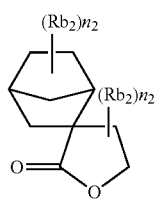

LC1-13
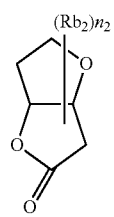

LC1-14
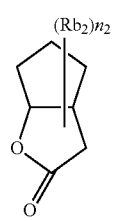

LC1-15
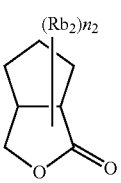

LC1-16
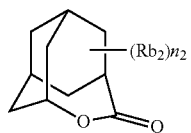

LC1-17
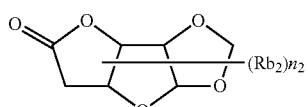

The lactone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group and an acid-decomposable group. Among these, an alkyl group having 1 to 4 carbon atoms, a cyano group and an acid-decomposable group are more preferred. $n_2$ represents an integer of 0 to 4. When $n_2$ is 2 or more, each substituent ($Rb_2$) may be the same as or different from every other substituent ($Rb_2$). Also, in this case, the plurality of substituents ($Rb_2$) may combine with each other to form a ring.

The resin (A), in an embodiment, preferably contains, as the repeating unit having a lactone structure, a repeating unit represented by the following formula (AII'):

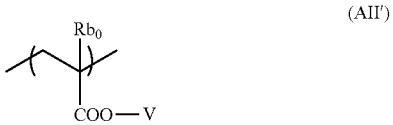

(AII')

In formula (AII'), $Rb_0$ represents a hydrogen atom, a halogen atom, or an alkyl group having 1 to 4 carbon atoms. Preferred examples of the substituent that the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, and more preferably a hydrogen atom or a methyl group.

V represents a group having a structure represented by any one of formulae (LC1-1) to (LC1-17).

The resin (A), in another embodiment, preferably contains, as the repeating unit having a lactone structure, a repeating unit represented by the following formula (III).

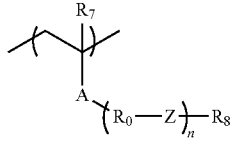

(III)

In formula (III), A represents an ester bond (a group represented by —COO—) or an amido bond (a group represented by —CONN—).

$R_0$ represents, and when a plurality of $R_0$'s are present, each independently represents, an alkylene group, a cycloalkylene group or a combination thereof.

Z represents, and when a plurality of Z's are present, each independently represents, an ether bond, an ester bond, an amide bond, a urethane bond
(a group represented by

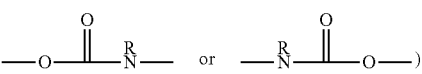

or a urea bond
(a group represented by

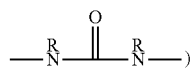

wherein each R independently represents a hydrogen atom, an alkyl group, a cycloalkyl group or an aryl group.

$R_8$ represents a monovalent organic group having a lactone structure.

n is the repetition number of the structure represented by —$R_0$—Z— and represents an integer of 1 to 5.

$R_7$ represents a hydrogen atom, a halogen atom or an alkyl group.

The alkylene group and cycloalkylene group of $R_o$ may have a substituent.

Z is preferably an ether bond or an ester bond, and more preferably an ester bond.

The alkyl group of $R_7$ is preferably an alkyl group having 1 to 4 carbon atoms, more preferably a methyl group or an ethyl group, and still more preferably a methyl group. The alkyl group in $R_7$ may be substituted, and examples of the substituent include a halogen atom such as a fluorine atom, a chlorine atom or a bromine atom, a mercapto group, a hydroxyl group, an alkoxy group such as a methoxy group, an ethoxy group, an isopropoxy group, a tert-butoxy group or a benzyloxy group, an acyl group such as an acetyl group or a propionyl group, and an acetoxy group. $R_7$ is preferably a hydrogen atom, a methyl group, a trifluoromethyl group or a hydroxymethyl group.

The chain alkylene group in $R_0$ is preferably a chain alkylene group having 1 to 10 carbon atoms, more preferably 1 to 5 carbon atoms, and examples thereof include a methylene group, an ethylene group and a propylene group. The cycloalkylene group is preferably a cycloalkylene group having 1 to 20 carbon atoms, and examples thereof include a cyclohexylene group, a cyclopentylene group, a norbornylene group and an adamantylene group. For bringing out the effects of the present invention, a chain alkylene group is more preferred, and a methylene group is still more preferred.

The lactone structure-containing substituent represented by $R_8$ is not limited as long as it has a lactone structure. Specific examples thereof include lactone structures represented by formulae (LC1-1) to (LC1-17) and among these, a structure represented by (LC1-4) is particularly preferred. Also, structures where $n_2$ in (LC1-1) to (LC1-17) is an integer of 2 or less are more preferred.

$R_8$ is preferably a monovalent organic group having an unsubstituted lactone structure or a monovalent organic group having a lactone structure containing a methyl group, a cyano group or an alkoxycarbonyl group as the substituent, and more preferably a monovalent organic group having a lactone structure containing a cyano group as the substituent (cyanolactone).

Specific examples of the repeating unit containing a group having a lactone structure represented by formula (III) are illustrated below, but the present invention is not limited thereto.

In specific examples, R represents a hydrogen atom, an alkyl group which may have a substituent, or a halogen atom, and preferably a hydrogen atom, a methyl group, a hydroxymethyl group or an acetoxymethyl group.

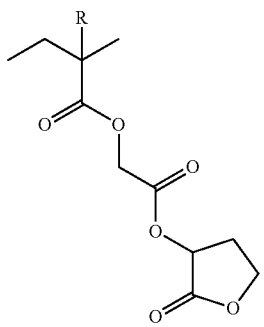

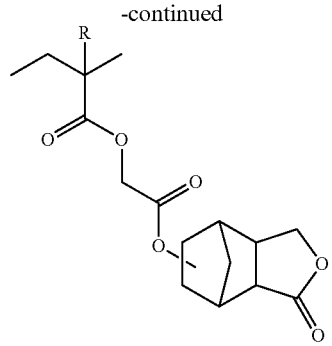

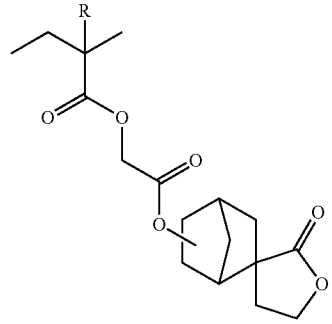

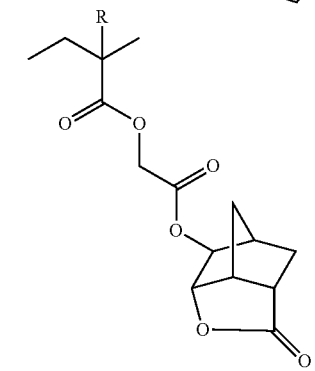

The repeating unit having a lactone structure represented by formula (III) is more preferably a repeating unit represented by the following formula (III-1):

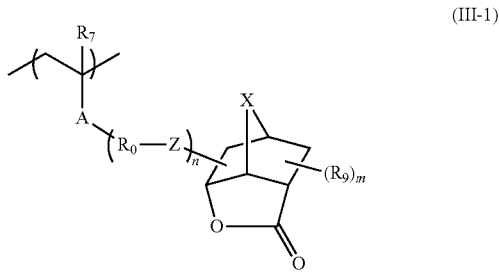

(III-1)

In formula (III-1), $R_7$, A, $R_0$, Z and n have the same meanings as in formula (III). $R_9$ represents, and when a plurality of $R_9$'s are present, each independently represents, an alkyl group, a cycloalkyl group, an alkoxycarbonyl group, a cyano group, a hydroxyl group or an alkoxy group, and when a plurality of $R_9$'s are present, two members thereof may combine to form a ring.

X represents an alkylene group, an oxygen atom or a sulfur atom.

m is the number of substituents and represents an integer of 0 to 5. m is preferably 0 or 1.

The alkyl group of $R_9$ is preferably an alkyl group having 1 to 4 carbon atoms, more preferably a methyl group or an ethyl group, and most preferably a methyl group. Examples of the cycloalkyl group include a cyclopropyl group, a cyclobutyl group, a cyclopentyl group and a cyclohexyl group. Examples of the alkoxycarbonyl group include a methoxycarbonyl group, an ethoxycarbonyl group, an n-butoxycarbonyl group and a tert-butoxycarbonyl group. Examples of the alkoxy group include a methoxy group, an ethoxy group, a propoxy group, an isopropoxy group and a butoxy group. These groups may have a substituent, and the substituent includes a hydroxyl group, an alkoxy group such as a methoxy group or an ethoxy group, a cyano group, and a halogen atom such as a fluorine atom. $R_9$ is preferably a methyl group, a cyano group or an alkoxycarbonyl group, and more preferably a cyano group.

Examples of the alkylene group of X include a methylene group and an ethylene group. X is preferably an oxygen atom or a methylene group, and more preferably a methylene group.

When m is 1 or more, at least one $R_9$ is preferably substituted on the α- or β-position, more preferably the α-position, of the carbonyl group of lactone.

Specific examples of the repeating unit having a lactone structure-containing group represented by formula (III-1) are illustrated below, but the present invention is not limited thereto. In specific examples, R represents a hydrogen atom, an alkyl group which may have a substituent, or a halogen atom, and preferably a hydrogen atom, a methyl group, a hydroxymethyl group or an acetoxymethyl group.

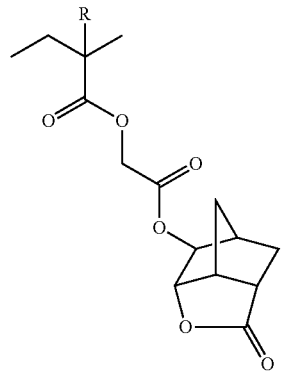
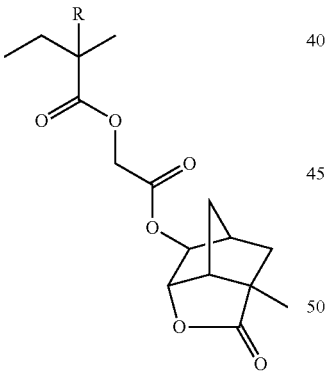
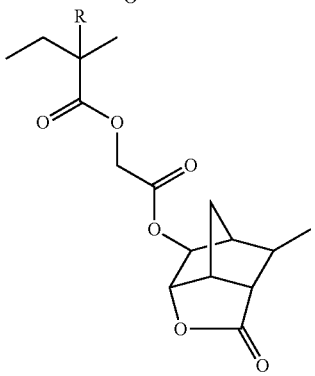

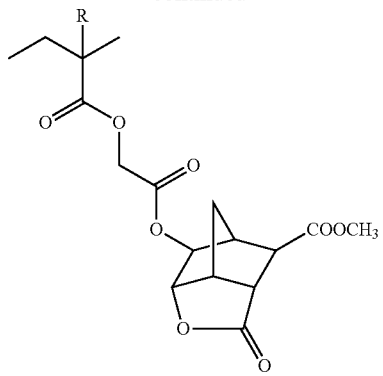
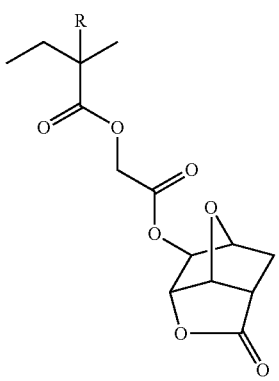
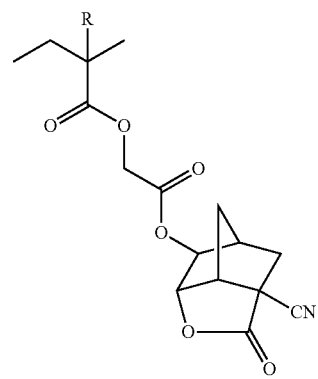
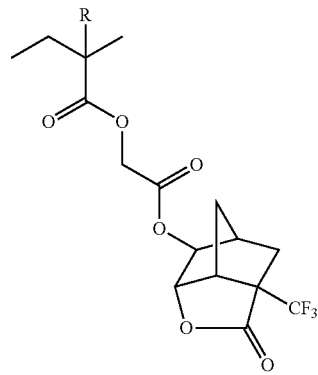

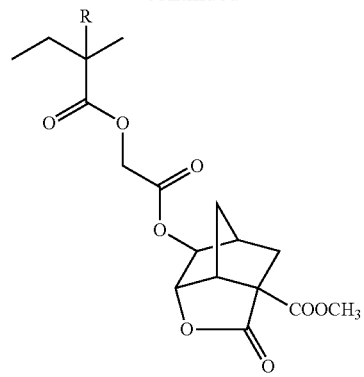
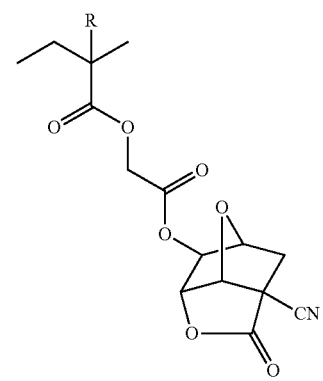
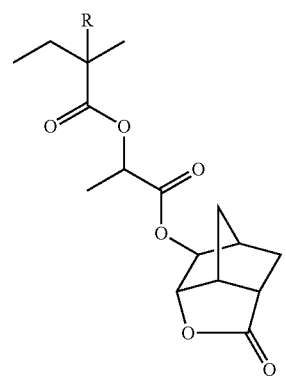
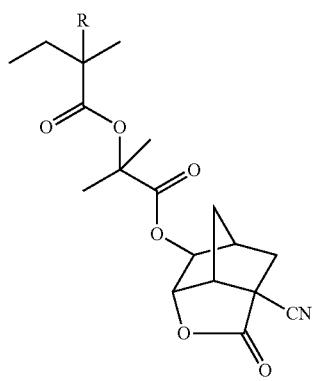
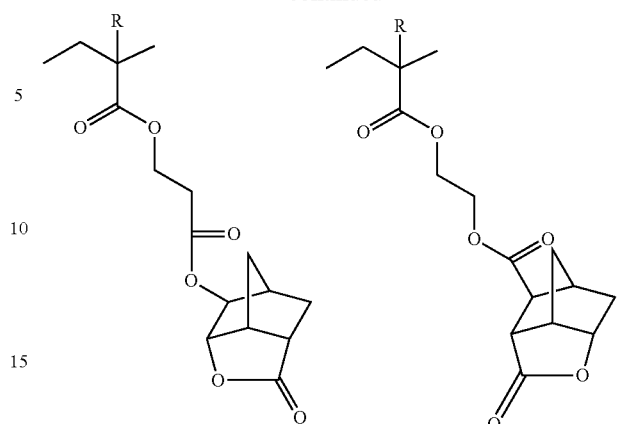
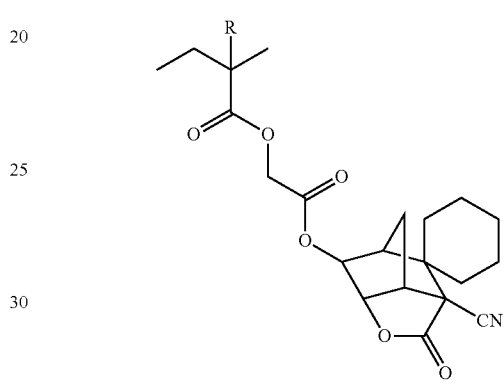
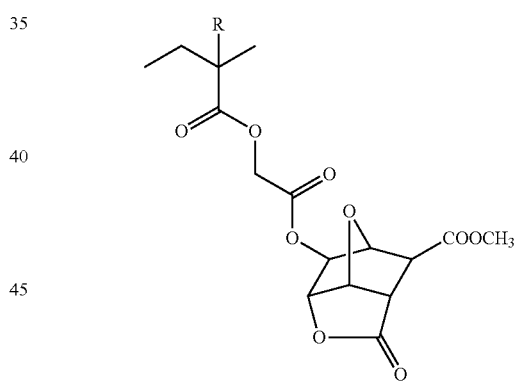
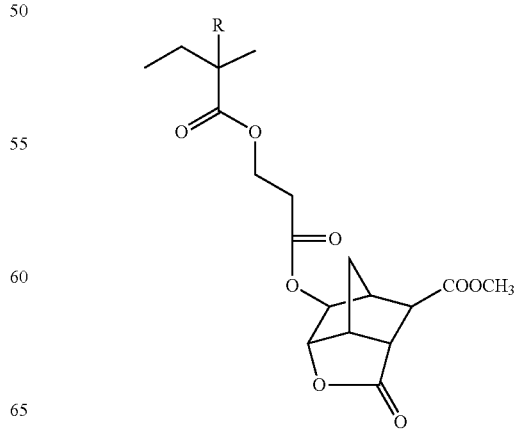

45
-continued
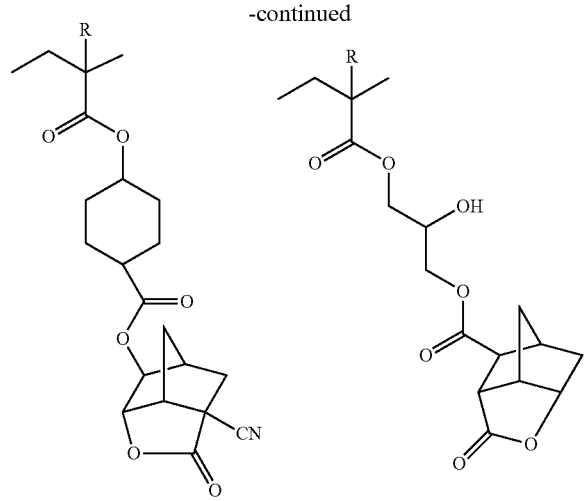
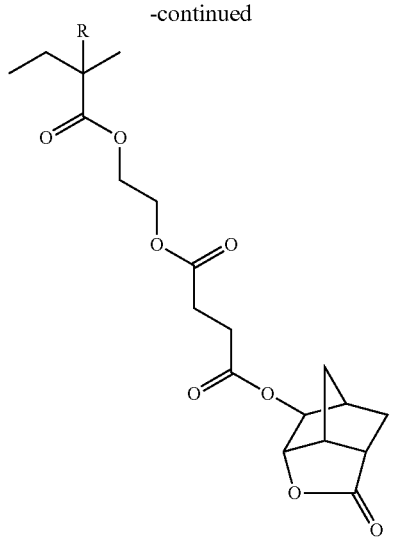
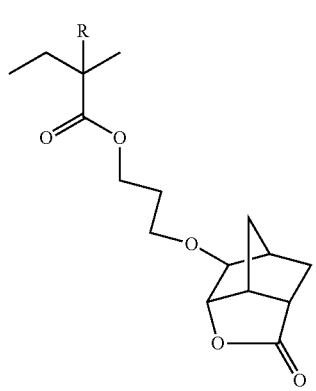
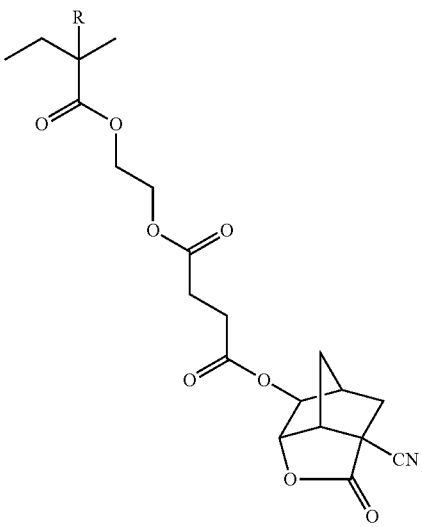
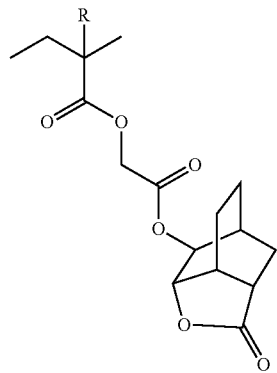
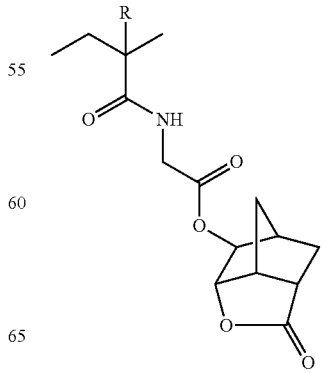

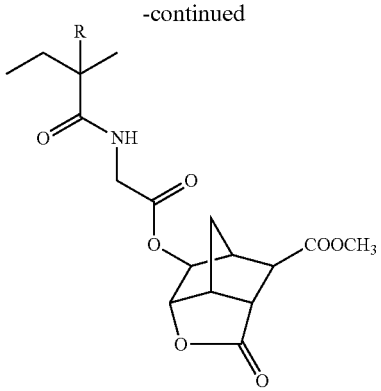

The content of the repeating unit represented by formula (III) is preferably from 15 to 60 mol %, more preferably from 20 to 60 mol %, and still more preferably from 30 to 50 mol %, based on all repeating units in the resin in the case where plural kinds of repeating units are contained.

The resin (A) may contain a repeating unit having a lactone group, in addition to the repeating unit represented by formula (III).

Specific examples of the repeating unit having a lactone group other than the unit represented by formula (III) are illustrated below, but the present invention is not limited thereto.

(In the formulae, Rx represents H, $CH_3$, $CH_2OH$ or $CF_3$.)

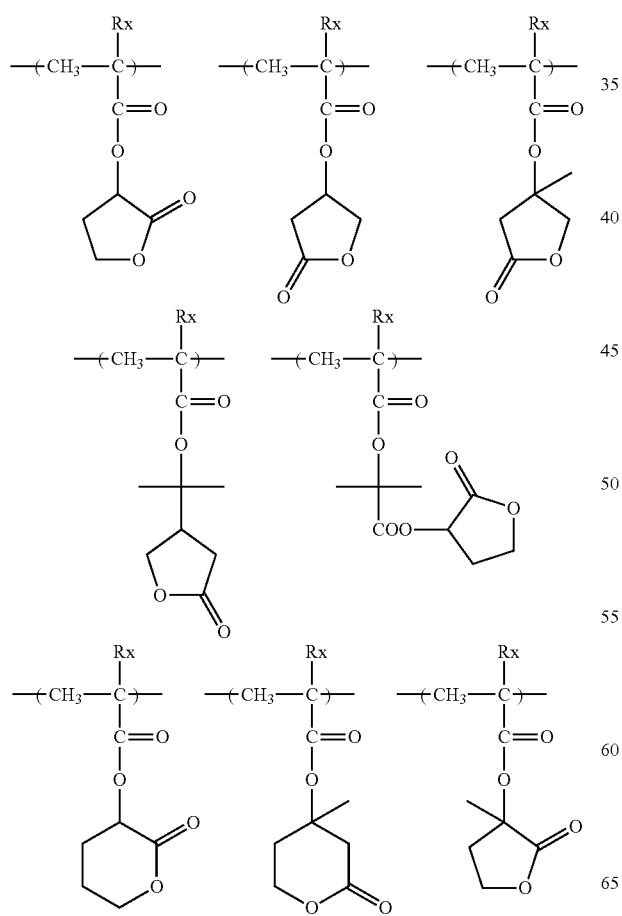

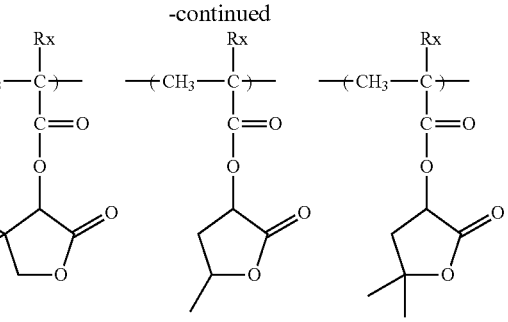

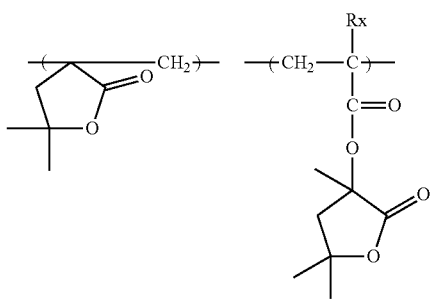

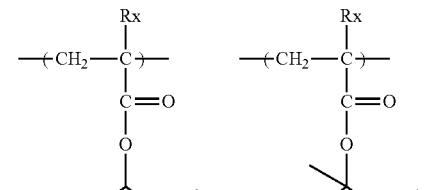

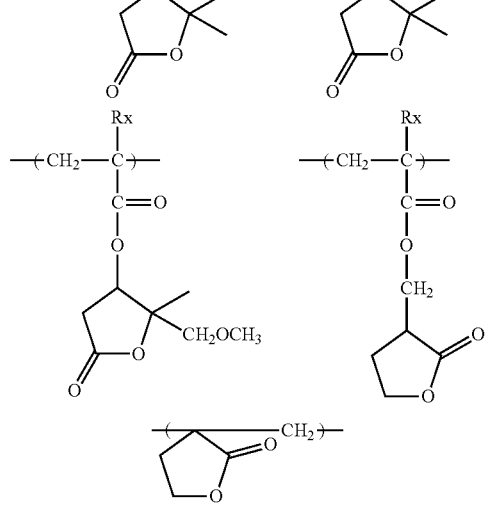

(In the formulae, Rx represents H, $CH_3$, $CH_2OH$ or $CF_3$.)

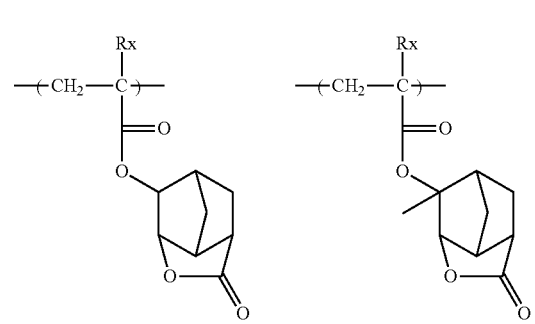

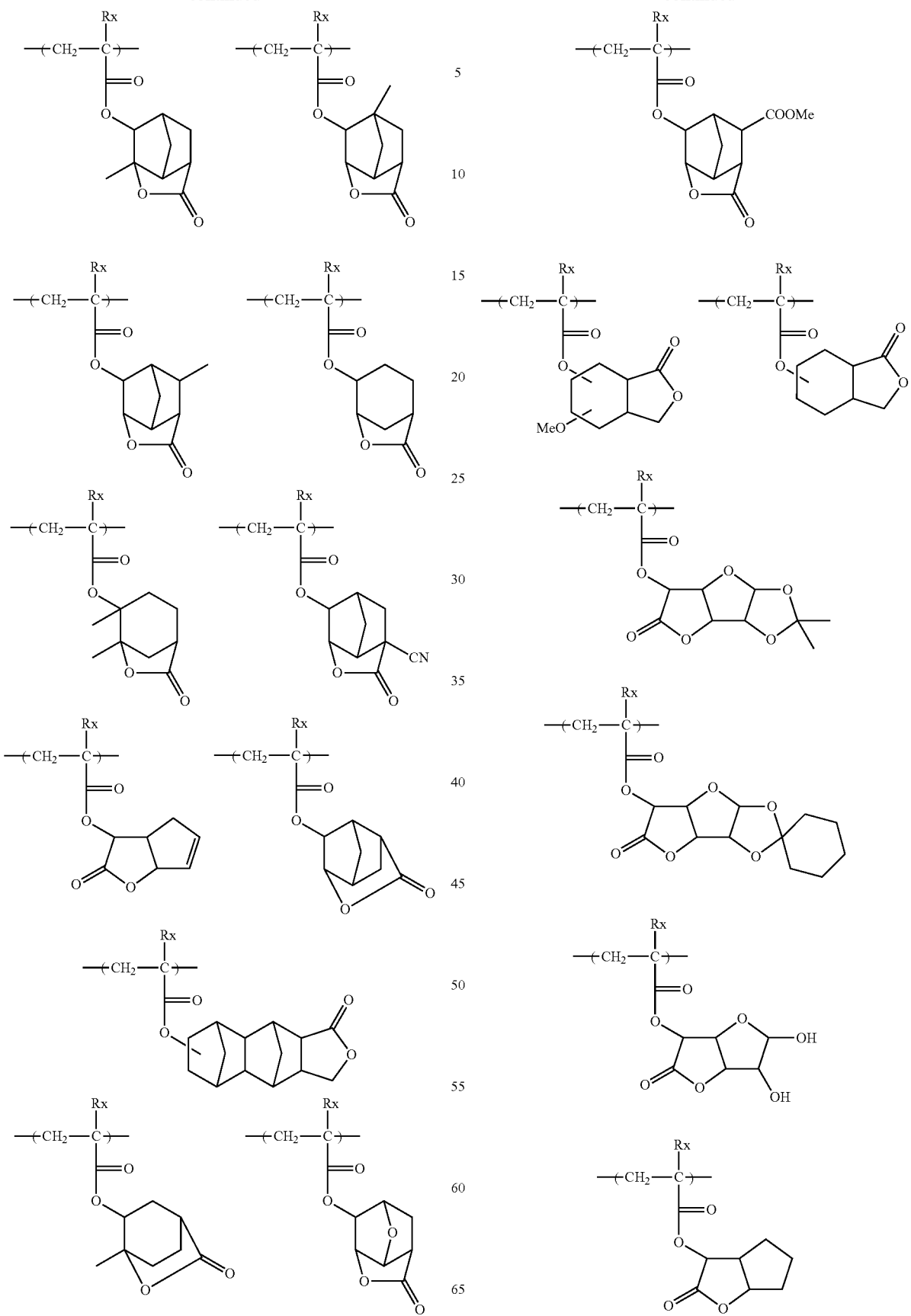

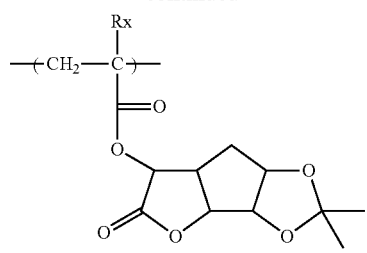
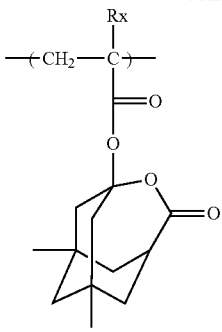
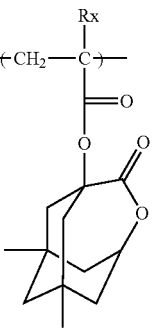
(In the formulae, Rx represents H, CH₃, CH₂OH or CF₃.)
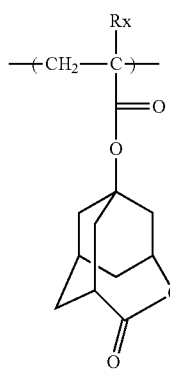
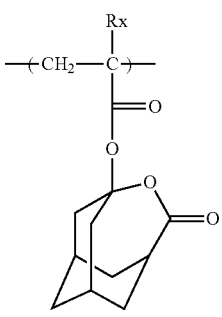
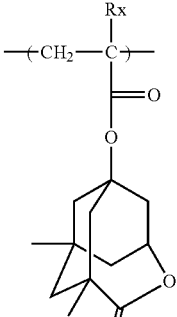
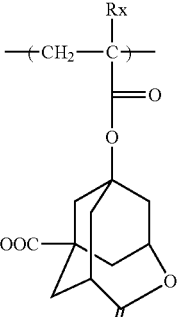
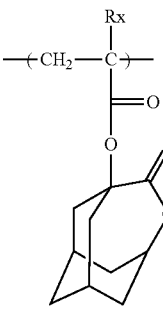
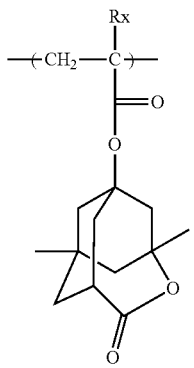
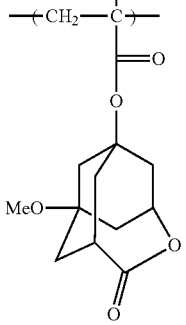
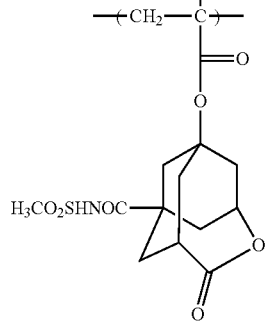
Particularly preferred repeating units having a lactone structure other than the unit represented by formula (III) include the following repeating units. By selecting an optimal lactone structure, the pattern profile and the iso/dense bias are improved.
(In the formulae, Rx represents H, CH₃, CH₂OH or CF₃.)
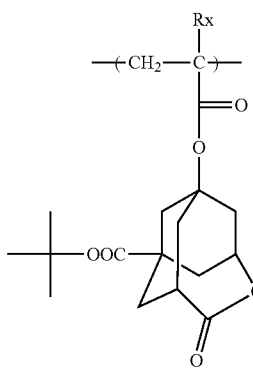
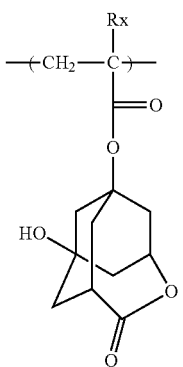
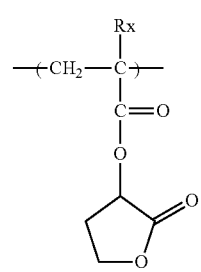
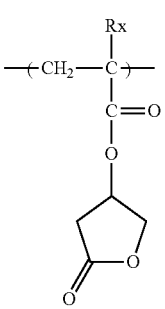

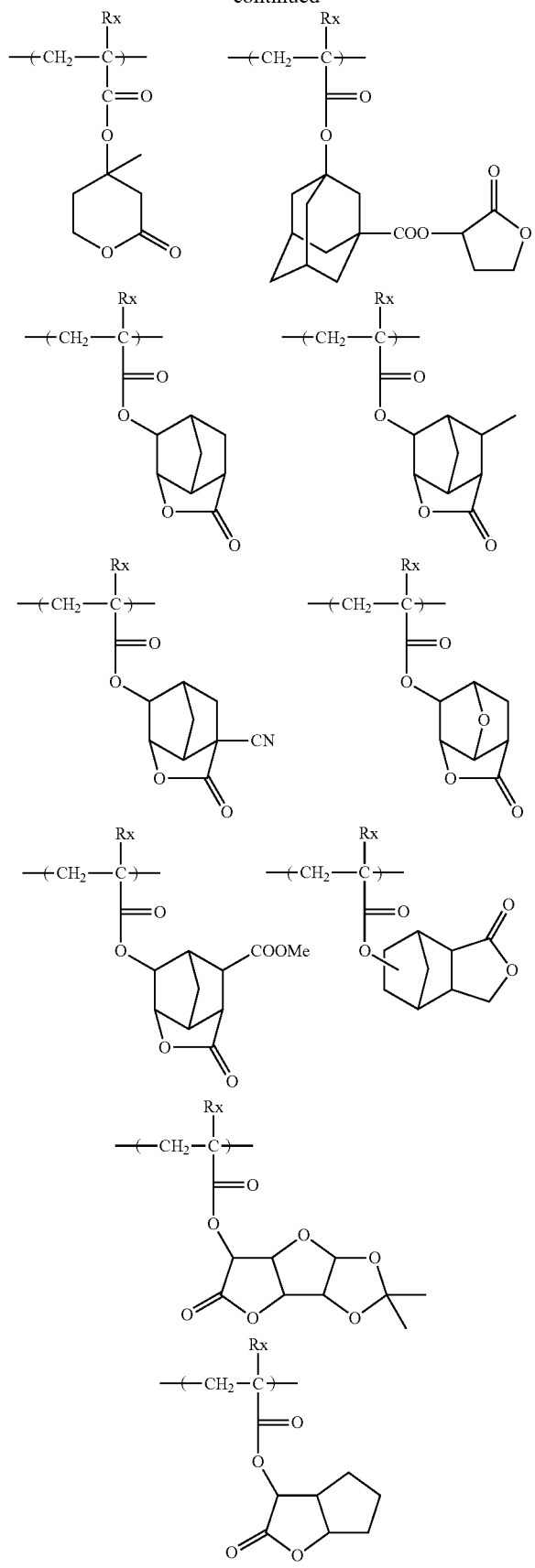

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, and more preferably 95% or more.

The content of a repeating unit having a lactone group, other than the repeating unit represented by formula (III), is preferably from 15 to 60 mol %, more preferably from 20 to 50 mol %, and still more preferably from 30 to 50 mol %, based on all repeating units in the resin in the case where plural kinds of repeating units are contained.

Two or more kinds of lactone repeating units selected from formula (III) may also be used in combination for increasing the effects of the present invention. In the case of a combination use, it is also preferred that out of formula (III), two or more kinds of lactone repeating units where n is 1 are selected and used in combination.

The resin (A) preferably contains a repeating unit having a hydroxyl group or a cyano group, other than formulae (AI) and (III). This repeating unit serves to improve adhesion to a substrate and affinity for a developer. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diadamantyl group or a norbornane group. The alicyclic hydrocarbon structure substituted with a hydroxyl group or a cyano group is preferably a partial structure represented by the following formulae (VIIa) to (VIId):

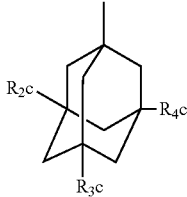
(VIIa)

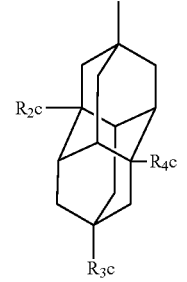
(VIIb)

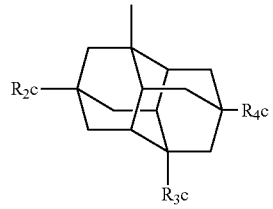
(VIIc)

-continued

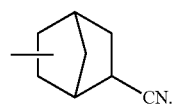
(VIId)

In formulae (VIIa) to (VIIc), $R_2c$ to $R_4c$ each independently represent a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

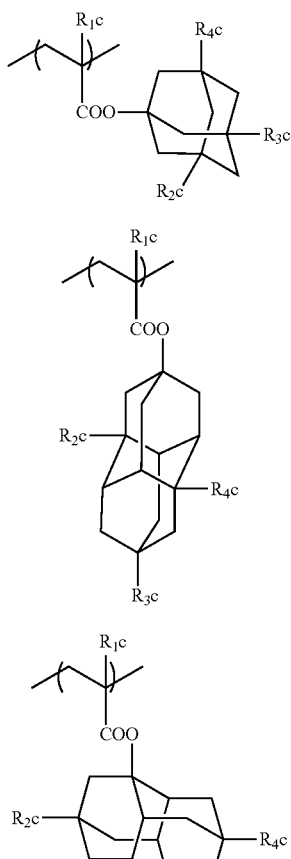

(AIIa)

(AIIb)

(AIIc)

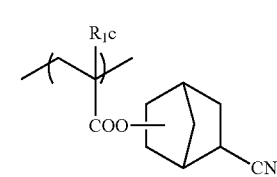
(AIId)

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The content of a repeating unit having a hydroxyl group or a cyano group is preferably from 5 to 40 mol %, more preferably from 5 to 30 mol %, and still more preferably from 10 to 25 mol %, based on all repeating units in the resin (A).

Specific examples of the repeating unit having a hydroxyl group or a cyano group are illustrated below, but the present invention is not limited thereto.

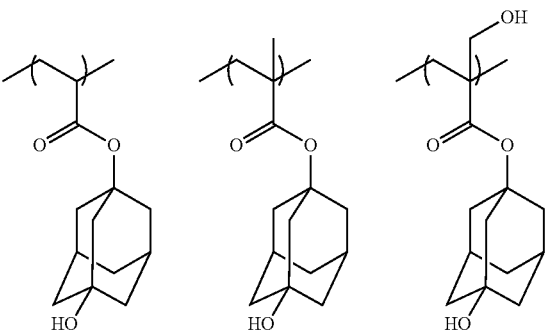

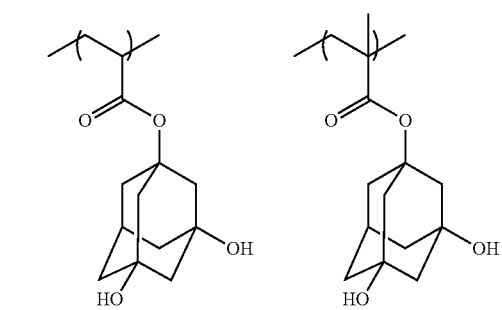

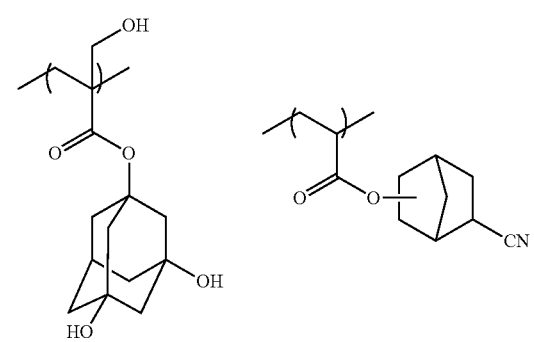

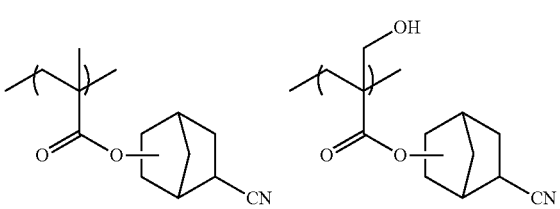

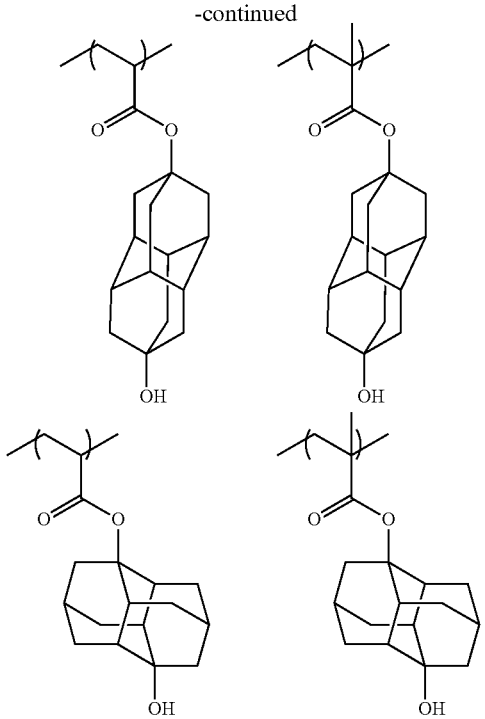

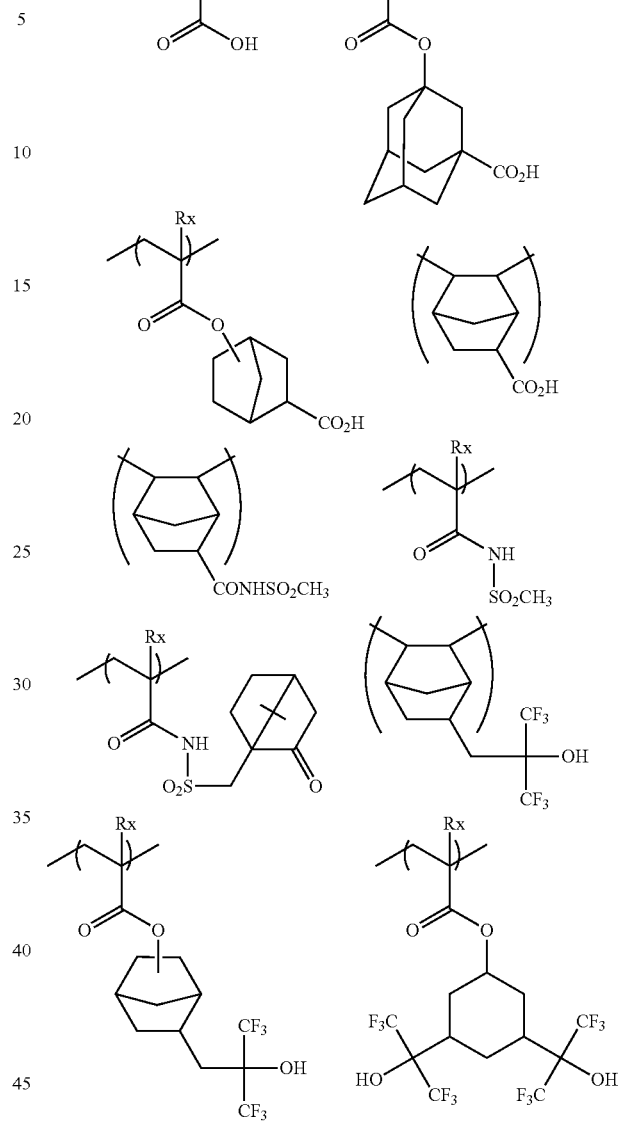

The resin used in the actinic ray-sensitive or radiation-sensitive resin composition of the present invention may contain a repeating unit having an alkali-soluble group. The alkali-soluble group includes a carboxyl group, a sulfonamide group, a sulfonylimide group, a bissulfonylimide group, and an aliphatic alcohol substituted with an electron-withdrawing group at the α-position (for example, hexafluoroisopropanol group), with a repeating unit having a carboxyl group being more preferred. By virtue of containing a repeating unit having an alkali-soluble group, the resolution increases in the usage of forming contact holes. As for the repeating unit having an alkali-soluble group, all of a repeating unit where an alkali-soluble group is directly bonded to the main chain of the resin, such as repeating unit composed of an acrylic acid or a methacrylic acid, a repeating unit where an alkali-soluble group is bonded to the main chain of the resin through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic cyclohydrocarbon structure. In particular, a repeating unit composed of an acrylic acid or a methacrylic acid is preferred.

The content of a repeating unit having an alkali-soluble group is preferably from 0 to 20 mol %, more preferably from 3 to 15 mol %, and still more preferably from 5 to 10 mol %, based on all repeating units in the resin (A).

Specific examples of the repeating unit having an alkali-soluble group are illustrated below, but the present invention is not limited thereto.

In specific examples, Rx represents H, $CH_3$, $CH_2OH$ or $CF_3$.

The resin (A) for use in the present invention may further contain a repeating unit having an alicyclic hydrocarbon structure free from a polar group and not exhibiting acid decomposability. Such a repeating unit includes a repeating unit represented by formula (IV):

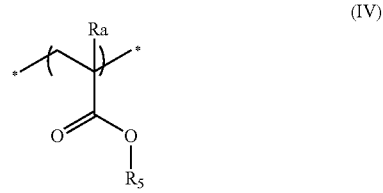

(IV)

In formula (IV), $R_5$ represents a hydrocarbon group having at least one cyclic structure and having neither a hydroxyl group nor a cyano group.

Ra represents a hydrogen atom, an alkyl group or a —CH$_2$—O—Ra$_2$ group, wherein Ra$_2$ represents a hydrogen atom, an alkyl group or an acyl group. Ra is preferably a hydrogen atom, a methyl group, a hydroxymethyl group or a trifluoromethyl group, and more preferably a hydrogen atom or a methyl group.

The cyclic structure contained in R$_5$ includes a monocyclic hydrocarbon group and a polycyclic hydrocarbon group. Examples of the monocyclic hydrocarbon group include a cycloalkyl group having 3 to 12 carbon atoms, such as a cyclopentyl group, a cyclohexyl group, a cycloheptyl group or a cyclooctyl group, and a cycloalkenyl group having 3 to 12 carbon atoms, such as a cyclohexenyl group. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as a pinane ring, a bornane ring, a norpinane ring, a norbornane ring or a bicyclooctane ring (for example, a bicyclo[2.2.2]octane ring, or a bicyclo[3.2.1]octane ring), a tricyclic hydrocarbon ring such as a homobrendane ring, an adamantane ring, a tricyclo[5.2.1.0$^{2,6}$]decane ring or a tricyclo[4.3.1.1$^{2,5}$]undecane ring, and a tetracyclic hydrocarbon ring such as a tetracyclo[4.4.0.1$^{2,5}$1$^{7,10}$]dodecane ring and a perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring and a perhydrophenalene ring.

Preferred examples of the crosslinked cyclic hydrocarbon ring include a norbornyl group, an adamantyl group, a bicyclooctanyl group and a tricyclo[5.2.1.0$^{2,6}$]decanyl group. Among these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group protected by a protecting group, and an amino group protected by a protecting group. The halogen atom is preferably a bromine atom, a chlorine atom or a fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protecting group, and an amino group protected by a protecting group.

Examples of the protecting group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having 1 to 4 carbon atoms; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having 1 to 6 carbon atoms, such as a formyl group, an acetyl group, a propionyl group, a butyryl group, an isobutyryl group, a valeryl group or a pivaloyl group; and the alkoxycarbonyl group is preferably an alkoxycarbonyl group having 1 to 4 carbon atoms.

The content of a repeating unit having an alicyclic hydrocarbon structure free from a polar group and not exhibiting acid decomposability is preferably from 0 to 40 mol %, and more preferably from 0 to 20 mol %, based on all repeating units in the resin (A).

Specific examples of the repeating unit having an alicyclic hydrocarbon structure free from a polar group and not exhibiting acid decomposability are illustrated below, but the present invention is not limited thereto. In the formulae, Ra represents H, CH$_3$, CH$_2$OH or CF$_3$.

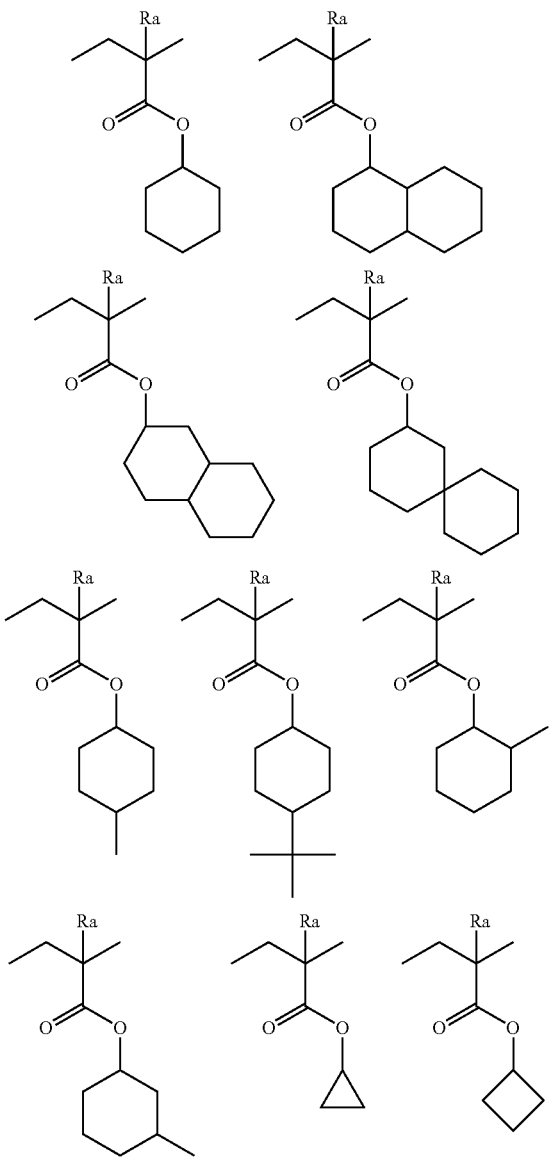

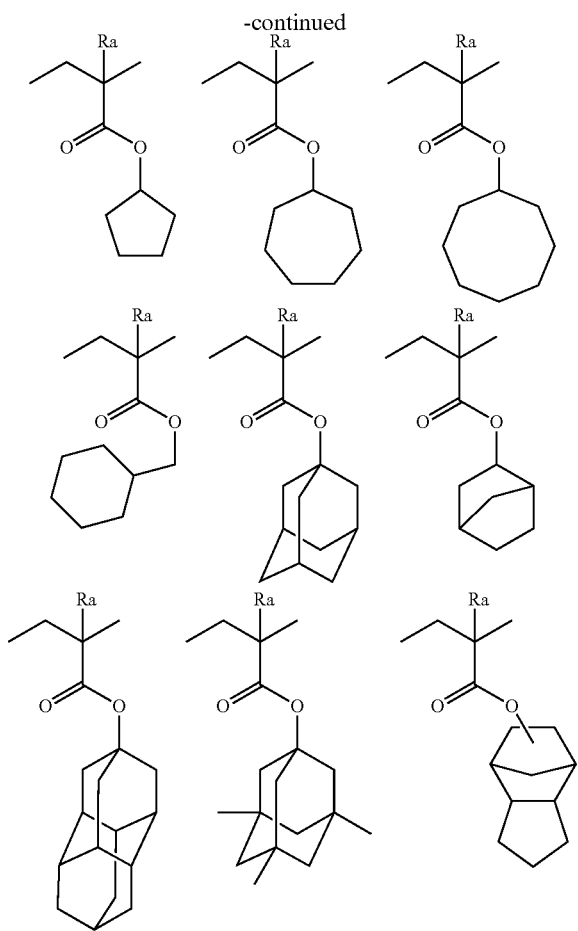

The resin (A) for use in the composition of the present invention may contain, in addition to the above-described repeating structural units, various repeating structural units for the purpose of controlling the dry etching resistance, suitability for standard developer, adhesion to substrate, resist profile, and properties generally required of a resist, such as resolution, heat resistance and sensitivity.

Examples of such a repeating structural unit include, but are not limited to, repeating structural units corresponding to the monomers described below.

The use of such repeating structural units enables the fine regulation of the performance required of the resin used in the composition of the present invention, particularly (1) solubility in a coating solvent, (2) film-forming property (glass transition point), (3) alkaline developability, (4) film loss (selection of hydrophilic, hydrophobic or alkali-soluble group), (5) adhesion of unexposed area to substrate, (6) dry etching resistance, and the like.

Examples of the monomer include a compound having one addition-polymerizable unsaturated bond selected from acrylic acid esters, methacrylic acid esters, acrylamides, methacrylamides, allyl compounds, vinyl ethers, vinyl esters and the like.

Other than these, an addition-polymerizable unsaturated compound copolymerizable with the monomers corresponding to the above-described various repeating structural units may be copolymerized.

In the resin (A) for use in the composition of the present invention, the molar ratio of respective repeating structural units contained in the resin is appropriately set to control the dry etching resistance of resist, suitability for standard developer, adhesion to substrate, resist profile, and performances generally required of a resist, such as resolution, heat resistance and sensitivity.

When the composition of the present invention is used for ArF exposure, it is preferred that resin (A) used in the composition of the present invention contain no aromatic group from the viewpoint of transparency to ArF light. More specifically, in all repeating units of the resin (A), the content of the aromatic group-containing repeating unit is preferably 5 mol % or less, more preferably 3 mol % or less, and still more preferably free from the aromatic group-containing repeating unit. Further, the resin (A) preferably has a monocyclic or polycyclic alicyclic hydrocarbon structure.

Also, the resin (A) preferably contains neither a fluorine atom nor a silicon atom from the viewpoint of compatibility with a hydrophobic resin described later.

The resin (A) for use in the composition of the present invention is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit and an acrylate-based repeating unit, but the content of the acrylate-based repeating unit in the resin is preferably 50 mol % or less based on all repeating units. A copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted with a hydroxyl group or a cyano group, and from 0 to 20 mol % of other (meth)acrylate-based repeating units is also preferred.

The resin (A) may be commercially available if commercially launched or may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvents capable of dissolving the actinic ray-sensitive or radiation-sensitive resin composition of the present invention, such as propylene glycol monomethyl ether acetate, propylene glycol monomethyl ether and cyclohexanone. The polymerization is more preferably carried out using the same solvent as the solvent used in the actinic ray-sensitive or radiation-sensitive resin composition of the present invention. By the use of the same solvent, production of particles during storage may be suppressed.

The polymerization reaction is preferably carried out in an inert gas atmosphere such as nitrogen or argon. As for the polymerization initiator, the polymerization is started using a commercially available radical initiator (for example, an azo-based initiator, or peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2- methylpropionate). The initiator is added additionally or in parts, if desired. After the completion of reaction, the reaction solution is poured into a solvent, and the desired polymer is collected by powder or solid recovery or the like method. The concentration during the reaction is from 5 to 50 mass %, preferably from 30 to 50 mass %, and the reaction temperature is usually from 10 to 150° C., preferably from 30 to 120° C., more preferably from 60 to 100° C.

In order to inhibit the aggregation or the like of the resin after the composition was prepared, for example, as described in JP2009-037108A, there may be added a step of dissolving the synthesized resin in a solvent and heating the resulting solution at a temperature of about 30° C. to 90° C. for about 30 minutes to 4 hours.

After the completion of reaction, the reaction solution is left standing to cool to room temperature and purified. The purification may be carried out by a normal method, for example, a liquid-liquid extraction method of applying water washing or combining appropriate solvents to remove residual monomers or oligomer components; a purification method in a solution sate, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin may be precipitated as a solid by bringing the reaction solution into contact with a solvent in which the resin is sparingly soluble or insoluble (poor solvent) and which is present in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing these solvents, and the like, according to the kind of the polymer.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, based on 100 parts by mass of the polymer solution.

The temperature during the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be carried out using a commonly employed mixing vessel such as stirring tank by a known method such as a batch system or a continuous system.

The precipitated or reprecipitated polymer is usually subjected to commonly employed solid-liquid separation such as filtration and centrifugation, then dried and used. The filtration is carried out using a solvent-resistant filter element preferably under pressure. The drying is carried out under atmospheric pressure or reduced pressure (preferably under reduced pressure) at a temperature of approximately from 30 to 100° C., preferably on the order of 30 to 50° C.

Incidentally, after the resin is once precipitated and separated, the resin may be dissolved again in a solvent and then put into contact with a solvent in which the resin is sparingly soluble or insoluble. That is, there may be used a method including, after the completion of radical polymerization reaction, bringing the polymer into contact with a solvent in which the polymer is sparingly soluble or insoluble, to precipitate a resin (step a), separating the resin from the solution (step b), dissolving the resin again in a solvent to prepare a resin solution A (step c), bringing the resin solution A into contact with a solvent in which the resin is sparingly soluble or insoluble and which is present in a volumetric amount of less than 10 times (preferably 5 times or less) the resin solution A, to precipitate a resin solid (step d), and separating the precipitated resin (step e).

The weight average molecular weight of the resin (A) for use in the present invention is preferably from 1,000 to 200,000, more preferably from 2,000 to 20,000, still more preferably from 3,000 to 15,000, and particularly preferably from 3,000 to 10,000, in terms of polystyrene by the GPC method. When the weight average molecular weight is from 1,000 to 200,000, this may prevent the deterioration of a film forming property due to an increase in viscosity of the composition and also prevent the deterioration of developability as well as heat resistance and dry etching resistance of the film formed using the composition of the present invention.

The dispersity (molecular weight distribution, Mw/Mn) is usually from 1 to 3, preferably from 1 to 2.6, more preferably from 1 to 2, and still more preferably from 1.4 to 2.0. As the molecular weight distribution is smaller, the resolution and pattern profile are more excellent, the side wall of the resist pattern is smoother, and the roughness is more improved. In the description of the present invention, the weight average molecular weight (Mw) and number average molecular weight (Mn) of the resin (A) may be calculated by using, for example, an HLC-8120 (manufactured by Tosoh Corporation) using a TSK gel Multipore HXL-M (manufactured by Tosoh Corporation, 7.8 mm ID×30.0 cm) column and tetrahydrofuran (THF) as an eluent.

In the present invention, the content of the resin (A) in the entire composition is preferably from 30 to 99 mass %, and more preferably from 60 to 95 mass %, based on the total solid content.

As for the resin (A) for use in the present invention, one kind of a resin may be used or a plurality of kinds of resins may be used in combination.

<Compound Capable of Generating an Acid Upon Irradiation of Actinic Rays or Radiation>

The composition of the present invention contains at least one selected from the group of compounds represented by the following formulae (ZI-3), (ZI-4) and (ZI-5), as a compound capable of generating an acid upon irradiation of actinic rays or radiation (hereinafter, also referred to as "acid generator"). Such a structure is superior in terms of transparency to ArF light, as compared to triphenylsulfonium commonly used as an acid generator, thus improving the pattern profile after development and is therefore effective for improving LER.

First, the compound represented by formula (ZI-3) will be described.

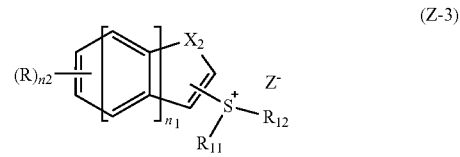

(Z-3)

In formula (ZI-3),

X$_2$ represents —CR$_{21}$=CR$_{22}$—, —NR$_{23}$—, —S— or —O—. R$_{21}$ and R$_{22}$ each independently represent a hydrogen atom, an alkyl group, a cycloalkyl group, an alkoxy group or an aryl group. R$_{23}$ represents a hydrogen atom, an alkyl group, a cycloalkyl group, an alkoxy group, an aryl group, an acyl group, an aralkyl group or an ester group.

R$_{11}$ and R$_{12}$ each independently represent an organic group. R$_{11}$ and R$_{12}$ may combine with each other to form a ring together with the sulfur atom in the formula.

R represents a substituent.

n$_1$ represents an integer of 0 to 3, and n$_2$ represents an integer of 0 or more.

Provided that when R$_{11}$ and R$_{12}$ are a phenyl group, n$_1$ represents an integer of 1 or more.

Z$^-$ represents a non-nucleophilic anion.

Examples of the organic group represented by R$_{11}$ or R$_{12}$ are the same as specific examples of the corresponding groups in formulae (ZI-3a) to (ZI-3d) described later.

The ring structure formed by combining R$_{11}$ and R$_{12}$ with each other together with the sulfur atom in the formula is preferably a 5-membered ring containing one sulfur atom or a condensed ring containing the same. The condensed ring preferably contains one sulfur atom and 18 or less carbon atoms, and is more preferably a ring structure represented by the following formulae (IV-1) to (IV-3).

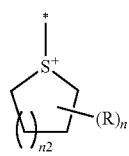

(IV-1)

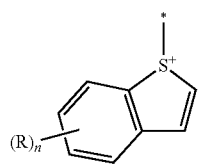

(IV-2)

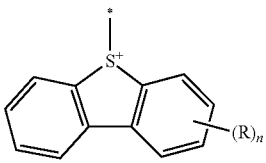

(IV-3)

In formulae (IV-1) to (IV-3), * represents a bond.

R represents an arbitrary substituent and examples thereof include a halogen atom, a hydroxyl group, a nitro group, a cyano group, a carboxyl group, a carbonyl group, an alkyl group (preferably having 1 to 20 carbon atoms), a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms).

n represents an integer of 0 to 4.

n$_2$ represents an integer of 0 to 3.

Examples of the substituent that the X$_2$-containing ring structure shown in the formula may have are the same as specific examples of the corresponding substituent in formulae (ZI-3a) to (ZI-3d) described later.

Examples of the substituent represented by R are the same as specific examples of the corresponding substituent in formulae (ZI-3a) to (ZI-3d) described later, that is, those exemplified for R$_{14}$ in formula (ZI-3a), Ra$_4$ in formula (ZI-3b), and R$_{41}$ in formulae (ZI-3c) and formula (ZI-3d).

Examples of the non-nucleophilic anion represented by Z$^-$ are the same as those described for the non-nucleophilic anion of Z$^-$ in formula (ZI) described later.

Among the compounds represented by formula (ZI-3), a preferred cation structure may be a cation structure represented by the following formulae (ZI-3a) to (ZI-3d).

First, the cation structure represented by formula (ZI-3a) will be described.

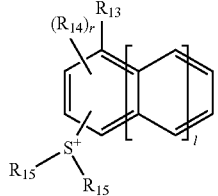

(ZI-3a)

In formula (ZI-3a), R$_{13}$ represents a hydrogen atom, a fluorine atom, a hydroxyl group, an alkyl group, a cycloalkyl group, an alkoxy group, an alkoxycarbonyl group, or a monocyclic or polycyclic cycloalkyl group-containing group. These groups may have a substituent.

R$_{14}$ represents, and when a plurality of R$_{14}$'s are present, each independently represents, an alkyl group, a cycloalkyl group, an alkoxy group, an alkoxycarbonyl group, an alkylcarbonyl group, an alkylsulfonyl group, a cycloalkylsulfonyl group, or a monocyclic or polycyclic cycloalkyl group-containing group. These groups may have a substituent.

Each R$_{15}$ independently represents an alkyl group, a cycloalkyl group or a naphthyl group. Two R$_{15}$'s may combine with each other to form a ring. These groups may have a substituent.

l represents an integer of 0 to 2.

r represents an integer of 0 to 8.

In formula (ZI-3a), the alkyl group of R$_{13}$, R$_{14}$ and R$_{15}$ is preferably a linear or branched alkyl group having 1 to 10 carbon atoms, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these alkyl groups, a methyl group, an ethyl group, an n-butyl group and a tert-butyl group are preferred.

The cycloalkyl group of R$_{13}$, R$_{14}$ and R$_{15}$ includes a monocyclic or polycyclic cycloalkyl group (preferably a cycloalkyl group having 3 to 20 carbon atoms), and examples thereof include cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl and adamantyl. Above all, cyclopropyl, cyclopentyl, cyclohexyl, and cyclooctyl are preferred.

The alkoxy group of R$_{13}$ and R$_{14}$ is preferably a linear or branched alkoxy group having 1 to 10 carbon atoms, and examples thereof include a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group and an n-decyloxy group. Among these alkoxy groups, a methoxy group, an ethoxy group, an n-propoxy group and an n-butoxy group are preferred.

The alkoxycarbonyl group of $R_{13}$ and $R_{14}$ is preferably a linear or branched alkoxycarbonyl group having 2 to 11 carbon atoms, and examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group and an n-decyloxycarbonyl group. Among these alkoxycarbonyl groups, a methoxycarbonyl group, an ethoxycarbonyl group and an n-butoxycarbonyl group are preferred.

Examples of the monocyclic or polycyclic cycloalkyl group-containing group of $R_{13}$ and $R_{14}$ include a monocyclic or polycyclic cycloalkyloxy group and an alkoxy group containing a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and preferably contains a monocyclic cycloalkyl group. The monocyclic cycloalkyloxy group having a total carbon number of 7 or more indicates a monocyclic cycloalkyloxy group where a cycloalkyloxy group such as a cyclopropyloxy group, a cyclobutyloxy group, a cyclopentyloxy group, a cyclohexyloxy group, a cyclobutyloxy group, a cyclooctyloxy group or a cyclododecanyloxy group arbitrarily has a substituent such as an alkyl group (for example, a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a tert-butyl group, or an isoamyl group), a hydroxyl group, a halogen atom (for example, fluorine, chlorine, bromine, or iodine), a nitro group, a cyano group, an amido group, a sulfonamido group, an alkoxy group (for example, a methoxy group, an ethoxy group, a hydroxyethoxy group, a propoxy group, a hydroxypropoxy group, or a butoxy group), an alkoxycarbonyl group (for example, a methoxycarbonyl group, an ethoxycarbonyl group), an acyl group (for example, a formyl group, an acetyl group, or a benzoyl group), an acyloxy group (for example, an acetoxy group, or a butyryloxy group) or a carboxyl group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably an alkoxy group having a monocyclic cycloalkyl group. The alkoxy group having a total carbon number of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group and a cyclohexylethoxy group, with a cyclohexylmethoxy group being preferred.

Examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$ above.

The alkylsulfonyl and cycloalkylsulfonyl group of $R_{14}$ are preferably a linear, branched or cyclic alkylsulfonyl group having 1 to 10 carbon atoms, and examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group and a cyclohexanesulfonyl group. Among these alkylsulfonyl groups and cycloalkylsulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

Examples of the substituent that may be substituted on each of the groups of $R_{13}$, $R_{14}$ and $R_{15}$ include a halogen atom (for example, fluorine atom), a hydroxyl group, a carboxyl group, a cyano group, a nitro group, an alkoxy group, an alkoxyalkyl group, an alkoxycarbonyl group and an alkoxycarbonyloxy group.

The alkoxy group includes, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a tert-butoxy group, a cyclopentyloxy group or cyclohexyloxy group.

The alkoxyalkyl group includes, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or 2-ethoxyethyl group.

The alkoxycarbonyl group includes, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, a cyclopentyloxycarbonyl group or a cyclohexyloxycarbonyl group.

The alkoxycarbonyloxy group includes, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a tert-butoxycarbonyloxy group, a cyclopentyloxycarbonyloxy group or a cyclohexyloxycarbonyloxy group.

The ring structure which may be formed by combining two $R_{15}$'s with each other includes a 5- or 6-membered ring, preferably a 5-membered ring (that is, tetrahydrothiophene ring), formed by two divalent $R_{15}$'s together with the sulfur atom in formula (ZI-3a) and may be fused with an aryl group or a cycloalkyl group. This divalent $R_{15}$ may have a substituent, and examples of the substituent include a hydroxyl group, a carboxyl group, a cyano group, a nitro group, an alkoxy group, an alkoxyalkyl group, an alkoxycarbonyl group and an alkoxycarbonyloxy group.

In formula (ZI-3a), $R_{15}$ is preferably, for example, a methyl group, an ethyl group, a naphthyl group, or a divalent group capable of forming a tetrahydrothiophene ring structure together with the sulfur atom when two $R_{15}$'s are combined.

The substituent that may be substituted on $R_{13}$ and $R_{14}$ is preferably a hydroxyl group, an alkoxy group, an alkoxycarbonyl group or a halogen atom (particularly a fluorine atom).

l is preferably 0 or 1, more preferably 1.

r is preferably 0 to 2.

Specific examples of the cation structure represented by formula (ZI-3a) are illustrated below.

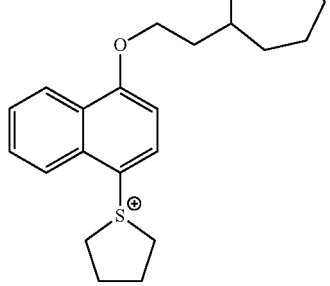
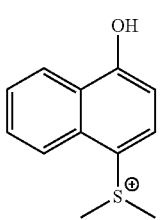
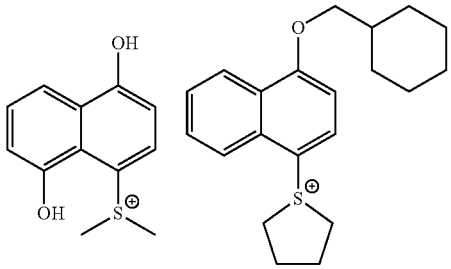
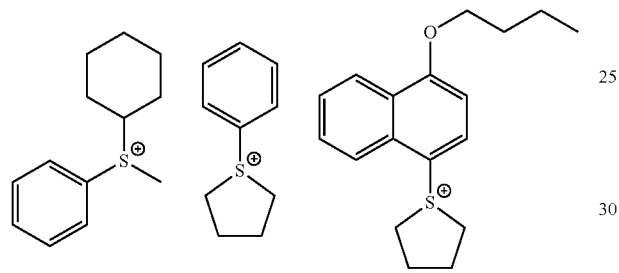
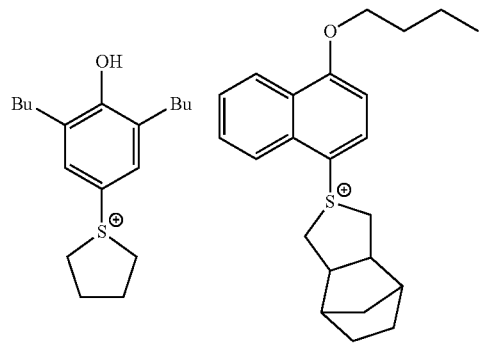
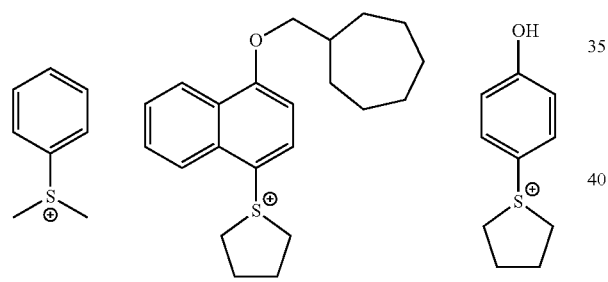
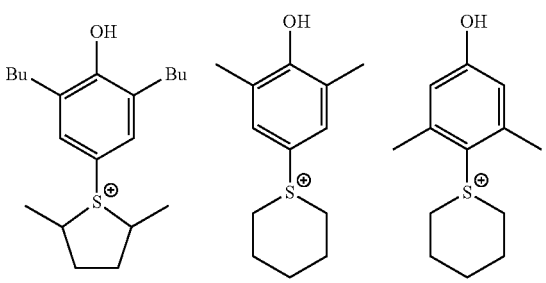
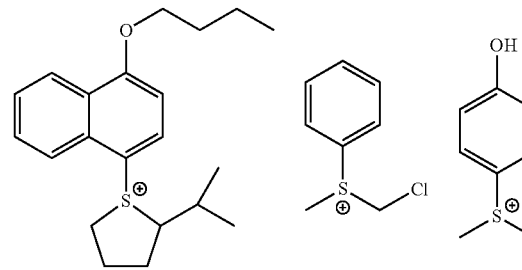
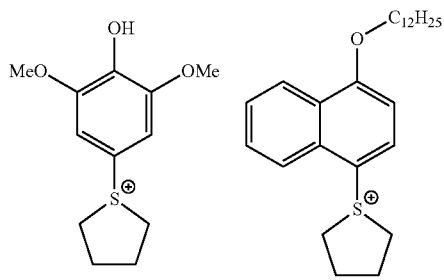
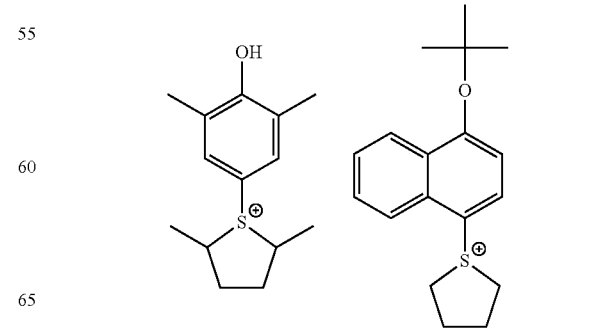

-continued

71
-continued
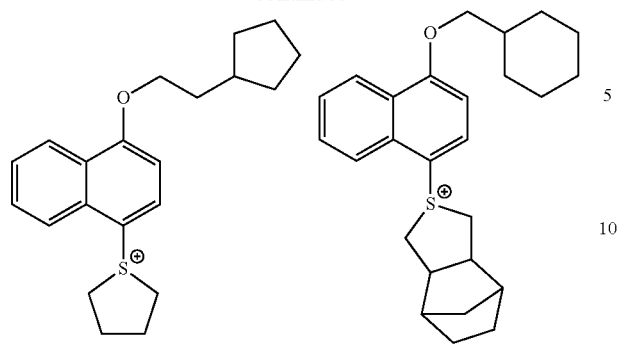
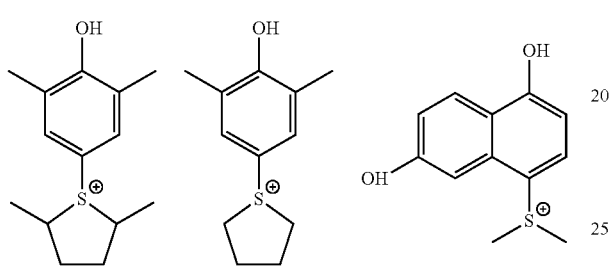
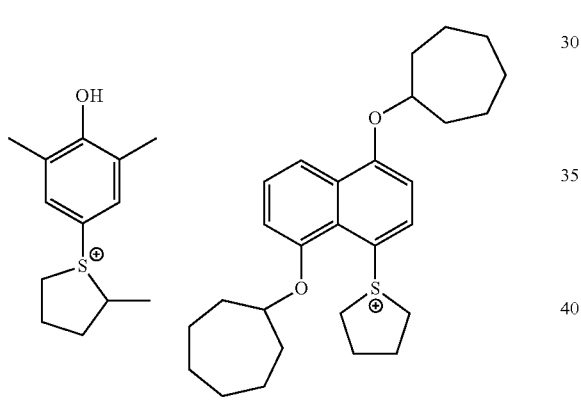
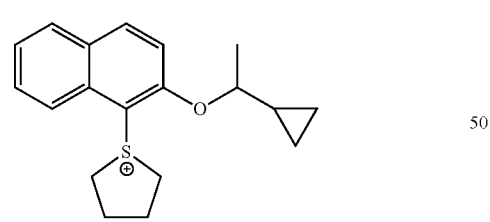
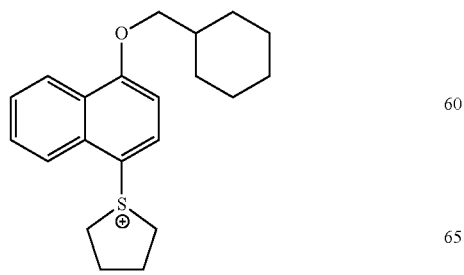
72
-continued
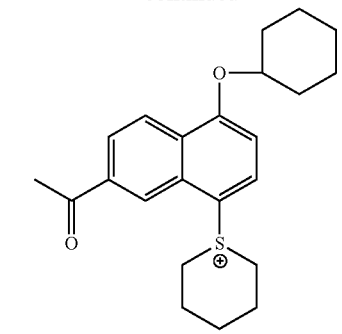
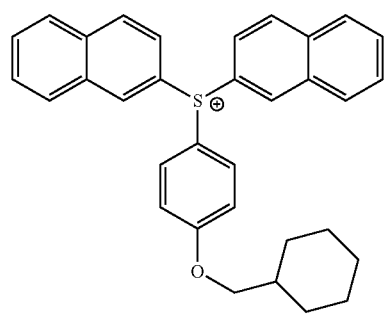
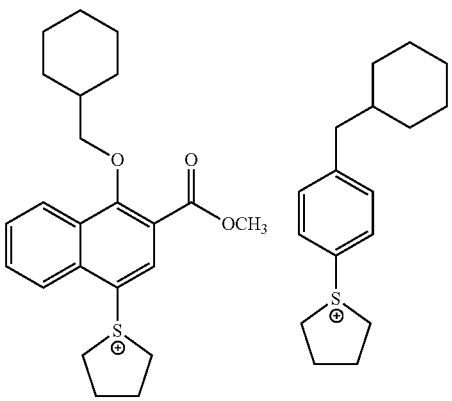
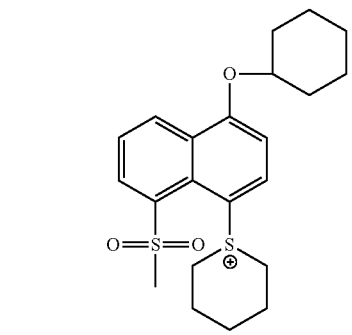
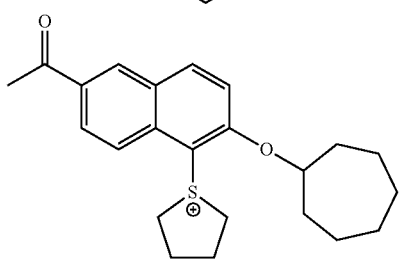

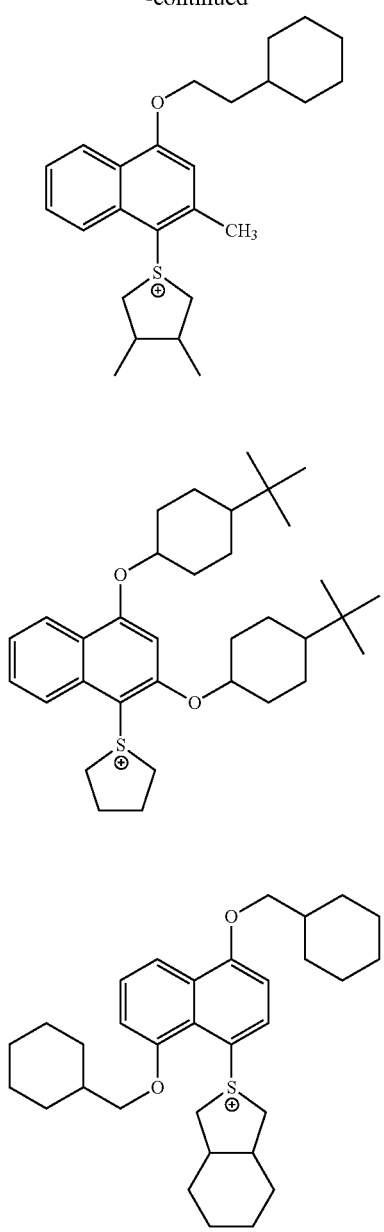
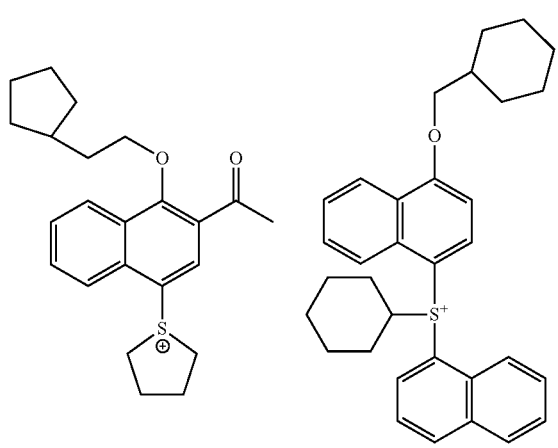
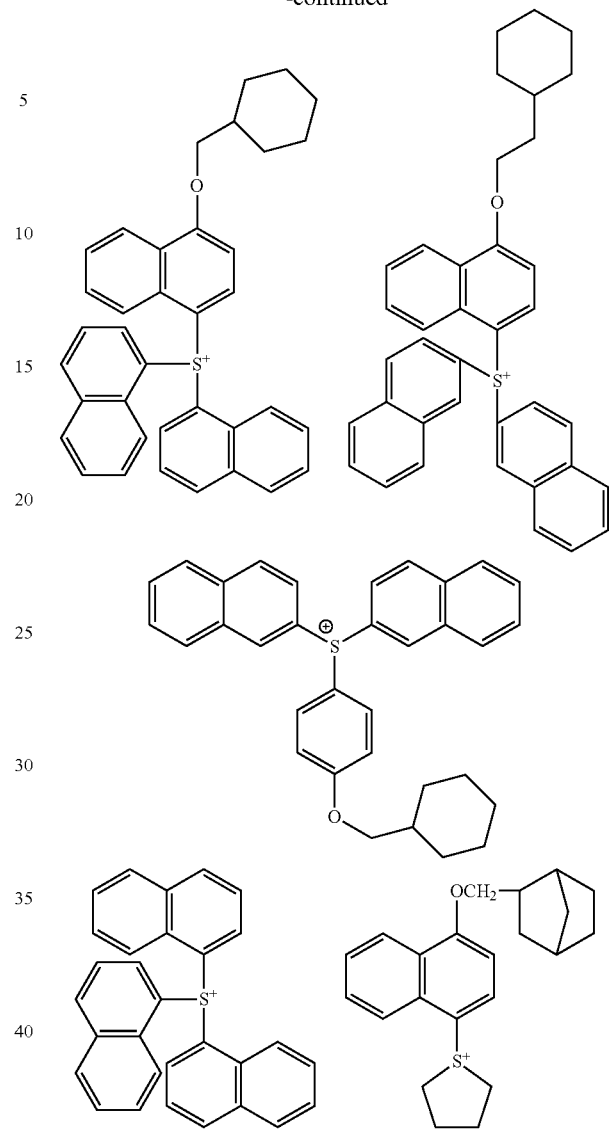

Next, the cation structure represented by formula (ZI-3b) will be described.

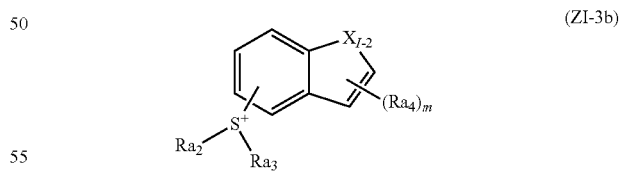

(ZI-3b)

In formula (ZI-3b), $X_{1-2}$ represents an oxygen atom, a sulfur atom or an —$NRa_1$- group, and $Ra_1$ represents a hydrogen atom, an alkyl group, a cycloalkyl group, an aryl group, an acyl group, an aralkyl group or an ester group.

$Ra_2$ and $Ra_3$ each independently represent an alkyl group, a cycloalkyl group or an alkenyl group. $Ra_2$ and $Ra_3$ may combine with each other to form a ring.

$Ra_4$ represents, and when a plurality of $Ra_4$'s are present, each independently represents, a substituent.

m represents an integer of 0 to 3.

The alkyl group of $Ra_1$ to $Ra_3$ is preferably a linear or branched alkyl group having 1 to 20 carbon atoms.

The cycloalkyl group of $Ra_1$ to $Ra_3$ is preferably a cycloalkyl group having 3 to 20 carbon atoms.

The aryl group of $Ra_1$ to $Ra_1$ is preferably an aryl group having 6 to 10 carbon atoms.

The acyl group of $Ra_1$ is preferably an acyl group having 2 to 20 carbon atoms.

The alkenyl group of $Ra_2$ and $Ra_3$ is preferably an alkenyl group having 2 to 15 carbon atoms.

The ring structure which may be formed by combining $Ra_2$ and $Ra_3$ with each other is preferably a group capable of forming a 5-membered ring or 6-membered ring, particularly preferably a 5-membered ring (that is, tetrahydrothiophene ring), together with the sulfur atom in formula (ZI-3b), and examples thereof are same as those described for the ring which may be formed by combining $R_{15}$'s in formula (ZI-3a) above.

Examples of the substituent of $Ra_4$ include an alkyl group (preferably having 1 to 20 carbon atoms), a cycloalkyl group (preferably having 3 to 20 carbon atoms), an aryl group (preferably having 6 to 10 carbon atoms), an alkoxy group (preferably having 1 to 20 carbon atoms), an acyl group (preferably having 2 to 20 carbon atoms), an acyloxy group (preferably having 2 to 20 carbon atoms), a fluorine atom, a chlorine atom, a bromine atom, an iodine atom, a hydroxyl group, a carboxyl group, a nitro group, a cyano group, an alkoxycarbonyl group, an alkylsulfonyl group, an arylsulfonyl group, an arylcarbonyl group, an alkylcarbonyl group, and an alkenylcarbonyl group.

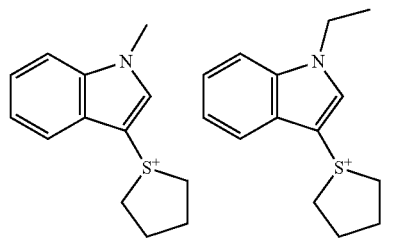

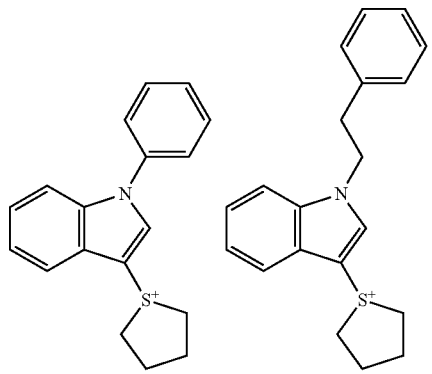

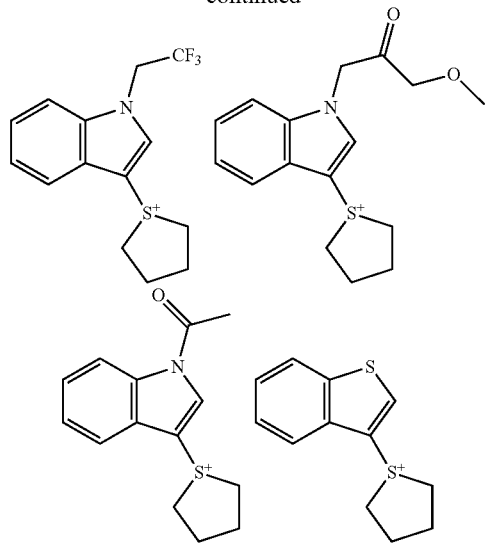

Next, the cation structure represented by formula (ZI-3c) will be described.

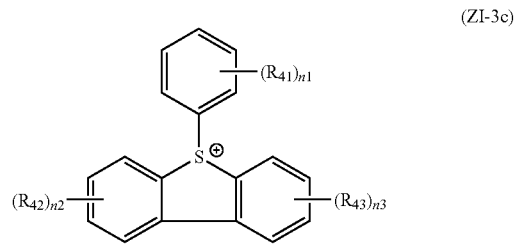

(ZI-3c)

In formula (ZI-3c), $R_{41}$ to $R_{43}$ each independently represent an alkyl group, a cycloalkyl group, an alkoxy group, an alkylcarbonyl group, a halogen atom (for example, a chlorine atom) or a hydroxyl group.

As for $R_{41}$ to $R_{43}$, the alkyl group is preferably a linear or branched lower alkyl group having 1 to 5 carbon atoms, and particularly preferably a methyl group, an ethyl group, a propyl group, an n-butyl group or a tert-butyl group.

The cycloalkyl group is preferably a cycloalkyl group having 5 to 8 carbon atoms, particularly preferably, for example, a cyclohexyl group or a cyclopentyl group.

The alkoxy group is preferably an alkoxy group having 1 to 5 carbon atoms, more preferably a linear or branched alkoxy group, and particularly preferably a methoxy group or an ethoxy group.

The alkyl group in the alkylcarbonyl group is preferably a methyl group, an ethyl group, an n-propyl group, an iso-propyl group, an n-butyl group or a tert-butyl group.

n1 to n3 each independently represent an integer of 0 to 2, preferably each independently represent 0 or 1. More preferably, all of n1 to n3 are 0.

When n1 to n3 are 2, a plurality of $R_{41}$'s, $R_{42}$'s or $R_{43}$'s may be the same as or different from every other $R_{41}$, $R_{42}$ or $R_{43}$.

Hereinafter, specific preferred examples of the cation structure represented by formula (ZI-3c) are illustrated below.

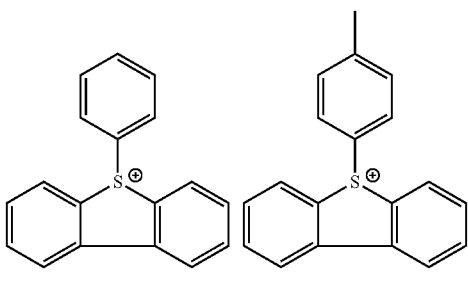

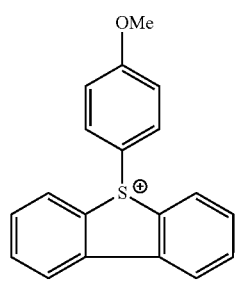

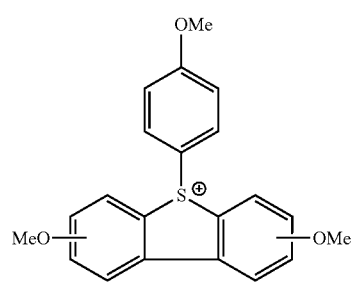

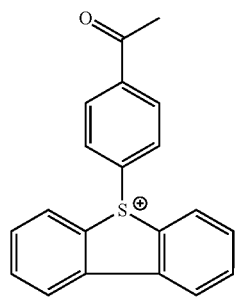

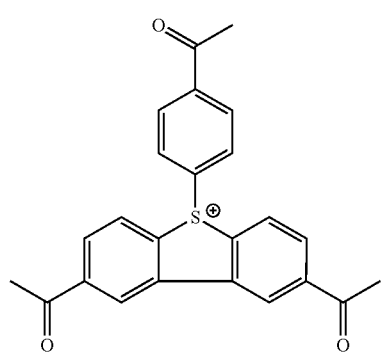

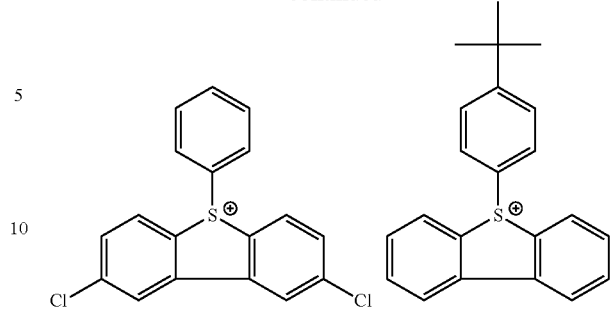

Next, the cation structure represented by formula (ZI-3d) will be described.

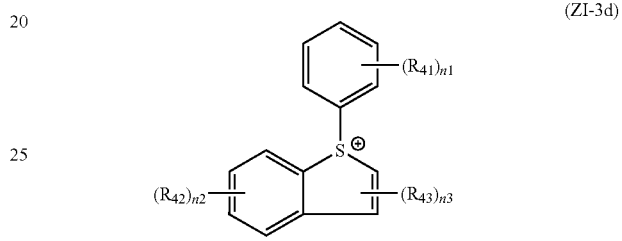

(ZI-3d)

In formula (ZI-3d), $R_{41}$ to $R_{43}$ each independently represent an alkyl group, a cycloalkyl group, an alkylcarbonyl group, an alkoxy group, a carboxyl group, a halogen atom (for example, a chlorine atom), a hydroxyl group or a hydroxyalkyl group.

The alkyl group, cycloalkyl group, alkoxy group, and alkylcarbonyl group as $R_{41}$ to $R_{43}$ are the same as those described for $R_{41}$ to $R_{43}$ in formula (ZI-3c).

The hydroxyalkyl group is preferably a group in which one or plural hydrogen atoms of the alkyl group are substituted by hydroxyl groups, and examples thereof include a hydroxymethyl group, a hydroxyethyl group, and a hydroxypropyl group.

n1 represents an integer of 0 to 3, preferably 1 or 2, and more preferably 1.

n2 represents an integer of 0 to 3, preferably 0 or 1, and more preferably 0.

n3 represents an integer of 0 to 2, preferably 0 or 1, and more preferably 1.

Provided that all of n1, n2 and n3 are not 0 at the same time.

Hereinafter, specific preferred examples of the cation represented by formula (ZI-3d) are illustrated below.

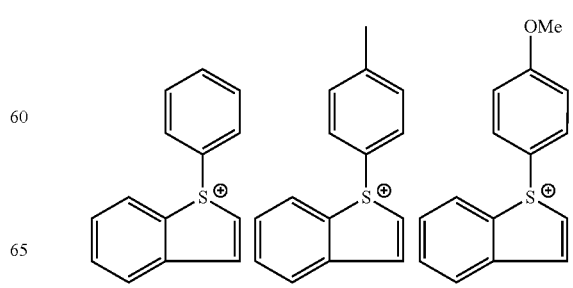

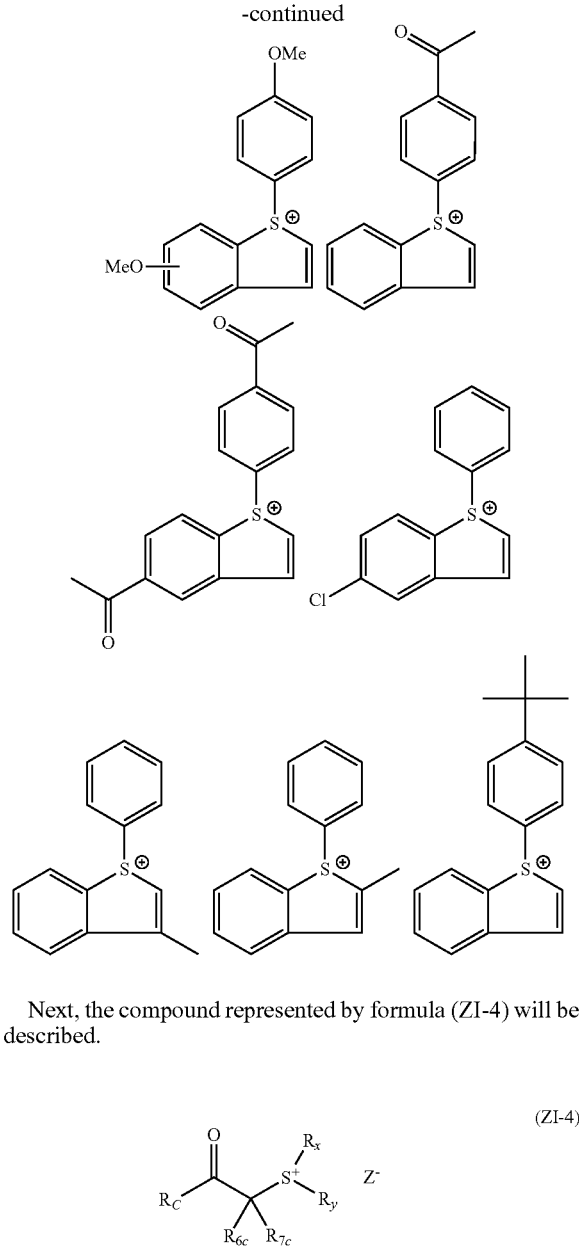

Next, the compound represented by formula (ZI-4) will be described.

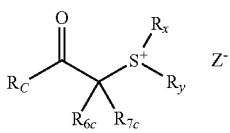

In formula (ZI-4), $R_c$ represents an aryl group.

$R_{6c}$ and $R_{7c}$ each independently represent a hydrogen atom, an alkyl group, a cycloalkyl group, a halogen atom, a cyano group or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group or a vinyl group.

Two or more groups selected from $R_c$, $R_{6c}$, $R_{7c}$, $R_x$ and $R_y$ may combine with each other to form a ring structure, and the ring structure may contain an oxygen atom, a sulfur atom, an ester bond, or an amide bond.

$Z^-$ represents a non-nucleophilic anion.

Formula (ZI-4) will be described in more detail.

The aryl group in $R_c$ is preferably an aryl group having 6 to 14 carbon atoms. The aryl group may have a substituent.

The alkyl group as $R_{6c}$ and $R_{7c}$ may be either linear or branched and is, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group, or a linear or branched pentyl group).

The cycloalkyl group as $R_{6c}$ and $R_{7c}$ is, for example, a cycloalkyl group having 3 to 8 carbon atoms (for example, a cyclopentyl group, or a cyclohexyl group).

The aryl group as $R_{6c}$ and $R_{7c}$ is preferably an aryl group having 5 to 15 carbon atoms, and examples thereof include a phenyl group and a naphthyl group.

In the case where $R_{6c}$ and $R_{7c}$ are combined to form a ring, the group formed by combining $R_{6c}$ and $R_{7c}$ is preferably an alkylene group having 2 to 10 carbon atoms, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group in $R_{6c}$ and $R_{7c}$.

Examples of the 2-oxoalkyl group and 2-oxocycloalkyl group as $R_x$ and $R_y$ include a group having >C=O at the 2-position of the alkyl group or cycloalkyl group as $R_{6c}$ and $R_{7c}$. The alkoxy group in the alkoxycarbonylalkyl group may be linear, branched or cyclic, and examples thereof include an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group, a linear or branched pentoxy group), a cyclic alkoxy group having 3 to 8 carbon atoms (for example, a cyclopentyloxy group, a cyclohexyloxy group). The alkyl group is, for example, an alkyl group having 1 to 12 carbon atoms, preferably a linear alkyl group having 1 to 5 carbon atoms (for example, a methyl group, or an ethyl group).

The allyl group as $R_x$ and $R_y$ is not particularly limited but is preferably an unsubstituted allyl group or an allyl group substituted with a monocyclic or polycyclic cycloalkyl group.

The vinyl group as $R_x$ and $R_y$ is not particularly limited but is preferably an unsubstituted vinyl group or a vinyl group substituted with a monocyclic or polycyclic cycloalkyl group.

The ring structure which may be formed by combining $R_x$ and $R_y$ with each other includes a 5- or 6-membered ring formed by divalent $R_x$ and $R_y$ (for example, a methylene group, an ethylene group or a propylene group) together with the sulfur atom in formula (ZI-4), and a 5-membered ring (that is, a tetrahydrothiophene ring) is particularly preferred.

Each of $R_x$ and $R_y$ is an alkyl or cycloalkyl group having a carbon number of preferably 4 or more, more preferably 6 or more, still more preferably 8 or more.

Each of the groups represented by $R_{6c}$, $R_{7c}$, $R_x$ and $R_y$ may further have a substituent, and the substituent which each group may further have includes a halogen atom, a hydroxyl group, a nitro group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). As for the aryl group, the cyclic structure in a cycloalkyl group or the like, and the aminoacyl group, the substituent further includes an alkyl group (preferably having 1 to 20 carbon atoms).

Specific examples of the non-nucleophilic anion represented by Z⁻ are the same as those described for Z⁻ in formula (ZI) described later.

Among the compounds represented by formula (ZI-4), a preferred cation structure includes a cation structure represented by the following formula (ZI-4a).

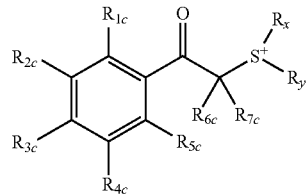

(ZI-4a)

In formula (ZI-4a), $R_{6c}$, $R_{7c}$, $R_x$ and $R_y$ have the same meanings as those in formula (ZI-4), respectively.

$R_{1c}$ to $R_{5c}$ each independently represent a hydrogen atom, an alkyl group, a cycloalkyl group, an alkoxy group, a halogen atom or a phenylthio group.

Two or more groups selected from $R_{1c}$ to $R_{7c}$, $R_x$ and $R_y$, may combine with each other to form a ring structure, and the ring structure may contain an oxygen atom, a sulfur atom, an ester bond or an amide bond.

Specific examples of the alkyl group and the cycloalkyl group as $R_{1c}$ to $R_{5c}$ are the same as specific examples of alkyl group and cycloalkyl group in $R_{6c}$ and $R_{7c}$ above.

The alkoxy group as $R_{1c}$ to $R_{5c}$ may be linear, branched or cyclic and is, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group, or a linear or branched pentoxy group), or a cyclic alkoxy group having 3 to 8 carbon atoms (for example, a cyclopentyloxy group, or a cyclohexyloxy group).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Due to such a compound, the solvent solubility is further enhanced and production of particles during storage can be suppressed.

Hereinafter, specific preferred examples of the cation structure represented by formula (ZI-4) are illustrated below.

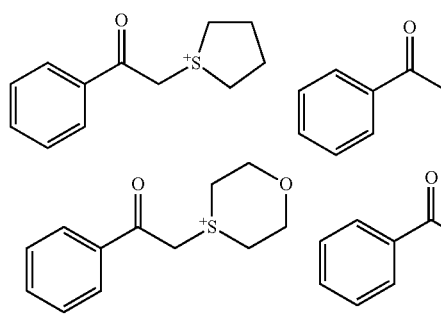

-continued

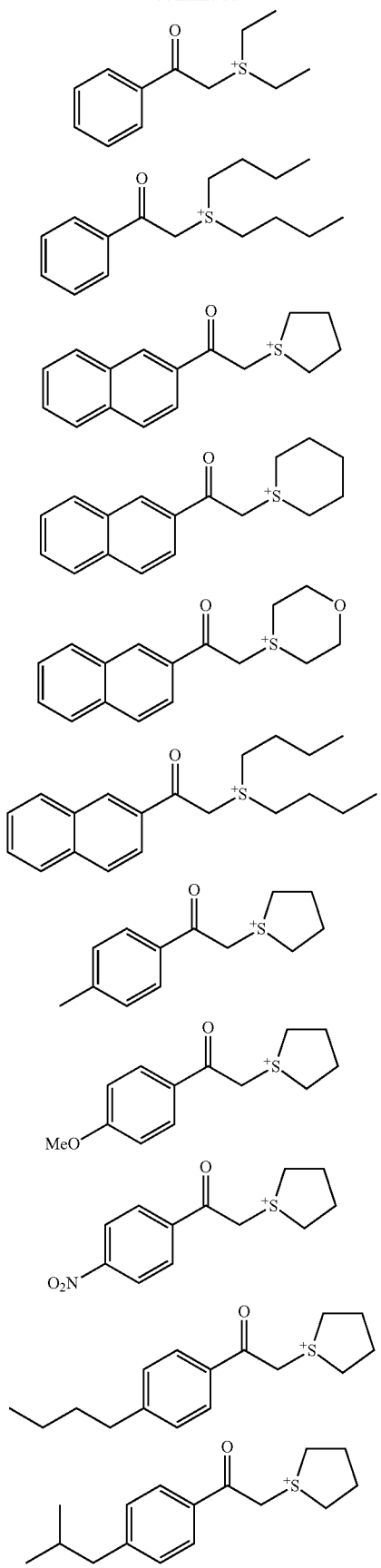

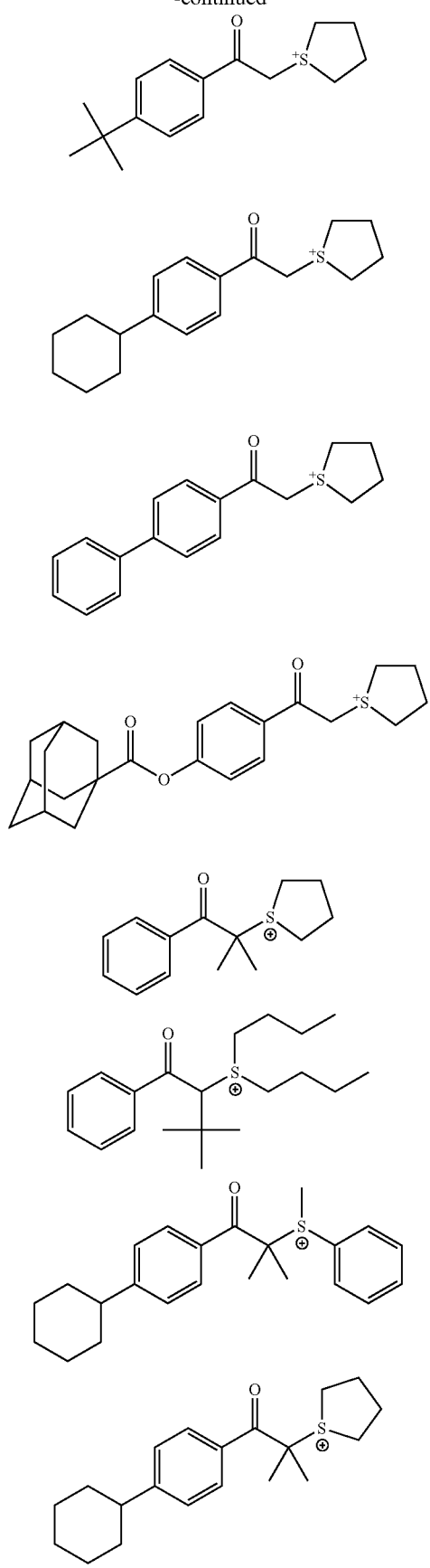
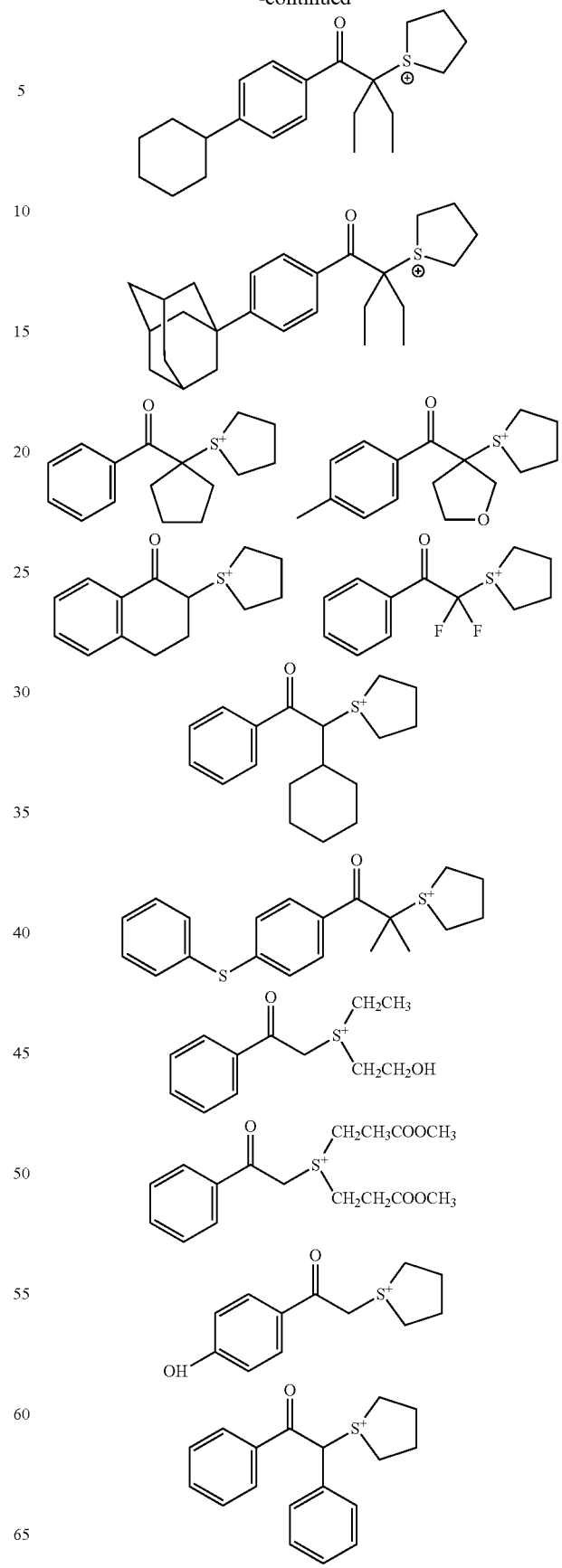

-continued

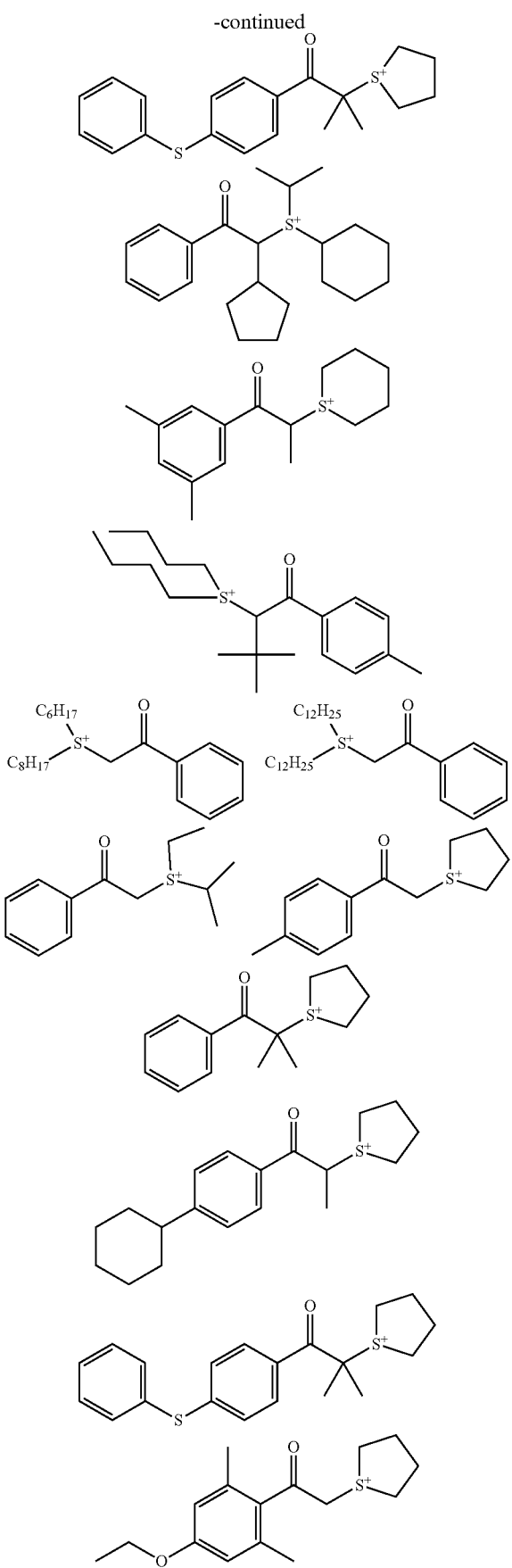

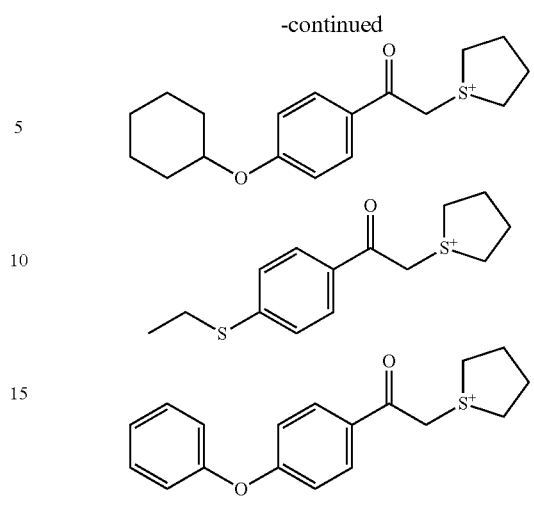

Next, the compound represented by formula (ZI-5) will be described.

(ZI-5)

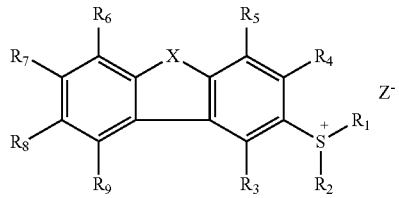

In the formula (ZI-5),

X represents an oxygen atom, a sulfur atom or —N(Rx)—. Rx represents a hydrogen atom, an alkyl group, a cycloalkyl group, an acyl group, an alkenyl group, an alkoxycarbonyl group, an aryl group, an arylcarbonyl group or an aryloxycarbonyl group.

$R_1$ and $R_2$ each independently represent an alkyl group, a cycloalkyl group or an aryl group.

$R_3$ to $R_9$ each independently represent a hydrogen atom, an alkyl group, a cycloalkyl group, an alkoxy group, an alkoxycarbonyl group, an acyl group, an alkylcarbonyloxy group, an aryl group, an aryloxy group, an aryloxycarbonyl group or an arylcarbonyloxy group.

$R_1$ and $R_2$ may combine with each other to form a ring. Two or more of $R_6$ to $R_9$, $R_3$ and $R_9$, $R_4$ and $R_5$, $R_5$ and Rx, and $R_6$ and Rx each may combine with each other to form a ring.

$Z^-$ represents a non-nucleophilic anion.

X is preferably a sulfur atom or —N(Rx)—, from the viewpoint of maintaining a low light absorption property (for example, absorbance at a wavelength of 193 nm).

The alkyl group for $R_1$ to $R_9$, and Rx may have a substituent, is preferably a linear or branched alkyl group having 1 to 20 carbon atoms, and may have an oxygen atom, a sulfur atom or a nitrogen atom in the alkyl chain. Specific examples of the alkyl group include linear alkyl groups such as a methyl group, an ethyl group, an n-propyl group, an n-butyl group, an n-pentyl group, an n-hexyl group, an n-octyl group, an n-dodecyl group, an n-tetradecyl group, and an n-octadecyl group, and branched alkyl groups such as an isopropyl group, an isobutyl group, a t-butyl group, a neopentyl group, and a 2-ethylhexyl group.

Examples of the substituent-containing alkyl group for Rx include a cyanomethyl group, a 2,2,2-trifluoroethyl group, a methoxycarbonylmethyl group, and an ethoxycarbonylmethyl group.

Examples of the substituent-containing alkyl group for $R_1$ and $R_2$ include a methoxyethyl group.

Further, the substituent-containing alkyl group includes, particularly, a group where a cycloalkyl group is substituted on a linear or branched alkyl group, such as an adamantylmethyl group, an adamantylethyl group, a cyclohexylethyl group and a camphor residue.

The cycloalkyl group of $R_1$ to $R_9$, and Rx, which may have a substituent, is preferably a cycloalkyl group having 3 to 20 carbon atoms and may contain an oxygen atom in the ring. Specific examples thereof include a cyclopropyl group, a cyclopentyl group, a cyclohexyl group, a norbornyl group and an adamantyl group.

The acyl group of $R_3$ to $R_9$, and Rx, which may have a substituent, is preferably an acyl group having 1 to 10 carbon atoms. Specific examples thereof include an acetyl group, a propionyl group, and an isobutyryl group.

The alkenyl group of Rx is preferably an alkenyl group having 2 to 8 carbon atoms, and examples thereof include a vinyl group, an allyl group, and a butenyl group.

The alkoxy group of $R_3$ to $R_9$, which may have a substituent, is preferably an alkoxy group having 1 to 20 carbon atoms. Specific examples thereof include a methoxy group, an ethoxy group, an isopropyloxy group, and a cyclohexyloxy group.

The alkoxycarbonyl group of $R_3$ to $R_9$, which may have a substituent, is preferably an alkoxycarbonyl group having 2 to 20 carbon atoms. Specific examples thereof include a methoxycarbonyl group, an ethoxycarbonyl group, an isopropyloxycarbonyl group, and a cyclohexyloxycarbonyl group.

The alkylcarbonyloxy group of $R_3$ to $R_9$, which may have a substituent, is preferably an alkylcarbonyloxy group having 2 to 20 carbon atoms. Specific examples thereof include a methylcarbonyloxy group, an ethylcarbonyloxy group, an isopropylcarbonyloxy group, and a cyclohexylcarbonyloxy group.

The aryl group of $R_1$ to $R_9$, and Rx, which may have a substituent, is preferably an aryl group having 6 to 14 carbon atoms, and examples thereof include a phenyl group, and a naphthyl group.

The aryloxy group of $R_3$ to $R_9$, which may have a substituent, is preferably an aryloxy group having 6 to 14 carbon atoms, and examples thereof include a phenyloxy group, and naphthyloxy group.

The aryloxycarbonyl group of $R_3$ to $R_9$, and Rx, which may have a substituent, is preferably an aryloxycarbonyl group having 7 to 15 carbon atoms, and examples thereof include a phenyloxycarbonyl group, and a naphthyloxycarbonyl group.

The arylcarbonyloxy group of $R_3$ to $R_9$, which may have a substituent, is preferably an arylcarbonyloxy group having 7 to 15 carbon atoms, and examples thereof include a phenylcarbonyloxy group, and a naphthylcarbonyloxy group.

The arylcarbonyl group of Rx, which may have a substituent, is preferably an arylcarbonyl group having 7 to 15 carbon atoms, and examples thereof include a phenylcarbonyl group, and a naphthylcarbonyl group.

Examples of the substituent that the cycloalkyl group of $R_1$ to $R_9$, and Rx, the acyl group of $R_3$ to $R_9$, and Rx, the alkoxy group of $R_3$ to $R_9$, the alkoxycarbonyl group of $R_3$ to $R_9$, the alkylcarbonyloxy group of $R_3$ to $R_9$, the aryl group of $R_1$ to $R_9$, and Rx, the aryloxy group of $R_3$ to $R_9$, the aryloxycarbonyl group of $R_3$ to $R_9$, and Rx, the arylcarbonyloxy group of $R_3$ to $R_9$, and the arylcarbonyl group of Rx may further have include an alkyl group (linear, branched, or cyclic, and preferably having 1 to 12 carbon atoms), an aryl group (preferably having 6 to 14 carbon atoms), a halogen atom such as a nitro group or a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), and an acyl group (preferably having 2 to 12 carbon atoms).

The ring structure which may be formed by combining $R_1$ and $R_2$ with each other includes a 5- or 6-membered ring formed by divalent $R_1$ and $R_2$ (for example, an ethylene group, a propylene group, and a 1,2-cyclohexylene group) together with the sulfur atom in formula (I), and a 5-membered ring (that is, a tetrahydrothiophene ring) is particularly preferred. From the viewpoint of decomposition efficiency of an acid anion generated, it is preferred that $R_1$ and $R_2$ do not combine with each other to form a ring.

The ring structure which may be formed by combining two or more of $R_6$ to $R_9$, $R_3$ and $R_9$, $R_4$ and $R_5$, $R_5$ and Rx, and $R_6$ and Rx with each other includes preferably a 5- or 6-membered ring, and a 6-membered ring is particularly preferred.

$R_1$ and $R_2$ are particularly preferably an alkyl group or an aryl group.

Particularly preferred examples of $R_3$ to $R_9$ include an alkyl group which may have a substituent, or a hydrogen atom. When the composition of the present invention is used for an ArF resist, a hydrogen atom is particularly preferred from the viewpoint of absorption intensity at 193 nm.

Rx is particularly preferably an alkyl group or an acyl group.

Specific examples of the non-nucleophilic anion represented by $Z^-$ are the same as those described for $Z^-$ in formula (ZI) described later.

Hereinafter, with respect to the compound represented by formula (ZI-5), specific preferred examples of the cation structure are illustrated below. In the following formulae, Me represents a methyl group, and Et represents an ethyl group.

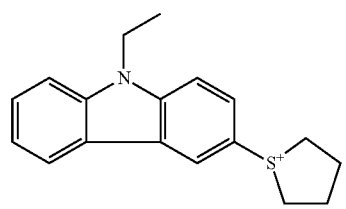

A-1

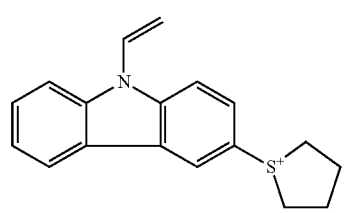

A-2

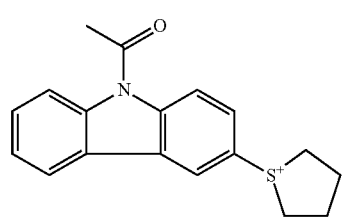

A-3

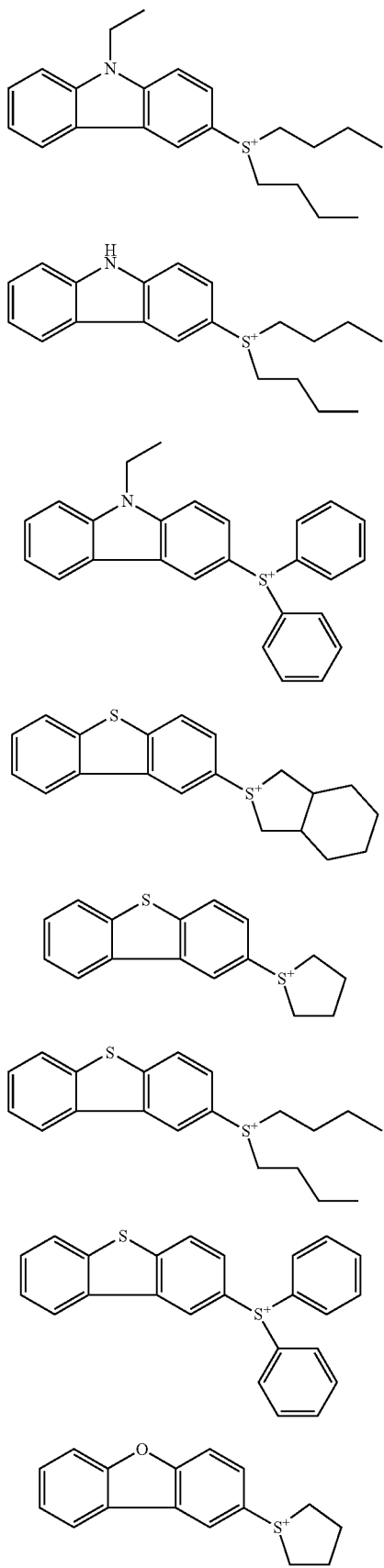
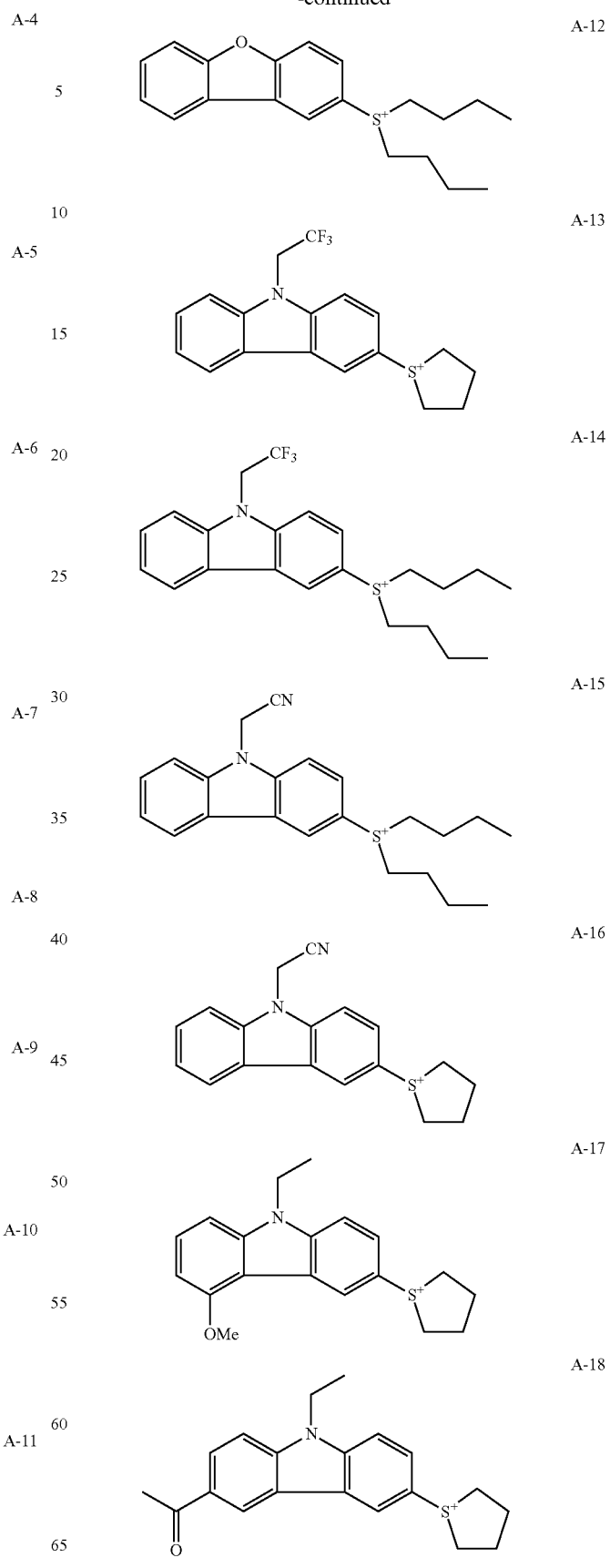

A-19
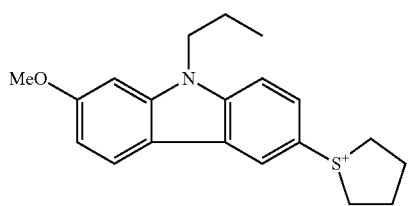
A-20
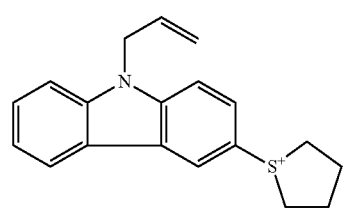
A-21
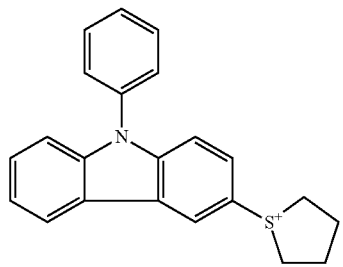
A-22
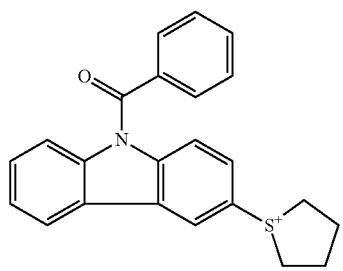
A-23
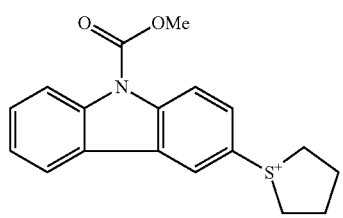
A-24
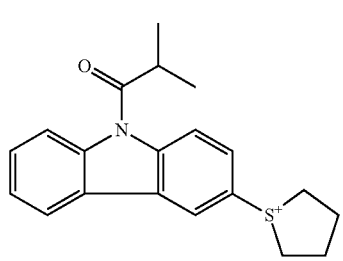
A-25
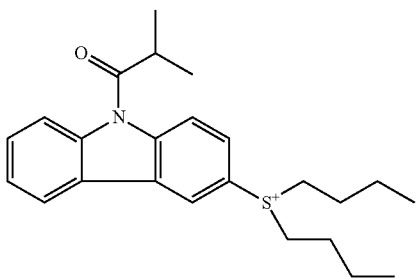
A-26
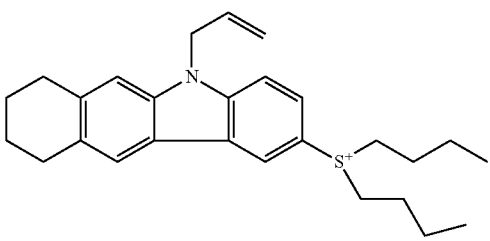
A-27
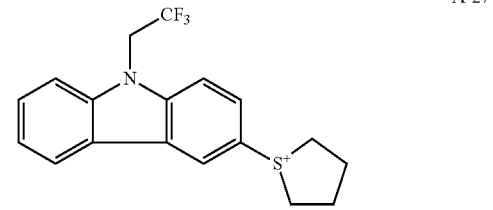
A-28
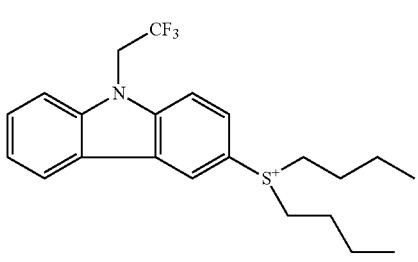
A-29
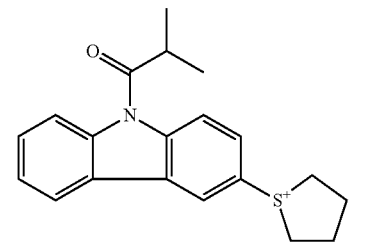
A-30
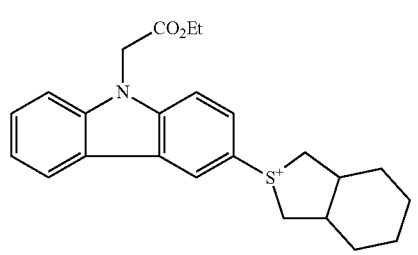
Among the cation structures represented by formulae (ZI-3a) to (ZI-3d), (ZI-4a) and (ZI-5), preferred structures are cation structures represented by formulae (ZI-3a), (ZI-3b), (ZI-4a) and (ZI-5), and more preferably cation structures represented by formulae (ZI-3a), (ZI-4a) and (ZI-5).

In the present invention, together with the foregoing acid generator represented by formula (ZI-3), (ZI-4) or (ZI-5), another acid generator may be used in combination. The acid generator which may be used in combination is not particularly limited, and use can be made of a member appropriately selected from among a photoinitiator for photocationic polymerization, a photoinitiator for photoradical polymerization, a photo-achromatic agent and photodiscoloring agent of dyes, and any of publicly known compounds that when irradiated with actinic rays or radiation, generate an acid, or are employed in microresists, etc., and mixtures thereof.

Examples of the acid generator which may be used in combination include a diazonium salt, a phosphonium salt, a sulfonium salt, an iodonium salt, imidesulfonate, oxime sulfonate, diazodisulfone, disulfone, and o-nitrobenzylsulfonate.

Further, use can be made of compounds obtained by introducing any of these groups or compounds that generate an acid when irradiated with actinic rays or radiation, in a polymer principal chain or side chain; for example, compounds described in U.S. Pat. No. 3,849,137, DE 3914407, JP1988-26653A (JP-S63-26653A), JP1980-164824A (JP-S55-164824A), JP1987-69263A (JP-S62-69263A), JP1988-146038A (JP-S63-146038A), JP1988-163452A (JP-S63-163452A), JP1987-153853A (JP-S62-153853A), JP1988-146029A (JP-S63-146029A), etc.

Furthermore, use can also be made of compounds that generate an acid when irradiated with light, described in U.S. Pat. No. 3,779,778 and EP 126,712.

Among the acid generators which may be used in combination, compounds represented by the following formulae (ZI), (ZII), and (ZIII) are preferred.

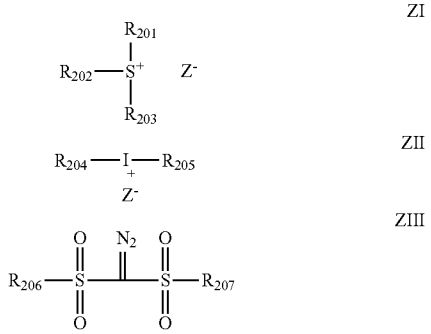

In formula (ZI), $R_{201}$, $R_{202}$ and $R_{203}$ each independently represent an organic group.

The carbon number of the organic group as $R_{201}$, $R_{202}$ and $R_{203}$ is generally from 1 to 30, and preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (for example, a butylene group, or a pentylene group).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methide anion.

The non-nucleophilic anion is an anion having an extremely low ability for causing a nucleophilic reaction, and this anion can suppress the decomposition over time due to an intramolecular nucleophilic reaction. Due to this anion, the stability of the resist over time is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having 1 to 30 carbon atoms or a cycloalkyl group having 3 to 30 carbon atoms, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aromatic group in the aromatic sulfonate anion is preferably an aryl group having 6 to 14 carbon atoms, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (for example, a fluorine atom, a chlorine atom, a bromine atom, or an iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). As for the aryl group or ring structure in each group, examples of the substituent further include an alkyl group (preferably having 1 to 15 carbon atoms).

Examples of the aliphatic moiety in the aliphatic carboxylate anion include the same alkyl groups and cycloalkyl groups as those in the aliphatic sulfonate anion.

Examples of the aromatic group in the aromatic carboxylate anion include the same aryl groups as those in the aromatic sulfonate anion.

The aralkyl group in the aralkylcarboxylate anion is preferably an aralkyl group having 6 to 12 carbon atoms, and examples thereof include a benzyl group, a phenethyl group, a naphthylmethyl group, a naphthylethyl group and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent of the alkyl group, cycloalkyl group, aryl group and aralkyl group in the aliphatic carboxylate anion, aromatic carboxylate anion and aralkylcarboxylate anion include the same halogen atoms, alkyl groups, cycloalkyl groups, alkoxy groups and alkylthio groups as in the aromatic sulfonate anion.

Examples of the sulfonylimide anion include a saccharin anion.

The alkyl group in the bis(alkylsulfonyl)imide anion and tris(alkylsulfonyl)methide anion is preferably an alkyl group having 1 to 5 carbon atoms, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, and alkyl, alkoxy, alkylthio, alkyloxysulfonyl, aryloxysulfonyl and cycloalkylaryloxysulfonyl groups each substituted with a halogen atom. An alkyl group substituted with a fluorine atom is preferred. Further, an embodiment in which two alkyl groups in the bis(alkylsulfonyl)imide anion combine with each other to form a ring structure is also preferred. In this case, the ring structure formed is preferably a 5- to 7-membered ring.

Other examples of the non-nucleophilic anion include phosphorus fluoride, boron fluoride and antimony fluoride.

The non-nucleophilic anion of $Z^-$ is preferably an aliphatic sulfonate anion substituted with a fluorine atom at the α-position of sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom, more preferably a perfluoroaliphatic sulfonate anion having 4 to 8 carbon atoms or a benzenesulfonate anion having a fluorine atom, still more preferably a nonafluorobutanesulfonate anion, a perfluorooctanesulfonate anion, a pentafluorobenzenesulfonate anion or a 3,5-bis(trifluoromethyl)benzenesulfonate anion.

The non-nucleophilic anion of $Z^-$ is preferably represented by, for example, the following formula (LD1).

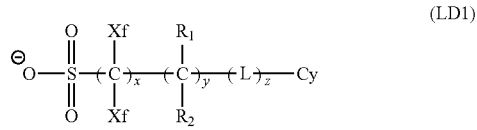

(LD1)

In formula (LD1),

Xf's each independently represent a fluorine atom or an alkyl group substituted with at least one fluorine atom.

$R_1$ and $R_2$ each independently represent a group selected from the group consisting of a hydrogen atom, a fluorine atom, an alkyl group, and an alkyl group substituted with at least one fluorine atom.

L's each independently represent a single bond or a divalent linking group.

Cy represents a group having a cyclic structure.

x represents an integer of 1 to 20.

y represents an integer of 0 to 10.

z represents an integer of 0 to 10.

Xf is a fluorine atom, or an alkyl group substituted with at least one fluorine atom. The alkyl group preferably contains 1 to 10 carbon atoms, and more preferably 1 to 4 carbon atoms.

Further, the alkyl group substituted with at least one fluorine atom is preferably a perfluoroalkyl group.

Xf is preferably a fluorine atom or a perfluoroalkyl group having 1 to 4 carbon atoms. More specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$.

$R_1$ and $R_2$ each independently represent a group selected from the group consisting of a hydrogen atom, a fluorine atom, an alkyl group, and an alkyl group substituted with at least one fluorine atom. The alkyl group in the alkyl group and the alkyl group substituted with at least one fluorine atom is preferably an alkyl group having 1 to 4 carbon atoms. More preferred is a perfluoroalkyl group having 1 to 4 carbon atoms. Specific examples thereof include $CF_3$, $C_2F_5$, $C_3F_7$, $C_4F_9$, $C_5F_{11}$, $C_6F_{13}$, $C_7F_{15}$, $C_5F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, with $CF_3$ being preferred.

L represents a single bond or a divalent linking group. Examples of the divalent linking group include —COO—, —OCO—, —CONH—, —CO—, —O—, —S—, —SO—, —SO$_2$—, an alkylene group, a cycloalkylene group, and alkenylene group. Among these groups, —COO—, —OCO—, —CONH—, —CO—, —O—, or —SO$_2$— are preferred, and —COO—, —OCO—, —CONH— or —SO$_2$— are more preferred.

Cy represents a group having a cyclic structure. The group having a cyclic structure includes, for example, an alicyclic group, an aryl group and a heterocyclic group, and may further be a group in which such a group is bonded to a divalent linking group, for example, an alkylene group.

The alicyclic group may be monocyclic or polycyclic. Examples of the monocyclic alicyclic group include monocyclic cycloalkyl groups such as a cyclopentyl group, a cyclohexyl group, and cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, alicyclic groups having a bulky structure containing 7 or more carbon atoms, such as a norbornyl group, a tricyclodecanyl group, a tetracyclodecanyl group, a tetracyclododecanyl group, and an adamantyl group, are preferred from the viewpoint of inhibiting diffusion into a film during a post-exposure baking (PEB) step and improving a Mask Error Enhancement Factor (MEEF).

The aryl group may be monocyclic or polycyclic. Examples of the aryl group include a phenyl group, a naphthyl group, a phenanthryl group and an anthryl group. Among these, a naphthyl group with relatively low absorbance at 193 nm is preferred.

The group having a heterocyclic structure may be monocyclic or polycyclic, but the polycyclic form is capable of further inhibiting diffusion of an acid. Further, the group having a heterocyclic structure may have or have not aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle having not aromaticity include a tetrahydropyran ring, a lactone ring, and a decahydroisoquinoline ring. The heterocycle in the group having a heterocyclic structure is particularly preferably a furan ring, a thiophene ring, a pyridine ring or a decahydroisoquinoline ring. Examples of the lactone ring are the same as the lactone structures described for in the foregoing resin (A).

The group having a cyclic structure may have a substituent. Examples of the substituent include an alkyl group, a cycloalkyl group, an aryl group, a hydroxyl group, an alkoxy group, an ester group, an amido group, a urethane group, a ureido group, a thioether group, a sulfonamido group, and a sulfonic acid ester group. The alkyl group may be linear or branched. The alkyl group is preferably an alkyl group having 1 to 12 carbon atoms. The cycloalkyl group may be monocyclic or polycyclic. The cycloalkyl group is preferably a cycloalkyl group having 3 to 12 carbon atoms. The aryl group is preferably an aryl group having 6 to 14 carbon atoms.

x is preferably from 1 to 8, more preferably from 1 to 4, and particularly preferably 1. y is preferably from 0 to 4, and more preferably 0. z is preferably from 0 to 8, more preferably from 0 to 4.

Further, the non-nucleophilic anion of $Z^-$ is preferably represented by, for example, the following formula (LD2).

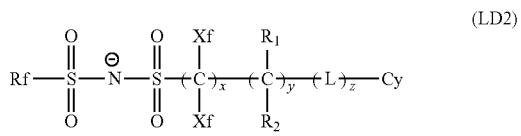

In formula (LD2), Xf, $R_1$, $R_2$, L, Cy, x, y and z have the same meanings as those in formula (LD1), respectively. Rf is a fluorine atom-containing group.

Examples of the fluorine atom-containing group represented by Rf include an alkyl group having at least one fluorine atom, a cycloalkyl group having at least one fluorine atom, and an aryl group having at least one fluorine atom.

These alkyl group, cycloalkyl group and aryl group may be substituted by a fluorine atom and may be further substituted by another substituent containing a fluorine atom. When Rf is a cycloalkyl group having at least one fluorine atom or an aryl group having at least one fluorine atom, examples of the other substituent containing a fluorine atom include an alkyl group substituted with at least one fluorine atom.

Incidentally, these alkyl group, cycloalkyl group and aryl group may be further substituted by a substituent containing no fluorine atom. Examples of this substituent include substituents containing no fluorine atom, among those described for Cy hereinbefore.

Examples of the alkyl group having at least one fluorine atom represented by Rf are the same as those described for alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

Examples of the organic groups as $R_{201}$, $R_{202}$ and $R_{203}$ include the corresponding groups in compounds (ZI-1) and (ZI-2) which will be described hereinafter.

The compound may be a compound having a plurality of structures represented by formula (ZI). For example, the compound may be a compound having a structure in which at least one of $R_{201}$ to $R_{203}$ of the compound represented by formula (ZI) is connected to at least one of $R_{201}$ to $R_{203}$ of another compound represented by formula (ZI).

As the component (ZI), a compound (ZI-1) and a compound (ZI-2) described below are more preferred.

The compound (ZI-1) is an arylsulfonium compound where at least one of $R_{201}$ to $R_{203}$ of formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom or the like. Examples of the heterocyclic structure include pyrrole, furan, thiophene, indole, benzofuran and benzothiophene. In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having 1 to 15 carbon atoms or a cycloalkyl group having 3 to 15 carbon atoms, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ may have, as the substituent, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group or a phenylthio group. The substituent is preferably a linear or branched alkyl group having 1 to 12 carbon atoms, a cycloalkyl group having 3 to 12 carbon atoms, or a linear, branched or cyclic alkoxy group having 1 to 12 carbon atoms, and more preferably an alkyl group having 1 to 4 carbon atoms, or an alkoxy group having 1 to 4 carbon atoms. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) will be described below.

The compound (ZI-2) is a compound where $R_{201}$ to $R_{203}$ in formula (ZI) each independently represent an aromatic ring-free organic group. The aromatic ring as used herein includes an aromatic ring containing a heteroatom.

The aromatic ring-free organic group as $R_{201}$ to $R_{203}$ has generally from 1 to 30 carbon atoms, and preferably from 1 to 20 carbon atoms.

$R_{201}$ to $R_{203}$ each independently represent preferably an alkyl group, a cycloalkyl group, an allyl group or a vinyl group, more preferably a linear or branched 2-oxoalkyl group, a 2-oxocycloalkyl group or an alkoxycarbonylmethyl group, and still more preferably a linear or branched 2-oxoalkyl group.

The alkyl group and cycloalkyl group of $R_{201}$ to $R_{203}$ are preferably a linear or branched alkyl group having 1 to 10 carbon atoms (for example, a methyl group, an ethyl group, a propyl group, a butyl group, or a pentyl group), and a cycloalkyl group having 3 to 10 carbon atoms (for example, a cyclopentyl group, a cyclohexyl group, or a norbornyl group). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having 1 to 5 carbon atoms (for example, a methoxy group, an ethoxy group, a propoxy group, a butoxy group, or a pentoxy group).

Each of $R_{201}$ to $R_{203}$ may be further substituted with a halogen atom, an alkoxy group (for example, having 1 to 5 carbon atoms), a hydroxyl group, a cyano group or a nitro group.

Hereinafter, formulae (ZII) and (ZIII) will be described.

In formulae (ZII) and (ZIII), $R_{204}$ to $R_{207}$ each independently represent an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the heterocyclic structure include pyrrole, furan, thiophene, indole, benzofuran and benzothiophene.

The alkyl group and cycloalkyl group of $R_{204}$ to $R_{207}$ are preferably a linear or branched alkyl group having 1 to 10 carbon atoms (for example, a methyl group, an ethyl group, a propyl group, a butyl group, or a pentyl group) and a cycloalkyl group having 3 to 10 carbon atoms (for example, a cyclopentyl group, a cyclohexyl group, or a norbornyl group).

The aryl group, alkyl group and cycloalkyl group of $R_{204}$ to $R_{207}$ may have a substituent. Examples of the substituent that may be substituted on the aryl group, alkyl group and cycloalkyl group of $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group and a phenylthio group.

$Z^-$ represents a non-nucleophilic anion and has the same meaning as the non-nucleophilic anion of $Z^-$ in formula (ZI).

The acid generator further includes compounds represented by the following formulae (ZIV), (ZV) and (ZVI):

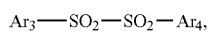

ZIV

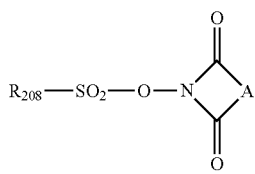

ZV

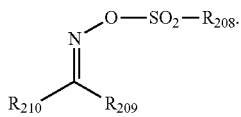

ZVI

In formulae (ZIV) to (ZVI), $Ar_3$ and $Ar_4$ each independently represent an aryl group.

$R_{208}$, $R_{209}$ and $R_{210}$ each independently represent an alkyl group, a cycloalkyl group or an aryl group.

A represents an alkylene group, an alkenylene group or an arylene group.

Among acid generators, compounds represented by formulae (ZI) to (ZIII) are more preferred.

Further, the acid generator is preferably a compound capable of generating an acid having one sulfonic acid group or imide group, more preferably a monovalent compound capable of generating a perfluoroalkane sulfonic acid, or a monovalent compound capable of generating an aromatic sulfonic acid substituted with a fluorine atom or a fluorine atom-containing group, or a monovalent compound capable of generating an imide acid substituted with a fluorine atom or a fluorine atom-containing group, and still more preferably a sulfonium salt of fluorine-substituted alkane sulfonic acid, fluorine-substituted benzene sulfonic acid, fluorine-substituted imide acid or fluorine-substituted methide acid. The usable acid generator is particularly preferably fluorine-substituted alkane sulfonic acid, fluorine-substituted benzene sulfonic acid or fluorine-substituted imide acid in which the generated acid has a pKa of −1 or less, thereby improving sensitivity.

Among acid generators, particularly preferred examples thereof are illustrated below.

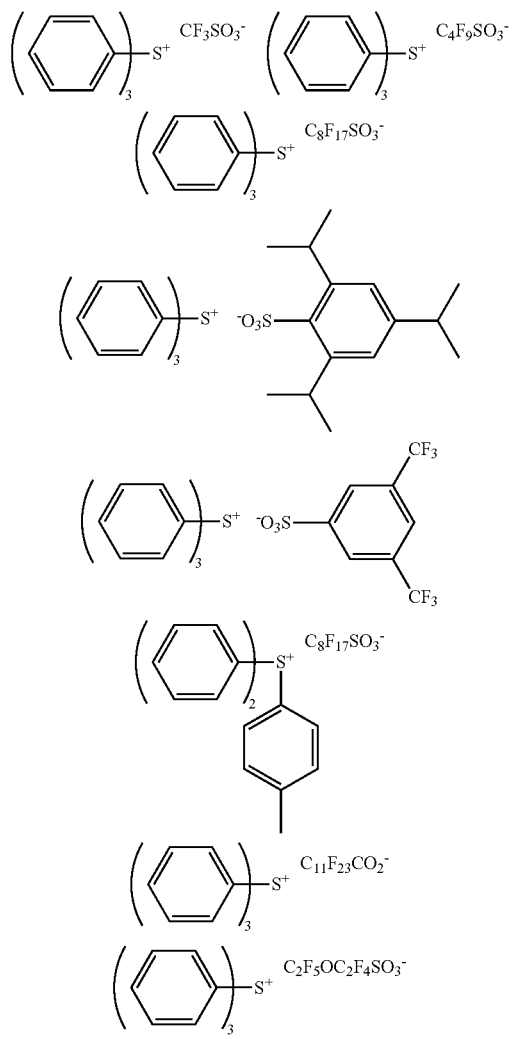

101
-continued
102
-continued
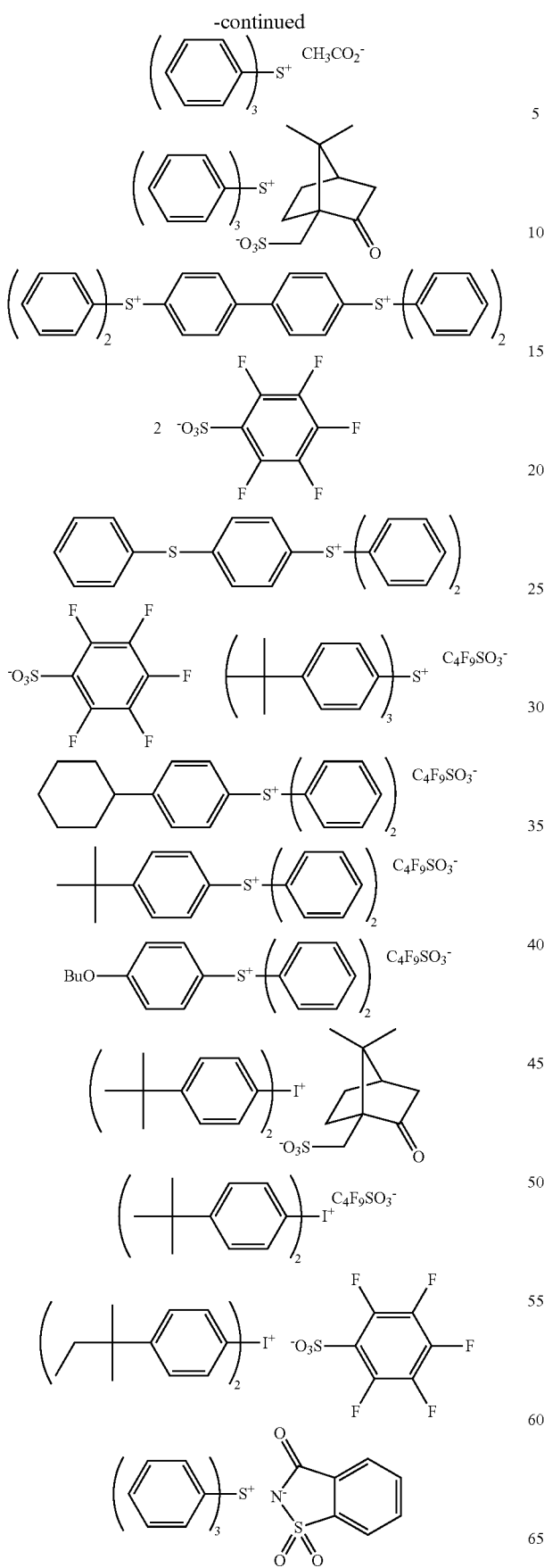
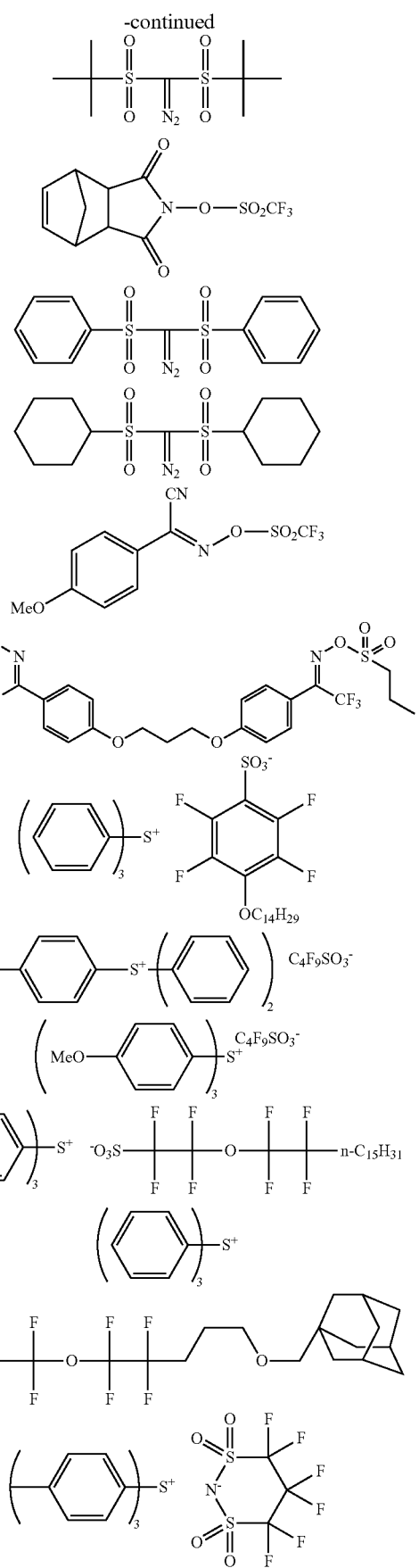

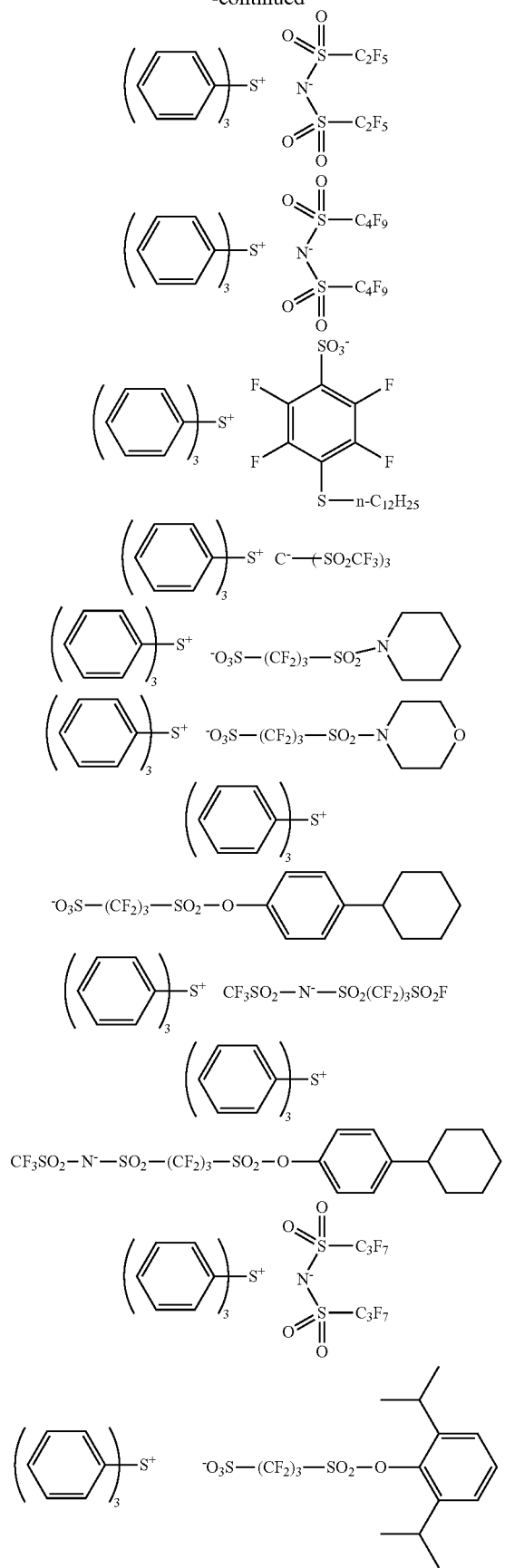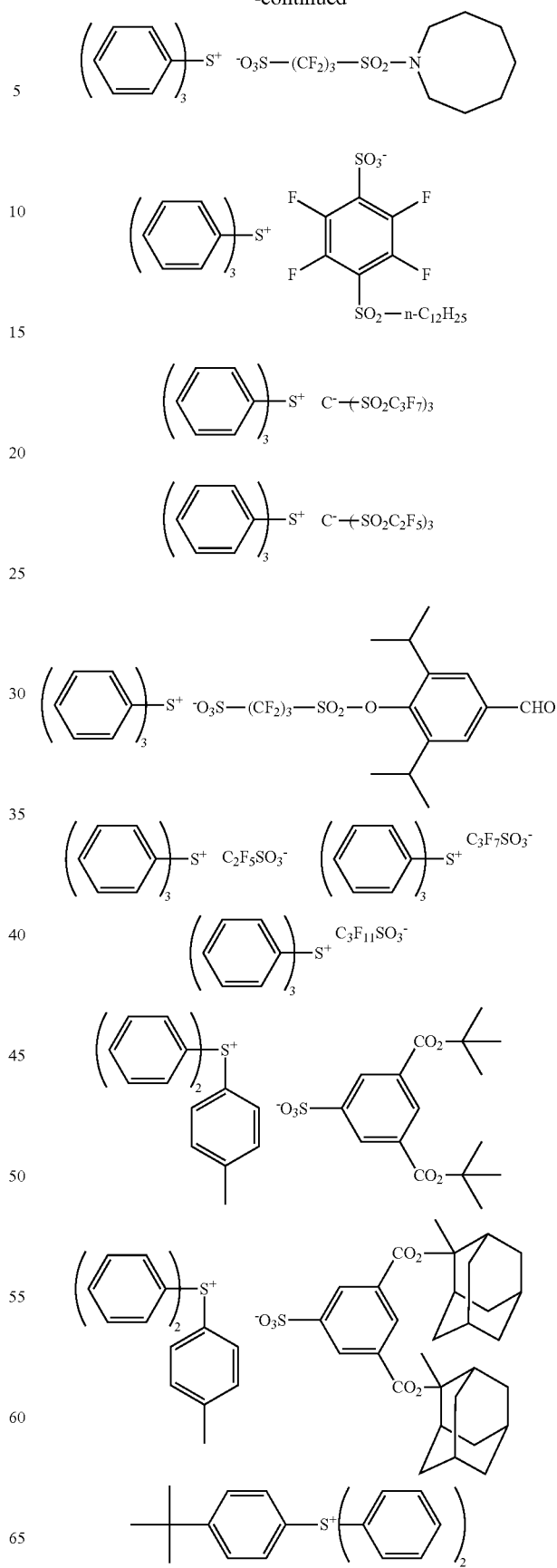

105
-continued
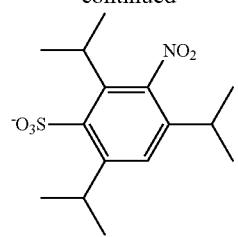
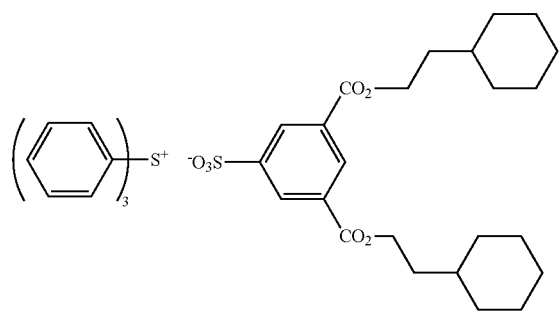
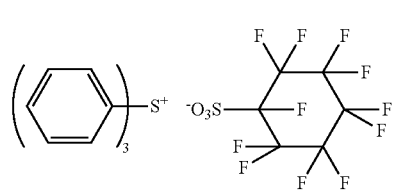
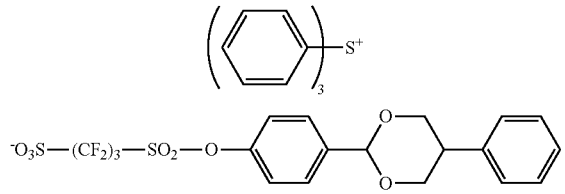
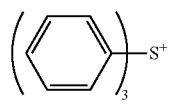
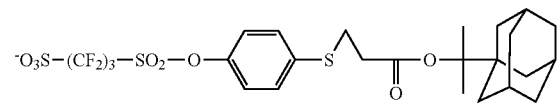
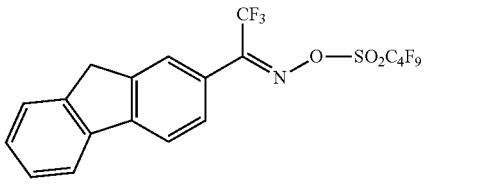
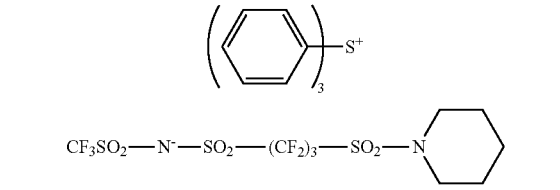
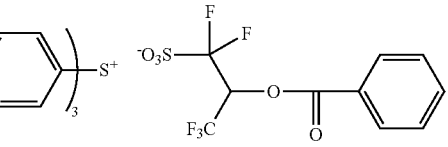
106
-continued
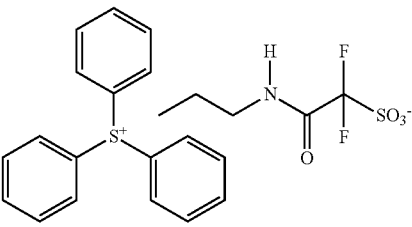
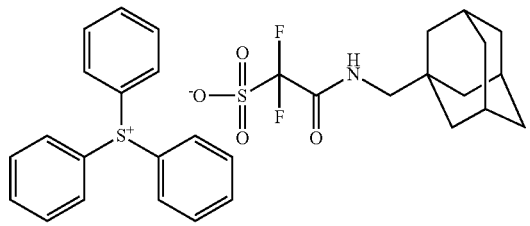
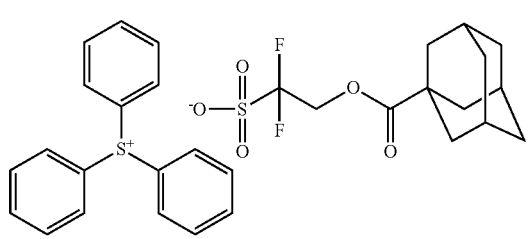
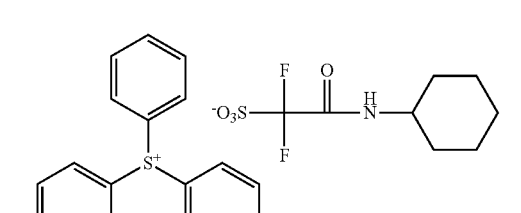
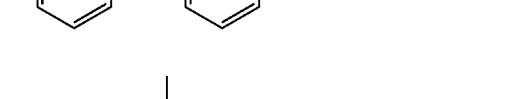
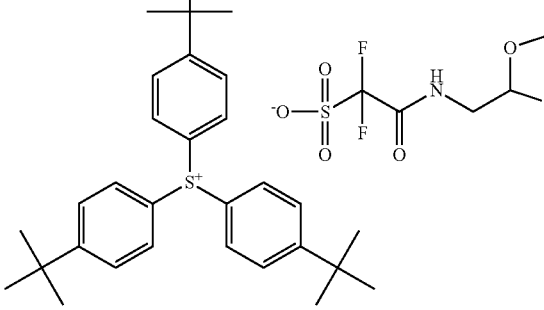
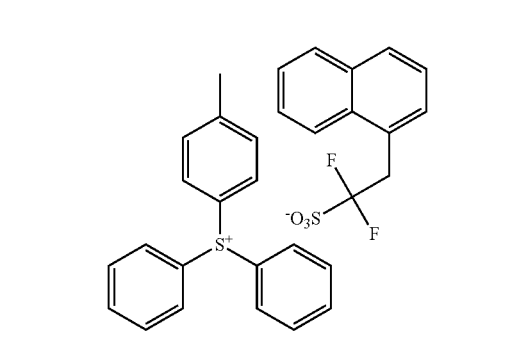

107
-continued

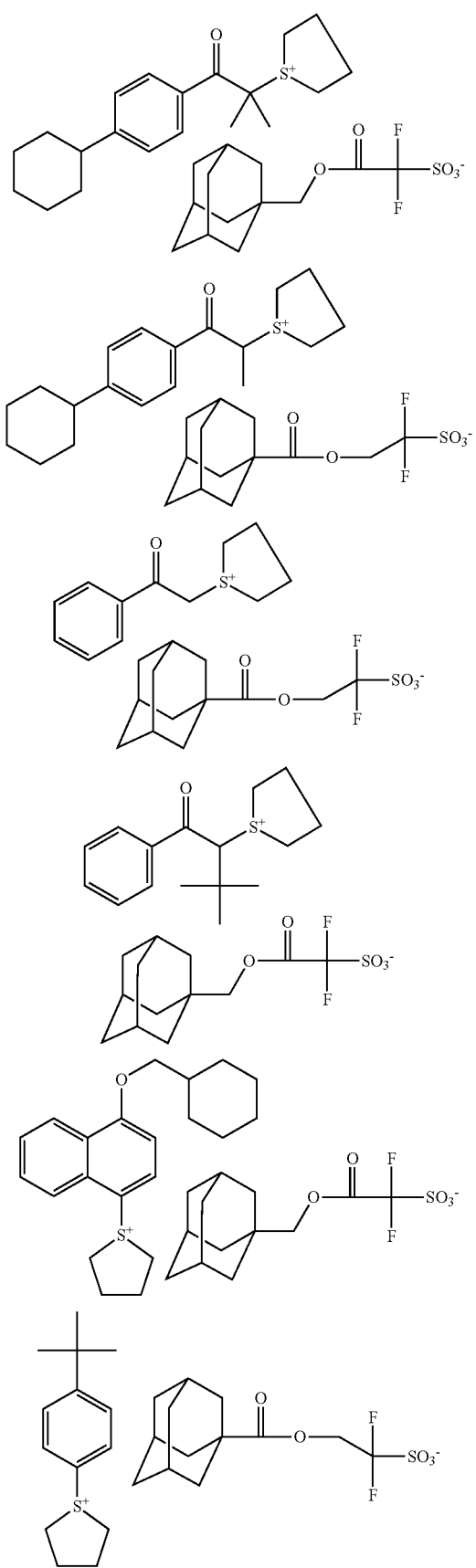

108
-continued

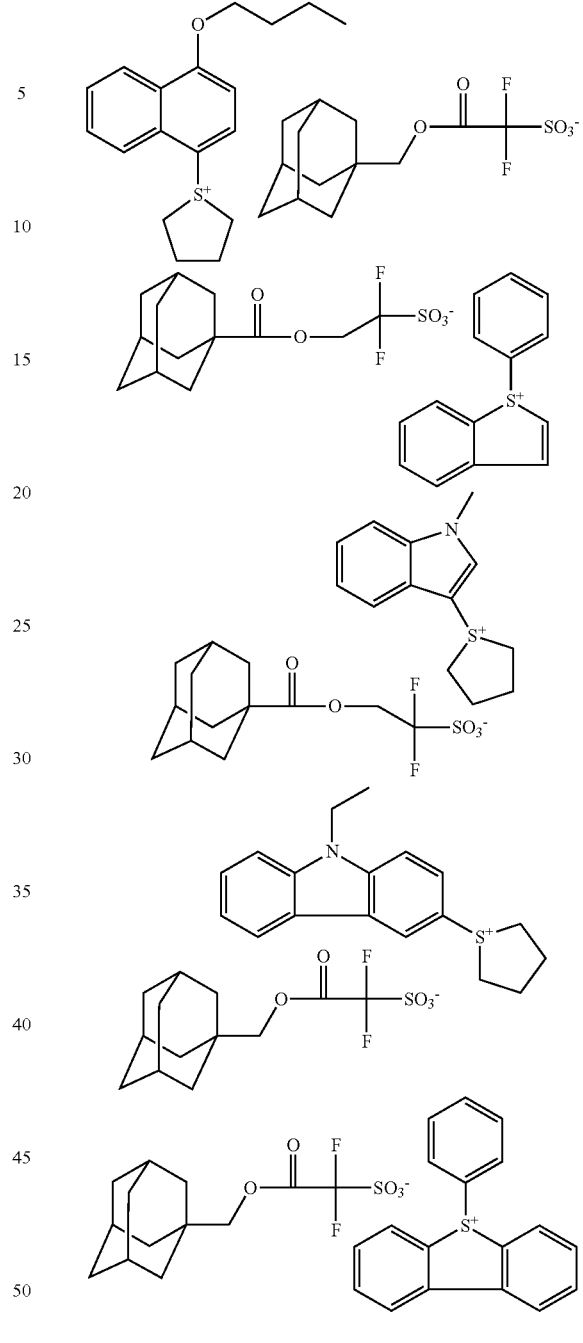

Acid generators may be used alone or in combination of two or more thereof.

The content of the acid generator is preferably from 0.1 to 30 mass %, more preferably from 0.5 to 25 mass %, and still more preferably from 3 to 20 mass %, based on the total solid content of the composition.

When the acid generator is represented by formula (ZI-3) or (ZI-4), the content thereof is preferably from 5 to 20 mass %, more preferably from 8 to 20 mass %, and particularly preferably from 10 to 20 mass %, based on the total solid content of the composition.

<Resin Containing a Repeating Unit Having at Least Either of a Fluorine Atom or a Silicon Atom>

The composition of the present invention is a resin containing a repeating unit having at least either of a fluorine atom or a silicon atom and may further contain resin (B) (hereinafter, also referred to as "hydrophobic resin"), which is different from resin (A).

At least either of a fluorine atom or a silicon atom in the resin (B) may be contained in the main chain of the resin or may be contained in the side chain.

In the case where the resin (B) contains a fluorine atom, the resin preferably contains, as a fluorine atom-containing partial structure, a fluorine atom-containing alkyl group, a fluorine atom-containing cycloalkyl group or a fluorine atom-containing aryl group.

The fluorine atom-containing alkyl group (preferably having 1 to 10 carbon atoms, and more preferably 1 to 4 carbon atoms) is a linear or branched alkyl group with at least one hydrogen atom being substituted by a fluorine atom and may further have a substituent other than the fluorine atom.

The fluorine atom-containing cycloalkyl group is a monocyclic or polycyclic cycloalkyl group with at least one hydrogen atom being substituted by a fluorine atom and may further have a substituent other than the fluorine atom.

The fluorine atom-containing aryl group is an aryl group (for example, a phenyl group, or a naphthyl group) with at least one hydrogen atom being substituted by a fluorine atom and may further have a substituent other than the fluorine atom.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

Specific examples of the group represented by formula (F2) include a p-fluorophenyl group, a pentafluorophenyl group and a 3,5-di(trifluoromethyl)phenyl group.

Specific examples of the group represented by formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro(trimethyl)hexyl group, a 2,2,3,3-tetrafluorocyclobutyl group and a perfluorocyclohexyl group. Among these, a hexafluoroisopropyl group, a heptafluoroisopropyl group, a hexafluoro(2-methyl)isopropyl group, an octafluoroisobutyl group, a nonafluoro-tert-butyl group and a perfluoroisopentyl group are preferred, and a hexafluoroisopropyl group and a heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

The fluorine atom-containing partial structure may be bonded directly to the main chain or may be bonded to the main chain through a group selected from the group consisting of an alkylene group, a phenylene group, an ether bond, a thioether bond, a carbonyl group, an ester bond, an amide bond, a urethane bond and a ureylene bond, or a group formed by combining two or more thereof.

As the repeating unit having a fluorine atom, those shown below are preferred.

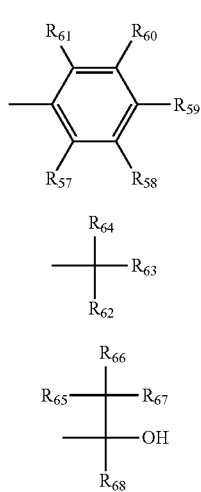

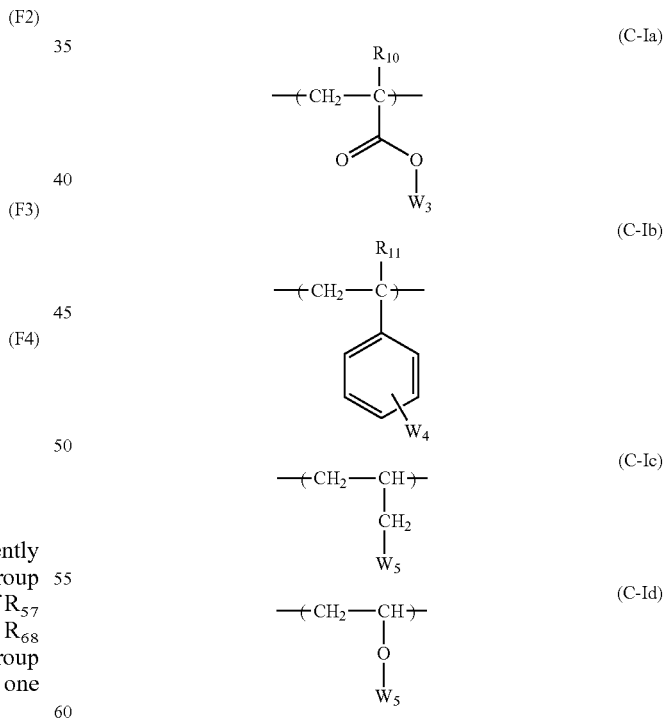

In formulae (F2) to (F4), $R_{57}$ to $R_{68}$ each independently represent a hydrogen atom, a fluorine atom or an alkyl group (linear or branched), provided that each of at least one of $R_{57}$ to $R_{61}$, at least one of $R_{62}$ to $R_{64}$, and at least one of $R_{65}$ to $R_{68}$ independently represents a fluorine atom or an alkyl group (preferably having 1 to 4 carbon atoms) with at least one hydrogen atom being substituted by a fluorine atom.

It is preferred that all of $R_{57}$ to $R_{61}$ and $R_{65}$ to $R_{67}$ are a fluorine atom. Each of $R_{62}$, $R_{63}$ and $R_{68}$ is preferably a fluoroalkyl group (preferably having 1 to 4 carbon atoms), and more preferably a perfluoroalkyl group having 1 to 4 carbon atoms. When $R_{62}$ and $R_{63}$ is a perfluoroalkyl group, $R_{64}$ is preferably a hydrogen atom. $R_{62}$ and $R_{63}$ may combine with each other to form a ring.

In the formulae, $R_{10}$ and $R_{11}$ each independently represent a hydrogen atom, a fluorine atom or an alkyl group. The alkyl group is preferably a linear or branched alkyl group having 1 to 4 carbon atoms and may have a substituent, and the alkyl group having a substituent includes, in particular, a fluorinated alkyl group.

$W_3$ to $W_6$ each independently represent an organic group having at least one or more fluorine atoms and specifically includes the atomic groups of (F2) to (F4).

Other than these, the resin (B) may contain a unit shown below as the repeating unit having a fluorine atom.

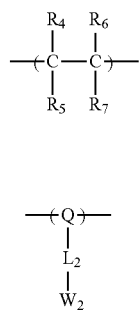

In the formulae, $R_4$ to $R_7$ each independently represent a hydrogen atom, a fluorine atom or an alkyl group. The alkyl group is preferably a linear or branched alkyl group having 1 to 4 carbon atoms and may have a substituent, and the alkyl group having a substituent includes, in particular, a fluorinated alkyl group.

Provided that at least one of $R_4$ to $R_7$ represents a fluorine atom. $R_4$ and $R_5$, or $R_6$ and $R_7$ may form a ring.

$W_2$ represents an organic group having at least one fluorine atom and specifically includes the atomic groups of (F2) to (F4).

$L_2$ represents a single bond or a divalent linking group. The divalent linking group is a substituted or unsubstituted arylene group, a substituted or unsubstituted alkylene group, a substituted or unsubstituted cycloalkylene group, —O—, —SO$_2$—, —CO—, —N(R)— (wherein R represents a hydrogen atom or an alkyl group), —NHSO$_2$—, or a divalent linking group formed by combining a plurality of these groups.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having 3 to 8 carbon atoms, and examples thereof include a cyclopentyl group, a cyclohexyl group, a cyclobutyl group and a cyclooctyl group. Examples of the polycyclic structure include a group containing a bicyclo, tricyclo or tetracyclo structure having 5 or more carbon atoms. A cycloalkyl group having 6 to 20 carbon atoms is preferred, and examples thereof include an adamantyl group, a norbornyl group, a dicyclopentyl group, a tricyclodecanyl group and a tetracyclododecyl group. A portion of carbon atoms in the cycloalkyl group may be substituted with a heteroatom such as an oxygen atom. In particular, Q is preferably a norbornyl group, a tricyclodecanyl group, a tetracyclododecyl group or the like.

The resin (B) may contain a silicon atom.

The resin preferably has, as a silicon atom-containing partial structure, an alkylsilyl structure (preferably a trialkylsilyl group) or a cyclic siloxane structure.

The alkylsilyl structure and cyclic siloxane structure specifically include, for example, the groups represented by the following formulae (CS-1) to (CS-3):

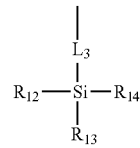

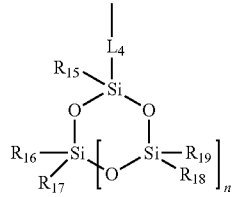

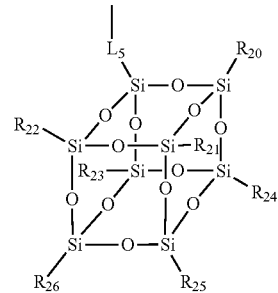

In formulae (CS-1) to (CS-3), $R_{12}$ to $R_{26}$ each independently represent a linear or branched alkyl group (preferably having 1 to 20 carbon atoms) or a cycloalkyl group (preferably having 3 to 20 carbon atoms).

$L_3$ to $L_5$ each represent a single bond or a divalent linking group. The divalent linking group is a sole group or a combination of two or more groups selected from the group consisting of an alkylene group, a phenylene group, an ether bond, a thioether bond, a carbonyl group, an ester bond, an amide bond, a urethane bond and a ureylene bond.

n represents an integer of 1 to 5. n is preferably an integer of 2 to 4.

The repeating unit having at least either of a fluorine atom or a silicon atom is preferably a (meth)acrylate-based repeating unit.

Specific examples of the repeating unit having at least either of a fluorine atom or a silicon atom are illustrated below, but the present invention is not limited thereto. In specific examples, $X_1$ represents a hydrogen atom, —CH$_3$, —F or —CF$_3$, and $X_2$ represents —F or —CF$_3$.

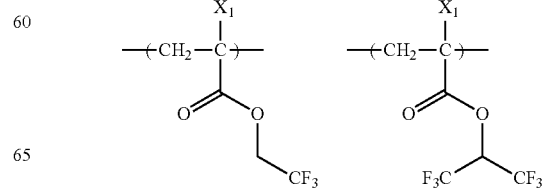

113
-continued
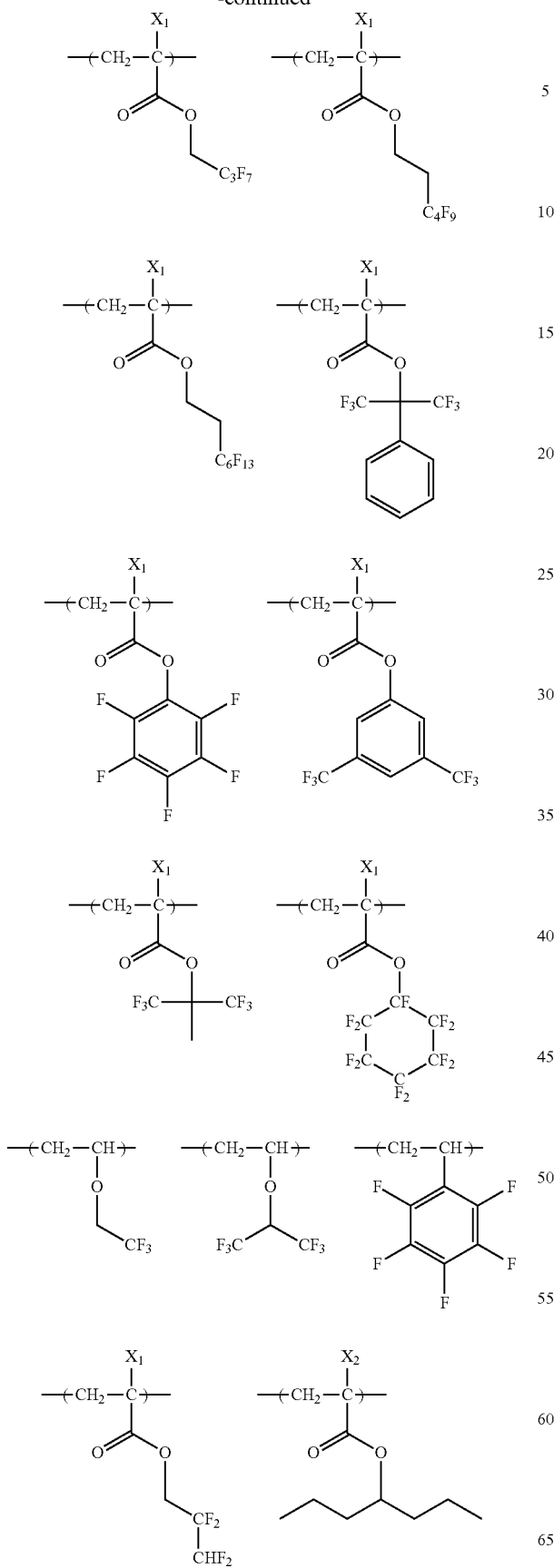
114
-continued
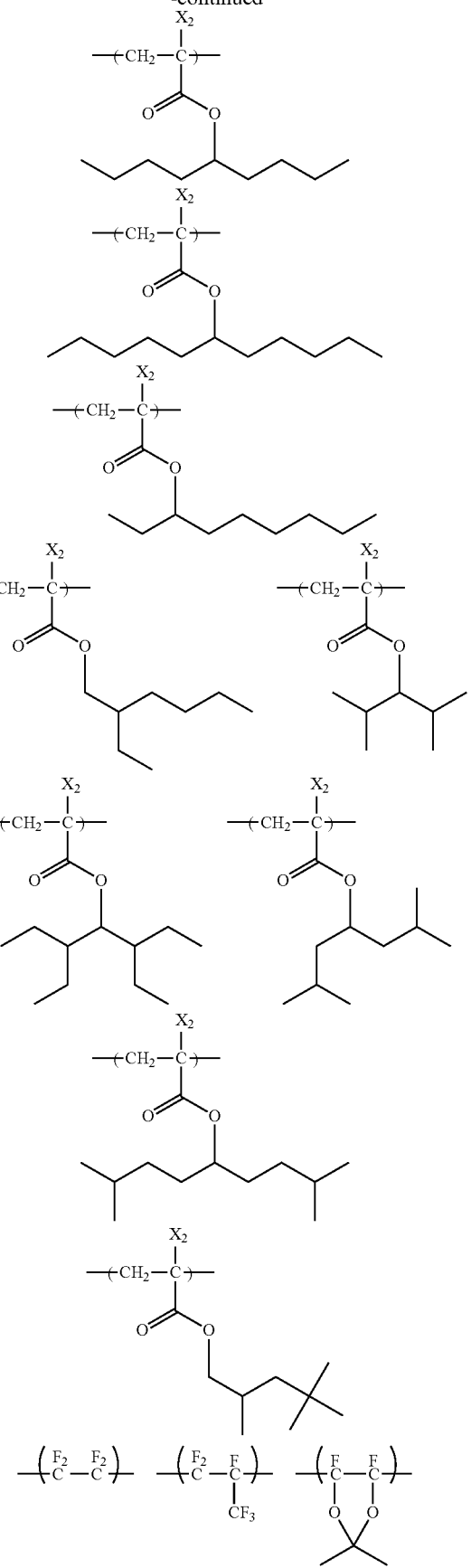

115
-continued
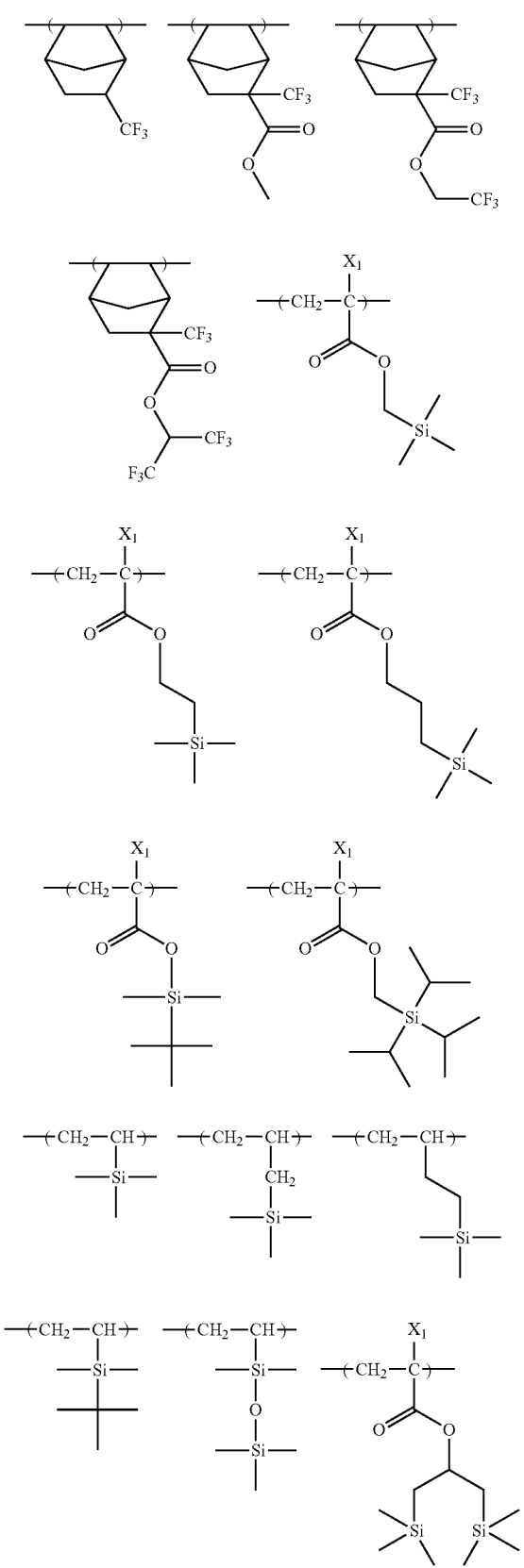
116
-continued
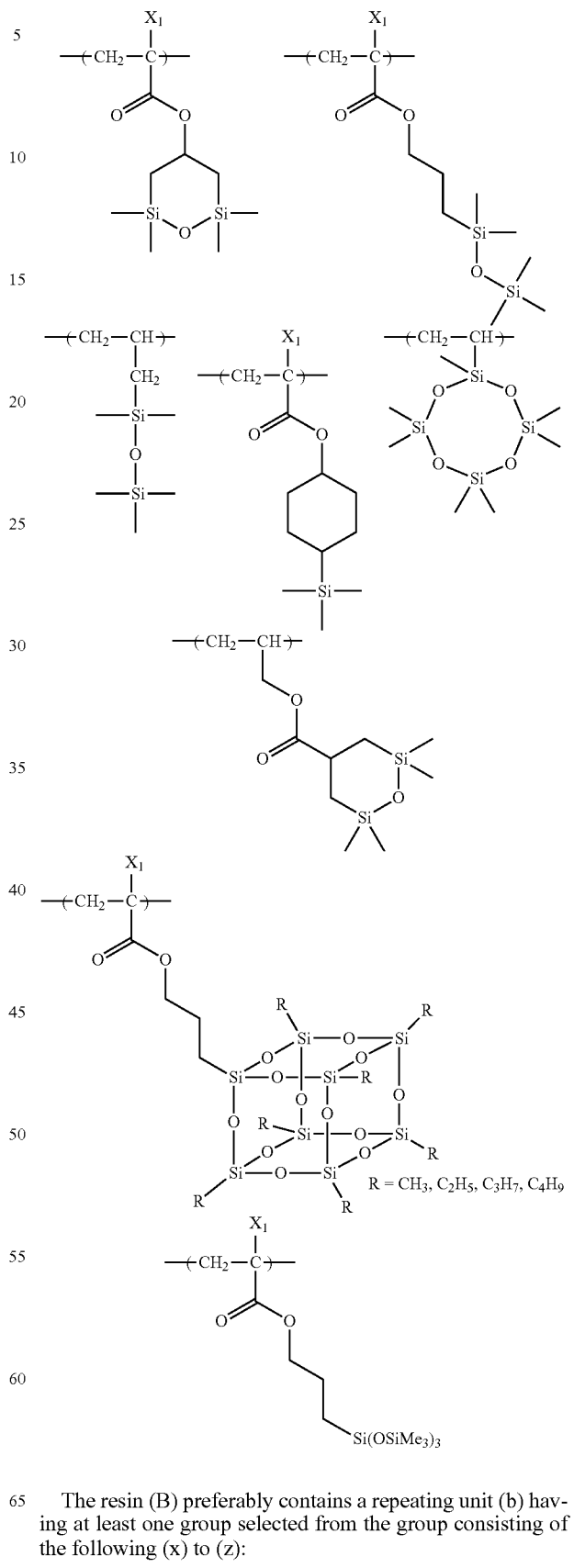
The resin (B) preferably contains a repeating unit (b) having at least one group selected from the group consisting of the following (x) to (z):

(x) an alkali-soluble group,
(y) a group capable of decomposing by the action of an alkaline developer to increase the solubility in an alkaline developer, and
(z) a group capable of decomposing by the action of an acid to increase the solubility in an alkaline developer.

The repeating unit (b) includes the following types.
(b') a repeating unit having at least either of a fluorine atom or a silicon atom and at least one group selected from the group consisting of (x) to (z) on one side chain,
(b*) a repeating unit having at least one group selected from the group consisting of (x) to (z) and having neither a fluorine atom nor a silicon atom,
(b") a repeating unit having at least one group selected from the group consisting of (x) to (z) on one side chain and having at least either of a fluorine atom or a silicon atom on a side chain different from the side chain above in the same repeating unit The resin (B) more preferably contains the repeating unit (b') as the repeating unit (b). That is, the repeating unit (b) having at least one group selected from the group consisting of (x) to (z) more preferably contains at least either of a fluorine atom or a silicon atom.

In the case where the resin (B) contains the repeating unit (b*), the resin is preferably a copolymer with a repeating unit having at least either of a fluorine atom or a silicon atom (a repeating unit different from the repeating units (b') and (b")). Also, in the repeating unit (b"), the side chain having at least one group selected from the group consisting of (x) to (z) and the side chain having at least either of a fluorine atom or a silicon atom are preferably bonded to the same carbon atom in the main chain, that is, have a positional relationship as in the following formula (K1).

In the formula, B1 represents a partial structure having at least one group selected from the group consisting of (x) to (z), and B2 represents a partial structure having at least either of a fluorine atom or a silicon atom.

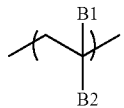

(K1)

The group selected from the group consisting of (x) to (z) is preferably (x) an alkali-soluble group or (y) a polarity converting group, and more preferably (y) a polarity converting group.

Examples of the (x) alkali-soluble group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups include a fluorinated alcohol group (preferably, a hexafluoroisopropanol group), a sulfonimide group and a bis(carbonyl)methylene group.

Examples of the repeating unit (bx) having (x) an alkali-soluble group include a repeating unit where an alkali-soluble group is directly bonded to the main chain of the resin, such as a repeating unit composed of an acrylic acid or a methacrylic acid, and a repeating unit where an alkali-soluble group is bonded to the main chain of the resin through a linking group. Furthermore, an alkali-soluble group may be introduced into the polymer chain terminal by Using an alkali-soluble group-containing polymerization initiator or chain transfer agent at the polymerization. All of these cases are preferred.

In the case where the repeating unit (bx) is a repeating unit having at least either of a fluorine atom or a silicon atom (that is, a repeating unit corresponding to the repeating unit (b') or (b")), examples of the fluorine atom-containing partial structure in the repeating unit (bx) are the same as those described for the repeating unit having at least either of a fluorine atom or a silicon atom and preferably include the groups represented by formulae (F2) to (F4). Also in this case, examples of the silicon atom-containing partial structure in the repeating unit (bx) are the same as those described for the repeating unit having at least either of a fluorine atom or a silicon atom and preferably include the groups represented by formulae (CS-1) to (CS-3).

The content of the repeating unit (bx) having (x) an alkali-soluble group is preferably from 1 to 50 mol %, more preferably from 3 to 35 mol %, and still more preferably from 5 to 20 mol %, based on all repeating units in the resin (B).

Specific examples of the repeating unit (bx) having (x) an alkali-soluble group are illustrated below, but the present invention is not limited thereto. In specific examples, $X_1$ represents a hydrogen atom, $—CH_3$, $—F$ or $—CF_3$.

In the formulae, Rx represents H, $CH_3$, $CF_3$ or $CH_2OH$.

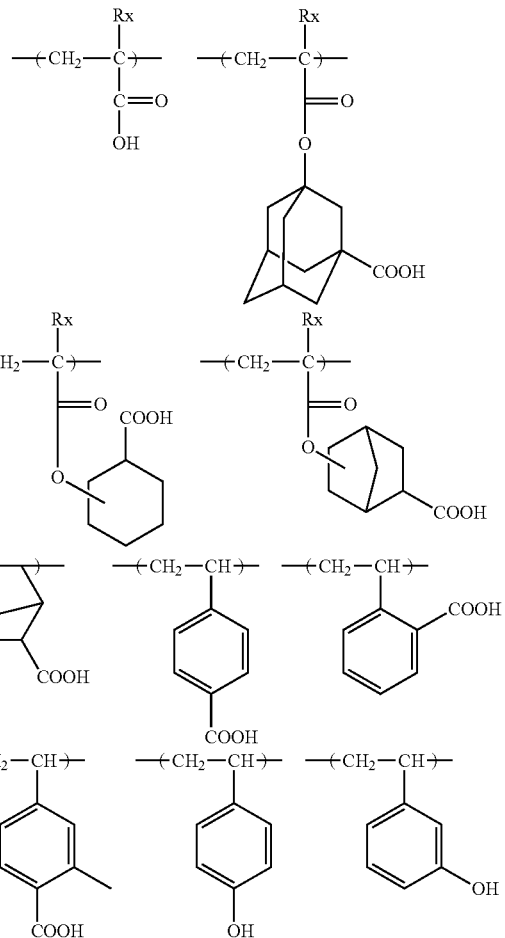

119
-continued
120
-continued
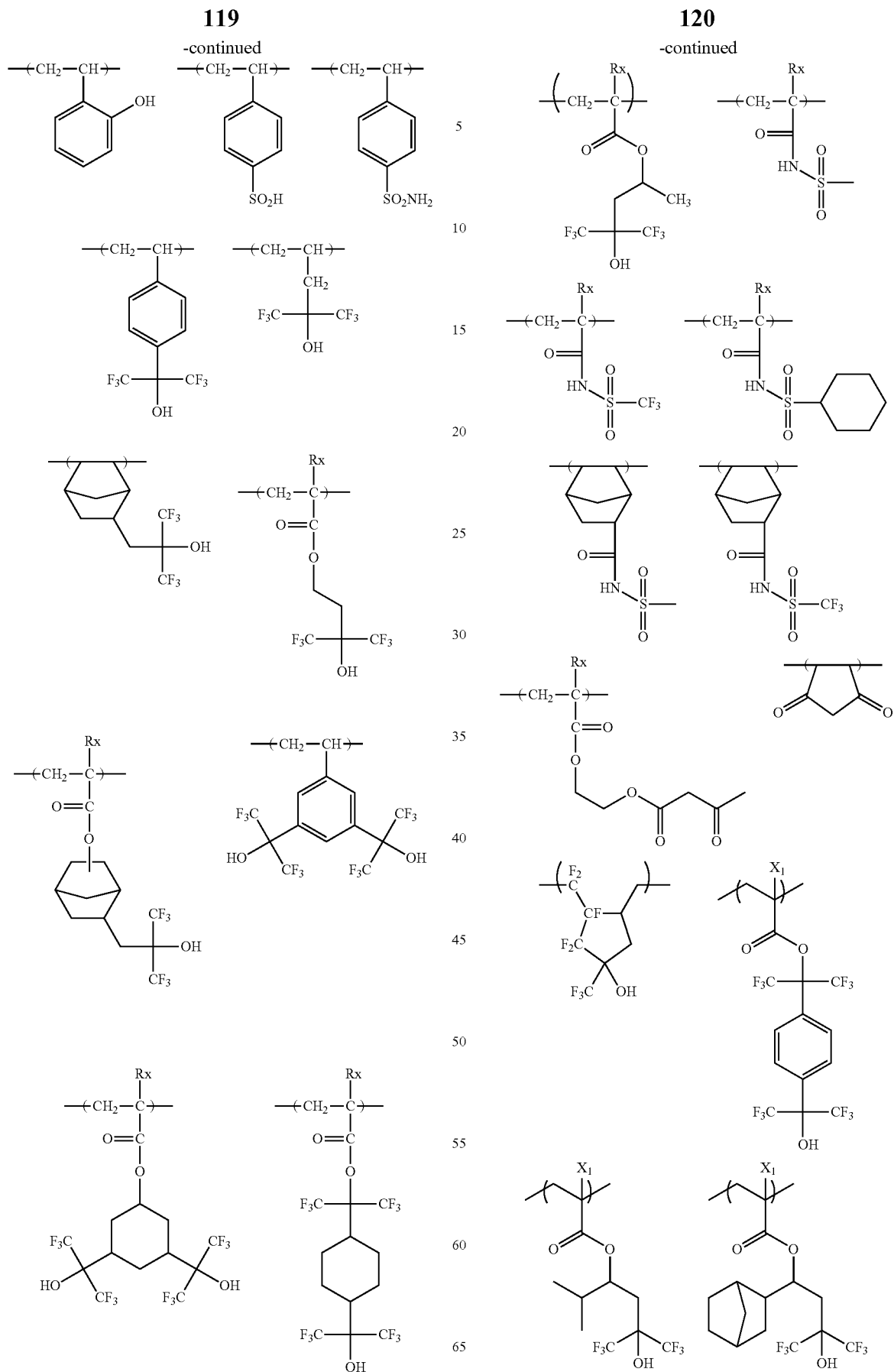

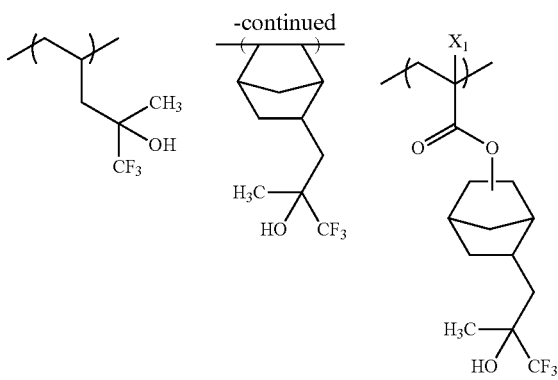

Examples of the polarity converting group (y) include a lactone group, a carboxylic acid ester group (—COO—), an acid anhydride group (—C(O)OC(O)—), an acid imide group (—NHCONH—), a carboxylic acid thioester group (—COS—), a carbonic acid ester group (—OC(O)O—), a sulfuric acid ester group (—OSO$_2$O—) and a sulfonic acid ester group (—SO$_2$O—), with a lactone group being preferred.

As for the polarity converting group (y), both a configuration where the polarity converting group is contained in a repeating unit composed of an acrylic acid ester or a methacrylic acid ester and thereby is introduced into the side chain of the resin, and a configuration where the polarity converting group is introduced into the polymer chain terminal by using a polymerization initiator or chain transfer agent containing the polarity converging group (y) at the polymerization are preferred.

Specific examples of the repeating unit (by) having (y) a polarity converting group include repeating units having a lactone structure represented by formulae (KA-1-1) to (KA-1-17) to be described hereinafter.

Further, the repeating unit (by) having (y) a polarity converting group is preferably a repeating unit having at least either of a fluorine atom and a silicon atom (that is, a repeating unit corresponding to the repeating unit (b') or (b")). The repeating unit (by)-containing resin has hydrophobicity, and addition thereof is preferred particularly from the viewpoint of reducing the development defects.

The repeating unit (by) includes, for example, a repeating unit represented by formula (KO):

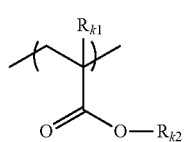

(KO)

In the formula, $R_{k1}$ represents a hydrogen atom, a halogen atom, a hydroxyl group, an alkyl group, a cycloalkyl group, an aryl group, or a polarity converting group-containing group.

$R_{k2}$ represents an alkyl group, a cycloalkyl group, an aryl group, or a polarity converting group-containing group.

Provided that at least either one of $R_{k1}$ and $R_{k2}$ represents a polarity converting group-containing group.

The polarity converting group is, as described above, a group capable of decomposing by the action of an alkaline developer to increase the solubility in an alkaline developer. The polarity converting group is preferably a group X in a partial structure represented by formula (KA-1) or (KB-1):

In formulae (KA-1) and (KB-1), X represents a carboxylic acid ester group: —COO—, an acid anhydride group: —C(O)OC(O)—, an acid imide group: —NHCONH—, a carboxylic acid thioester group: —COS—, a carbonic acid ester group: —OC(O)O—, a sulfuric acid ester group: —OSO$_2$O—, or a sulfonic acid ester group: —SO$_2$O—.

Each of $Y^1$ and $Y^2$, which may be the same or different, represents an electron-withdrawing group.

Incidentally, the repeating unit (by) has a preferred group capable of increasing the solubility in an alkaline developer by containing a group having a partial structure represented by formula (KA-1) or (KB-1), but as in the case of the partial structure represented by formula (KA-1) or the partial structure represented by formula (KB-1) where $Y^1$ and $Y^2$ are monovalent, when the partial structure does not have a bond, the group having the partial structure is a group having a monovalent or higher valent group formed by removing at least one arbitrary hydrogen atom in the partial structure.

The partial structure represented by formula (KA-1) or (KB-1) is connected to the main chain of the resin (B) at an arbitrary position through a substituent.

The partial structure represented by formula (KA-1) is a structure forming a ring structure together with the group as X.

In formula (KA-1), X is preferably a carboxylic acid ester group (that is, a case of forming a lactone ring structure as KA-1), an acid anhydride group or a carbonic acid ester group, more preferably a carboxylic acid ester group.

The ring structure represented by formula (KA-1) may have a substituent and, for example, may have nka substituents $Z_{ka1}$.

When a plurality of $Z_{ka1}$'s are present, each $Z_{ka1}$ independently represents a halogen atom, an alkyl group, a cycloalkyl group, an ether group, a hydroxyl group, an amido group, an aryl group, a lactone ring group, or an electron-withdrawing group.

$Z_{ka1}$'s may combine with each other to form a ring. Examples of the ring formed by combining $Z_{ka1}$'s with each other include a cycloalkyl ring and a heterocyclic ring (for example, a cyclic ether ring, or a lactone ring).

nka represents an integer of 0 to 10 and is preferably an integer of 0 to 8, more preferably an integer of 0 to 5, still more preferably an integer of 1 to 4, and most preferably an integer of 1 to 3.

The electron-withdrawing group as $Z_{ka1}$ has the same meaning as the electron-withdrawing group of $Y^1$ and $Y^2$ to be described hereinafter. Incidentally, the electron-withdrawing group above may be substituted with another electron-withdrawing group.

$Z_{ka1}$ is preferably an alkyl group, a cycloalkyl group, an ether group, a hydroxyl group or an electron-withdrawing group, more preferably an alkyl group, a cycloalkyl group or an electron-withdrawing group. The ether group is preferably an ether group substituted, for example, with an alkyl group or a cycloalkyl group, that is, an alkyl ether group. The electron-withdrawing group has the same meaning as above.

Examples of the halogen atom as $Z_{ka1}$ include a fluorine atom, a chlorine atom, a bromine atom and an iodine atom, with a fluorine atom being preferred.

The alkyl group as $Z_{ka1}$ may have a substituent and may be either linear or branched. The linear alkyl group is preferably an alkyl group having 1 to 30 carbon atoms, more preferably 1 to 20 carbon atoms, and examples thereof include a methyl group, an ethyl group, an n-propyl group, an n-butyl group, a sec-butyl group, a tert-butyl group, an n-pentyl group, an n-hexyl group, an n-heptyl group, an n-octyl group, an n-nonyl group and an n-decanyl group. The branched alkyl group is preferably an alkyl group having 3 to 30 carbon atoms, more preferably 3 to 20, and examples thereof include an i-propyl group, an i-butyl group, a tert-butyl group, an i-pentyl group, a tert-pentyl group, an i-hexyl group, a tert-hexyl group, an i-heptyl group, a tert-heptyl group, an i-octyl group, a tert-octyl group, an i-nonyl group and a tert-decanoyl group. An alkyl group having 1 to 4 carbon atoms is preferred, such as a methyl group, an ethyl group, an n-propyl group, an i-propyl group, am n-butyl group, an i-butyl group and a tert-butyl group.

The cycloalkyl group as $Z_{ka1}$ may have a substituent and may be monocyclic or polycyclic. The polycyclic cycloalkyl group may be crosslinked. That is, in this case, the cycloalkyl group may have a bridged structure. The monocyclic type is preferably a cycloalkyl group having 3 to 8 carbon atoms, and examples thereof include a cyclopropyl group, a cyclopentyl group, a cyclohexyl group, a cyclobutyl group and a cyclooctyl group. The polycyclic type includes a group having a bicyclo, tricyclo or tetracyclo structure or the like and having 5 or more carbon atoms. A cycloalkyl group having 6 to 20 carbon atoms is preferred, and examples thereof include an adamantyl group, a norbornyl group, an isobornyl group, a camphanyl group, a dicyclopentyl group, an α-pinel group, a tricyclodecanyl group, a tetracyclododecyl group and an androstanyl group. The following structures are also preferred as the cycloalkyl group. Incidentally, a portion of carbon atoms in the cycloalkyl group may be substituted with a hetero atom such as an oxygen atom.

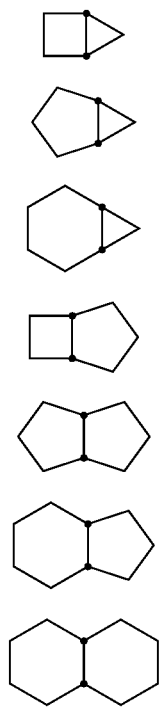

(1)
(2)
(3)
(4)
(5)
(6)
(7)

-continued

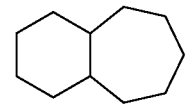

(8)

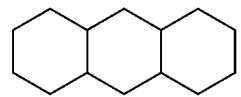

(9)

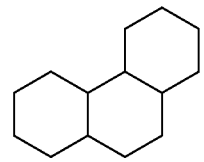

(10)

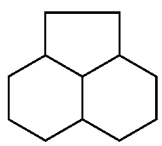

(11)

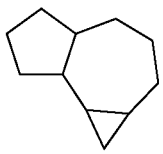

(12)

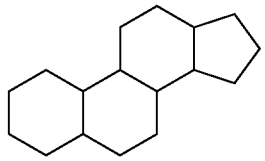

(13)

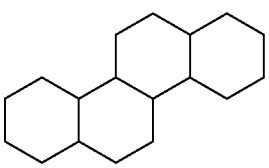

(14)

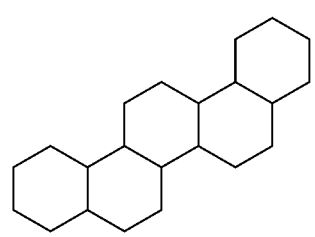

(15)

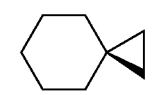

(16)

(17)

(18)

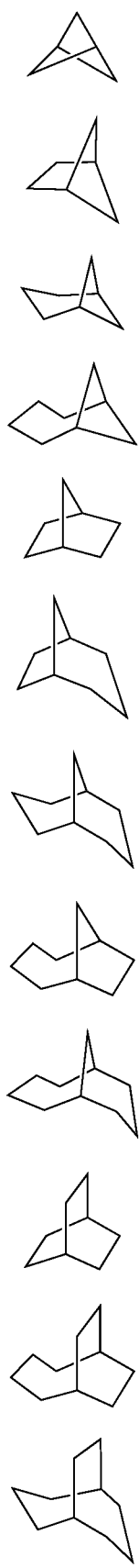
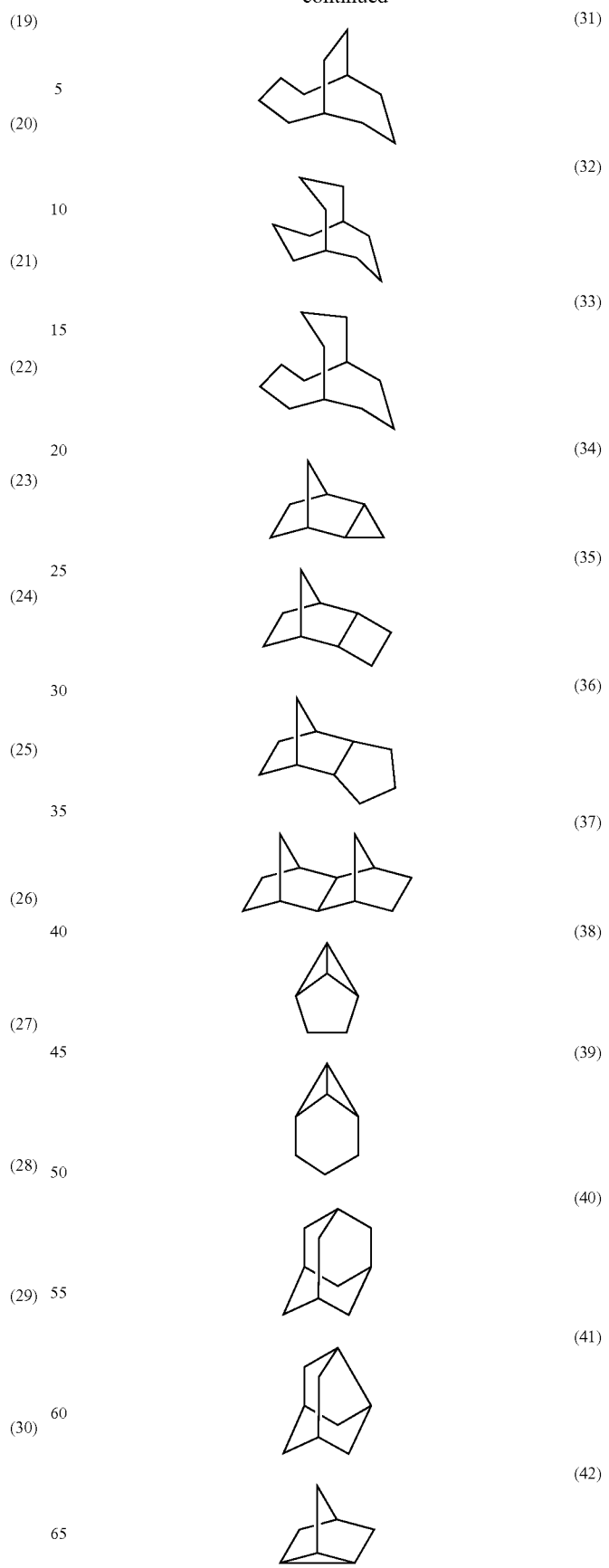

(43) 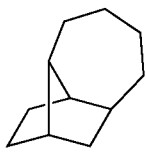

(44) 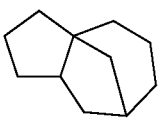

(45) 

(46) 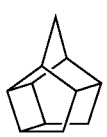

(47) 

(48) 

(49) 

(50) 

The alicyclic moiety is preferably an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group or a cyclododecanyl group, more preferably an adamantyl group, a decalin group, a norbornyl group, a cedrol group, a cyclohexyl group, a cycloheptyl group, a cyclooctyl group, a cyclodecanyl group, a cyclododecanyl group or a tricyclodecanyl group.

The substituent in such an alicyclic moiety includes an alkyl group, a halogen atom, a hydroxyl group, an alkoxy group, a carboxyl group and an alkoxycarbonyl group. The alkyl group is preferably a lower alkyl group such as a methyl group, an ethyl group, a propyl group, an isopropyl group or a butyl group, more preferably a methyl group, an ethyl group, a propyl group or an isopropyl group. The alkoxy group is preferably an alkoxy group having 1 to 4 carbon atoms, such as a methoxy group, an ethoxy group, a propoxy group or a butoxy group. Examples of the substituent that the alkyl group and alkoxy group may have include a hydroxyl group, a halogen atom and an alkoxy group (preferably having 1 to 4 carbon atoms).

Each of these groups may further have a substituent, and examples of the further substituent include a hydroxyl group, a halogen atom (for example, fluorine, chlorine, bromine, or iodine), a nitro group, a cyano group, the foregoing alkyl group, an alkoxy group such as a methoxy group, an ethoxy group, a hydroxyethoxy group, a propoxy group, a hydroxypropoxy group, an n-butoxy group, an isobutoxy group, a sec-butoxy group or a tert-butoxy group, an alkoxycarbonyl group such as a methoxycarbonyl group or an ethoxycarbonyl group, an aralkyl group such as a benzyl group, a phenethyl group or a cumyl group, an aralkyloxy group, an acyl group such as a formyl group, an acetyl group, a butyryl group, a benzoyl group, a cinnamoyl group or a valeryl group, an acyloxy group such as a butyryloxy group, the above-mentioned alkenyl group, an alkenyloxy group such as a vinyloxy group, a propenyloxy group, an allyloxy group or a butenyloxy group, the above-mentioned aryl group, an aryloxy group such as a phenoxy group, and an aryloxycarbonyl group such as a benzoyloxy group.

It is preferred that X in formula (KA-1) is a carboxylic acid ester group and the partial structure represented by formula (KA-1) is a lactone ring, and the lactone ring is preferably a 5- to 7-membered lactone ring.

In this connection, as in (KA-1-1) to (KA-1-17) described below, another ring structure is preferably fused to a 5- to 7-membered lactone ring that is the partial structure represented by formula (KA-1), in the form of forming a bicyclo or spiro structure.

Examples of the peripheral ring structure with which the ring structure represented by formula (KA-1) may combine include those in (KA-1-1) to (KA-1-17) and structures based on these structures.

The structure containing the lactone ring structure represented by formula (KA-1) is more preferably a structure represented by any one of the following (KA-1-1) to (KA-1-17). The lactone structure may be bonded directly to the main chain. Preferred structures are (KA-1-1), (KA-1-4), (KA-1-5), (KA-1-6), (KA-1-13), (KA-1-14), and (KA-1-17).

KA-1-1
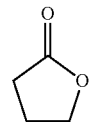

KA-1-2
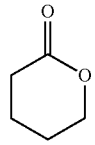

KA-1-3
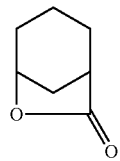

KA-1-4
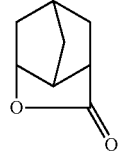

KA-1-5 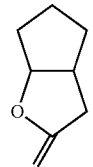

KA-1-6 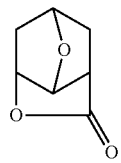

KA-1-7 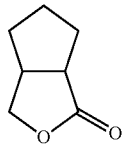

KA-1-8 

KA-1-9 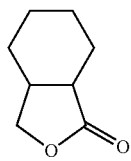

KA-1-10 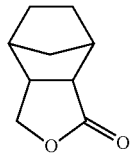

KA-1-11 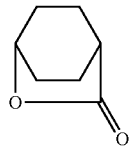

KA-1-12 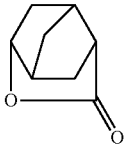

KA-1-13 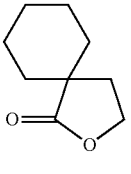

KA-1-14 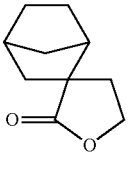

KA-1-15 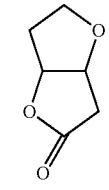

KA-1-16 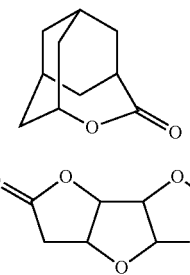

KA-1-17

The structure containing the above-described lactone ring structure may or may not have a substituent. Preferred examples of the substituent are the same as those of the substituent $Z_{ka1}$ which the ring structure represented by formula (KA-1) may have.

In formula (KB-1), X is preferably a carboxylic acid ester group (—COO—).

In formula (KB-1), $Y^1$ and $Y^2$ each independently represent an electron-withdrawing group.

The electron-withdrawing group is a partial structure represented by formula (EW) described below. In formula (EW), * indicates a direct bond to (KA-1) or a direct bond to X in (KB-1).

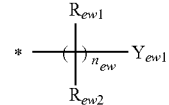

(EW)

In formula (EW), $n_{ew}$ is a repetition number of the linking group represented by —C($R_{ew1}$)($R_{ew2}$)— and represents an integer of 0 or 1. In the case where $n_{ew}$ is 0, this indicates that the bond is a single bond and $Y_{ew1}$ is directly bonded.

$Y_{ew1}$ is a halogen atom, a cyano group, a nitrile group, a nitro group, a halo(cyclo)alkyl group represented by —C($R_{f1}$)($R_{f2}$)—$R_{f3}$, a haloaryl group, an oxy group, a carbonyl group, a sulfonyl group, a sulfinyl group, or a combination thereof. The electron-withdrawing group may be, for example, a structure shown below. The "halo(cyclo)alkyl group" indicates an alkyl or cycloalkyl group that is at least partially halogenated, and the "haloaryl group" indicates an aryl group that is at least partially halogenated. In the following structural formulae, $R_{ew3}$ and $R_{ew4}$ each independently represent an arbitrary structure. The partial structure represented by formula (EW) has an electron-withdrawing group regardless of what structure $R_{ew3}$ or $R_{ew4}$ may take, and each of $R_{ew3}$ and $R_{ew4}$ may be connected, for example, to the main chain of the resin but is preferably an alkyl group, a cycloalkyl group or an alkyl fluoride group.

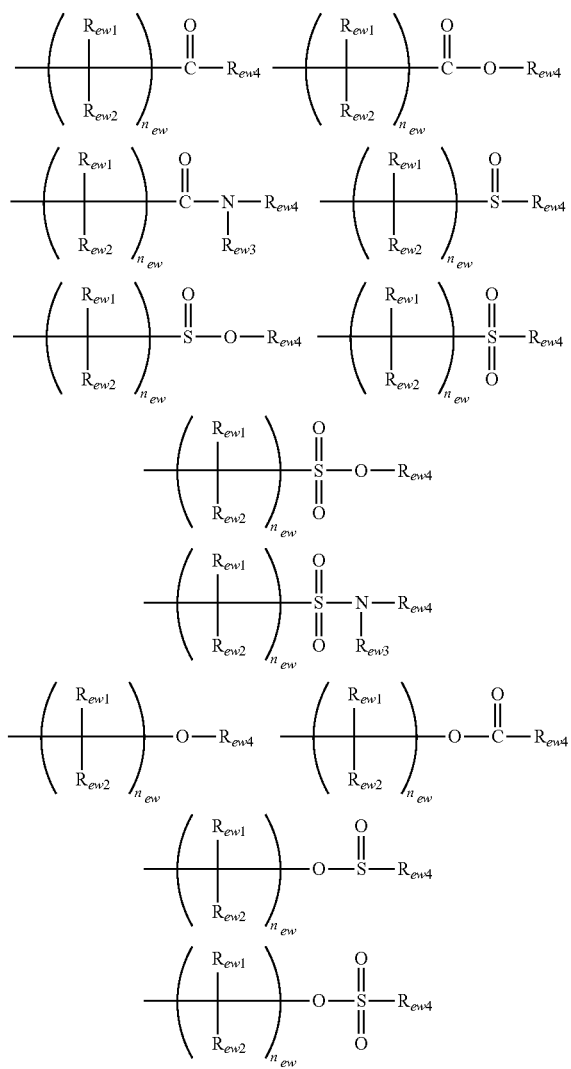

When $Y_{ew1}$ is a divalent or higher valent group, the remaining bond forms bonding to an arbitrary atom or substituent. At least any one group of $Y_{ew1}$, $R_{ew1}$ and $R_{ew2}$ may be connected to the main chain of the resin (C) through a further substituent.

$Y_{ew1}$ is preferably a halogen atom, a halo(cyclo)alkyl group represented by $-C(R_{f1})(R_{f2})-R_{f3}$ or a haloaryl group.

$R_{ew1}$ and $R_{ew2}$ each independently represent an arbitrary substituent, for example, represents a hydrogen atom, an alkyl group, a cycloalkyl group, or an aryl group.

At least two members out of $R_{ew1}$, $R_{ew2}$ and $Y_{ew1}$ may combine with each other to form a ring.

$R_{f1}$ represents a halogen atom, a perhaloalkyl group, a perhalocycloalkyl group or a perhaloaryl group and is preferably a fluorine atom, a perfluoroalkyl group or a perfluorocycloalkyl group, more preferably a fluorine atom or a trifluoromethyl group.

$R_{f2}$ and $R_{f3}$ each independently represent a hydrogen atom, a halogen atom or an organic group, or alternatively $R_{f2}$ and $R_{f3}$ may combine to form a ring. Examples of the organic group include an alkyl group, a cycloalkyl group and an alkoxy group. $R_{f2}$ is more preferably the same group as $R_{f1}$ or combines with $R_{f3}$ to form a ring.

$R_{f1}$ to $R_{f3}$ may combine to form a ring, and examples of the ring formed include a (halo)cycloalkyl ring and a (halo)aryl ring.

Examples of the (halo)alkyl group in $R_{f1}$ to $R_{f3}$ include the alkyl group in $Z_{ka1}$ and halogenated structures thereof.

Examples of the (per)halocycloalkyl group and (per)haloaryl group in $R_{f1}$ to $R_{f3}$ or in the ring formed by combining $R_{f2}$ and $R_{f3}$ include structures resulting from halogenation of cycloalkyl groups in $Z_{ka1}$, preferably a fluorocycloalkyl group represented by $-C_{(n)}F_{(2n-2)}H$, and a perfluoroaryl group represented by $-C_{(n)}F_{(n-1)}$, wherein the carbon number n is not particularly limited but is preferably from 5 to 13, more preferably 6.

The ring which may be formed by combining at least two members of $R_{ew1}$, $R_{ew2}$ and $Y_{ew1}$ with each other is preferably a cycloalkyl group or a heterocyclic group, and the heterocyclic group is preferably a lactone ring group. Examples of the lactone ring include structures represented by formulae (KA-1-1) to (KA-1-17).

Incidentally, the repeating unit (by) may have a plurality of partial structures represented by formula (KA-1), a plurality of partial structures represented by formula (KB-1), or both a partial structure of formula (KA-1) and a partial structure of formula (KB-1).

Here, the partial structure of formula (KA-1) may partially or entirely serve also as the electron-withdrawing group of $Y^1$ or $Y^2$ in formula (KB-1). For example, in the case where X in formula (KA-1) is a carboxylic acid ester group, the carboxylic acid ester group may function as an electron-withdrawing group of $Y^1$ or $Y^2$ in formula (KB-1).

In the case where the repeating unit (by) contains a partial structure corresponding to the repeating unit (b*) or (b'') and represented by formula (KA-1), the partial structure represented by formula (KA-1) is more preferred when the polarity converting group is a partial structure represented by —COO— in the structure of formula (KA-1).

The repeating unit (by) may be a repeating unit having a partial structure represented by formula (KY-0).

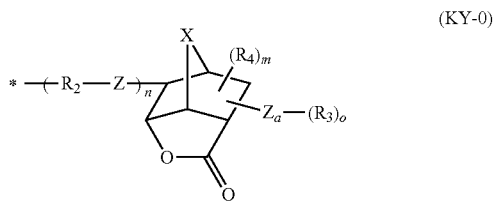

(KY-0)

In formula (KY-0), $R_2$ represents a chain or cyclic alkylene group and when a plurality of $R_2$'s are present, each $R_2$ may be the same as or different from every other $R_2$.

$R_3$ represents a linear, branched or cyclic hydrocarbon group where a part or all of hydrogen atoms on the constituent carbons are substituted by a fluorine atom.

$R_4$ represents a halogen atom, a cyano group, a hydroxyl group, an amide group, an alkyl group, a cycloalkyl group, an alkoxy group, a phenyl group, an acyl group, an alkoxycarbonyl group or a group represented by R—C(=O)— or R—C(=O)O— (wherein R represents an alkyl group or a cycloalkyl group). When a plurality of $R_4$'s are present, each $R_4$ may be the same as or different from every other $R_4$, and two or more $R_4$'s may combine to form a ring.

X represents an alkylene group, an oxygen atom or a sulfur atom.

Each of Z and Za represents a single bond, an ether bond, an ester bond, an amide bond, a urethane bond or a urea bond and when a plurality of Z's or Za's are present, each Z or Za may be the same as or different from every other Z or Za.

* represents a bond to the main or side chain of the resin.

o is the number of substituents and represents an integer of 1 to 7.

m is the number of substituents and represents an integer of 0 to 7.

n is a repetition number and represents an integer of 0 to 5.

The structure of $-R_2-Z-$ is preferably a structure represented by $-(CH_2)_lCOO-$ (wherein l represents an integer of 1 to 5).

The preferred carbon number range and specific examples of the chain or cyclic alkylene group as $R_2$ are an alkylene group having 1 or 2 carbon atoms or a cycloalkylene group having 5 to 10 carbon atoms.

The carbon number of the linear, branched or cyclic hydrocarbon group as $R_3$ is, in the case of a linear hydrocarbon group, preferably from 1 to 30, more preferably from 1 to 20; in the case of a branched hydrocarbon group, preferably from 3 to 30, more preferably from 3 to 20; and in the case of a cyclic hydrocarbon group, from 6 to 20. Specific examples of $R_3$ include specific examples of the alkyl group and cycloalkyl group as $Z_{ka1}$ above.

The preferred carbon numbers and specific examples of the alkyl group and cycloalkyl group as $R_4$ and R are the same as those described above for the alkyl group and cycloalkyl group as $Z_{ka1}$.

The acyl group as $R_4$ is preferably an acyl group having 1 to 6 carbon atoms, and examples thereof include a formyl group, an acetyl group, a propionyl group, a butyryl group, an isobutyryl group, a valeryl group and a pivaloyl group.

The alkyl moiety in the alkoxy group and alkoxycarbonyl group as $R_4$ includes a linear, branched or cyclic alkyl moiety, and the preferred carbon number and specific examples of the alkyl moiety are the same as those described above for the alkyl group and cycloalkyl group as $Z_{ka1}$.

The alkylene group as X includes a chain or cyclic alkylene group, and the preferred carbon number and specific examples thereof are the same as those described for the chain alkylene group and cyclic alkylene group as $R_2$.

As for the specific structure of the repeating unit (by), the repeating unit also includes repeating units having a partial structure shown below.

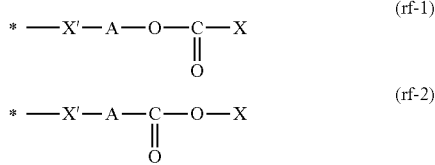

In formulae (rf-1) and (rf-2), X' represents an electron-withdrawing substituent and is preferably a carbonyloxy group, an oxycarbonyl group, a fluorine atom-substituted alkylene group or a fluorine atom-substituted cycloalkylene group.

A represents a single bond or a divalent linking group represented by $-C(Rx)(Ry)-$ wherein Rx and Ry each independently represent a hydrogen atom, a fluorine atom, an alkyl group (preferably having 1 to 6 carbon atoms; which may be substituted with a fluorine atom or the like), or a cycloalkyl group (preferably having 5 to 12 carbon atoms; which may be substituted with a fluorine atom or the like). Each of Rx and Ry is preferably a hydrogen atom, an alkyl group or a fluorine atom-substituted alkyl group.

X represents an electron-withdrawing group and specific examples thereof include those electron-withdrawing groups as $Y^1$ and $Y^2$ above. Among these, an alkyl fluoride group, a cycloalkyl fluoride group, an aryl group substituted with fluorine or an alkyl fluoride group, an aralkyl group substituted with fluorine or an alkyl fluoride group, a cyano group, and a nitro group are preferred.

* represents a bond to the main or side chain of the resin, that is, a bond to the main chain of the resin through a single bond or a linking group.

Incidentally, when X' is a carbonyloxy group or an oxycarbonyl group, A is not a single bond.

The polarity converting group is decomposed by the action of an alkaline developer to effect polarity conversion, whereby the receding contact angle with water of the resin composition film after alkali development can be decreased. Decreasing the receding contact angle with water of the film after alkali development is preferred from the standpoint of suppressing the development defects.

The receding contact angle with water of the resin composition film after alkali development is preferably 50° or less, more preferably 40° or less, still more preferably 35° or less, and most preferably 30° or less, at a temperature of 23±3° C. and a humidity of 45±5%.

The receding contact angle is a contact angle measured when a contact line recedes on the liquid droplet-substrate interface, and this is generally known to be useful in simulating the mobility of a liquid droplet in the dynamic state. In a simple manner, the receding contact angle is defined as a contact angle at the time of the liquid droplet interface receding when a liquid droplet ejected from a needle tip is landed on a substrate and then the liquid droplet is again suctioned into the needle. In general, the receding contact angle may be measured by a contact angle measuring method called an expansion/contraction method.

The above-described receding contact angle of the film after alkali development is a contact angle measured on the film described below by an expansion/contraction method employed in Examples later. That is, an organic antireflection film, ARC29A (manufactured by Nissan Chemical Industries, Ltd.), is coated on a silicon wafer (8 inches in diameter) and baked at 205° C. for 60 seconds to form a 98 nm-thick antireflection film, the composition of the present invention is coated thereon and baked at 120° C. for 60 seconds to form a film having a thickness of 120 nm, this film is developed with an aqueous tetramethylammonium hydroxide solution (2.38 mass %) for 30 seconds, rinsed with pure water and spin-dried, and the contact angle of the obtained film is measured by the expansion/contraction method.

The hydrolysis rate of the resin (B) for an alkaline developer is preferably 0.001 nm/sec or more, more preferably 0.01 nm/sec or more, still more preferably 0.1 nm/sec or more, and most preferably 1 nm/sec or more.

Here, the hydrolysis rate of the resin (B) for an alkaline developer is a rate at which the thickness of a resin film formed of only the resin (B) decreases when treated with TMAH (an aqueous tetramethylammonium hydroxide solution) (2.38 mass %) at 23° C.

The repeating unit (by) is more preferably a repeating unit having at least two or more polarity converting groups.

In the case where the repeating unit (by) has at least two polarity converting groups, the repeating unit preferably has a group containing a partial structure having two polarity converting groups represented by the following formula (KY-1). Incidentally, when the structure represented by formula (KY-1) does not have a bond, this is a group containing a monovalent or higher valent group formed by removing at least one arbitrary hydrogen atom from the structure.

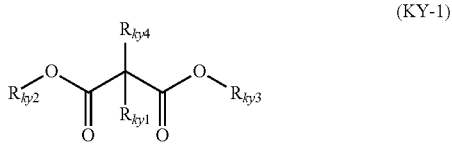
(KY-1)

In formula (KY-1), $R_{ky1}$ and $R_{ky4}$ each independently represent a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group. Alternatively, $R_{ky1}$ and $R_{ky4}$ may be bonded to the same atom to form a double bond. For example, $R_{ky1}$ and $R_{ky4}$ may be bonded to the same oxygen atom to form a part (=O) of a carbonyl group.

$R_{ky2}$ and $R_{ky3}$ each independently represent an electron-withdrawing group, or while $R_{ky1}$ and $R_{ky2}$ combine to form a lactone ring, $R_{ky3}$ is an electron-withdrawing group. The lactone ring formed is preferably a structure of (KA-1-1) to (KA-1-17). Examples of the electron-withdrawing group are the same as those for $Y_1$ and $Y_2$ in formula (KB-1), and a halogen atom, or a halo(cyclo)alkyl group or haloaryl group represented by —C($R_{f1}$)($R_{f2}$)—$R_{f3}$ is preferred. Preferably, $R_{ky3}$ is a halogen atom, or a halo(cyclo)alkyl group or haloaryl group represented by —C($R_{f1}$)($R_{f2}$)—$R_{f3}$, and $R_{ky2}$ combines with $R_{ky1}$ to form a lactone ring or is an electron-withdrawing group containing no halogen atom.

$R_{ky1}$, $R_{ky2}$ and $R_{ky4}$ may combine with each other to form a monocyclic or polycyclic structure.

Specific examples of $R_{ky1}$ and $R_{ky4}$ include the same groups as those for $Z_{ka1}$ in formula (KA-1).

The lactone ring formed by combining $R_{ky1}$ and $R_{ky2}$ is preferably a structure of (KA-1-1) to (KA-1-17). Examples of the electron-withdrawing group are the same as those for $Y_1$ and $Y_2$ in formula (KB-1).

The structure represented by formula (KY-1) is preferably a structure represented by the following formula (KY-2). Here, the structure represented by formula (KY-2) is a group having a monovalent or higher valent group formed by removing at least one arbitrary hydrogen atom from the structure.

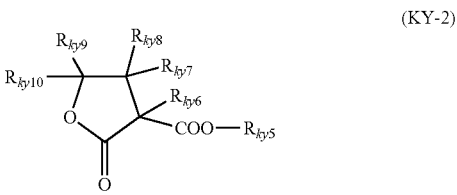
(KY-2)

In formula (KY-2), $R_{ky6}$ to $R_{ky10}$ each independently represent a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group.

Two or more members of $R_{ky6}$ to $R_{ky10}$ may combine with each other to form a monocyclic or polycyclic structure.

$R_{ky5}$ represents an electron-withdrawing group. Examples of the electron-withdrawing group are the same as those for $Y_1$ and $Y_2$ above, and among these, a halogen atom, or a halo(cyclo)alkyl group or haloaryl group represented by —C($R_{f1}$)($R_{f2}$)—$R_{f3}$ is preferred.

Specific examples of $R_{ky5}$ to $R_{ky10}$ include the same groups as those for $Z_{ka1}$ in formula (KA-1).

The structure represented by formula (KY-2) is preferably a partial structure represented by the following formula (KY-3).

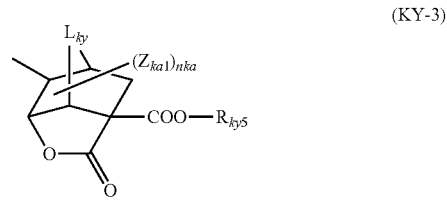
(KY-3)

In formula (KY-3), $Z_{ka1}$ and nka have the same meanings as in formula (KA-1). $R_{ky5}$ has the same meaning as in formula (KY-2).

$L_{ky}$ represents an alkylene group, an oxygen atom or a sulfur atom. Examples of the alkylene group of $L_{ky}$ include a methylene group and an ethylene group. $L_{ky}$ is preferably an oxygen atom or a methylene group, and more preferably a methylene group.

The repeating unit (b) is not limited as long as it is a repeating unit obtained by polymerization such as addition polymerization, condensation polymerization or addition condensation, but this repeating unit is preferably a repeating unit obtained by addition polymerization of a carbon-carbon double bond. Examples thereof include an acrylate-based repeating unit (including a system having a substituent at the α- or β-position), a styrene-based repeating unit (including a system having a substituent at the α- or β-position), a vinyl ether-based repeating unit, a norbornene-based repeating unit, and a maleic acid derivative (such as a maleic anhydride or its derivative, or maleimide) repeating unit. An acrylate-based repeating unit, a styrene-based repeating unit, a vinyl ether-based repeating unit and a norbornene-based repeating unit are preferred, an acrylate-based repeating unit, a vinyl ether-based repeating unit and a norbornene-based repeating unit are more preferred, and an acrylate-based repeating unit is most preferred.

In the case where the repeating unit (by) is a repeating unit having at least either of a fluorine atom or a silicon atom (that is, a repeating unit corresponding to the repeating unit (b') or (b")), examples of the fluorine atom-containing partial structure in the repeating unit (by) are the same as those in the repeating unit having at least either of a fluorine atom or a silicon atom, and the groups represented by formula (F2) to (F4) are preferred. Also, examples of the silicon atom-containing partial structure in the repeating unit (by) are the same as those in the repeating unit having at least either of a fluorine atom or a silicon atom, and the groups represented by formulae (CS-1) to (CS-3) are preferred.

In the resin (B), the content of the repeating unit (by) is preferably from 10 to 100 mol %, more preferably from 20 to 99 mol %, still more preferably from 30 to 97 mol %, and most preferably from 40 to 95 mol %, based on all repeating units in the resin (B).

Specific examples of the repeating unit (by) having a group capable of increasing the solubility in an alkaline developer are illustrated below, but the present invention is not limited thereto. Specific examples of the repeating unit (a3) of the resin (A) are also included in specific examples of the repeating unit (by).

Ra represents a hydrogen atom, a fluorine atom, a methyl group or a trifluoromethyl group.

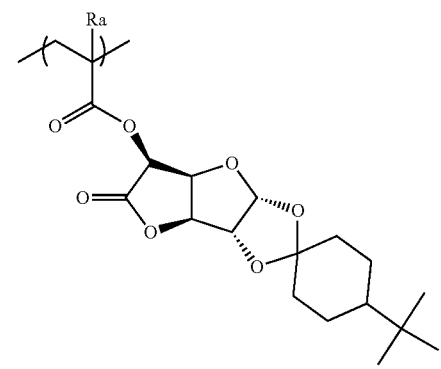

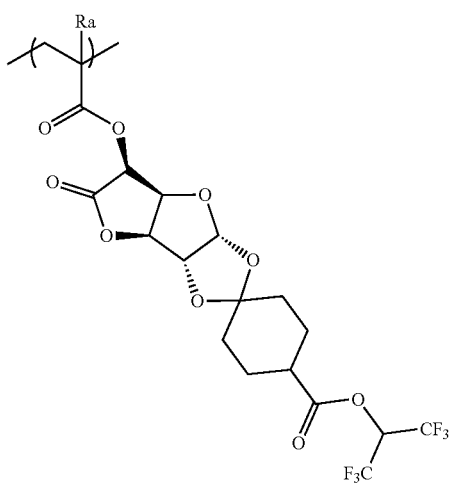

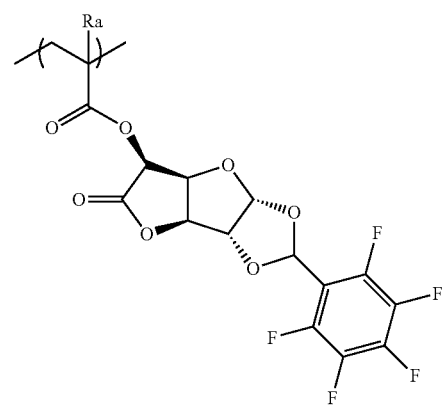

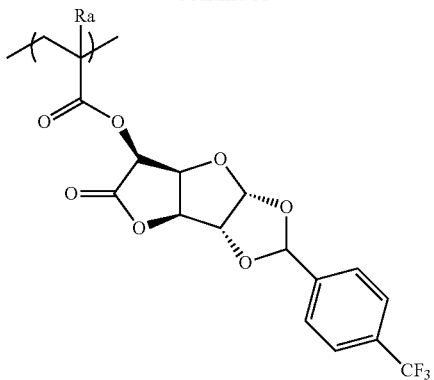

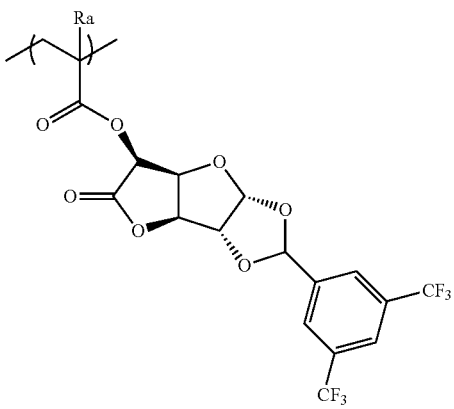

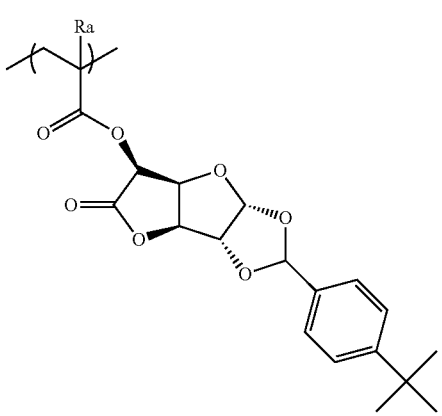

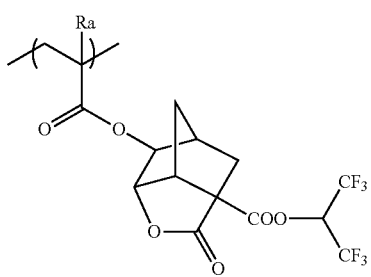

139
-continued
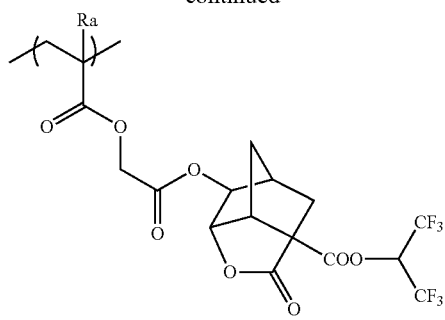
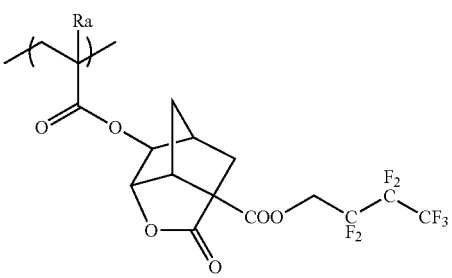
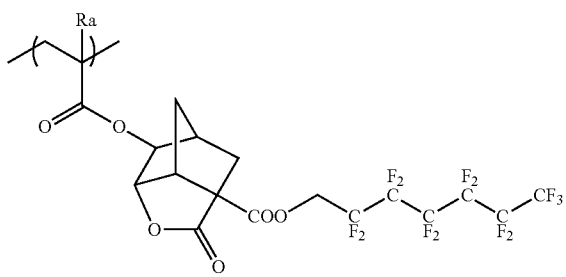
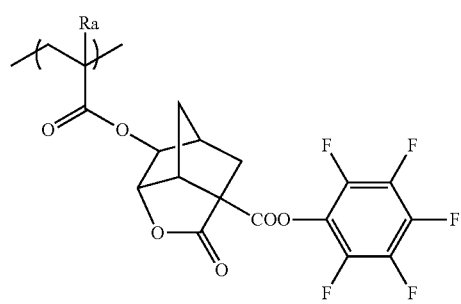
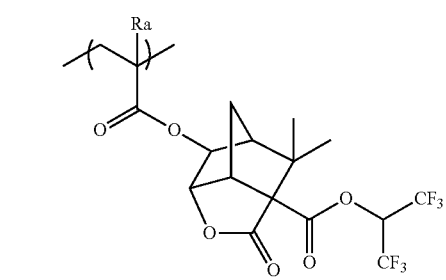
140
-continued
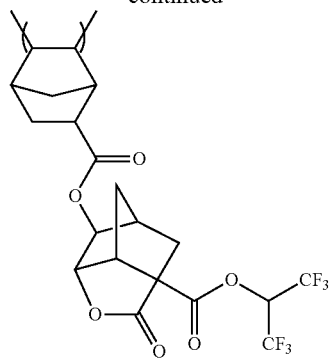
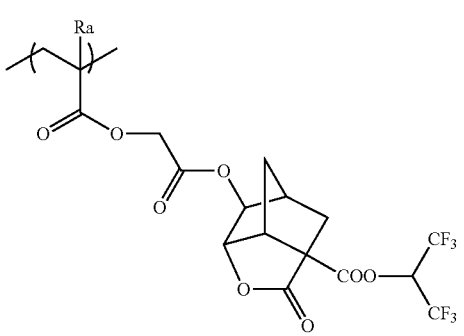
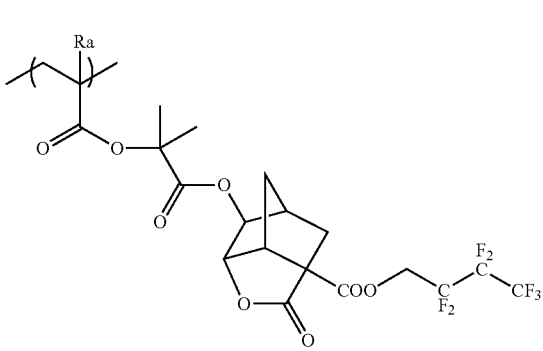
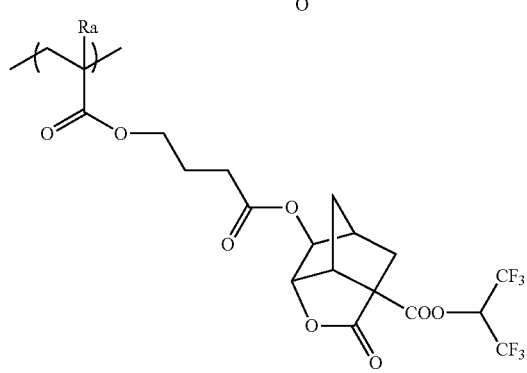
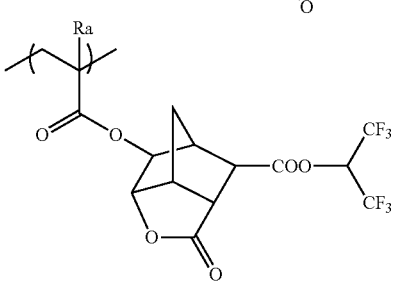

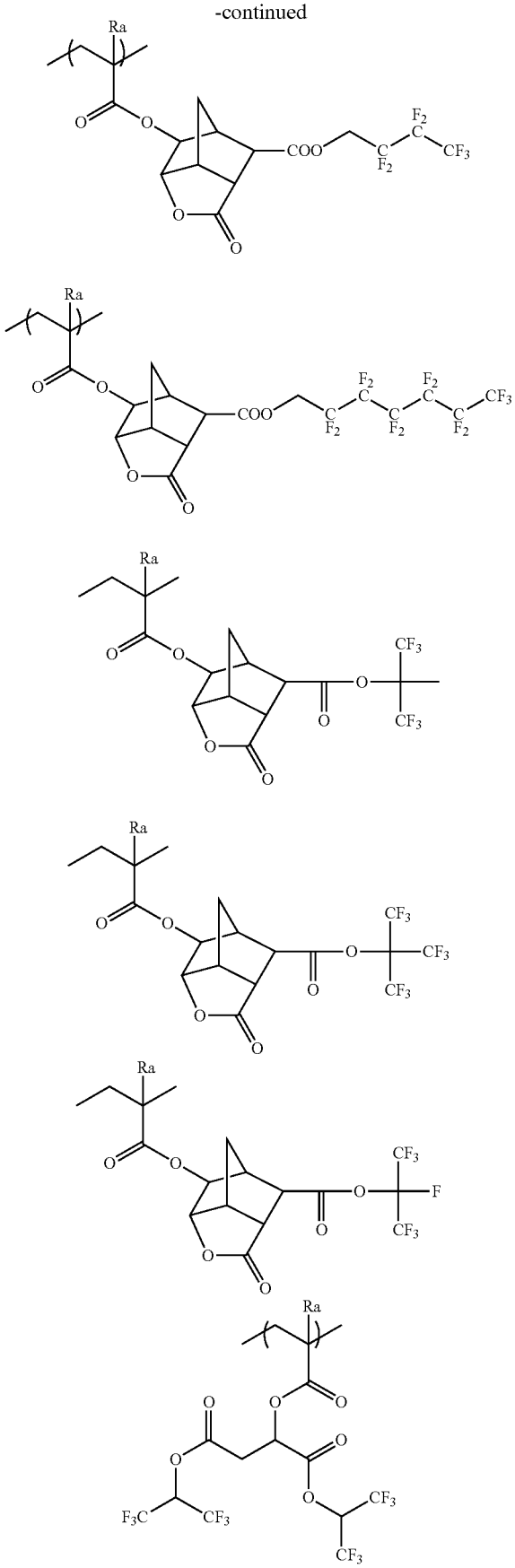
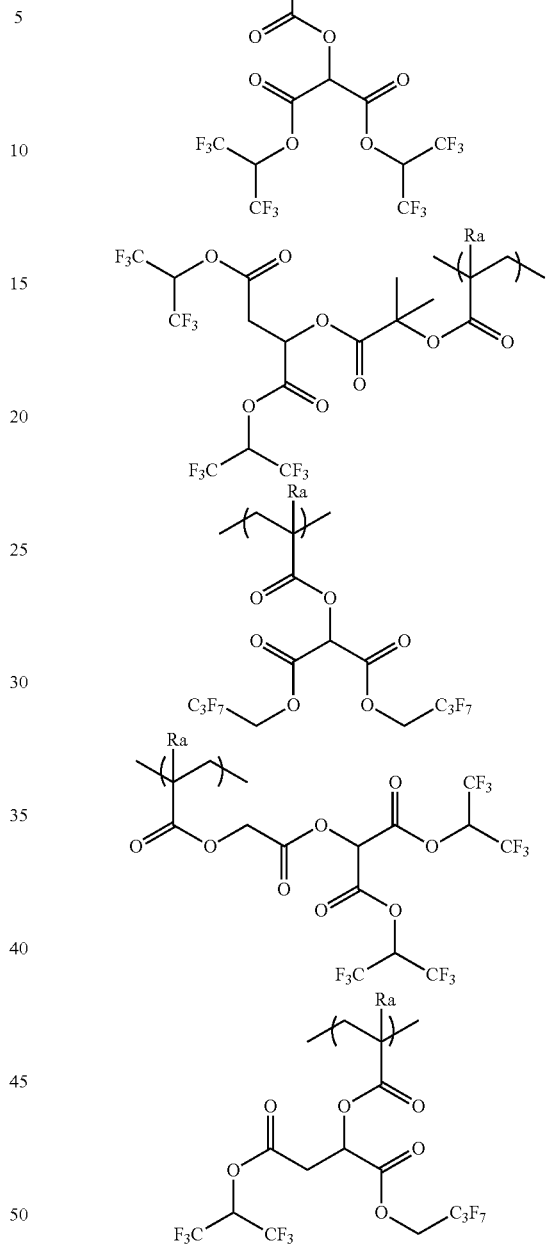

In the resin (B), examples of the repeating unit (bz) having a group (z) capable of decomposing by the action of an acid are the same as those described for the repeating unit having an acid-decomposable group in the resin (A).

In the case where the repeating unit (bz) is a repeating unit having at least either of a fluorine atom or a silicon atom (that is, a repeating unit corresponding to the repeating unit (b') or (b")), examples of the fluorine atom-containing partial structure in the repeating unit (bz) are the same as those described for the repeating unit having at least either of a fluorine atom or a silicon atom and preferably include the groups represented by formulae (F2) to (F4). Also in this case, examples of the silicon atom-containing partial structure in the repeating unit (by) are the same as those described for the repeating unit having at least either of a fluorine atom or a silicon atom and preferably include the groups represented by formulae (CS-1) to (CS-3).

In the resin (B), the content of the repeating unit (bz) having a group (z) capable of decomposing by the action of an acid is preferably from 1 to 80 mol %, more preferably from 10 to 80 mol %, and still more preferably from 20 to 60 mol %, based on all repeating units in the resin (B).

The repeating unit (b) having at least one group selected from the group consisting of (x) to (z) was described as above, but the content of the repeating unit (b) in the resin (B) is preferably from 1 to 98 mol %, more preferably from 3 to 98 mol %, still more preferably from 5 to 97 mol %, and most preferably from 10 to 95 mol %, based on all repeating units in the resin (B).

The content of the repeating unit (b') is preferably from 1 to 100 mol %, more preferably from 3 to 99 mol %, still more preferably from 5 to 97 mol %, and most preferably from 10 to 95 mol %, based on all repeating units in the resin (B).

The content of the repeating unit (b*) is preferably from 1 to 90 mol %, more preferably from 3 to 80 mol %, still more preferably 5 to 70 mol %, and most preferably 10 to 60 mol %, based on all repeating units in the resin (B). The content of the repeating unit having at least either of a fluorine atom or a silicon atom, which is used together with the repeating unit (b*) is preferably from 10 to 99 mol %, more preferably from 20 to 97 mol %, still more preferably from 30 to 95 mol %, and most preferably from 40 to 90 mol %, based on all repeating units in the resin (B).

The content of the repeating unit (b") is preferably from 1 to 100 mol %, more preferably from 3 to 99 mol %, more preferably from 5 to 97 mol %, and most preferably from 10 to 95 mol %, based on all repeating units in the resin (B).

The resin (B) may further contain a repeating unit represented by the following formula (III):

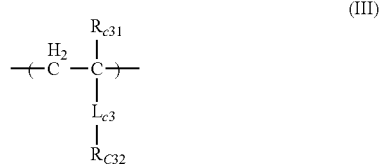

(III)

In formula (III), $R_{c31}$ represents a hydrogen atom, an alkyl group, or an alkyl group which may be substituted with a fluorine atom, a cyano group or a —$CH_2$—O—$R_{ac2}$ group wherein $R_{ac2}$ represents a hydrogen atom, an alkyl group or an acyl group. $R_{c31}$ is preferably a hydrogen atom, a methyl group, a hydroxymethyl group or a trifluoromethyl group, and more preferably a hydrogen atom or a methyl group.

$R_{c32}$ represents a group having an alkyl group, a cycloalkyl group, an alkenyl group, a cycloalkenyl group or an aryl group. Each of these groups may be substituted with a fluorine atom- or silicon atom-containing group or the like.

$L_{c3}$ represents a single bond or a divalent linking group.

In formula (III), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, more preferably a phenyl group or a naphthyl group, each of which may have a substituent.

$R_{c32}$ is preferably an unsubstituted alkyl group or a fluorine atom-substituted alkyl group.

The divalent linking group of $L_{c3}$ is preferably an alkylene group (preferably having 1 to 5 carbon atoms), an oxy group, a phenylene group or an ester bond (a group represented by —COO—).

It is also preferred that the resin (B) further contains a repeating unit represented by the following formula (BII-AB):

(BII-AB)

In formula (BII-AB), $R_{c11}'$ and $R_{c12}'$ each independently represent a hydrogen atom, a cyano group, a halogen atom or an alkyl group.

$Z_c'$ represents an atomic group for forming an alicyclic structure containing two carbon atoms (C—C) to which $Z_c'$ is bonded.

In the case where each group in the repeating units represented by formulae (III) and (BII-AB) is substituted with a fluorine atom- or silicon atom-containing group, the repeating unit corresponds also to the repeating unit having at least either of a fluorine atom or a silicon atom.

Specific examples of the repeating units represented by formulae (III) and (BII-AB) are illustrated below, but the present invention is not limited thereto. In the formulae, Ra represents H, $CH_3$, $CH_2OH$, $CF_3$ or CN. Incidentally, the repeating unit where Ra is $CF_3$ corresponds also to the repeating unit having at least either of a fluorine atom or a silicon atom.

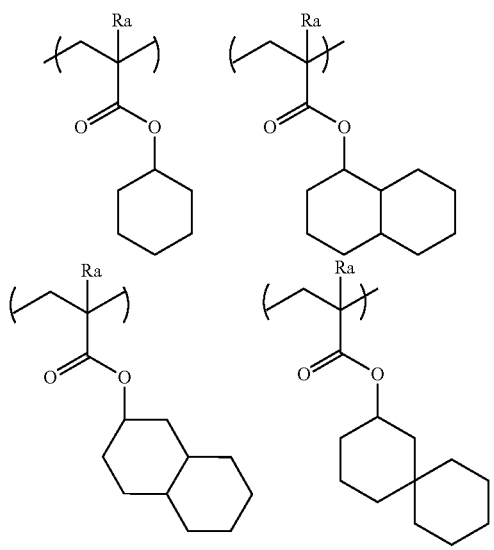

-continued

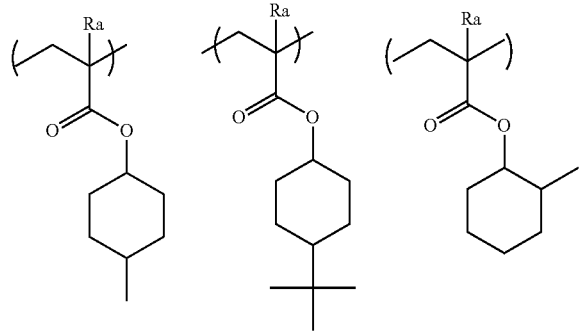
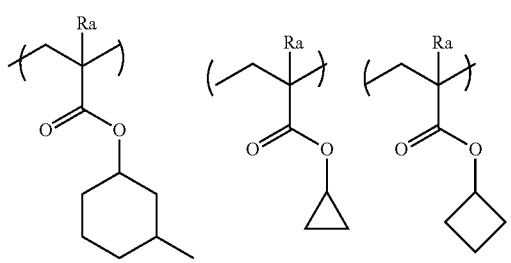
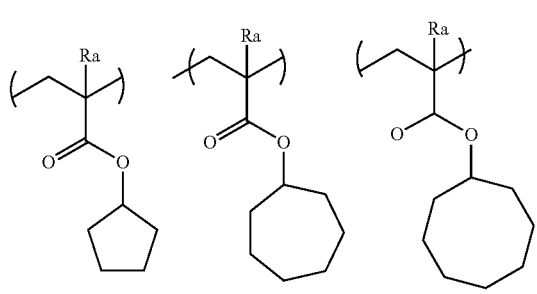
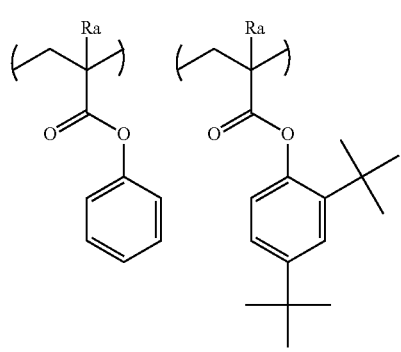
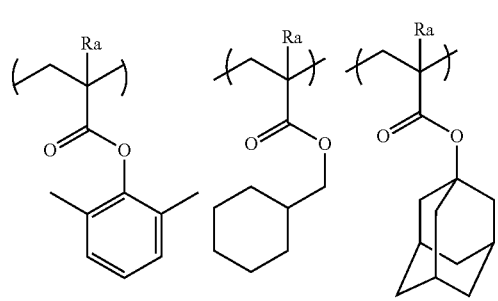

-continued

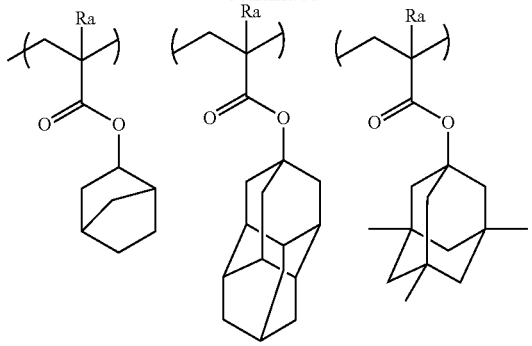
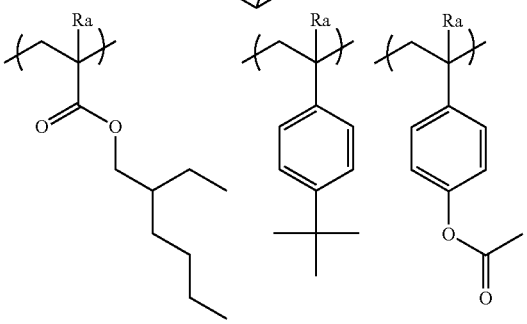
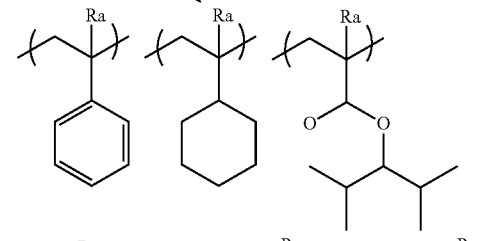

In the resin (B), similarly to the resin (A), it is of course preferred that the content of impurities such as metals is low, but also, the content of residual monomers or oligomer components is preferably from 0 to 10 mass %, more preferably from 0 to 5 mass %, and still more preferably from 0 to 1 mass %. When these conditions are satisfied, a resist composition free from foreign substances in the liquid or change in sensitivity or the like over time can be obtained. Furthermore, in view of resolution, resist profile, side wall of resist pattern, roughness and the like, the molecular weight distribution (Mw/Mn, also referred to as "dispersity") is preferably from 1 to 3, more preferably from 1 to 2, still more preferably from 1 to 1.8, and most preferably from 1 to 1.5.

As for the resin (B), various commercially available products may be also used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (for example, temperature, and concentration) and the purification method after reaction are the same as those described for the resin (A).

Specific examples of the resin (B) are illustrated below. Also, the molar ratio of repeating units (corresponding to repeating units starting from the left), weight average molecular weight and dispersity of each resin are shown in Table 1 below.

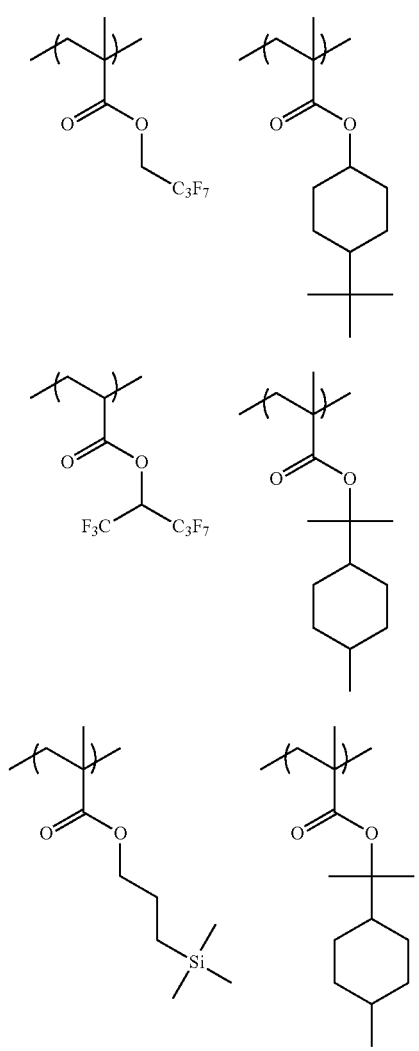

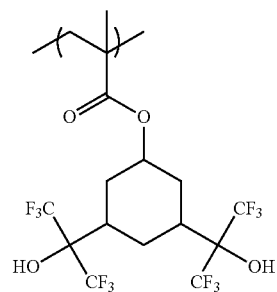

(B-4)

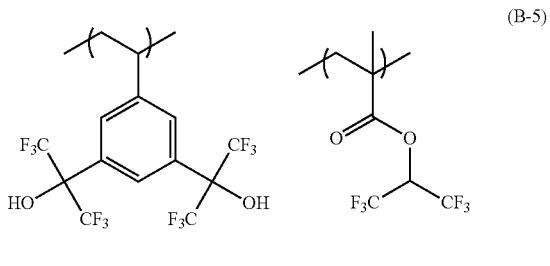

(B-5)

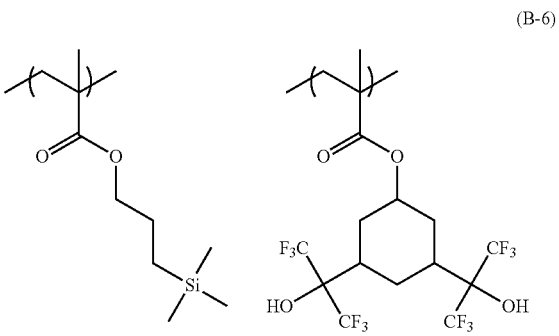

(B-6)

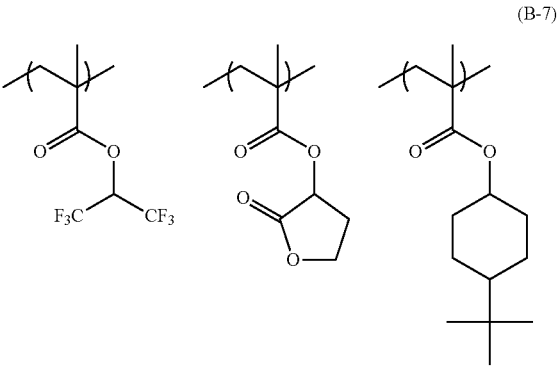

(B-7)

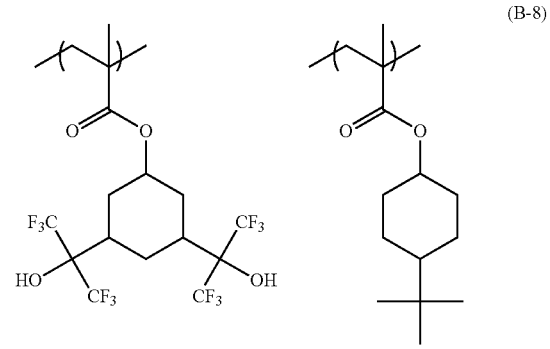

(B-8)

(B-9)
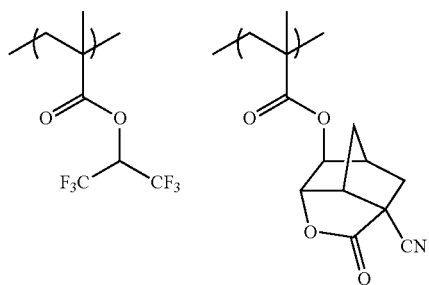
(B-10)
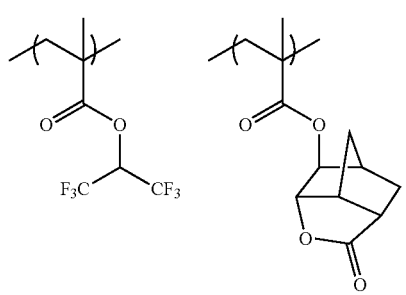
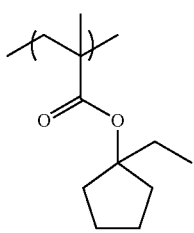
(B-11)
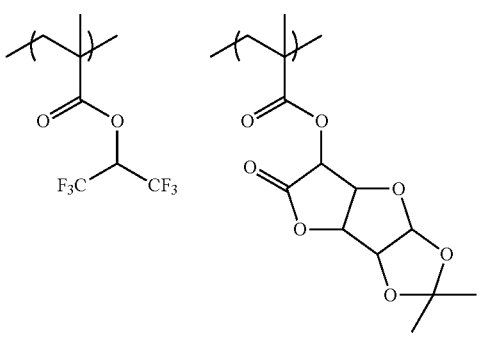
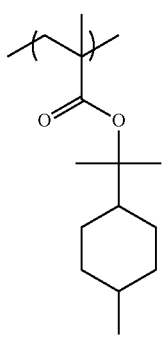
(B-12)
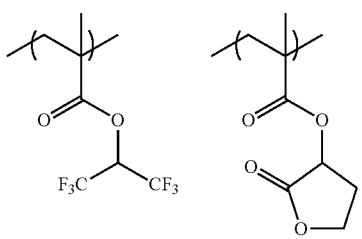
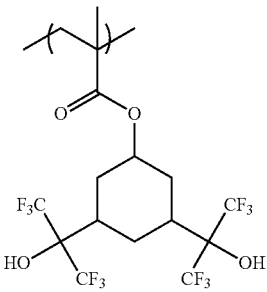
(B-13)
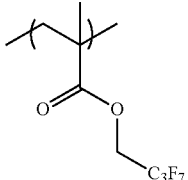
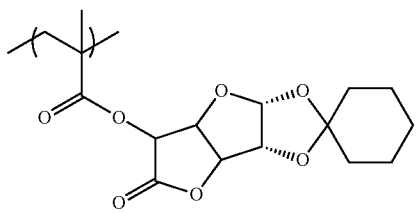
(B-14)
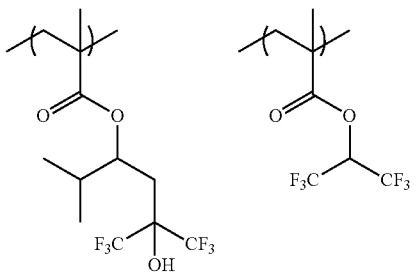
(B-15)
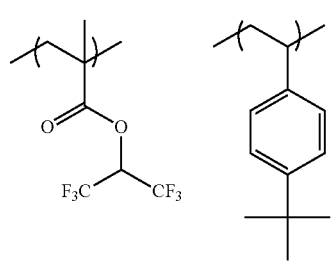

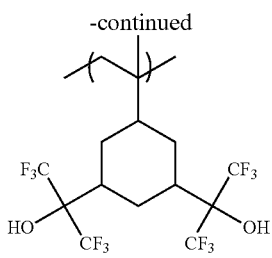
(B-16)
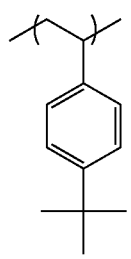 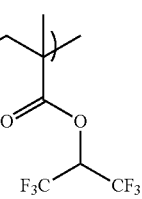
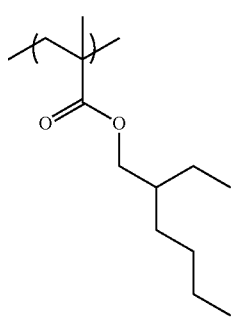
(B-17)
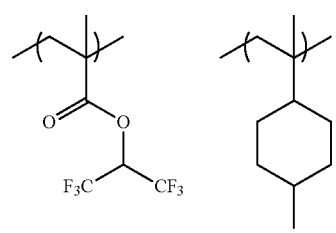
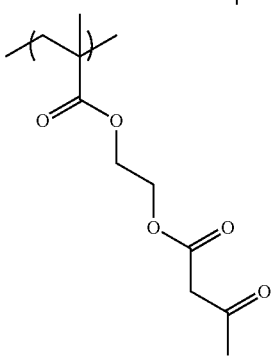
(B-18)
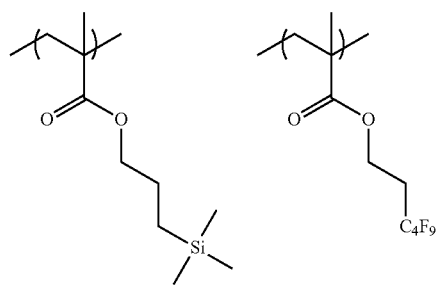
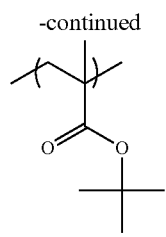
(B-19)
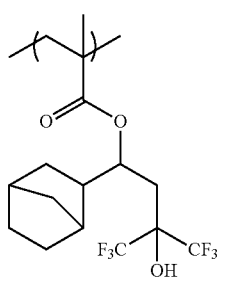
(B-20)
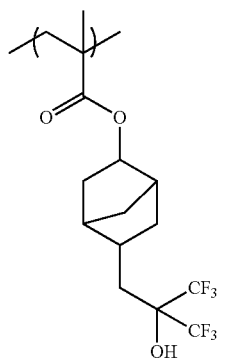
(B-21)
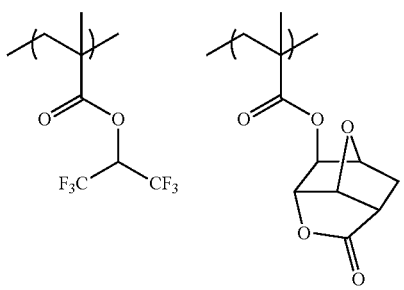
(B-22)
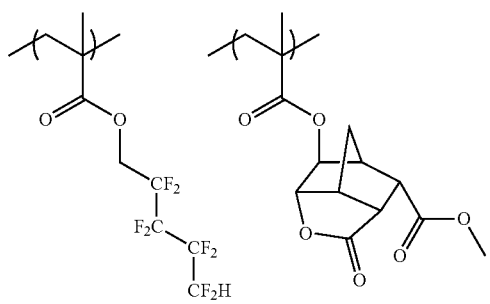

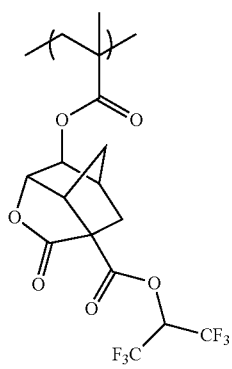 (B-23)
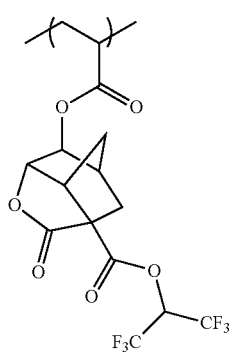 (B-24)
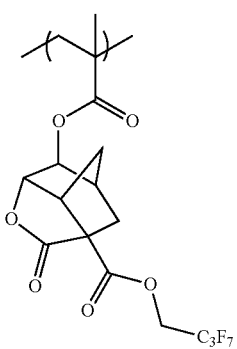 (B-25)
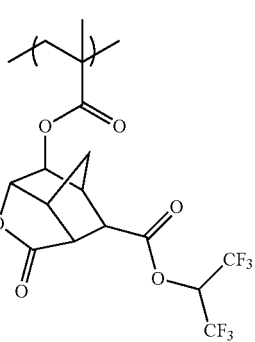 (B-26)
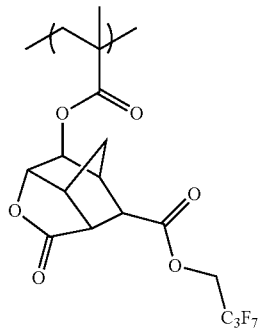 (B-27)
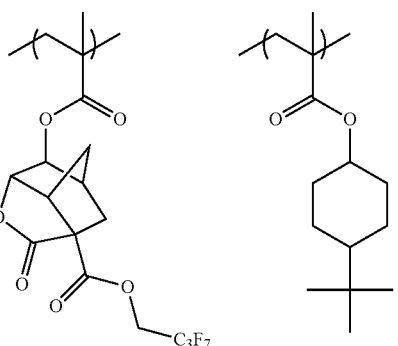 (B-28)
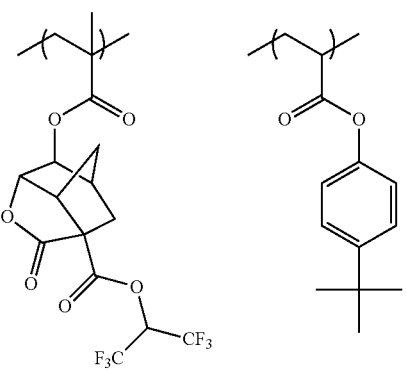 (B-29)

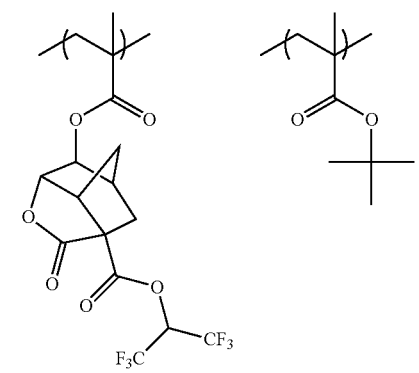
(B-30)
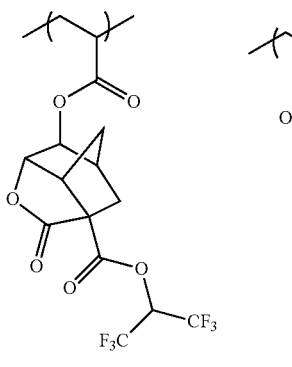
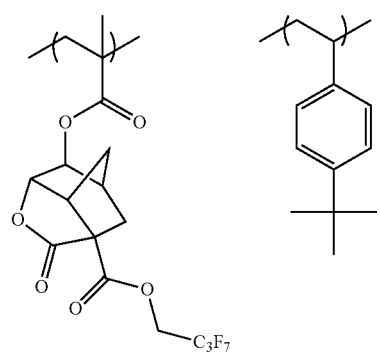
(B-31)
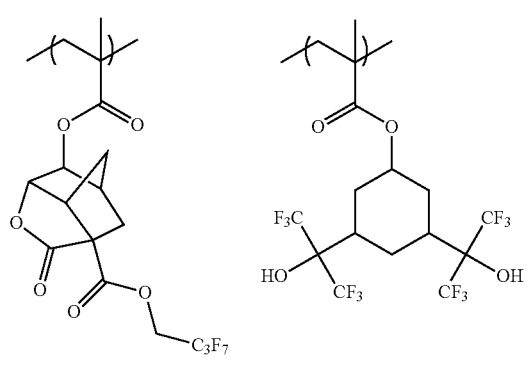
(B-32)
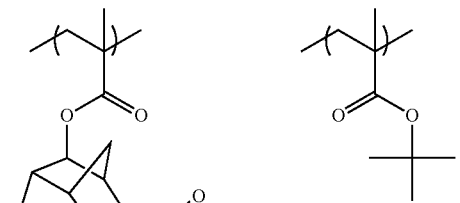
(B-33)
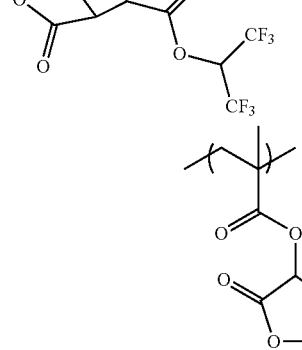
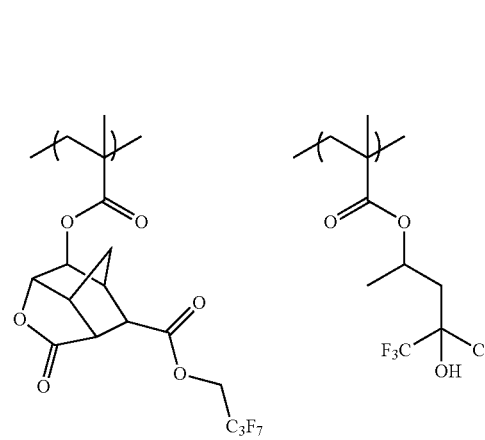
(B-34)
(B-35)
(B-36)
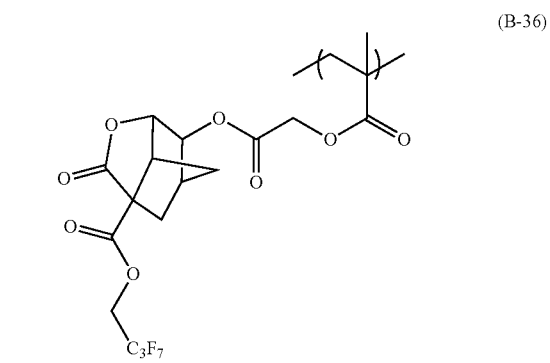
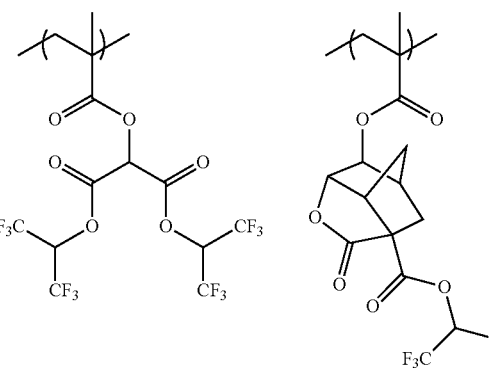
(B-37)

(B-38)
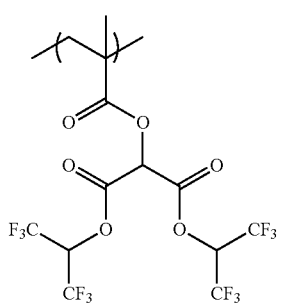
(B-39)
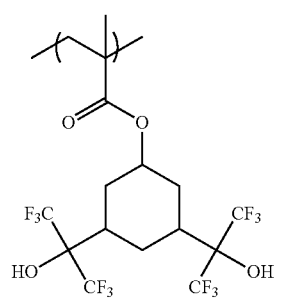
(B-40)
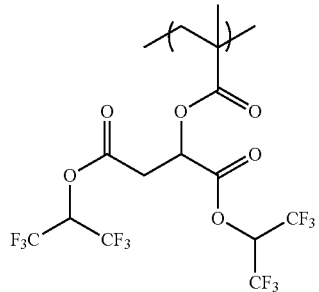
(B-41)
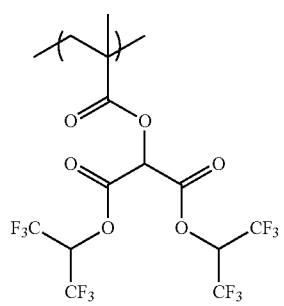
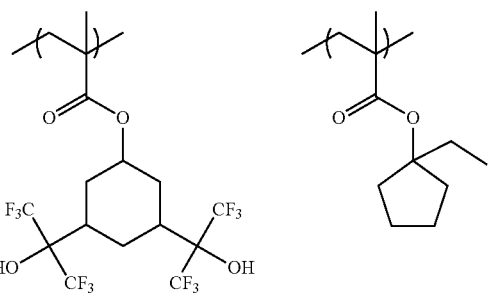
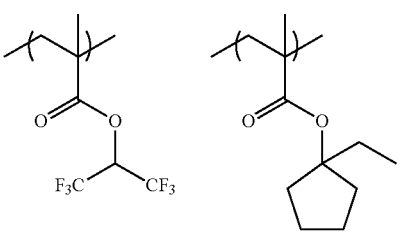
(B-42)
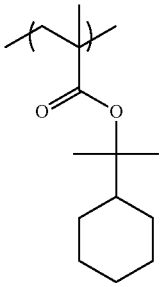 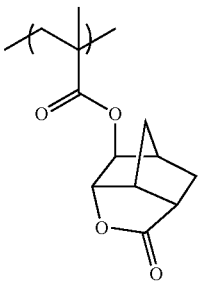
(B-43)
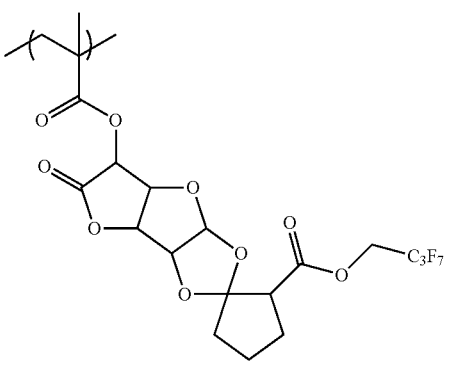
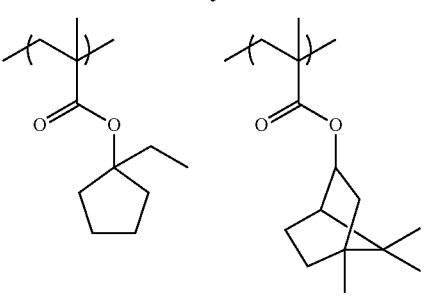

(B-44)
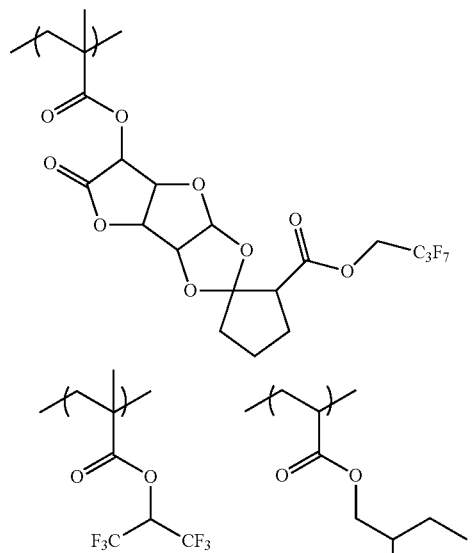
(B-45)
(B-46)
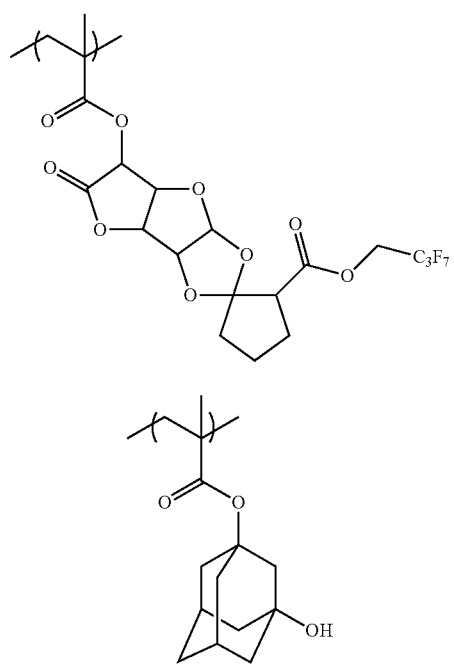
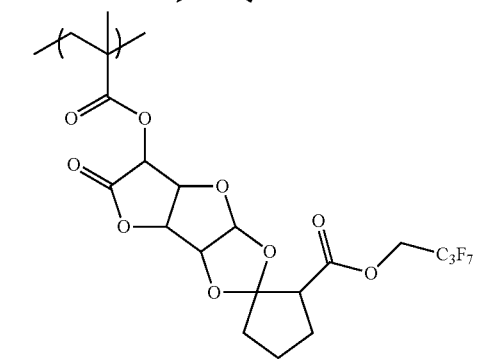
(B-47)
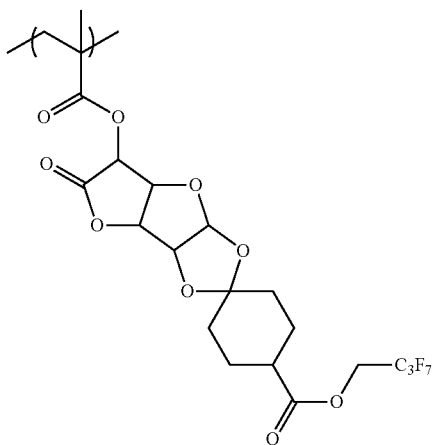
(B-48)
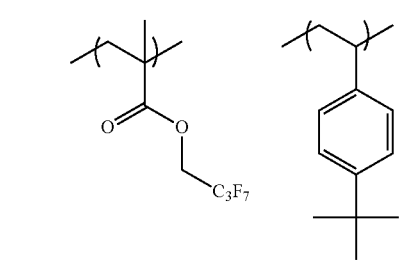

(B-49)
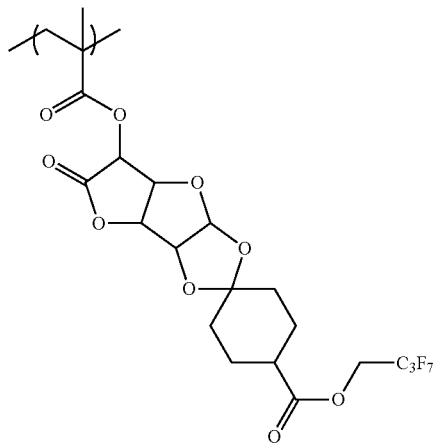
(B-50)
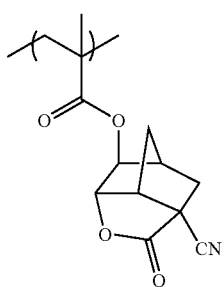
(B-51)
(B-52)
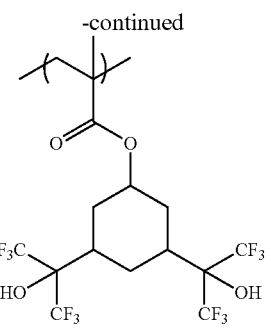
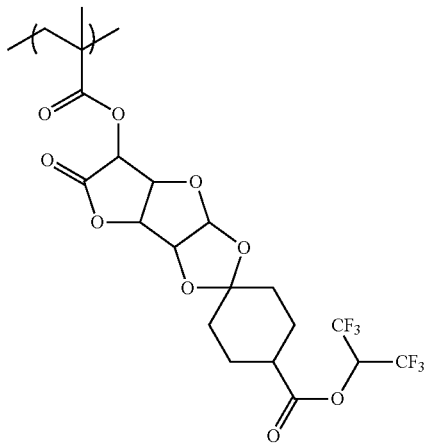
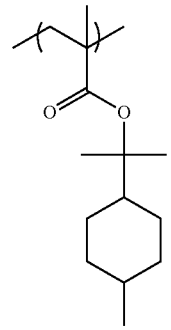
(B-53)
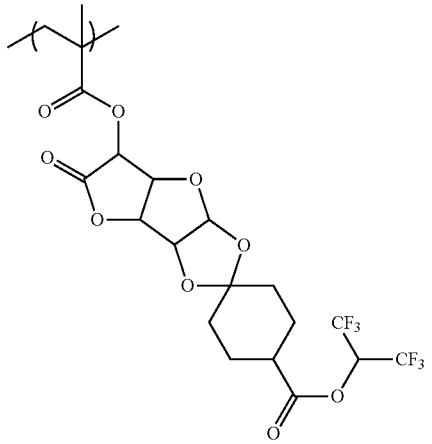

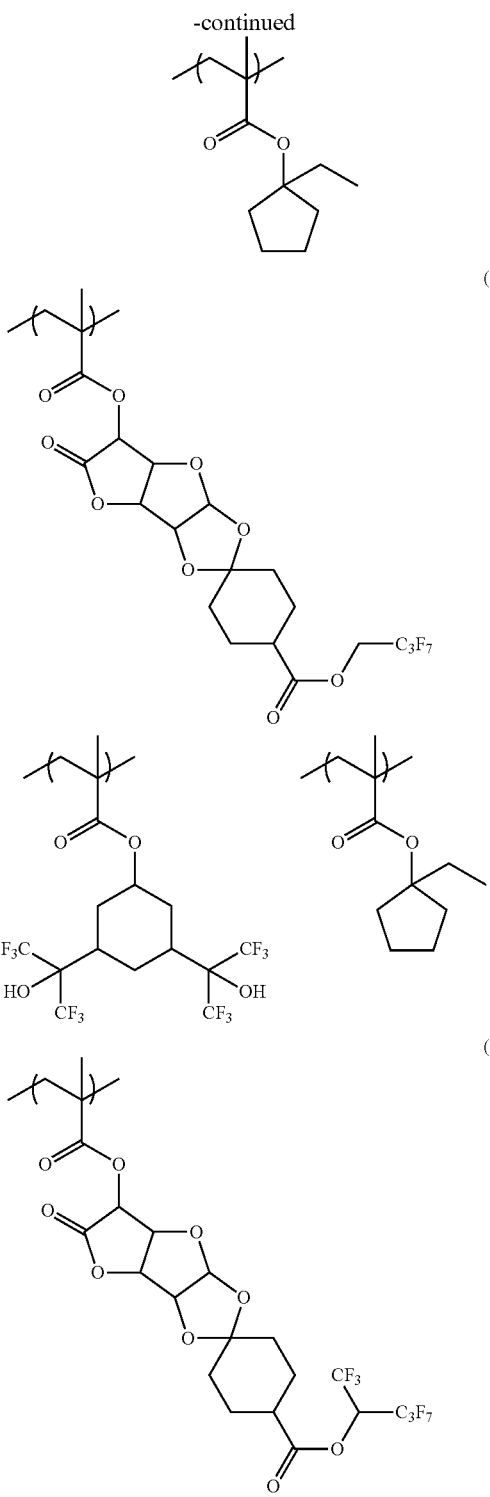

TABLE 1

| Polymer | Ratio (mol %) | Mw | Mw/Mn |
|---|---|---|---|
| B-1 | 50/50 | 6000 | 1.5 |
| B-2 | 30/70 | 6500 | 1.4 |
| B-3 | 45/55 | 8000 | 1.4 |
| B-4 | 100 | 15000 | 1.7 |
| B-5 | 60/40 | 6000 | 1.4 |

TABLE 1-continued

| Polymer | Ratio (mol %) | Mw | Mw/Mn |
|---|---|---|---|
| B-6 | 40/60 | 8000 | 1.4 |
| B-7 | 30/40/30 | 8000 | 1.4 |
| B-8 | 60/40 | 8000 | 1.3 |
| B-9 | 50/50 | 6000 | 1.4 |
| B-10 | 40/40/20 | 7000 | 1.4 |
| B-11 | 40/30/30 | 9000 | 1.6 |
| B-12 | 30/30/40 | 6000 | 1.4 |
| B-13 | 60/40 | 9500 | 1.4 |
| B-14 | 60/40 | 8000 | 1.4 |
| B-15 | 35/35/30 | 7000 | 1.4 |
| B-16 | 50/40/5/5 | 6800 | 1.3 |
| B-17 | 20/30/50 | 8000 | 1.4 |
| B-18 | 25/25/50 | 6000 | 1.4 |
| B-19 | 100 | 9500 | 1.5 |
| B-20 | 100 | 7000 | 1.5 |
| B-21 | 50/50 | 6000 | 1.6 |
| B-22 | 40/60 | 9600 | 1.3 |
| B-23 | 100 | 20000 | 1.7 |
| B-24 | 100 | 25000 | 1.4 |
| B-25 | 100 | 15000 | 1.7 |
| B-26 | 100 | 12000 | 1.8 |
| B-27 | 100 | 18000 | 1.3 |
| B-28 | 70/30 | 15000 | 2.0 |
| B-29 | 80/15/5 | 18000 | 1.8 |
| B-30 | 60/40 | 25000 | 1.8 |
| B-31 | 90/10 | 19000 | 1.6 |
| B-32 | 60/40 | 20000 | 1.8 |
| B-33 | 50/30/20 | 11000 | 1.6 |
| B-34 | 60/40 | 12000 | 1.8 |
| B-35 | 60/40 | 15000 | 1.6 |
| B-36 | 100 | 22000 | 1.8 |
| B-37 | 20/80 | 35000 | 1.6 |
| B-38 | 30/70 | 12000 | 1.7 |
| B-39 | 30/70 | 9000 | 1.5 |
| B-40 | 100 | 9000 | 1.5 |
| B-41 | 40/15/45 | 12000 | 1.9 |
| B-42 | 30/30/40 | 13000 | 2.0 |
| B-43 | 40/40/20 | 23000 | 2.1 |
| B-44 | 65/30/5 | 25000 | 1.6 |
| B-45 | 100 | 15000 | 1.7 |
| B-46 | 20/80 | 9000 | 1.7 |
| B-47 | 70/30 | 18000 | 1.5 |
| B-48 | 60/20/20 | 18000 | 1.8 |
| B-49 | 100 | 12000 | 1.4 |
| B-50 | 60/40 | 20000 | 1.6 |
| B-51 | 70/30 | 33000 | 2.0 |
| B-52 | 60/40 | 19000 | 1.8 |
| B-53 | 50/50 | 15000 | 1.5 |
| B-54 | 40/20/40 | 35000 | 1.9 |
| B-55 | 100 | 16000 | 1.4 |

Since the hydrophobic resin (B) containing at least either of a fluorine atom or a silicon atom is contained in the actinic ray-sensitive or radiation-sensitive resin composition of the present invention, the resin (B) is unevenly distributed to a surface layer of the film formed from the actinic ray-sensitive or radiation-sensitive resin composition and when the immersion medium is water, the receding contact angle of the film surface with water can be increased to thereby enhance followability of the immersion liquid.

The receding contact angle of the film of the actinic ray-sensitive or radiation-sensitive resin composition of the present invention that has been baked but is not yet exposed, as measured at the exposure temperature, generally room temperature of 23±3° C. and a humidity of 45±5%, is preferably from 60° to 90°, more preferably 65° or greater, still more preferably 70° or greater and most preferably 75° or greater.

The resin (B) is, as described above, unevenly distributed to the interface but unlike a surfactant, need not necessarily have a hydrophilic group in the molecule and may not contribute to uniform mixing of polar/nonpolar substances.

In the immersion exposure step, the immersion liquid needs to move on a wafer following the movement of an exposure head that is scanning the wafer at a high speed and forming an exposure pattern. Therefore, the contact angle of the immersion liquid with the resist film in a dynamic state is important, and the resist is required to have a performance of allowing liquid droplets to follow the high-speed scanning of an exposure head without leaving any liquid droplet.

As the resin (B) is hydrophobic, the problems of development residue (scum) and blob defect after alkali development are likely to become serious. However, improvement of performance in terms of the development residue (scum) and blob defect can be attained due to an increase in alkali dissolution rate by three or more polymer chains combined together through at least one branch point being contained, as compared with linear chain resins.

When the resin (B) contains a fluorine atom, the content of the fluorine atoms is preferably from 5 to 80 mass %, and more preferably from 10 to 80 mass %, based on the molecular weight of the resin (B). The proportion of the repeating unit containing a fluorine atom is preferably from 10 to 100 mass %, and more preferably 30 to 100 mass %, based on all repeating units in the resin (B).

When the resin (B) contains a silicon atom, the content of the silicon atoms is preferably from 2 to 50 mass %, and more preferably from 2 to 30 mass %, based on the molecular weight of the resin (B). The proportion of the repeating unit containing a silicon atom is preferably from 10 to 90 mass %, and more preferably 20 to 80 mass %, based on all the repeating units of the resin (B).

The weight average molecular weight of the resin (B) is preferably from 1000 to 100,000, more preferably from 2000 to 50,000 and still more preferably from 3000 to 30,000. Here, the weight average molecular weight of the resin indicates a molecular weight in terms of polystyrene measured by GPC (carrier: tetrahydrofuran (THF)).

The content of the resin (B) in the actinic ray-sensitive or radiation-sensitive resin composition may be adjusted prior to use so that the receding contact angle of the film formed of the actinic ray-sensitive or radiation-sensitive resin composition falls within the above-specified range. The content of the resin is preferably from 0.01 to 20 mass %, more preferably from 0.1 to 15 mass %, still more preferably from 0.1 to 10 mass % and most preferably from 0.5 to 8 mass %, based on the total solid content of the actinic ray-sensitive or radiation-sensitive resin composition.

The resins (B) may be used alone or in combination of two or more thereof.

<Solvent>

The composition in accordance with the present invention may further contain a solvent.

Examples of the solvent include organic solvents such as alkylene glycol monoalkyl ether carboxylates, alkylene glycol monoalkyl ethers, alkyl lactates, alkyl alkoxypropionates, cyclic lactones (preferably having 4 to 10 carbon atoms), monoketone compounds (preferably having 4 to 10 carbon atoms) which may contain a ring, alkylene carbonates, alkyl alkoxyacetates, and alkyl pyruvates.

Preferred examples of the alkylene glycol monoalkyl ether carboxylates include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ethers include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactates include methyl lactate, ethyl lactate, propyl lactate and butyl lactate.

Preferred examples of the alkyl alkoxypropionates include ethyl 3-ethoxypropionate, methyl 3-methoxypropionate, methyl 3-ethoxypropionate and ethyl 3-methoxypropionate.

Preferred examples of the cyclic lactones include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dim ethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent that may be preferably used includes a solvent having a boiling point of 130° C. or higher at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent containing no hydroxyl group may be used as the organic solvent.

The solvent containing a hydroxyl group and the solvent containing no hydroxyl group may be appropriately selected from the compounds illustrated above, but the solvent containing a hydroxyl group is preferably an alkylene glycol monoalkyl ether, an alkyl lactate or the like. Propylene glycol monomethyl ether and ethyl lactate are more preferred. The solvent containing no hydroxyl group is preferably an alkylene glycol monoalkyl ether acetate, an alkyl alkoxypropionate, a monoketone compound that may contain a ring, a cyclic lactone, an alkyl acetate or the like. Among these, propylene glycol monomethyl ether acetate, ethyl ethoxypropionate, 2-heptanone, γ-butyrolactone, cyclohexanone and butyl acetate are particularly preferred, and propylene glycol monomethyl ether acetate, ethyl ethoxypropionate and 2-heptanone are most preferred.

The mixing ratio (by mass) of the solvent containing a hydroxyl group to the solvent containing no hydroxyl group is from 1/99 to 99/1, preferably from 10/90 to 90/10, and more preferably from 20/80 to 60/40. A mixed solvent in which the solvent containing no hydroxyl group is contained in a ratio of 50 mass % or more is particularly preferred in view of coating uniformity.

The solvent is preferably a mixed solvent of two or more kinds of solvents containing propylene glycol monomethyl ether acetate.

<Basic Compound>

The composition in accordance with the present invention may further contain a basic compound so as to reduce the change in performance over time from exposure to heat. Preferred basic compounds include a compound having a structure represented by the following formulae (A) to (E):

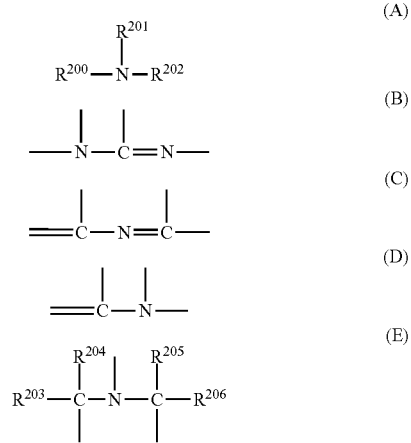

In formulae (A) and (E), $R^{200}$, $R^{201}$ and $R^{202}$, which may be the same or different, represent a hydrogen atom, an alkyl group (preferably having 1 to 20 carbon atoms), a cycloalkyl group (preferably having 3 to 20 carbon atoms) or an aryl group (having 6 to 20 carbon atoms), and $R^{201}$ and $R^{202}$ may combine together to form a ring. $R^{203}$, $R^{204}$, $R^{205}$ and $R^{206}$, which may be the same or different, represent an alkyl group having 1 to 20 carbon atoms.

As for the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl group in formulae (A) and (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2] octane, 1,5-diazabicyclo[4,3,0]non-5-ene and 1,8-diazabicyclo[5,4,0]undec-7-ene. Examples of the compound having an onium hydroxide structure include tetrabutylammonium hydroxide, a triarylsulfonium hydroxide, a phenacylsulfonium hydroxide, and a sulfonium hydroxide having a 2-oxoalkyl group, specifically, triphenylsulfonium hydroxide, tris(tert-butylphenyl)sulfonium hydroxide, bis(tert-butylphenypiodonium hydroxide, phenacylthiophenium hydroxide and 2-oxopropylthiophenium hydroxide. The compound having an onium carboxylate structure is a compound where the anion moiety of the compound having an onium hydroxide structure becomes a carboxylate, and examples thereof include an acetate, an adamantane-1-carboxylate and a perfluoroalkyl carboxylate. Examples of the compound having a trialkylamine structure include tri(n-butyl)amine and tri(n-octyl)amine. Examples of the aniline compound include 2,6-diisopropylaniline, N,N-dimethyl aniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris (methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

Each of the above phenoxy group-containing amine compound, phenoxy group-containing ammonium salt compound, sulfonic acid ester group-containing amine compound and sulfonic acid ester group-containing ammonium salt compound preferably has at least one alkyl group bonded to the nitrogen atom thereof. Further preferably, the alkyl group contains an oxygen atom in its chain, thereby forming an oxyalkylene group. The number of oxyalkylene groups in each molecule is one or more, preferably 3 to 9 and more preferably 4 to 6. Oxyalkylene groups having the structure of —$CH_2CH_2O$—, —$CH(CH_3)CH_2O$— or —$CH_2CH_2CH_2O$— are preferred.

Specific examples of the above phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in Paragraph [0066] of U.S. Patent Application Publication No. 2007/0224539.

These basic compounds may be used alone or in combination of two or more thereof.

When the composition in accordance with the present invention contains a basic compound, the content thereof is usually from 0.001 to 10 mass %, and preferably from 0.01 to 5 mass %, based on the total solid content of the composition of the present invention.

The content ratio of the acid generator and the basic compound in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern over time after exposure until heat treatment. The acid generator/basic compound (by mol) is more preferably from 3.5 to 200, and still more preferably from 3.5 to 150.

<Low Molecular Weight Compound Having a Group Capable of Leaving by the Action of an Acid to Increase Basicity>

The composition in accordance with the present invention preferably contains a low molecular weight compound having a group capable of leaving by the action of an acid to increase basicity (hereinafter, also referred to as a "low molecular weight compound").

The group capable of leaving by the action of an acid is not particularly limited but is preferably an acetal group, a carbonate group, a carbamate group, a tertiary ester group, a tertiary hydroxyl group or a hemiaminal ether group, and more preferably a carbamate group or a hemiaminal ether group.

The molecular weight of the low molecular weight compound having a group capable of leaving by the action of an acid is preferably from 100 to 1,000, more preferably from 100 to 700, and still more preferably from 100 to 500.

The low molecular weight compound is preferably an amine derivative having, on the nitrogen atom, a group capable of leaving by the action of an acid.

The low molecular weight compound may have a protective group-containing carbamate group on the nitrogen atom. The protective group constituting the carbamate group is represented, for example, by the following formula (d-1):

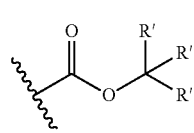

In formula (d-1), each R' independently represents a hydrogen atom, a linear or branched alkyl group, a cycloalkyl group, an aryl group, an aralkyl group or an alkoxyalkyl group. R's may combine with every other to form a ring.

R' is preferably a linear or branched alkyl group, a cycloalkyl group or an aryl group, more preferably a linear or branched alkyl group or a cycloalkyl group.

The low molecular weight compound may be also composed by arbitrarily combining the above-described basic compound and the structure represented by formula (d-1).

The low molecular weight compound is more preferably a compound having a structure represented by the following formula (A).

Incidentally, the low molecular weight compound may be a compound corresponding to the above-described basic compound as long as it is a low molecular weight compound having a group capable of leaving by the action of an acid.

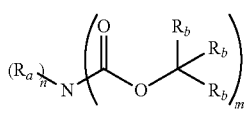

In formula (A), each Ra independently represents a hydrogen atom, an alkyl group, a cycloalkyl group, an aryl group or an aralkyl group. Also, when n=2, two Ra's may be the same or different, and two Ra's may combine with each other to form a heterocyclic hydrocarbon group (preferably having 20 or less carbon atoms) or a derivative thereof.

Each Rb independently represents a hydrogen atom, an alkyl group, a cycloalkyl group, an aryl group, an aralkyl group or an alkoxyalkyl group. However, in —C(Rb)(Rb)(Rb), when one or more Rb's are a hydrogen atom, at least one of the remaining Rb's is a cyclopropyl group, a 1-alkoxyalkyl group or an aryl group.

At least two Rb's may combine to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In formula (A), each of the alkyl group, cycloalkyl group, aryl group and aralkyl group of Ra and Rb may be substituted with a functional group such as a hydroxyl group, a cyano group, an amino group, a pyrrolidino group, a piperidino group, a morpholino group or an oxo group, an alkoxy group or a halogen atom.

The same shall apply to the alkoxyalkyl group of Rb.

Examples of the alkyl group, cycloalkyl group, aryl group and aralkyl group (each of these alkyl group, cycloalkyl group, aryl group and aralkyl group may be substituted with the above-described functional group, an alkoxy group or a halogen atom) of Ra and/or Rb include:

- a group derived from a linear or branched alkane such as methane, ethane, propane, butane, pentane, hexane, heptane, octane, nonane, decane, undecane or dodecane, or a group where the group derived from an alkane is substituted with one or more kinds of or one or more groups of cycloalkyl groups such as a cyclobutyl group, a cyclopentyl group and cyclohexyl group;
- a group derived from a cycloalkane such as cyclobutane, cyclopentane, cyclohexane, cycloheptane, cyclooctane, norbornane, adamantane or noradamantane, or a group where the group derived from a cycloalkane is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group and a tert-butyl group;
- a group derived from an aromatic compound such as benzene, naphthalene or anthracene, or a group where the group derived from an aromatic compound is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group and a tert-butyl group;
- a group derived from a heterocyclic compound such as pyrrolidine, piperidine, morpholine, tetrahydrofuran, tetrahydropyran, indole, indoline, quinoline, perhydroquinoline, indazole or benzimidazole, or a group where the group derived from a heterocyclic compound is substituted with one or more kinds of or one or more groups of linear or branched alkyl groups or aromatic compound-derived groups; a group where the group derived from a linear or branched alkane or the group derived from a cycloalkane is substituted with one or more kinds of or one or more groups of aromatic compound-derived groups such as a phenyl group, a naphthyl group and anthracenyl group; and a group where the substituent above is substituted with a functional group such as a hydroxyl group, a cyano group, an amino group, a pyrrolidino group, a piperidino group, a morpholino group or an oxo group.

Examples of the divalent heterocyclic hydrocarbon group (preferably having 1 to 20 carbon atoms) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1, 2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline or 1,5,9-triazacyclododecane, and a group where the group derived from a heterocyclic compound is substituted with one or more kinds of or one or more groups of a linear or branched alkane-derived group, a cycloalkane-derived group, an aromatic compound-derived group, a heterocyclic compound-derived group, and a functional group such as a hydroxyl group, a cyano group, an amino group, a pyrrolidino group, a piperidino group, a morpholino group or oxo group.

Specific examples of the low molecular weight compound particularly preferred in the present invention are illustrated below, but the present invention is not limited thereto.

(D-1)
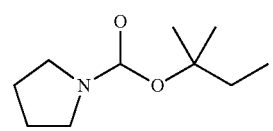

(D-2)
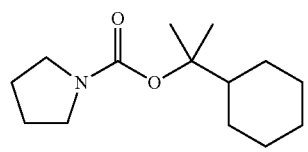

(D-3)
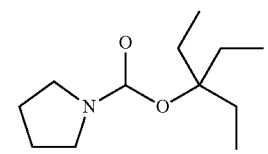

(D-4)
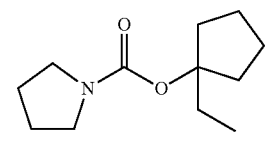

(D-5)
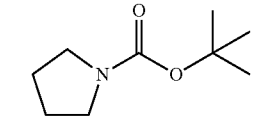

(D-6)
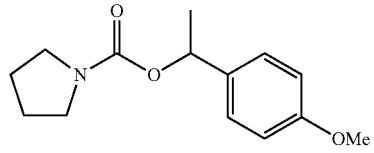

(D-7)
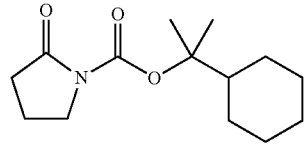

(D-8)
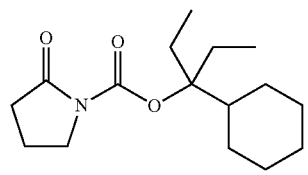

-continued (D-9)
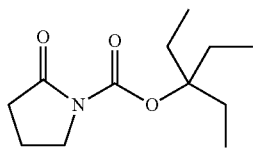

(D-10)
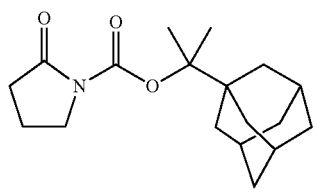

(D-11)
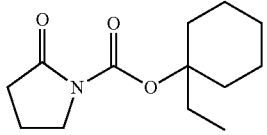

(D-12)
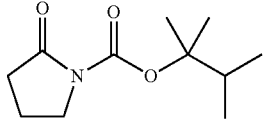

(D-13)
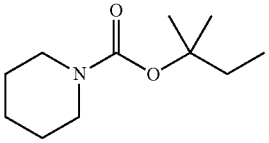

(D-14)
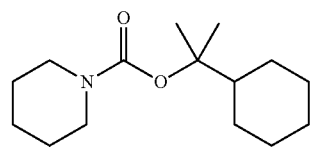

(D-15)
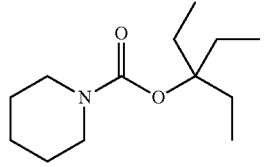

(D-16)
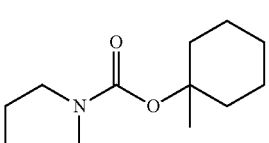

(D-17)
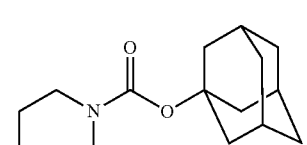

(D-18)
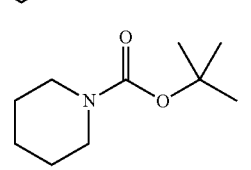

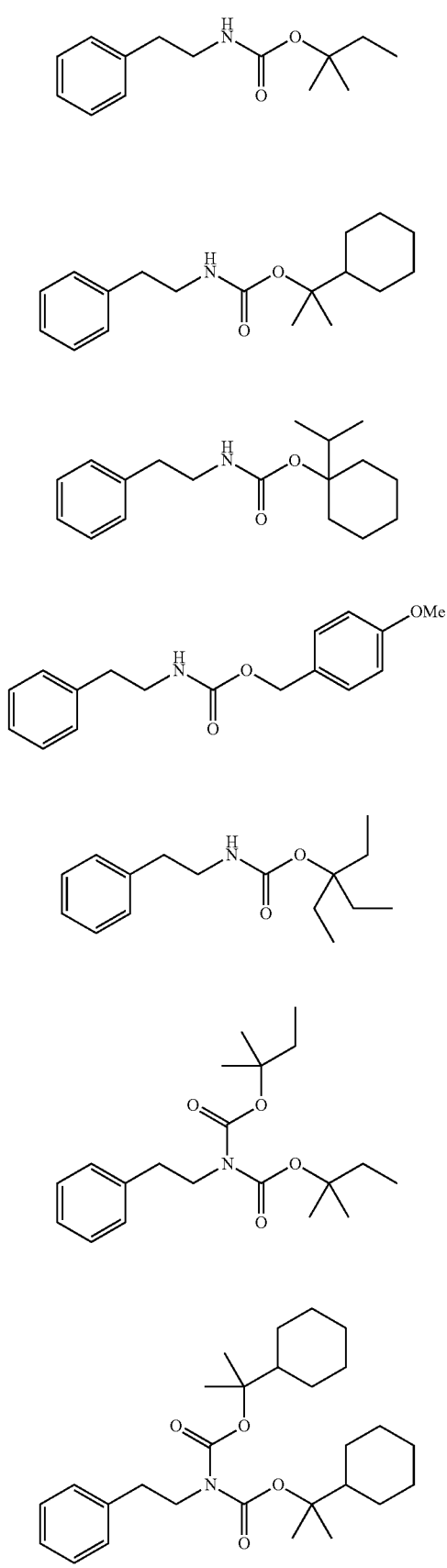
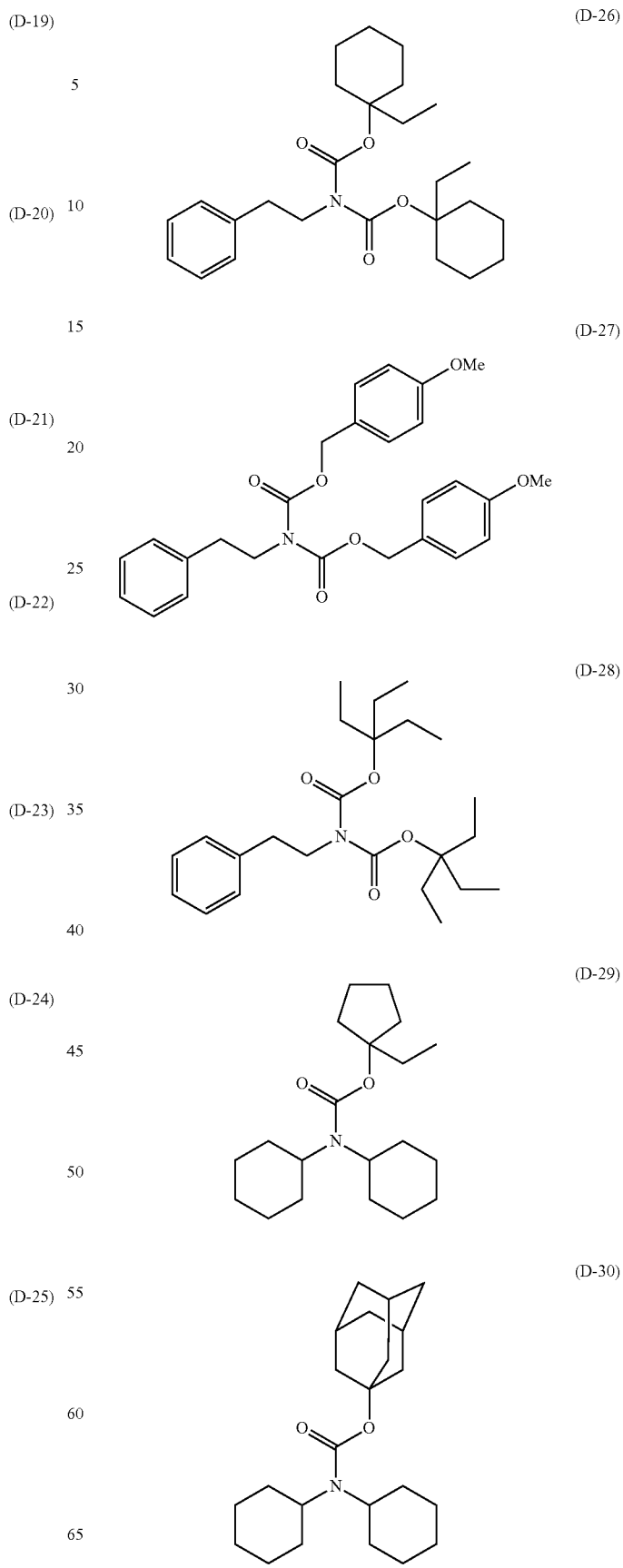

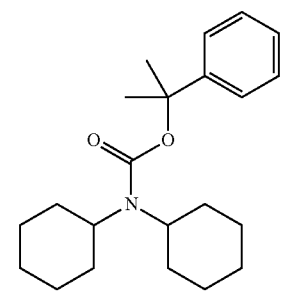
(D-31)
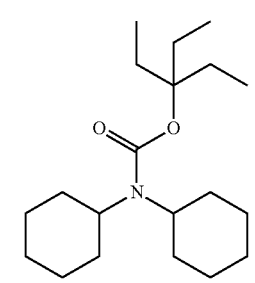
(D-32)
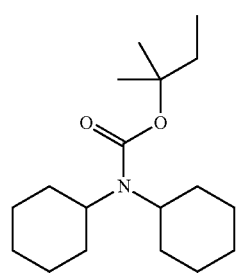
(D-33)
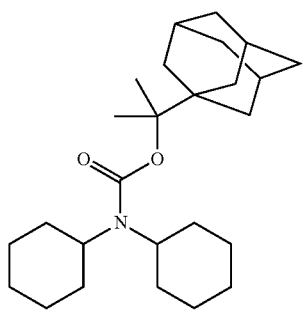
(D-34)
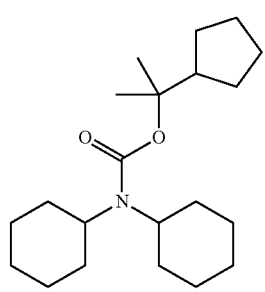
(D-35)
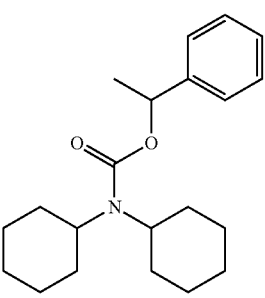
(D-36)
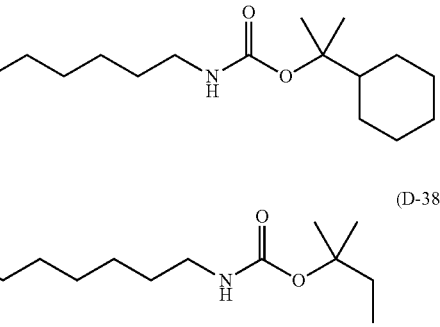
(D-37)
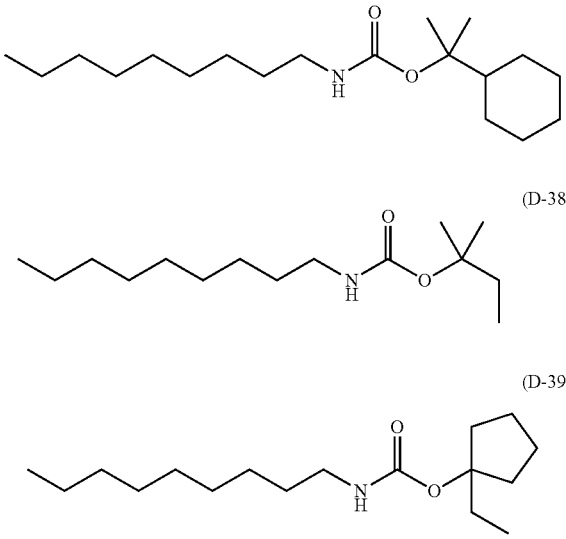
(D-38)
(D-39)
(D-40)
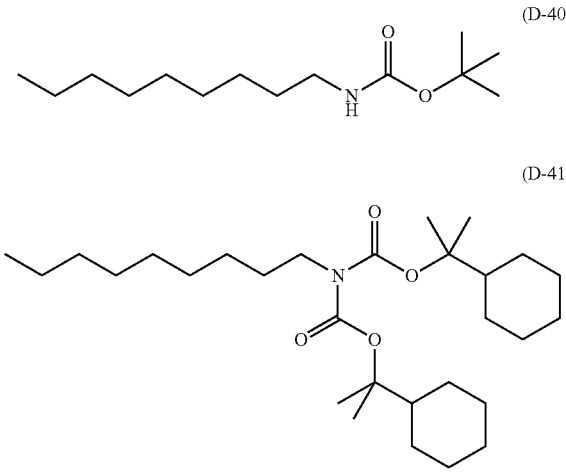
(D-41)
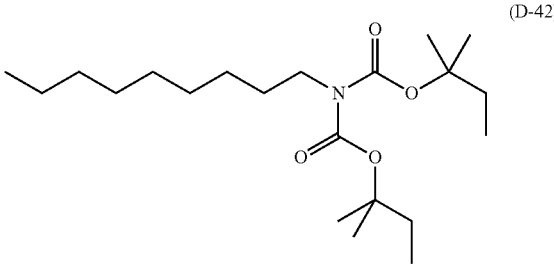
(D-42)

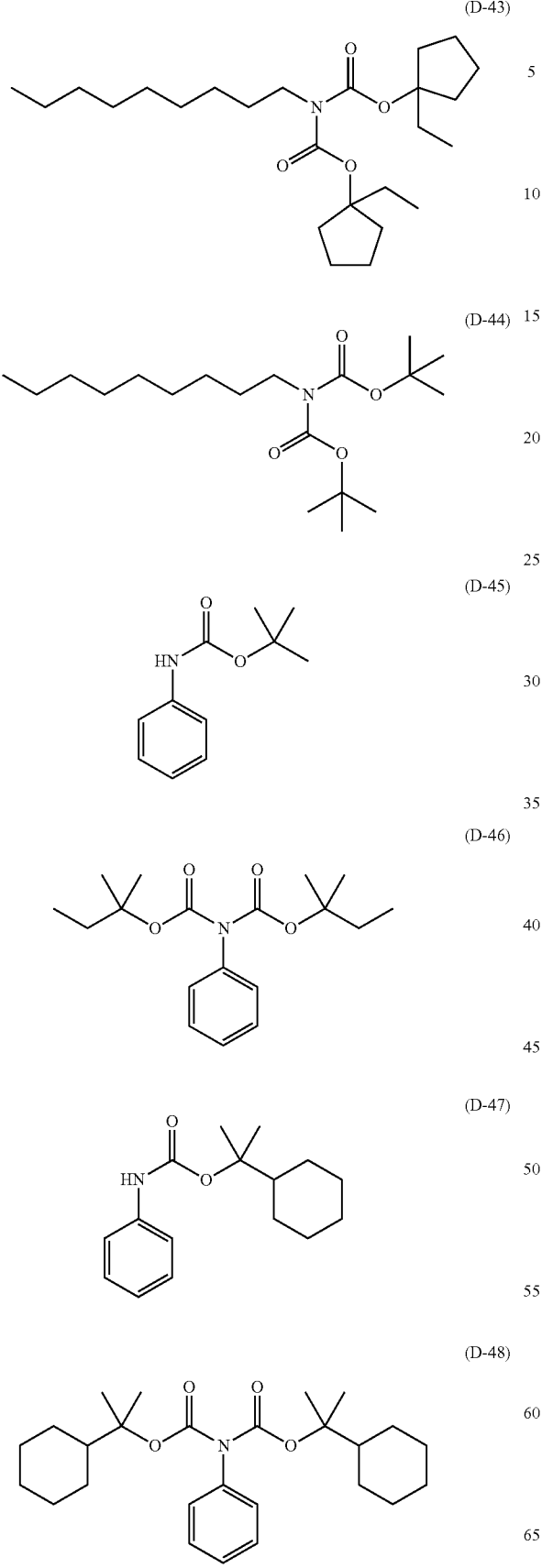
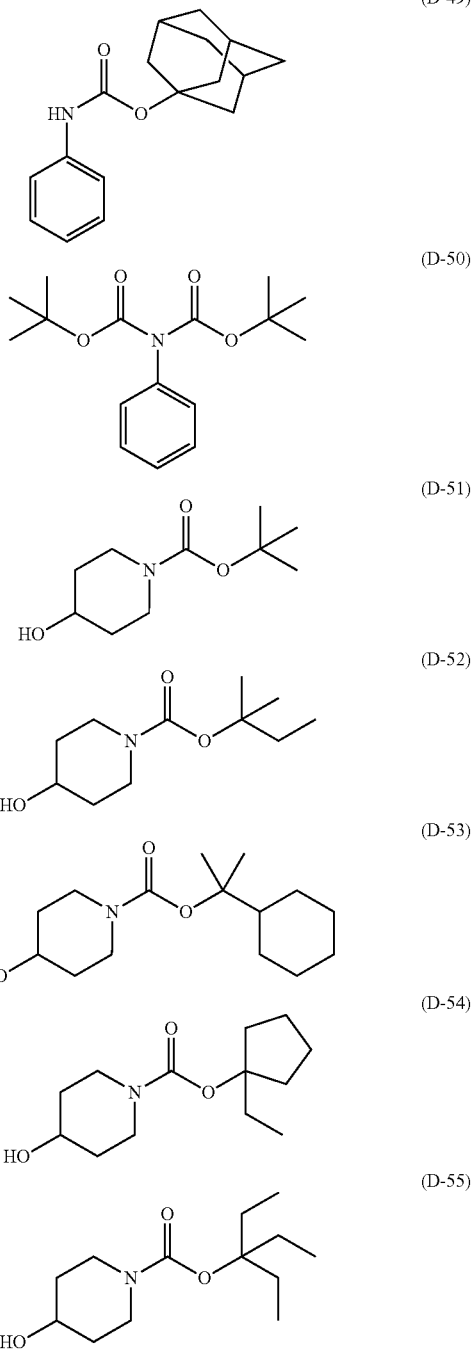

The compound represented by formula (A) may be synthesized according to the method disclosed, for example, in JP2009-199021A.

In the present invention, as for the low molecular weight compound, one kind of a compound may be used alone, or two or more kinds of compounds may be mixed and used. In the present invention, the content of the low molecular weight compound is usually from 0.001 to 20 mass %, preferably from 0.001 to 10 mass %, more preferably from 0.01 to 5 mass %, based on the total solid content of the composition combined with the basic compound.

The ratio between the acid generator and the low molecular weight compound used in the composition is preferably acid generator/[low molecular weight compound+basic compound] (by mol)=from 2.5 to 300. That is, the molar ratio is preferably 2.5 or more in view of sensitivity and resolution and preferably 300 or less from the standpoint of suppressing the reduction in resolution due to thickening of the resist pattern over time after exposure until heat treatment. The acid generator/[low molecular weight compound+basic compound] (by mol) is more preferably from 3.5 to 200, still more preferably from 3.5 to 150.

<Surfactant>

The composition of the present invention may or may not further contain a surfactant, but in the case of containing a surfactant, it is preferred to contain any one of fluorine-containing and/or silicon-containing surfactants (a fluorine-containing surfactant, a silicon-containing surfactant and a surfactant containing both a fluorine atom and a silicon atom), or two or more thereof.

By containing the above-described surfactant, the composition of the present invention can give a resist pattern enhanced in the sensitivity, resolution and adhesion and reduced in terms of development defects when using an exposure light source with a wavelength of 250 nm or less, particularly a wavelength of 220 nm or less.

Examples of the fluorine-containing and/or silicon-containing surfactants include surfactants described in Paragraph [0276] of U.S. Patent Application Publication No. 2008/0248425, such as EFtop EF301 and EF303 (manufactured by Shin-Akita Kasei K.K.); Florad FC430, 431 and 4430 (manufactured by Sumitomo 3M Inc.); Megaface F171, F173, F176, F189, F113, F110, F177, F120 and R08 (manufactured by Dainippon Ink & Chemicals, Inc.); Surflon S-382, SC101, 102, 103, 104, 105 and 106 (manufactured by Asahi Glass Co., Ltd.); Troysol S-366 (manufactured by Troy Chemical); GF-300 and GF-150 (manufactured by Toagosei Chemical Industry Co., Ltd.); Surflon S-393 (manufactured by Seimi Chemical Co., Ltd.); EFtop EF121, EF122A, EF122B, RF122C, EF125M, EF135M, EF351, EF352, EF801, EF802 and EF601 (manufactured by JEMCO Inc.); PF636, PF656, PF6320 and PF6520 (manufactured by OMNOVA); and FTX-204G, 208G, 218G; 230G, 204D, 208D, 212D, 218D and 222D (manufactured by NEOS Co., Ltd.). In addition, Polysiloxane Polymer KP-341 (manufactured by Shin-Etsu Chemical Co., Ltd.) may be also used as the silicon-containing surfactant.

Other than those known surfactants, a surfactant using a polymer having a fluoroaliphatic group derived from a fluoroaliphatic compound which is produced by a telomerization process (also called a telomer process) or an oligomerization process (also called an oligomer process) may be used. The fluoroaliphatic compound may be synthesized according to the method described in JP2002-90991A.

The polymer having a fluoroaliphatic group is preferably a copolymer of a fluoroaliphatic group-containing monomer with a (poly(oxyalkylene)) acrylate and/or a (poly(oxyalkylene)) methacrylate, and the copolymer may have an irregular distribution or may be a block copolymer. Examples of the poly(oxyalkylene) group include a poly(oxyethylene) group, a poly(oxypropylene) group and a poly(oxybutylene) group. This group may be also a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoroaliphatic group-containing monomer and a (poly(oxyalkylene)) acrylate (or methacrylate) is not limited only to a binary copolymer but may be also a ternary or higher copolymer obtained by simultaneously copolymerizing two or more different fluoroaliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (manufactured by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, surfactants described in Paragraph [0280] of US Patent Application Publication No. 2008/0248425, other than the fluorine-containing and/or silicon-containing surfactant, may be also used.

One of these surfactants may be used alone, or some of them may be used in combination.

In the case where the composition in accordance with the present invention contains a surfactant, the content of the surfactant is preferably from 0.1 to 2 mass %, more preferably from 0.1 to 1.5 mass %, and particularly preferably from 0.1 to 1 mass %, based on the total solid content of the composition.

<Onium Carboxylate>

The composition of the present invention may contain an onium carboxylate. Examples of onium carboxylate include iodonium carboxylate and sulfonium carboxylate. The anion moiety is preferably a linear or branched, monocyclic or polycyclic alkylcarboxylate anion having 1 to 30 carbon atoms, and more preferably the carboxylate anion in which the alkyl group is partially or entirely fluorine-substituted. The alkyl chain may contain an oxygen atom. Due to such a configuration, the transparency to light at 220 nm or less is ensured, the sensitivity and resolution are enhanced, and the iso/dense bias and exposure margin are improved.

Examples of the fluorine-substituted carboxylate anion include fluoroacetate, difluoroacetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

The content of the onium carboxylate in the composition is generally from 0.1 to 20 mass %, preferably from 0.5 to 10 mass %, and more preferably from 1 to 7 mass %, based on the total solid content of the composition.

<Dissolution-Inhibiting Compound>

The composition of the present invention may contain a dissolution-inhibiting compound having a molecular weight of 3,000 or less and capable of decomposing by the action of an acid to increase the solubility in an alkaline developer. The dissolution-inhibiting compound is preferably an alicycilc or aliphatic compound having an acid-decomposable group, such as the cholic acid derivatives containing an acid-decomposable group which are described in Proceeding of SPIE, 2724,355 (1996), so as not to reduce transmission at wavelengths of 220 nm and shorter. Examples of the acid-decomposable group and alicyclic structure are the same as those described above for the resin (A).

When the composition of the present invention is exposed by a KrF excimer laser or irradiated with an electron beam, the dissolution-inhibiting compound preferably contains a structure in which a phenolic hydroxyl group of a phenol compound has been substituted by an acid-decomposable group. The phenol compound preferably contains 1 to 9 phenol skeletons, and more preferably 2 to 6 phenol skeletons.

The content of the dissolution-inhibiting compound added is preferably from 3 to 50 mass %, and more preferably from 5 to 40 mass %, based on the total solid content of the actinic ray-sensitive or radiation-sensitive resin composition.

Hereinafter, specific examples of the dissolution-inhibiting compound are shown, but the present invention is not limited thereto.

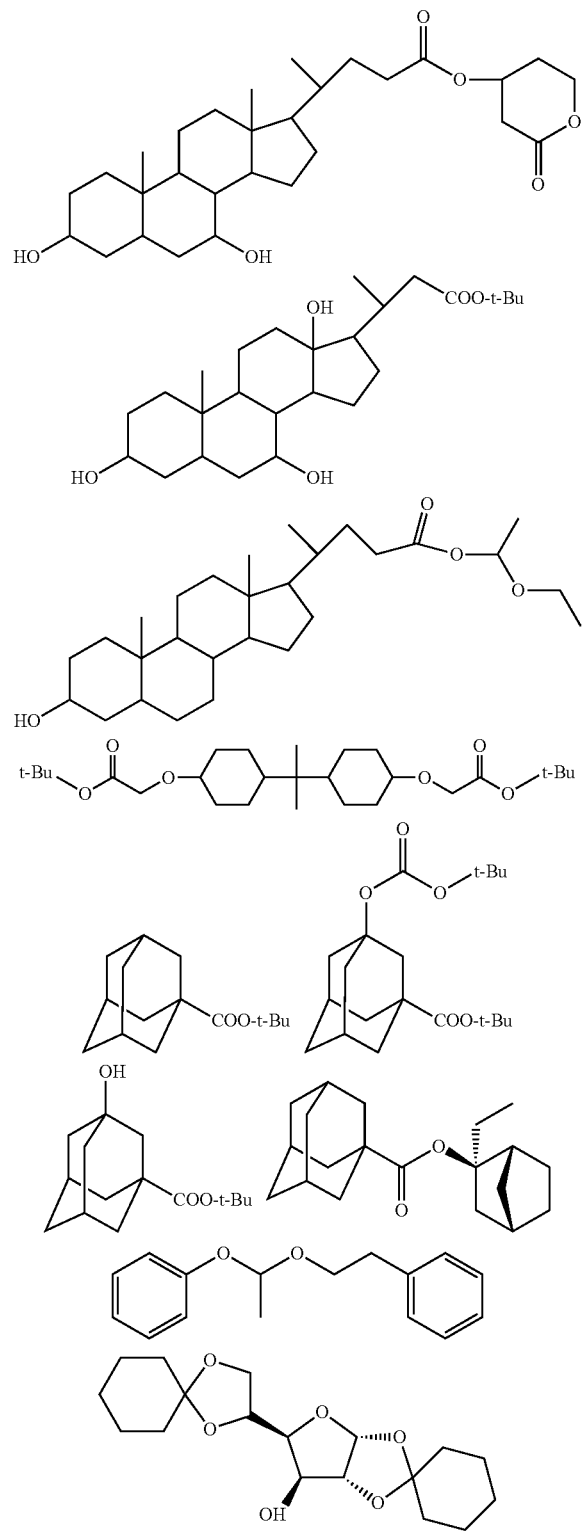

<Other Additives>

The composition of the present invention may further contain a dye, a plasticizer, a photosensitizer, a light absorber, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less may be easily synthesized by one skilled in the art by referring to the method described, for example, in JP1992-122938A (JP-H4-122938A), JP1990-28531A (JP-H2-28531A), U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid or lithocholic acid, an adamantanecarboxylic acid derivative, an adamantanedicarboxylic acid, a cyclohexanecarboxylic acid and a cyclohexanedicarboxylic acid.

<Pattern Forming Method>

The composition of the present invention is preferably used in a film thickness of 30 to 250 nm, more preferably from 30 to 200 nm, from the standpoint of enhancing the resolution. Such a film thickness may be obtained by setting the solid content concentration in the actinic ray-sensitive or radiation-sensitive resin composition to an appropriate range, thereby imparting an appropriate viscosity and enhancing the coatability and film-forming property.

The total solid content concentration in the composition of the present invention is generally from 1 to 10 mass %, preferably from 1 to 8.0 mass %, and more preferably from 1.0 to 7.0 mass %.

The composition of the present invention is used by dissolving the components above in a predetermined organic solvent, preferably in the above-described mixed solvent, filtering the solution, and coating it on a predetermined support as follows. The filter used for filtration is preferably a polytetrafluoroethylene-, polyethylene- or nylon-made filter having a pore size of 0.1 μm or less, more preferably 0.05 μm or less, and still more preferably 0.03 μm or less.

For example, the actinic ray-sensitive or radiation-sensitive resin composition is coated on a substrate (for example, silicon/silicon dioxide-coated substrate) as used in the production of a precision integrated circuit device, by an appropriate coating method such as spinner or coater and dried to form a film.

The film is irradiated with actinic rays or radiation through a predetermined mask, then preferably baked (heated), and subjected to development and rinsing, whereby a good pattern can be obtained.

Examples of the actinic rays or radiation include infrared light, visible light, ultraviolet light, far ultraviolet light, extreme-ultraviolet light, X-rays and an electron beam, but the radiation is preferably far ultraviolet light at a wavelength of 250 nm or less, more preferably 220 nm or less, still more preferably from 1 to 200 nm. Specific examples thereof include a KrF excimer laser (248 nm), an ArF excimer laser (193 nm), an $F_2$ excimer laser (157 nm), X-rays, EUV (13 nm), and an electron beam, with an ArF excimer laser, an $F_2$ excimer laser, EUV and an electron beam being preferred.

Before forming the film, an antireflection film may be previously provided by coating on the substrate.

The antireflection film used may be either an inorganic film type such as titanium, titanium dioxide, titanium nitride, chromium oxide, carbon or amorphous silicon, or an organic film type composed of a light absorber and a polymer material. As for the organic antireflection film, a commercially available organic antireflection film such as DUV30 Series and DUV-40 Series manufactured by Brewer Science, Inc. and AR-2, AR-3 and AR-5 manufactured by Shipley Co., Ltd. may also be used.

In the development step, an alkaline developer used is usually a quaternary ammonium salt typified by tetramethylammonium hydroxide, but other than this compound, an aqueous alkali solution of an inorganic alkali, a primary to tertiary amine, an alkanolamine, a cyclic amine or the like may also be used.

Furthermore, the alkaline developer may be used after adding alcohols and a surfactant thereto each in an appropriate amount.

The alkali concentration of the alkaline developer is usually from 0.1 to 20 mass %.

The pH of the alkaline developer is usually from 10.0 to 15.0.

Furthermore, the alkaline aqueous solution may be used after adding alcohols and a surfactant thereto each in an appropriate amount. As for the rinsing solution, pure water is used, and an appropriate amount of a surfactant may be added to the pure water before use.

After the development or rinsing, a treatment of removing the developer or rinsing solution adhering on the pattern by a supercritical fluid may be carried out.

For the film formed using the composition in accordance with the present invention, the exposure may also be carried out by immersion exposure, that is, by filling a liquid having a refractive index higher than that of air between the film and the lens at the irradiation with actinic rays or radiation. By this exposure, the resolution can be further enhanced.

The immersion liquid used in the immersion exposure will be described below.

The immersion liquid is preferably a liquid being transparent to light at the exposure wavelength and having as small a temperature coefficient of refractive index as possible in order to minimize the distortion of an optical image projected on the resist film. Particularly, when the exposure light source is an ArF excimer laser (wavelength: 193 nm), water is preferably used in view of convenient availability and easy handleability in addition to the above-described aspects.

Furthermore, a medium having a refractive index of 1.5 or more may also be used from the standpoint that a shorter wavelength can be achieved. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element may be added in a small proportion.

The additive is preferably an aliphatic alcohol having a refractive index nearly equal to that of water, and specific examples thereof include methyl alcohol, ethyl alcohol and isopropyl alcohol. By adding an alcohol having a refractive index nearly equal to that of water, even when the alcohol component in water is evaporated and its content concentration is changed, the change in the refractive index of the entire liquid can be made very small. On the other hand, if a substance opaque to light at 193 nm or an impurity greatly differing in the refractive index from water is intermixed, this incurs distortion of the optical image projected on the resist film. Therefore, the water used is preferably distilled water. Pure water obtained by further filtering the distilled water through an ion exchange filter or the like may be also used.

The electrical resistance of water used as the immersion liquid is preferably 18.3 MΩcm or more, and TOC (total organic carbon) is preferably 20 ppb or less. Also, the water is preferably subjected to a deaeration treatment.

The lithography performance can be enhanced by raising the refractive index of the immersion liquid. From such a standpoint, an additive for raising the refractive index may be added to water, or heavy water ($D_2O$) may be used in place of water.

In the development step, an alkaline developer used is usually an aqueous solution of a quaternary ammonium salt typified by tetramethylammonium hydroxide, but other alkali aqueous solutions of an inorganic alkali, a primary to tertiary amine, an alkanolamine, a cyclic amine or the like may also be used. The alkaline developer may be used after adding thereto an appropriate amount of alcohols and/or a surfactant.

The alkali concentration of the alkaline developer is usually from 0.1 to 20 mass %.

The pH of the alkaline developer is usually from 10.0 to 15.0.

As for the rinsing solution, pure water is used, and an appropriate amount of a surfactant may be added to the pure water before use. After the development or rinsing, a treatment of removing the developer or rinsing solution adhering on the pattern by a supercritical fluid may be carried out.

Examples

Hereinafter, embodiments of the present invention will be described in more detail with reference to the following Examples, but the present invention is not limited thereto.

[Resin (A)]

<Monomer Synthesis Example 1: Synthesis of Monomer 1>

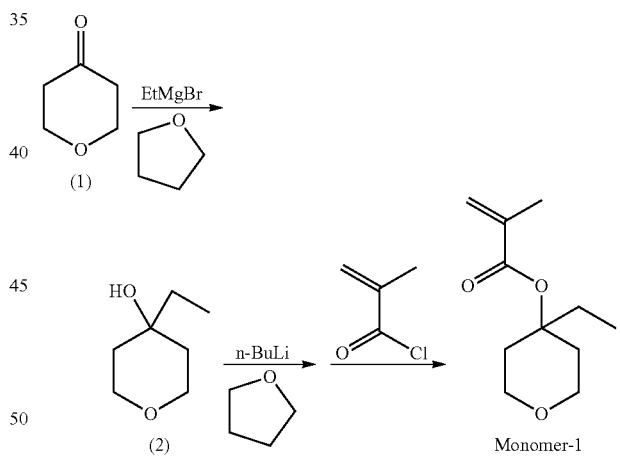

Under ice cooling, 170.0 g of tetrahydrofuran (THF) was added with stirring to 100.0 ml of ethyl magnesium bromide (39 mass % ethyl ether solution, approximately 3 mol/L, manufactured by TCI), to which a solution of 25.0 g of the compound (1) in 70.0 g of THF was then added dropwise. The reaction solution was returned to room temperature and further stirred for 3 hours. Under ice cooling, 200.0 ml of a saturated ammonium chloride aqueous solution was added dropwise to the reaction solution which was then extracted with ethyl acetate. The organic layer was combined and dried over magnesium sulfate, and the solvent was removed by evaporation to obtain 28.0 g (yield: 86%) of a compound (2).

20.0 g of the compound (2) was dissolved in 200.0 ml of THF, and while stirring under ice cooling, 61.2 ml of n-butyl lithium (n-hexane solution, 2.76 mol/l, manufactured by Kanto Chemical Co., Inc.) was added dropwise thereto, followed by further stirring for 30 minutes. Then, 19.3 g of methacrylic acid chloride was added dropwise thereto. The reaction solution was returned to room temperature and further stirred for 3 hours. Under ice cooling, 200.0 ml of a saturated sodium hydrogen carbonate aqueous solution was added dropwise to the reaction solution which was then extracted with ethyl acetate. The organic layer was combined and dried over magnesium sulfate, and the solvent was removed by evaporation, followed by further purification by column chromatography to obtain 25.3 g (yield: 83%) of monomer 1.

<Monomer Synthesis Example 2: Synthesis of Monomer 2>

(3)

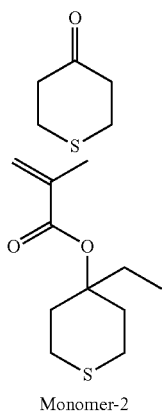

Monomer-2

Monomer 2 was synthesized in the same manner as in monomer 1, except that the compound (3) was used in place of the compound (1).

<Monomer Synthesis Example 3: Synthesis of Monomer 3>

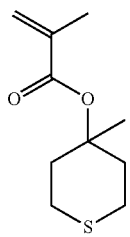

Monomer-3

Monomer 3 was synthesized in the same manner as in monomer 2, except that methyl magnesium bromide was used in place of ethyl magnesium bromide.

<Monomer Synthesis Example 4: Synthesis of Monomer 4>

(4)

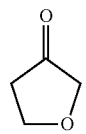

-continued

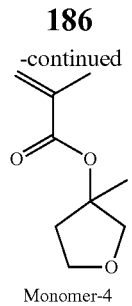

Monomer-4

Monomer 4 was synthesized in the same manner as in monomer 3, except that the compound (4) (synthesized according to Journal of Organic Chemistry, 1989, Volume 54, Issue 6 p. 1249-1256) was used in place of the compound (3).

<Monomer Synthesis Example 5: Synthesis of Monomer 5>

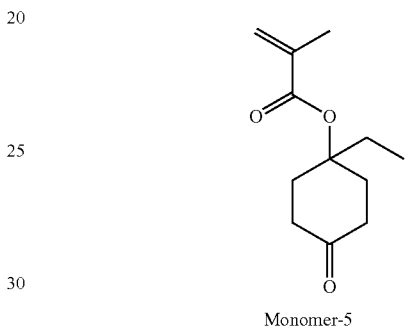

Monomer-5

Under a nitrogen stream, 300 ml of ethyl magnesium bromide (1 mol/L THF solution, 0.3 mol) was charged in a three-necked flask, followed by water cooling, and a solution of 23.5 g of 1,4-cyclohexanedione monoethylene ketal in 120 ml of THF was added dropwise thereto such that the reaction temperature became to the range of 20° C. to 30° C. After dropwise addition was completed, the mixture was stirred at 25° C. for 2 hours. After the reaction was completed, distilled water, an ammonium chloride saturated aqueous solution, and ethyl acetate was added, followed by liquid separation purification. Then, the organic layer was washed with a sodium hydrogen carbonate aqueous solution and distilled water and then solvent was removed by evaporation under reduced pressure to obtain 11.5 g of an oily compound.

The resulting oily compound was charged in a three-necked flask and 80 ml of THF was added thereto under a nitrogen stream. The solution was cooled to −50° C. and 30.5 ml (2.64 mol/L) of n-butyl lithium was added thereto. After being warmed to 0° C. and stirred for 1 hour, 7.8 ml of methacrylic acid chloride was added thereto. After being stirred at 25° C. for 3 hours, distilled water and ethyl acetate were added, followed by liquid separation. The organic layer was washed with a sodium hydrogen carbonate aqueous solution and distilled water, and the solvent was removed by evaporation under reduced pressure to obtain 18.0 g of an oily compound.

The resulting oily compound was dissolved in 150 ml of THF to which 80 ml of 1N hydrochloric acid was then added, followed by stirring at 60° C. for 3 hours. After being left to stand to cool, ethyl acetate was added, followed by liquid separation. The organic layer was washed with a sodium hydrogen carbonate aqueous solution and 20 mg of 4-hydroxy TEMPO (2,2,6,6-tetramethyl piperidine 1-oxyl) was added thereto. The solvent was removed by evaporation under reduced pressure, followed by distillation under reduced pressure to obtain 6 g of monomer 5.

$^1$H-NMR (400 MHz in $(CD_3)_2CO$): δ (ppm)=0.92 (t, 3H), 1.79 (dt, 2H), 1.98 (t, 3H), 2.04 (q, 2H), 2.22-2.4 (br, 2H), 2.45 (dt, 2H), 2.62-2.8 (br, 2H), 5.59 (d, 1H), 6.10 (d, 1H)

<Resin Synthesis Example 1: Synthesis of Resin (A-1)>

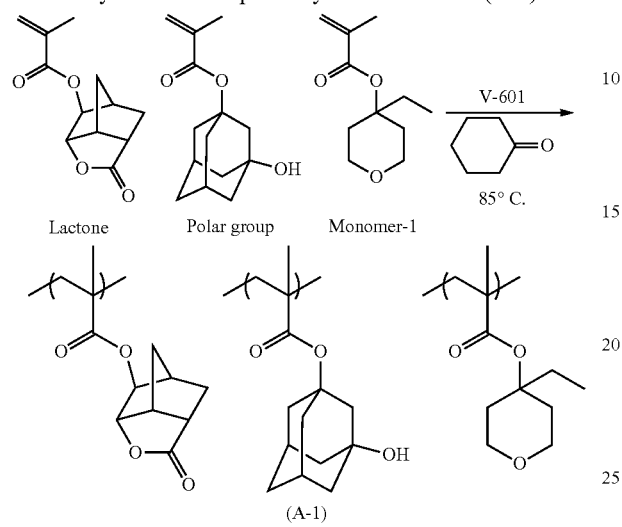

Under a nitrogen stream, 11.1 g of cyclohexanone was charged in a three-necked flask which was then heated to 85° C. 4.4 g of the foregoing lactone, 1.2 g of the foregoing polar group, 5.0 g of monomer 1, and a 6.5 mol % solution of a polymerization initiator V-601 (manufactured by Wako Pure Chemical Industries, Ltd.) based on the sum of three monomers in 20.6 g of cyclohexanone were added dropwise thereto over 6 hours. After the completion of dropwise addition, the reaction was further allowed to proceed at 85° C. for 2 hours. The reaction liquid was left standing to cool and was then added dropwise to a mixture of heptane (259.3 g)/ethyl acetate (111.1 g). The precipitated powder was collected by filtration and dried to obtain 8.5 g of resin (A-1). The thus-obtained resin had a weight average molecular weight of 8500 in terms of standard polystyrene and dispersity (Mw/Mn) of 1.5.

Similarly, other resins (A-2) to (A-28) illustrated below were synthesized.

Structures of the acid-decomposable resin (A) used in Examples are illustrated below. In addition, the molar ratio of repeating units (corresponding to repeating units starting from the left in structural formulae), logP value, weight average molecular weight (Mw), and dispersity (Mw/Mn) of each resin are shown in Table 2 below.

(A-1)

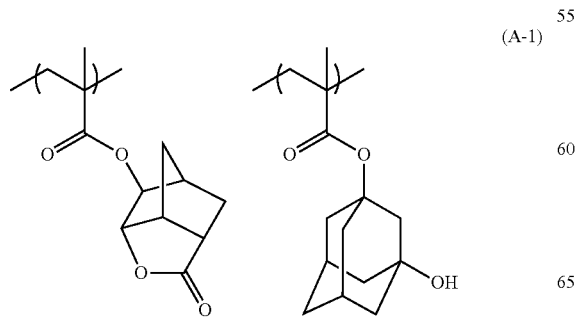

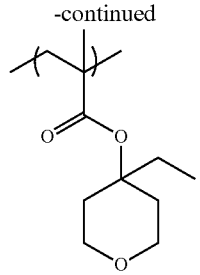

(A-2)

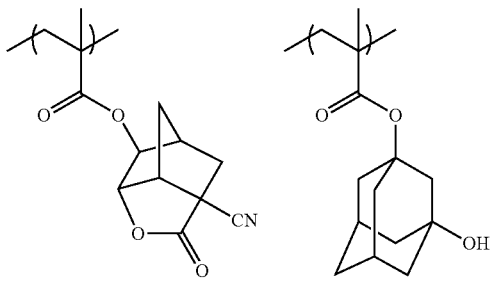

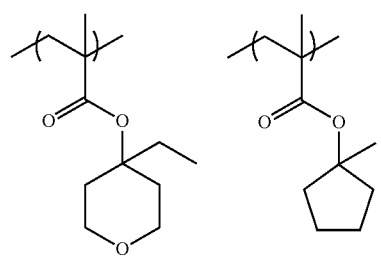

(A-3)

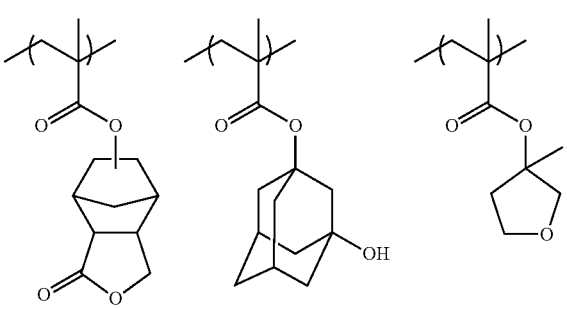

(A-4)

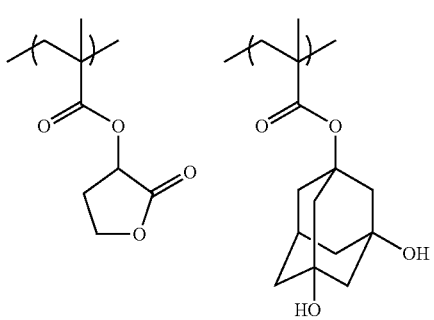

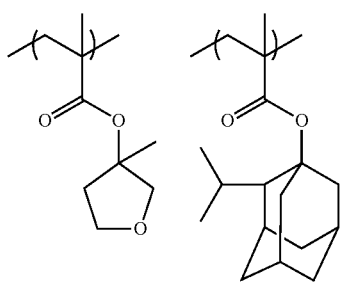
(A-5)
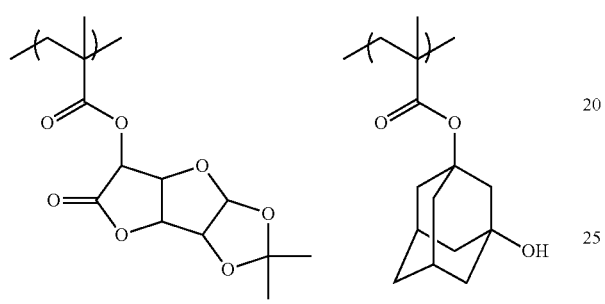
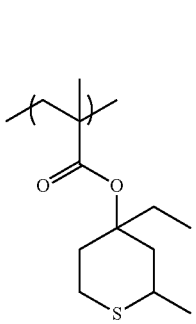
(A-6)
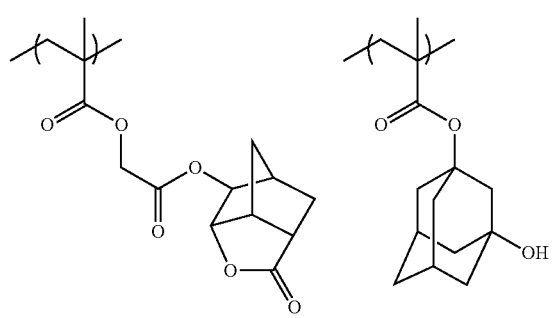
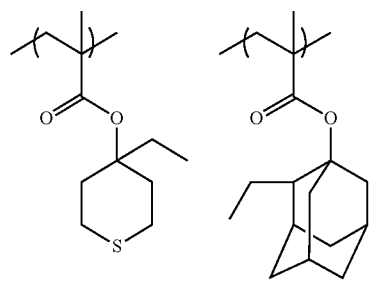
(A-7)
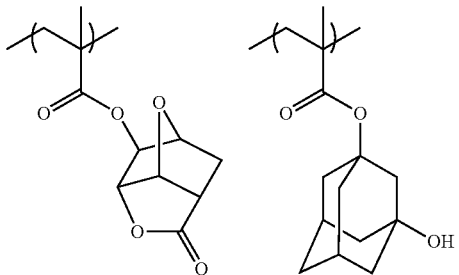
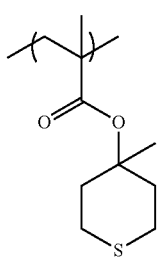
(A-8)
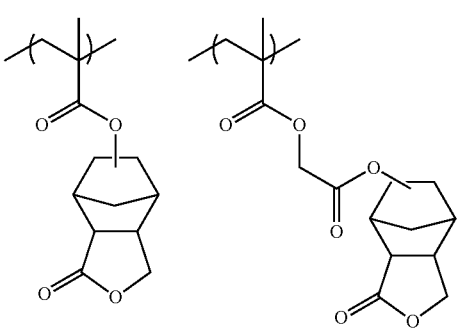
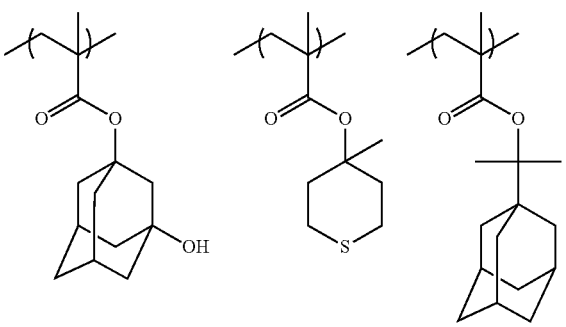
(A-9)
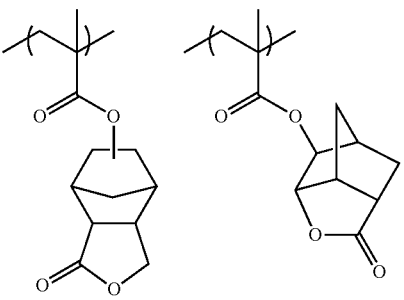

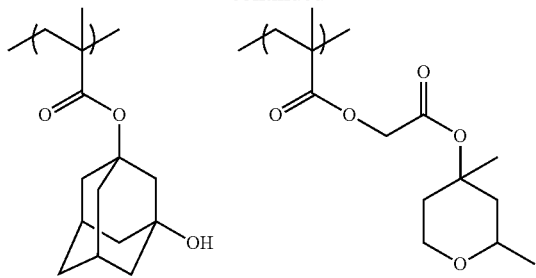
(A-10)
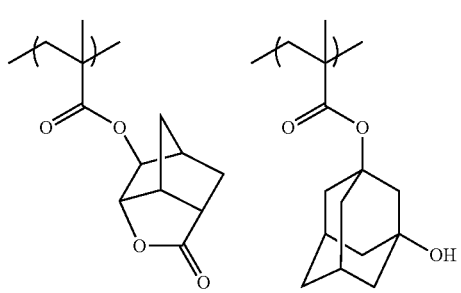
(A-11)
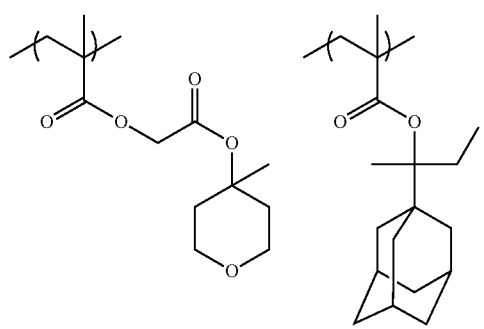
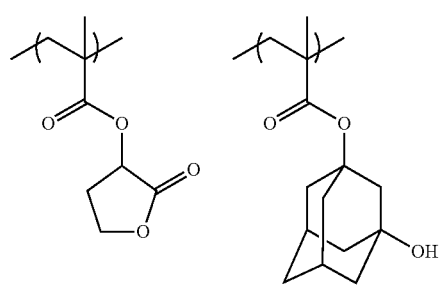
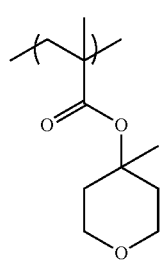
(A-12)
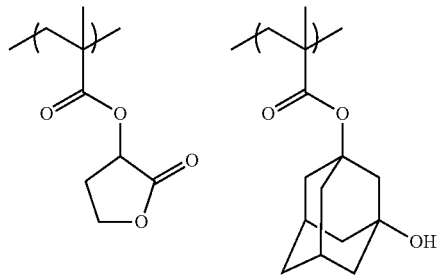
(A-13)
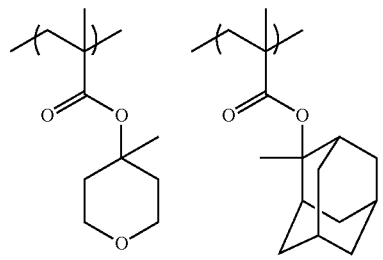
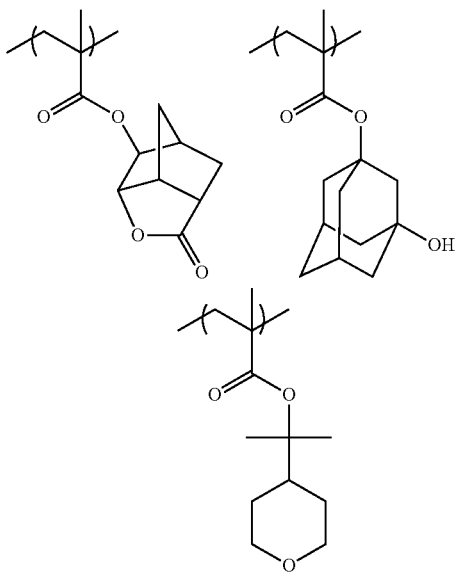
(A-14)
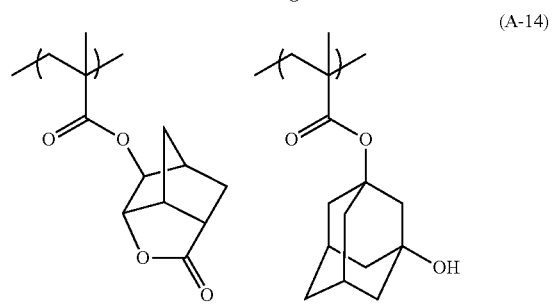
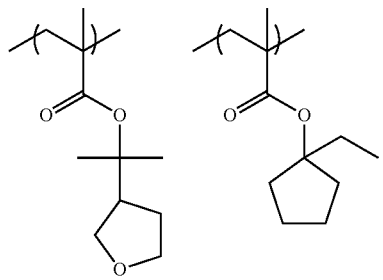

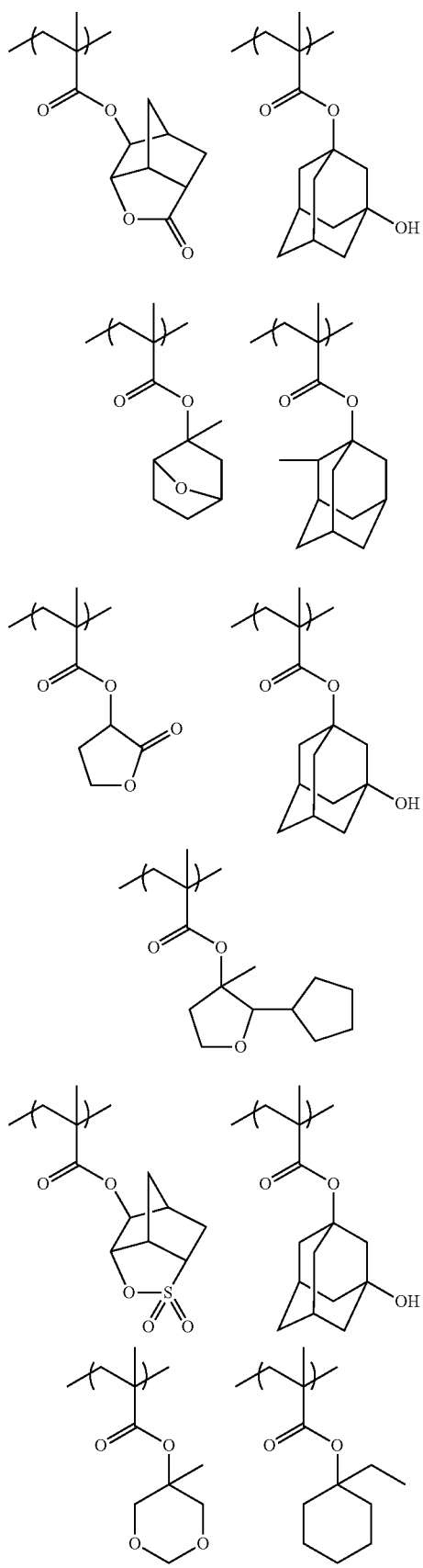
(A-15)
(A-16)
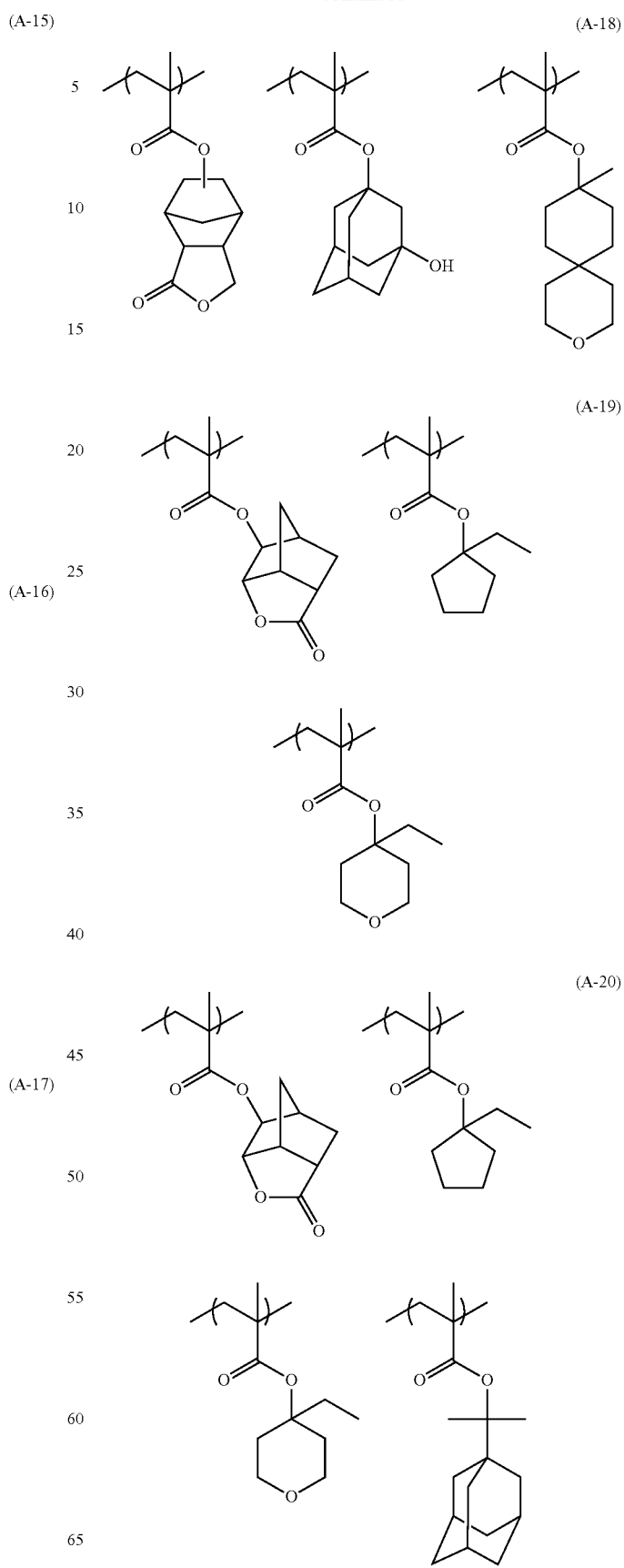
(A-18)
(A-19)
(A-20)

(A-21)
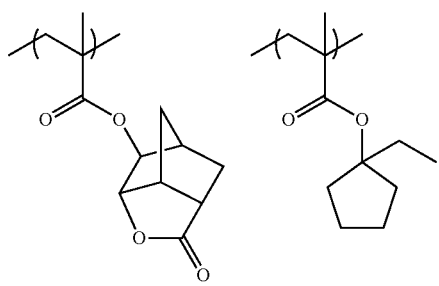
(A-22)
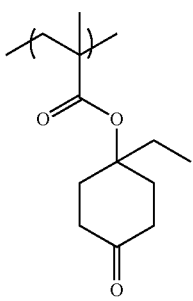
(A-23)
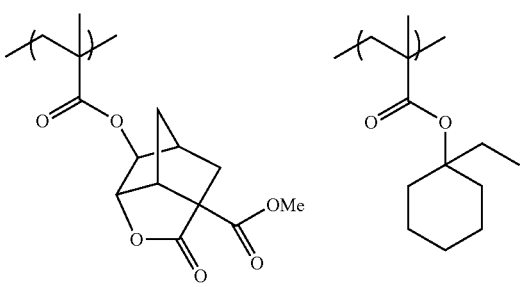
(A-24)
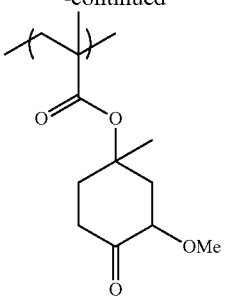
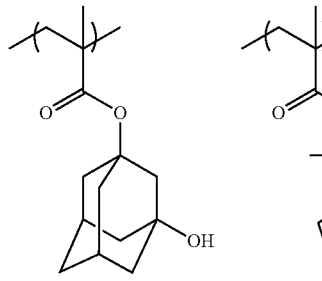
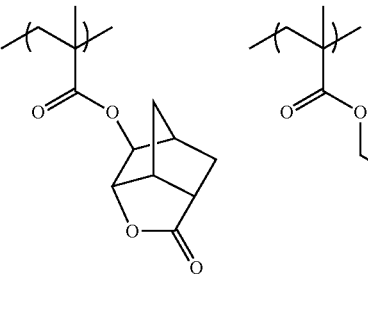
(A-25)
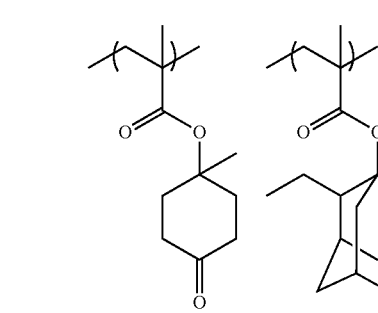

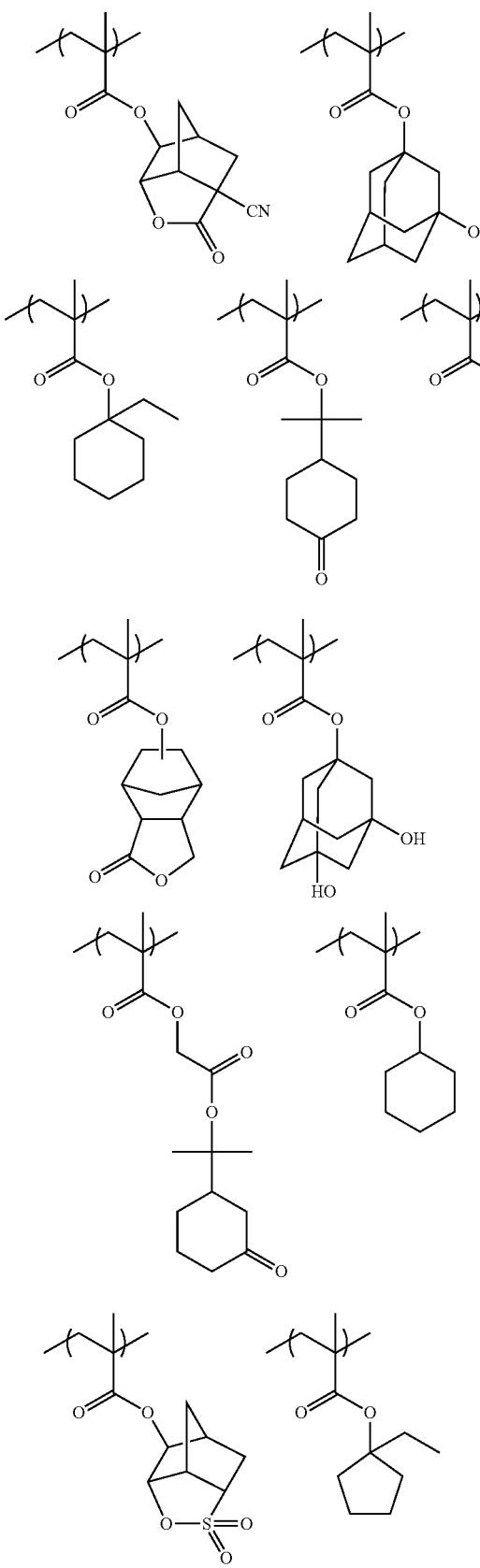

(A-26)
(A-27)
(A-28)

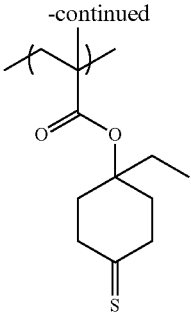

TABLE 2

| Resin (A) | Composition (molar ratio) | | | | | Repeating unit (a) logP value* | Mw | Mw/Mn |
|---|---|---|---|---|---|---|---|---|
| A-1 | 40 | 10 | 50 | | | 1.09 | 8500 | 1.5 |
| A-2 | 40 | 10 | 40 | 10 | | 1.09 | 9400 | 1.6 |
| A-3 | 30 | 15 | 55 | | | 0.45 | 9300 | 1.4 |
| A-4 | 50 | 5 | 35 | 10 | | 0.45 | 9700 | 1.4 |
| A-5 | 40 | 10 | 50 | | | 2.14 | 7800 | 1.5 |
| A-6 | 40 | 10 | 30 | 20 | | 1.82 | 7600 | 1.8 |
| A-7 | 50 | 10 | 40 | | | 1.45 | 8500 | 1.7 |
| A-8 | 25 | 25 | 15 | 25 | 10 | 1.45 | 12000 | 1.3 |
| A-9 | 40 | 10 | 15 | 35 | | 1.05 | 8900 | 1.4 |
| A-10 | 50 | 10 | 30 | 10 | | 0.73 | 9600 | 1.6 |
| A-11 | 40 | 10 | 50 | | | 0.73 | 9800 | 1.7 |
| A-12 | 40 | 30 | 20 | 10 | | 0.73 | 6500 | 1.8 |
| A-13 | 50 | 10 | 40 | | | 1.47 | 7300 | 1.6 |
| A-14 | 40 | 10 | 40 | 10 | | 1.13 | 8900 | 1.6 |
| A-15 | 40 | 5 | 40 | 15 | | 0.72 | 9300 | 1.5 |
| A-16 | 40 | 15 | 45 | | | 1.99 | 6900 | 1.7 |
| A-17 | 30 | 20 | 25 | 25 | | 0.29 | 7500 | 1.6 |
| A-18 | 50 | 10 | 40 | | | 2.28 | 10500 | 1.7 |
| A-19 | 50 | 35 | 15 | | | 1.09 | 7800 | 1.5 |
| A-20 | 40 | 30 | 20 | 10 | | 1.09 | 8800 | 1.6 |
| A-21 | 50 | 40 | 10 | | | 1.7 | 8200 | 1.4 |
| A-22 | 40 | 20 | 40 | | | 1.33 | 7500 | 1.5 |
| A-23 | 45 | 40 | 15 | | | 0.24 | 9600 | 1.7 |
| A-24 | 35 | 10 | 10 | 45 | | 0.8 | 7200 | 1.5 |
| A-25 | 25 | 25 | 25 | 25 | | 1.33 | 6800 | 1.3 |
| A-26 | 40 | 5 | 40 | 10 | 5 | 1.88 | 8800 | 1.7 |
| A-27 | 40 | 10 | 40 | 10 | | 1.88 | 13200 | 1.9 |
| A-28 | 55 | 30 | 15 | | | 1.88 | 9100 | 1.6 |

*"CLogP value" calculated by using software package 2 described hereinbefore

[Exposure condition: ArF Immersion Exposure]

<Preparation of Actinic Ray-Sensitive or Radiation-Sensitive Resin Composition>

Components given in Table 3 below were dissolved in a solvent to prepare a solution having a solid content concentration of 4 mass % for each Example. Each solution was filtered through a polyethylene filter having a pore size of 0.1 μm to prepare an actinic ray-sensitive or radiation-sensitive resin composition (positive photosensitive resin composition). The prepared positive photosensitive resin composition was evaluated according to the following method. The results are given in Table 3.

<Image Performance Test>

ARC29SR (manufactured by Nissan Chemical Industries, Ltd.) for forming an organic antireflection film, was coated on a silicon wafer (12 inches in diameter) and baked at 205° C. for 60 seconds to form a 98 nm-thick antireflection film, and the positive photosensitive resin composition prepared was coated thereon and baked at 120° C. for 60 seconds to form a photosensitive film having a thickness of 100 nm. The obtained wafer was exposed through a 6% halftone mask having a 1:1 line-and-space pattern with a line width of 75 nm by using an ArF excimer laser immersion scanner (manufactured by ASML, XT1700i, NA 1.20, C-Quad, outer sigma 0.981, inner sigma 0.895, XY deflection). As for the immersion liquid, ultrapure water was used. Thereafter, the wafer was heated at 120° C. for 60 seconds, developed with an aqueous tetramethylammonium hydroxide solution (2.38 mass %) for 30 seconds, rinsed with pure water and spin-dried to obtain a resist pattern.

<Line Edge Roughness>

Line edge roughness (nm) was measured as follows. A line-and-space (1:1) pattern was observed by using a length-measuring scanning electron microscope (SEM) and with respect to the longitudinal edge in the range of 5 μm of the line pattern, the distance from the reference line where the edge should be present was measured at 50 points by using a length-measuring SEM (S-8840, manufactured by Hitachi, Ltd.). From the values obtained, the standard deviation was determined and the 3σ was calculated. A smaller value indicates higher performance.

<Pattern Collapse>

The exposure dose for reproducing a 75 nm line-and-space mask pattern was taken as an optimum exposure dose, and the line width (nm) at which a pattern was resolved without collapse when the line width of a line pattern formed with a further increase of an exposure dose from the optimum exposure dose was narrowed was measured. A smaller value indicates that a finer pattern is resolved without collapse and pattern collapse is less liable to occur.

TABLE 3-1

| Example No. | Resin (A) (2 g) | Hydrophobic resin (B) (mg) | Acid generator (C) (mg) | Basic compound (mg) | Surfactant (mg) | Organic solvent (mass ratio) | LER (nm) | Pattern collapse (nm) |
|---|---|---|---|---|---|---|---|---|
| 1 | A-1 | B-2 (40) | C-2 (600) | D-52 (10) | W-4 (2) | S1-1/S2-1 (8/2) | 4.7 | 47 |
| 2 | A-2 | B-3 (40) | C-1 (500) | DIA (6) | W-1 (3) | S1-1/S2-1 (6/4) | 4.5 | 45 |
| 3 | A-3 | B-14 (70) | C-3 (500) | DIA (14) | W-3 (3) | S1-1/S2-1 (7/3) | 4.9 | 48 |
| 4 | A-4 | B-21 (80) | C-2 (500) | DIA (10) | W-4 (2) | S1-1/S2-1 (8/2) | 4.5 | 46 |
| 5 | A-5 | B-32 (60) | C-7 (400) | TOA (6) | — | S1-2/S2-1 (7/3) | 5.6 | 55 |
| 6 | A-6 | B-39 (40) | C-3 (600) | DIA (10) | W-2 (2) | S1-1/S2-2 (9.5/0.5) | 4.8 | 47 |
| 7 | A-7 | B-42 (50) | C-6 (600) | PEA (5) | W-4 (2) | S1-1/S2-1 (8/2) | 5.6 | 56 |
| 8 | A-8 | B-50 (80) | C-8 (500) | DIA (5) | W-5 (3) | S1-1/S2-1 (8/2) | 5.1 | 52 |
| 9 | A-9 | B-55 (30) | C-5 (400) | DIA (10) | W-5 (3) | S1-1/S2-2 (9/1) | 5.6 | 55 |
| 10 | A-10 | B-2 (75) | C-4 (600) | D-13 (14) | W-1 (3) | S1-1 | 5.3 | 52 |
| 11 | A-1/A-4 (1 g/1 g) | B-3 (55) | C-1 (500) | PBI (8) | W-5 (3) | S1-1/S2-1 (8/2) | 4.6 | 45 |
| 12 | A-3/A-4 (1.5 g/0.5 g) | B-14 (12) | C-2 (600) | DIA (7) | W-5 (3) | S1-2/S2-1 (7/3) | 4.8 | 49 |
| 13 | A-6/A-9 (1 g/1 g) | B-21 (35) | C-5 (400) | DIA (10) | W-1 (3) | S1-1/S2-1 (8/2) | 5.8 | 56 |
| 14 | A-1 | B-32 (40) | C-2/C-8 (400/200) | DIA (15) | W-5 (3) | S1-1/S2-1 (8/2) | 5.2 | 52 |
| 15 | A-2 | B-39 (25) | C-1/C-9 (500/100) | DIA (10) | W-2 (2) | S1-1/S2-3 (8/2) | 4.5 | 45 |
| 16 | A-3 | B-21 (30) | C-3/C-5 (400/100) | DIA/PEA (6/9) | W-1 (3) | S1-1/S2-1 (6/4) | 4.8 | 49 |
| 17 | A-4 | B-32 (50) | C-8 (500) | DIA/DHA (6/10) | W-4 (2) | S1-1/S2-1 (8/2) | 5.0 | 49 |
| 18 | A-5 | B-39 (40) | C-4 (400) | DIA/TOA (12/14) | W-2 (2) | S1-1/S2-3 (9/1) | 5.3 | 52 |
| 19 | A-6 | B-1/B-3 (40/5) | C-8 (600) | DIA (10) | W-3 (3) | S1-1/S2-1 (9/1) | 5.2 | 52 |
| 20 | A-7 | B-4/B-5 (80/5) | C-6 (600) | TMEA (10) | W-4 (2) | S1-1/S2-1 (9/1) | 5.6 | 57 |

TABLE 3-2

| Example No. | Resin (A) (2 g) | Hydrophobic resin (B) (mg) | Acid generator (C) (mg) | Basic compound (mg) | Surfactant (mg) | Organic solvent (mass ratio) | LER (nm) | Pattern collapse (nm) |
|---|---|---|---|---|---|---|---|---|
| 21 | A-13 | B-2 (40) | C-1 (600) | TMEA (11) | W-5 (3) | S1-1 | 6.0 | 58 |
| 22 | A-14 | B-3 (40) | C-2 (600) | D-52 (10) | W-1 (3) | S1-1/S2-1 (9/3) | 6.1 | 58 |

TABLE 3-2-continued

| Example No. | Resin (A) (2 g) | Hydrophobic resin (B) (mg) | Acid generator (C) (mg) | Basic compound (mg) | Surfactant (mg) | Organic solvent (mass ratio) | LER (nm) | Pattern collapse (nm) |
|---|---|---|---|---|---|---|---|---|
| 23 | A-15 | B-14 (70) | C-4 (550) | TMEA (13) | W-4 (5) | S1-1/S2-1 (9/4) | 4.6 | 48 |
| 24 | A-16 | B-39 (40) | C-5 (650) | DIA (10) | W-4 (6) | S1-1 | 4.9 | 50 |
| 25 | A-17 | B-14 (70) | C-3 (600) | TMEA (15) | W-1 (3) | S1-1/S2-2 (9.5/0.5) | 5.5 | 53 |
| 26 | A-18 | B-21 (80) | C-1 (600) | PBI (8) | W-4 (8) | S1-1/S2-1 (9/1) | 5.4 | 51 |
| 27 | A-19 | B-29 (40) | C-2 (500) | D-13 (8) | W-1 (3) | S1-1 | 4.6 | 47 |
| 28 | A-20 | B-30 (40) | C-10 (600) | D-52 (16) | W-4 (8) | S1-1/S2-1 (9/7) | 4.6 | 47 |
| 29 | A-19 | B-26 (40) | C-10 (600) | PBI (8) | W-5 (3) | S1-1/S2-2 (9.5/0.5) | 4.7 | 49 |
| 30 | A-20 | B-16 (20) | C-10/C-9 (500/100) | D-13 (18) | W-5 (3) | S1-1/S2-2 (9.5/0.5) | 4.8 | 48 |
| 31 | A-21 | B-7 (50) | C-2 (600) | TMEA (10) | W-1 (2) | S1-1/S2-1 (9/1) | 5.1 | 46 |
| 32 | A-22 | B-31 (45) | C-4/C-9 (300/150) | DIA (8) | W-3 (3) | S1-1 | 5.2 | 50 |
| 33 | A-23 | B-24 (80) | C-1 (650) | TOA (9) | W-5 (2) | S1-1/S1-2 (8/2) | 4.9 | 51 |
| 34 | A-24 | B-22 (70) | C-10/C-9 (400/200) | PEA (12) | W-4 (2) | S1-1/S2-2 (9/1) | 5.3 | 53 |
| 35 | A-25 | B-15 (60) | C-6 (500) | PBI (6) | W-2 (3) | S1-2/S2-3 (9.5/0.5) | 5.1 | 48 |
| 36 | A-26 | B-8 (65) | C-3 (550) | DIA/DHA (10/4) | W-5 (3) | S1-1/S2-1 (7/3) | 5.3 | 51 |
| 37 | A-27 | B-19 (40) | C-5 (400) | TEMA (7) | W-1 (2) | S1-2/S2-2 (90/10) | 5.2 | 55 |
| 38 | A-28 | B-25 (60) | C-7 (500) | DHA (6) | W-4 (3) | S1-1 | 5.6 | 56 |
| Comparative Example 1 | A-11 | B-2 (50) | C-9 (600) | DIA (10) | W-1 (3) | S1-1/S2-1 (8/2) | 7.2 | 70 |
| Comparative Example 2 | A-12 | B-3 (45) | C-9 (300) | DIA (10) | W-1 (3) | S1-1/S2-1 (8/2) | 7.0 | 67 |

Resin (A) and Hydrophobic resin (B) correspond to those as described hereinbefore.

Acid generator (C), Basic compound, Surfactant, and Solvent are as follows.

(Acid Generator (C))

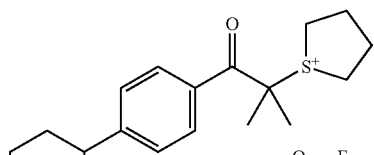
(C-1)

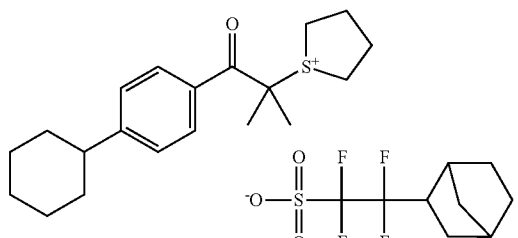
(C-2)

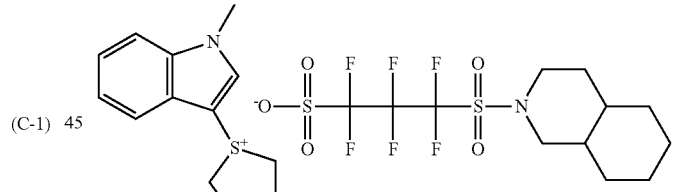
(C-3)

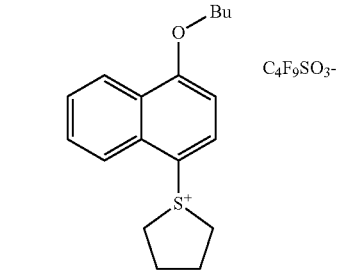
(C-4)

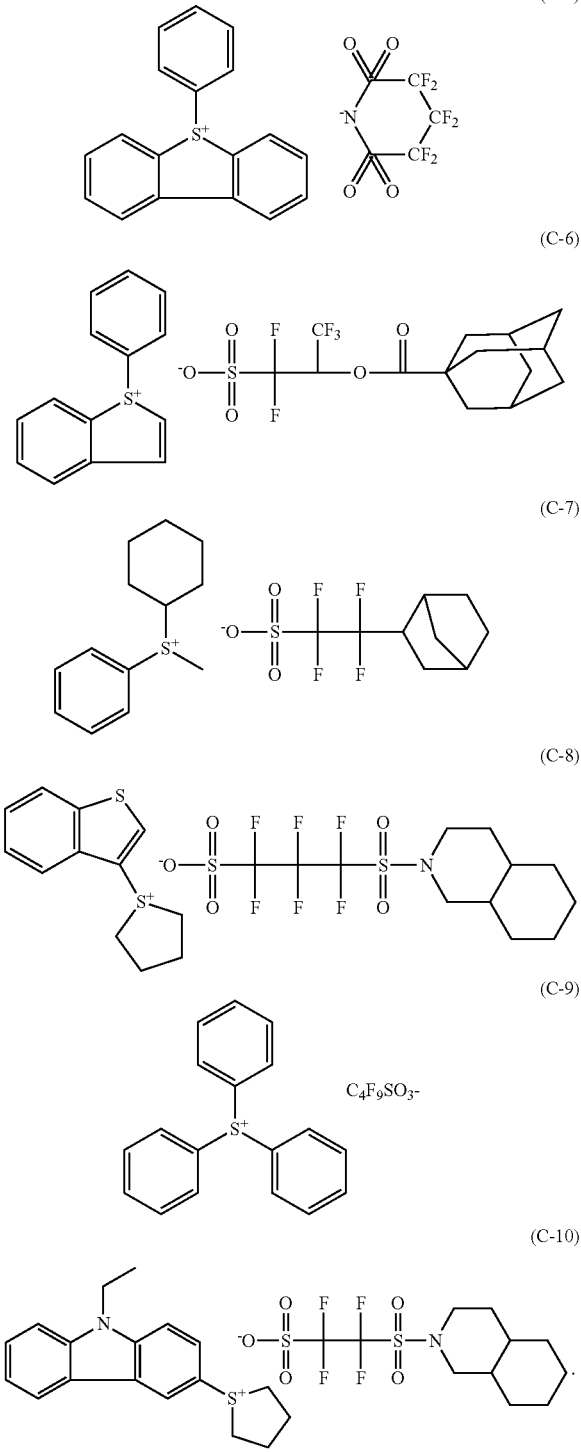

(Basic Compound)
DIA: 2,6-diisopropylaniline,
TMEA: Tris(methoxyethoxyethyl)amine,
PEA: N-phenyldiethanolamine.
TOA: Trioctylamine,
PBI: 2-phenylbenzoimidazole, and
DHA: N,N-dihexylaniline

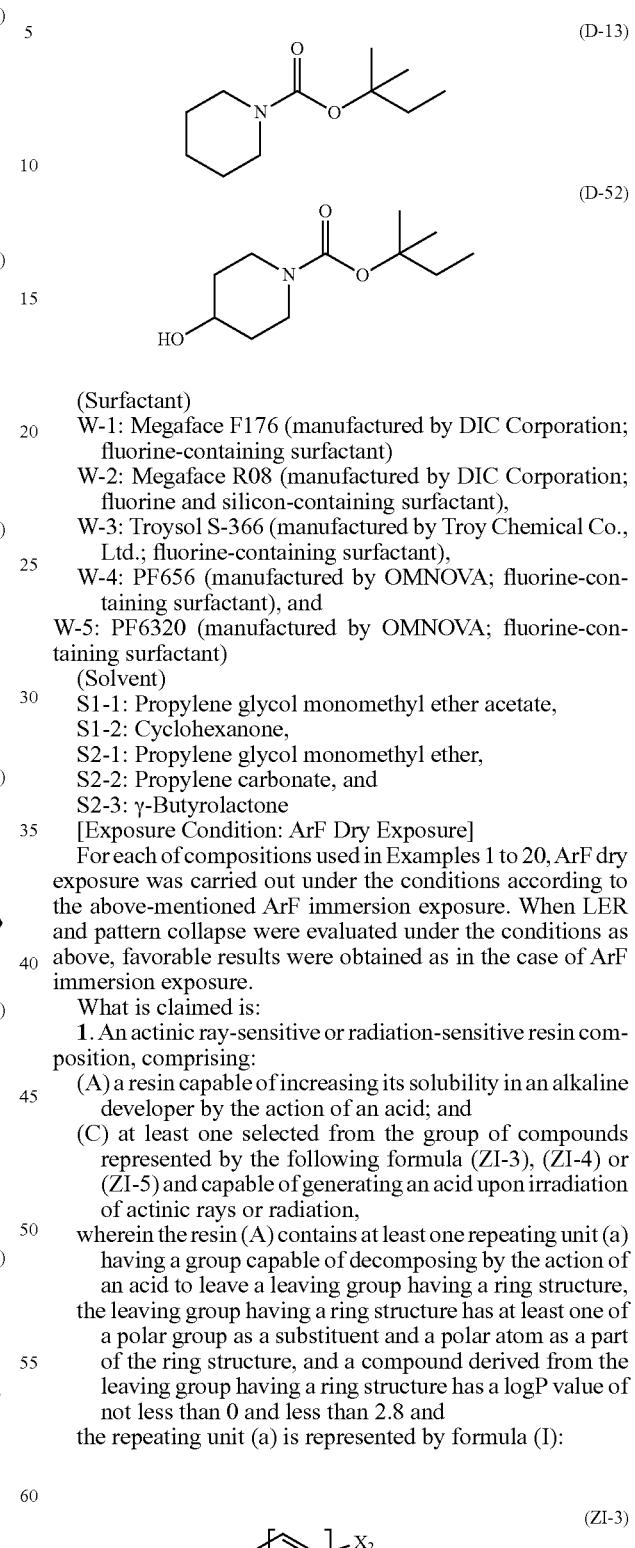

(Surfactant)
W-1: Megaface F176 (manufactured by DIC Corporation; fluorine-containing surfactant)
W-2: Megaface R08 (manufactured by DIC Corporation; fluorine and silicon-containing surfactant),
W-3: Troysol S-366 (manufactured by Troy Chemical Co., Ltd.; fluorine-containing surfactant),
W-4: PF656 (manufactured by OMNOVA; fluorine-containing surfactant), and
W-5: PF6320 (manufactured by OMNOVA; fluorine-containing surfactant)
(Solvent)
S1-1: Propylene glycol monomethyl ether acetate,
S1-2: Cyclohexanone,
S2-1: Propylene glycol monomethyl ether,
S2-2: Propylene carbonate, and
S2-3: γ-Butyrolactone
[Exposure Condition: ArF Dry Exposure]
For each of compositions used in Examples 1 to 20, ArF dry exposure was carried out under the conditions according to the above-mentioned ArF immersion exposure. When LER and pattern collapse were evaluated under the conditions as above, favorable results were obtained as in the case of ArF immersion exposure.

What is claimed is:
1. An actinic ray-sensitive or radiation-sensitive resin composition, comprising:
(A) a resin capable of increasing its solubility in an alkaline developer by the action of an acid; and
(C) at least one selected from the group of compounds represented by the following formula (ZI-3), (ZI-4) or (ZI-5) and capable of generating an acid upon irradiation of actinic rays or radiation,
wherein the resin (A) contains at least one repeating unit (a) having a group capable of decomposing by the action of an acid to leave a leaving group having a ring structure,
the leaving group having a ring structure has at least one of a polar group as a substituent and a polar atom as a part of the ring structure, and a compound derived from the leaving group having a ring structure has a logP value of not less than 0 and less than 2.8 and
the repeating unit (a) is represented by formula (I):

-continued

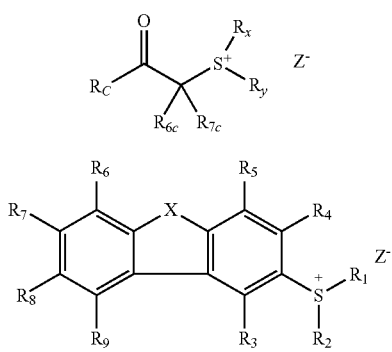
(ZI-4)

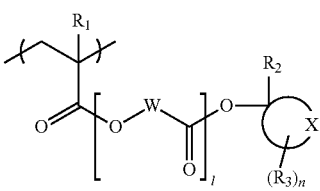
(I)

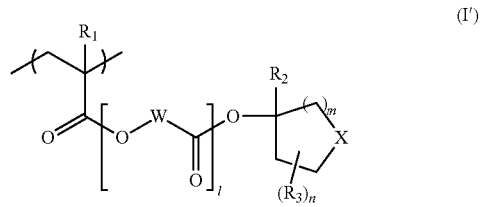
(ZI-5)

wherein formula (I),
R$_1$ represents an atom or group selected from a hydrogen atom, an alkyl group, a halogen atom, a cyano group and an alkyloxycarbonyl group,
R$_2$ represents an alkyl group or a cycloalkyl group,
R$_3$ represents a monovalent substituent,
W represents an alkylene group or a cycloalkylene group,
X represents an oxygen atom or a sulfur atom, and the X-containing ring represents a ring structure containing an ether bond or a thioether bond, and
l and n each independently represents an integer of 0 or more, and in a case where n is 2 or more, each of a plurality of R$_3$'s is independent from every other R$_3$ and may combine with each other to form a ring.

2. The composition according to claim 1, wherein the repeating unit (a) represented by formula (I) is represented by the following formula (I'):

wherein in formula (ZI-3),
X$_2$ represents —CR$_{21}$═CR$_{22}$—, —NR$_{23}$—, —S— or —O—, wherein R$_{21}$ to R$_{23}$ each independently represents a hydrogen atom, an alkyl group, a cycloalkyl group, an alkoxy group, or an aryl group,
R$_{11}$ and R$_{12}$ each independently represents an organic group, and R$_{11}$ and R$_{12}$ may combine with each other to form a ring,
R represents a substituent,
n$_1$ represents an integer of 0 to 3, and n$_2$ represents an integer of 0 or more, in a case where R$_{11}$ and R$_{12}$ represent a phenyl group, n$_1$ represents an integer of 1 or more, and
Z$^-$ represents a non-nucleophilic anion;
wherein in formula (ZI-4),
R$_c$ represents an aryl group,
R$_{6c}$ and R$_{7c}$ each independently represents a hydrogen atom, an alkyl group, a cycloalkyl group, a halogen atom, a cyano group or an aryl group,
R$_x$ and R$_y$ each independently represents an alkyl group, a cycloalkyl group, a 2-oxoalkyl group, a 2-oxocycloalkyl group, an alkoxycarbonylalkyl group, an allyl group or a vinyl group,
R$_{6c}$ and R$_{7c}$, and R$_x$ and R$_y$ each may combine with each other to form a ring structure, and the ring structure may contain an oxygen atom, a sulfur atom, an ester bond, or an amide bond, and
Z$^-$ represents a non-nucleophilic anion; and
wherein in formula (ZI-5),
X represents an oxygen atom, a sulfur atom or —N(Rx)- wherein Rx represents a hydrogen atom, an alkyl group, a cycloalkyl group, an acyl group, an alkenyl group, an alkoxycarbonyl group, an aryl group, an arylcarbonyl group or an aryloxycarbonyl group,
R$_1$ and R$_2$ each independently represents an alkyl group, a cycloalkyl group or an aryl group,
R$_3$ to R$_9$ each independently represents a hydrogen atom, an alkyl group, a cycloalkyl group, an alkoxy group, an alkoxycarbonyl group, an acyl group, an alkylcarbonyloxy group, an aryl group, an aryloxy group, an aryloxycarbonyl group or an arylcarbonyloxy group,
R$_1$ and R$_2$ may combine with each other to form a ring, and two or more members out of R$_6$ to R$_9$, R$_3$ and R$_9$, R$_4$ and R$_5$, R$_5$ and Rx, and R$_6$ and Rx each may combine with each other to form a ring, and Z$^-$ represents a non-nucleophilic anion;

(I')

wherein,
R$_1$ represents an atom or group selected from a hydrogen atom, an alkyl group, a halogen atom, a cyano group and an alkyloxycarbonyl group,
R$_2$ represents an alkyl group or a cycloalkyl group,
R$_3$ represents a monovalent substituent,
W represents an alkylene group or a cycloalkylene group,
X represents an oxygen atom or a sulfur atom, and the X-containing ring represents a ring structure containing an ether bond or a thioether bond,
l and n each independently represents an integer of 0 or more, m represents an integer of 1 or more, and in a case where n is 2 or more, each of a plurality of R$_3$'s is independent from every other R$_3$ and may combine with each other to form a ring.

3. The composition according to claim 1, wherein X in formula (I) represents an oxygen atom.

4. The composition according to claim 1, further comprising:
(B) a resin containing a repeating unit having at least one of a fluorine atom and a silicon atom, and different from the resin (A).

5. The composition according to claim 1, wherein the resin (A) further contains a repeating unit having a lactone structure.

6. The composition according to claim 1, wherein the resin (A) further contains a repeating unit having a group capable of decomposing by the action of an acid other than the repeating unit (a) having a group capable of decomposing by the action of an acid.

7. An actinic ray-sensitive or radiation-sensitive film formed using the composition of claim 1.

8. A pattern forming method, comprising:
forming a film using the composition of claim 1;
exposing the formed film; and
developing the exposed film.

9. The method according to claim 8, wherein the exposure is carried out using an immersion liquid.

10. An actinic ray-sensitive or radiation-sensitive resin composition, comprising:
(A) a resin capable of increasing the solubility in an alkaline developer by the action of an acid; and
(C) at least one selected from the group of compounds represented by the following formula (ZI-3), (ZI-4) or (ZI-5) and capable of generating an acid upon irradiation of actinic rays or radiation,
wherein the resin (A) contains at least one repeating unit (a) having a group capable of decomposing by the action of an acid to leave a leaving group having a ring structure,
the leaving group having a ring structure has at least one of a polar group as a substituent and a polar atom as a part of the ring structure, and a compound derived from the leaving group having a ring structure has a logP value of not less than 0 and less than 2.8, and
the repeating unit (a) is represented by at least one of the following formulae (II) and (III):

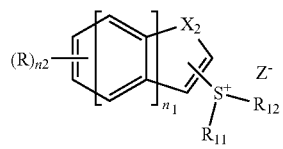
(ZI-3)

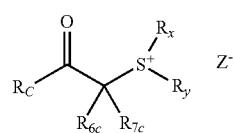
(ZI-4)

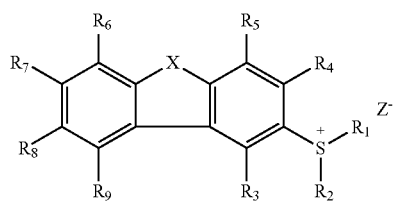
(ZI-5)

wherein in formula (ZI-3),
$X_2$ represents —$CR_{21}$=$CR_{22}$—, —$NR_{23}$—, —S— or —O—, wherein $R_{21}$ to $R_{23}$ each independently represents a hydrogen atom, an alkyl group, a cycloalkyl group, an alkoxy group, or an aryl group,
$R_{11}$ and $R_{12}$ each independently represents an organic group, and $R_{11}$ and $R_{12}$ may combine with each other to form a ring,
R represents a substituent,
$n_1$ represents an integer of 0 to 3, and $n_2$ represents an integer of 0 or more, in a case where $R_{11}$ and $R_{12}$ represent a phenyl group, $n_1$ represents an integer of 1 or more, and $Z^-$ represents a non-nucleophilic anion;
wherein in formula (ZI-4),
$R_c$ represents an aryl group,
$R_{6c}$ and $R_{7c}$ each independently represents a hydrogen atom, an alkyl group, a cycloalkyl group, a halogen atom, a cyano group or an aryl group,
$R_x$ and $R_y$ each independently represents an alkyl group, a cycloalkyl group, a 2-oxoalkyl group, a 2-oxocycloalkyl group, an alkoxycarbonylalkyl group, an allyl group or a vinyl group,
$R_{6c}$ and $R_{7c}$, and $R_x$ and $R_y$ each may combine with each other to form a ring structure, and the ring structure may contain an oxygen atom, a sulfur atom, an ester bond, or an amide bond, and
$Z^-$ represents a non-nucleophilic anion; and
wherein in formula (ZI-5),
X represents an oxygen atom, a sulfur atom or —N(Rx)— wherein Rx represents a hydrogen atom, an alkyl group, a cycloalkyl group, an acyl group, an alkenyl group, an alkoxycarbonyl group, an aryl group, an arylcarbonyl group or an aryloxycarbonyl group,
$R_1$ and $R_2$ each independently represents an alkyl group, a cycloalkyl group or an aryl group,
$R_3$ to $R_9$ each independently represents a hydrogen atom, an alkyl group, a cycloalkyl group, an alkoxy group, an alkoxycarbonyl group, an acyl group, an alkylcarbonyloxy group, an aryl group, an aryloxy group, an aryloxycarbonyl group or an arylcarbonyloxy group,
$R_1$ and $R_2$ may combine with each other to form a ring, and two or more members out of $R_6$ to $R_9$, $R_3$ and $R_9$, $R_4$ and $R_5$, $R_5$ and Rx, and $R_6$ and Rx each may combine with each other to form a ring, and
$Z^-$ represents a non-nucleophilic anion;

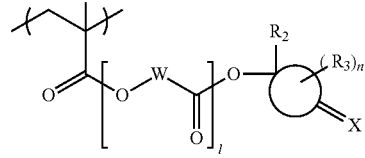
(II)

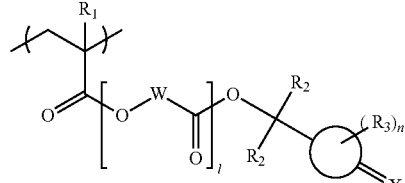
(III)

wherein in formula (II) and (III),
$R_1$ represents an atom or group selected from a hydrogen atom, an alkyl group, a halogen atom, a cyano group and an alkyloxycarbonyl group,
$R_2$ represents an alkyl group or a cycloalkyl group, and in a case where two $R_2$'s are present, each $R_2$ independently represents an alkyl group or a cycloalkyl group,
$R_3$ represents a monovalent substituent,
W represents an alkylene group or a cycloalkylene group,
X represents an oxygen atom or a sulfur atom, and the X-containing ring represents a ring structure containing a carbonyl group or a thiocarbonyl group, l and n each independently represents an integer of 0 or more, and in a case where n is 2 or more, each of a plurality of $R_3$'s is independent from every other $R_3$ and may combine with each other to form a ring.

11. The composition according to claim 10, wherein X in at least one of formulae (II) and (III) represents an oxygen atom.

12. The composition according to claim 1, wherein $Z^-$ in the formula (ZI-3), (ZI-4) and (ZI-5) is an anion represented by the following formula (LD1):

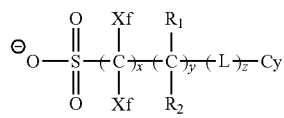
(LD1)

wherein in formula (LD1),
Xf's each independently represent a fluorine atom or an alkyl group substituted with at least one fluorine atom,
$R_1$ and $R_2$ each independently represents a group selected from the group consisting of a hydrogen atom, a fluorine atom, an alkyl group, and an alkyl group substituted with at least one fluorine atom,
L's each independently represent a single bond or a divalent linking group,
Cy represents a group having a cyclic structure,
x represents an integer of 1 to 20,
y represents an integer of 0 to 10, and
z represents an integer of 0 to 10.

13. The composition according to claim 10, wherein $Z^-$ in the formula (ZI-3), (ZI-4) and (ZI-5) is an anion represented by the following formula (LD1):

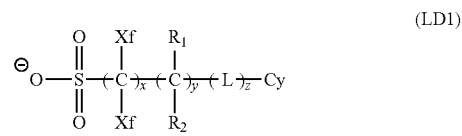
(LD1)

wherein in formula (LD1),
Xf's each independently represent a fluorine atom or an alkyl group substituted with at least one fluorine atom,
$R_1$ and $R_2$ each independently represents a group selected from the group consisting of a hydrogen atom, a fluorine atom, an alkyl group, and an alkyl group substituted with at least one fluorine atom,
L's each independently represent a single bond or a divalent linking group,
Cy represents a group having a cyclic structure,
x represents an integer of 1 to 20,
y represents an integer of 0 to 10, and
z represents an integer of 0 to 10.

\* \* \* \* \*